(12) United States Patent  
Yoshida et al.

(10) Patent No.: US 9,142,555 B2  
(45) Date of Patent: Sep. 22, 2015

(54) SEMICONDUCTOR DEVICE

(71) Applicant: Renesas Electronics Corporation, Kawasaki-shi, Kanagawa (JP)

(72) Inventors: Yoshinori Yoshida, Kanagawa (JP); Hirokazu Kato, Kanagawa (JP); Tsuyoshi Kachi, Kanagawa (JP); Keisuke Furuya, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/548,311

(22) Filed: Nov. 20, 2014

(65) Prior Publication Data

US 2015/0145025 A1 May 28, 2015

(30) Foreign Application Priority Data

Nov. 22, 2013 (JP) .................. 2013-241987

(51) Int. Cl.
| | |
|---|---|
| *H01L 29/66* | (2006.01) |
| *H01L 27/088* | (2006.01) |
| *H01L 23/528* | (2006.01) |
| *H01L 29/417* | (2006.01) |
| *H01L 29/40* | (2006.01) |
| *H01L 29/78* | (2006.01) |

(52) U.S. Cl.
CPC ............ *H01L 27/088* (2013.01); *H01L 23/528* (2013.01); *H01L 29/402* (2013.01); *H01L 29/41741* (2013.01); *H01L 29/7809* (2013.01)

(58) Field of Classification Search
CPC ................ H01L 29/7813; H01L 29/66795; H01L 27/088
See application file for complete search history.

(56) References Cited

U.S. PATENT DOCUMENTS

| | | | | |
|---|---|---|---|---|
| 5,981,996 | A | * | 11/1999 | Fujishima ................ 257/335 |
| 6,548,860 | B1 | * | 4/2003 | Hshieh et al. ............. 257/328 |
| 7,235,845 | B2 | | 6/2007 | Xu et al. |
| 2007/0138548 | A1 | | 6/2007 | Kocon et al. |

* cited by examiner

*Primary Examiner* — Fernando L Toledo  
*Assistant Examiner* — Neil Prasad  
(74) *Attorney, Agent, or Firm* — Miles & Stockbridge P.C.

(57) ABSTRACT

Provided is a semiconductor device having improved performance. A semiconductor substrate is formed with unit LDMOSFET elements. The unit LDMOSFET elements have respective source regions electrically coupled to each other via a first source interconnect line and a second source interconnect line. The unit LDMOSFET elements have respective gate electrodes electrically coupled to each other via a first gate interconnect line and also electrically coupled to a second gate interconnect line in the same layer as that of the second source interconnect line via the first gate interconnect line. The unit LDMOSFET elements have respective drain regions electrically coupled to a back surface electrode via a conductive plug embedded in a trench of the semiconductor substrate. Each of the first source interconnect line and the first gate interconnect line has a thickness smaller than that of the second source interconnect line. Over the plug, the first gate interconnect line extends.

20 Claims, 56 Drawing Sheets

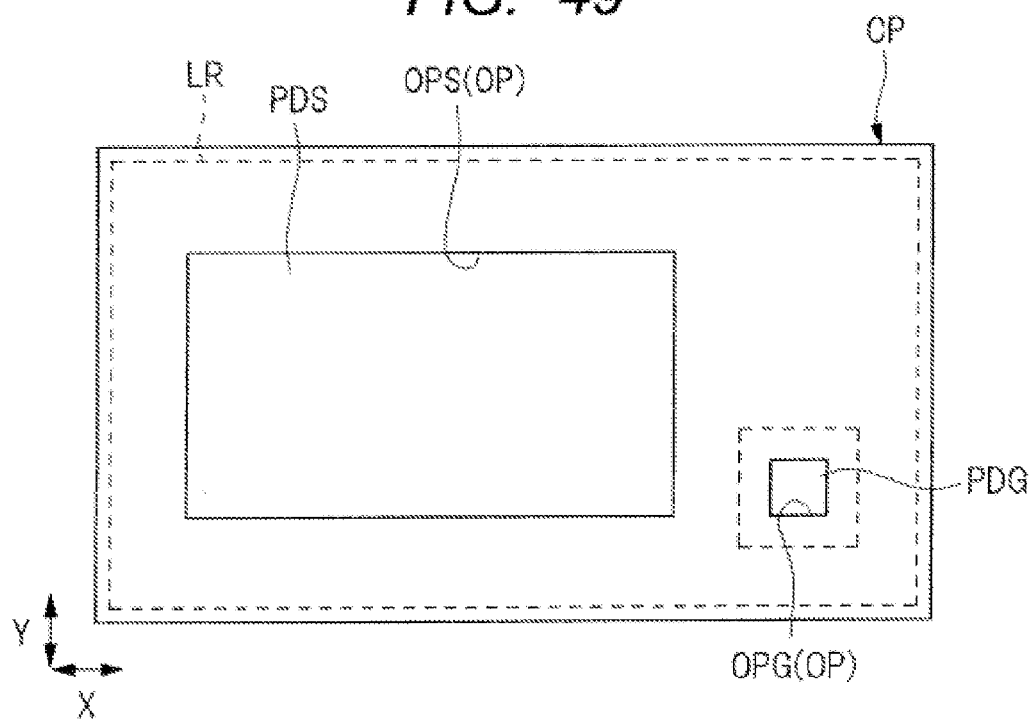
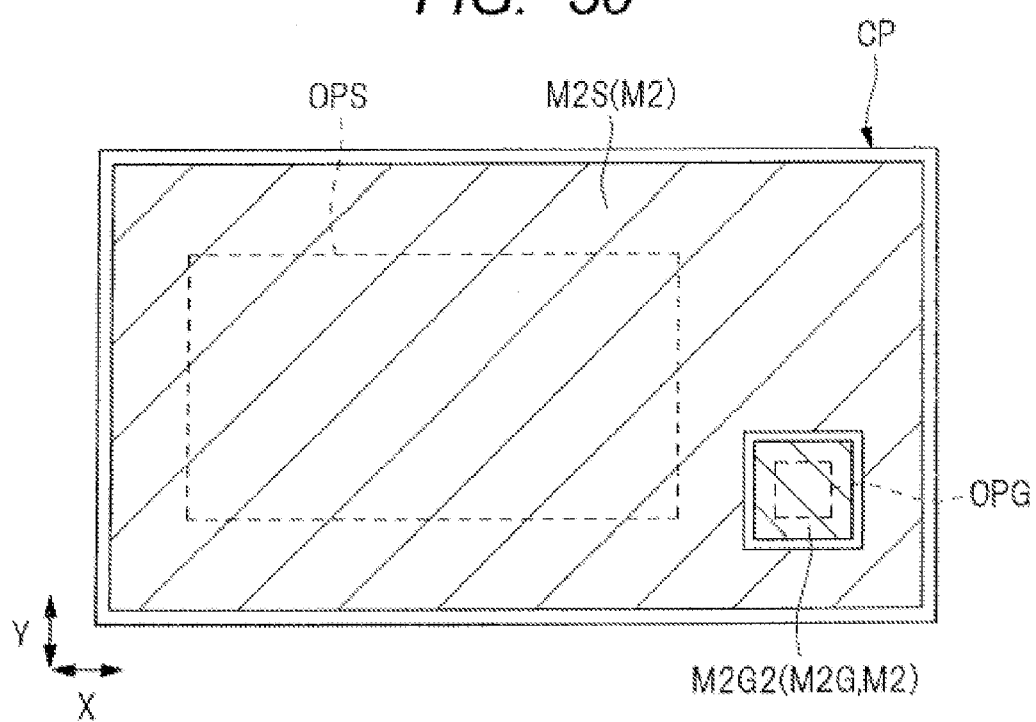

SEMICONDUCTOR DEVICE

CROSS-REFERENCE TO RELATED APPLICATIONS

The disclosure of Japanese Patent Application No. 2013-241987 filed on Nov. 22, 2013 including the specification, drawings and abstract is incorporated herein by reference in its entirety.

BACKGROUND

The present invention relates to a semiconductor device and can be used appropriately for, e.g., a semiconductor device having a MISFET.

In each of the specification of US Patent Application Publication No. 2007/0138548 (Patent Document 1) and the specification of U.S. Pat. No. 7,235,845 (Patent Document 2), a technology related to a semiconductor device having an LDMOS (Laterally Diffused Metal-Oxide-Semiconductor) transistor is described.

RELATED ART DOCUMENTS

Patent Documents

[Patent Document 1]
US Patent Application Publication No. 2007/0138548
[Patent Document 2]
U.S. Pat. No. 7,235,845

SUMMARY

There is a technique which forms a plurality of unit MISFETs in a semiconductor substrate and couples in parallel the plurality of unit MISFETs to each other to form a semiconductor device having the power MISFETs. In such a semiconductor device also, it is desired to maximally improve the performance thereof.

Other problems and novel features of the present invention will become apparent from a statement in the present specification and the accompanying drawings.

According to an embodiment, a semiconductor device includes a plurality of unit MISFET elements formed in a first MISFET formation region of a main surface of a semiconductor substrate and coupled in parallel to each other, an interconnect line structure having a first interconnect line layer, and a second interconnect line layer located over the first interconnect line layer, and a back surface electrode formed over a back surface of the semiconductor substrate. The first interconnect line layer of the interconnect line structure includes a first source interconnect line, and a first gate interconnect line. The second interconnect line layer of the interconnect line structure includes a second source interconnect line, and a second gate interconnect line. Each of the first source interconnect line and the first gate interconnect line has a thickness smaller than a thickness of each of the second source interconnect line and the second gate interconnect line. The unit MISFET elements have respective drain regions electrically coupled to the back surface electrode via a conductive plug embedded in a trench of the semiconductor substrate. The unit MISFET elements have respective source regions electrically coupled to each other via the first source interconnect line and the second source interconnect line. The unit MISFET elements have respective gate electrodes electrically coupled to each other via the first gate interconnect line and electrically coupled to the second gate interconnect line via the first gate interconnect line. Over the plug, the first gate interconnect line extends.

According to another embodiment, a semiconductor device includes a plurality of unit MISFET elements formed in a first MISFET formation region of a main surface of a semiconductor substrate and coupled in parallel to each other, an interconnect line structure having a first interconnect line layer, and a second interconnect line layer located over the first interconnect line layer, and a back surface electrode formed over a back surface of the semiconductor substrate. The first interconnect line layer of the interconnect line structure includes a first drain interconnect line, and a first gate interconnect line. The second interconnect line layer of the interconnect line structure includes a second drain interconnect line, and a second gate interconnect line. Each of the first drain interconnect line and the first gate interconnect line has a thickness smaller than a thickness of each of the second drain interconnect line and the second gate interconnect line. The unit MISFET elements have respective source regions electrically coupled to the back surface electrode via a conductive plug embedded in a trench of the semiconductor substrate. The unit MISFET elements have respective drain regions electrically coupled to each other via the first drain interconnect line and the second drain interconnect line. The unit MISFET elements have respective gate electrodes electrically coupled to each other via the first gate interconnect line and electrically coupled to the second gate interconnect line via the first gate interconnect line. Over the plug, the first gate interconnect line extends.

According to the embodiment, it is possible to improve the performance of the semiconductor device.

BRIEF DESCRIPTION OF THE DRAWINGS

FIG. 49 is an overall plan view of a semiconductor device in still another embodiment;

FIG. 50 is an overall plan view of the semiconductor device in the still other embodiment;

DETAILED DESCRIPTION

Figure 1:
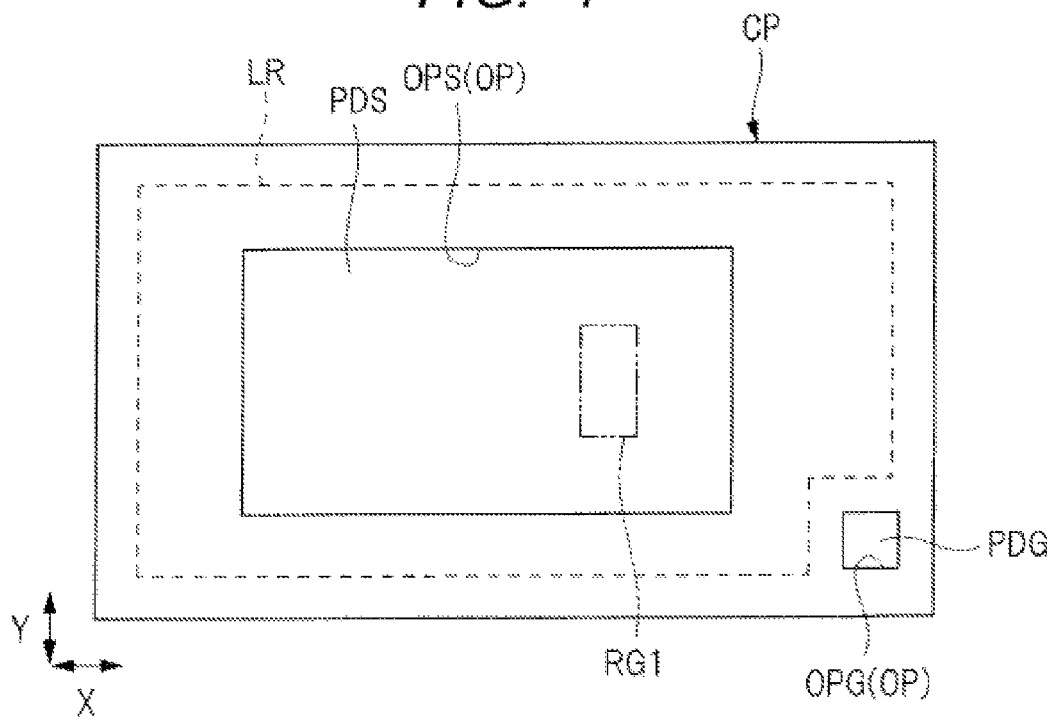
FIG. 1 is an overall plan view of a semiconductor device in an embodiment.

In the following embodiments, if necessary for the sake of convenience, the embodiments will be each described by being divided into a plurality of sections or embodiments. However, they are by no means irrelevant to each other unless particularly explicitly described otherwise, and one of the sections or embodiments is modifications, details, supplementary explanation, and so forth of part or the whole of the others. Also, in the following embodiments, when the number and the like (including the number, numerical value, amount, range, and the like) of elements are mentioned, they are not limited to the specified numbers unless particularly explicitly described otherwise or unless they are obviously limited to specific numbers in principle. The number and the like of the elements may be not less than or not more than the specified numbers. Also, in the following embodiments, it goes without saying that the components thereof (including also elements, steps, and the like) are not necessarily indispensable unless particularly explicitly described otherwise or unless the components are considered to be obviously indispensable in principle. Likewise, if the shapes, positional relationships, and the like of the components and the like are mentioned in the following embodiments, the shapes, positional relationships, and the like are assumed to include those substantially proximate or similar thereto and the like unless particularly explicitly described otherwise or unless it can be considered that they obviously do not in principle. The same shall apply in regard to the foregoing numerical value and range.

Hereinbelow, the embodiments will be described in detail on the basis of the drawings. Note that, throughout all the drawings for illustrating the embodiments, members having the same functions are designated by the same reference numerals, and the repeated description thereof is omitted. Also, in the following embodiments, a description of the same or like parts will not be repeated in principle unless particularly necessary.

In the drawings used in the embodiments, hatching may be omitted even in a cross-sectional view for improved clarity of illustration, while even a plan view may be hatched for improved clarity of illustration.

Embodiment 1

<About Structure of Semiconductor Device>

Figure 2:
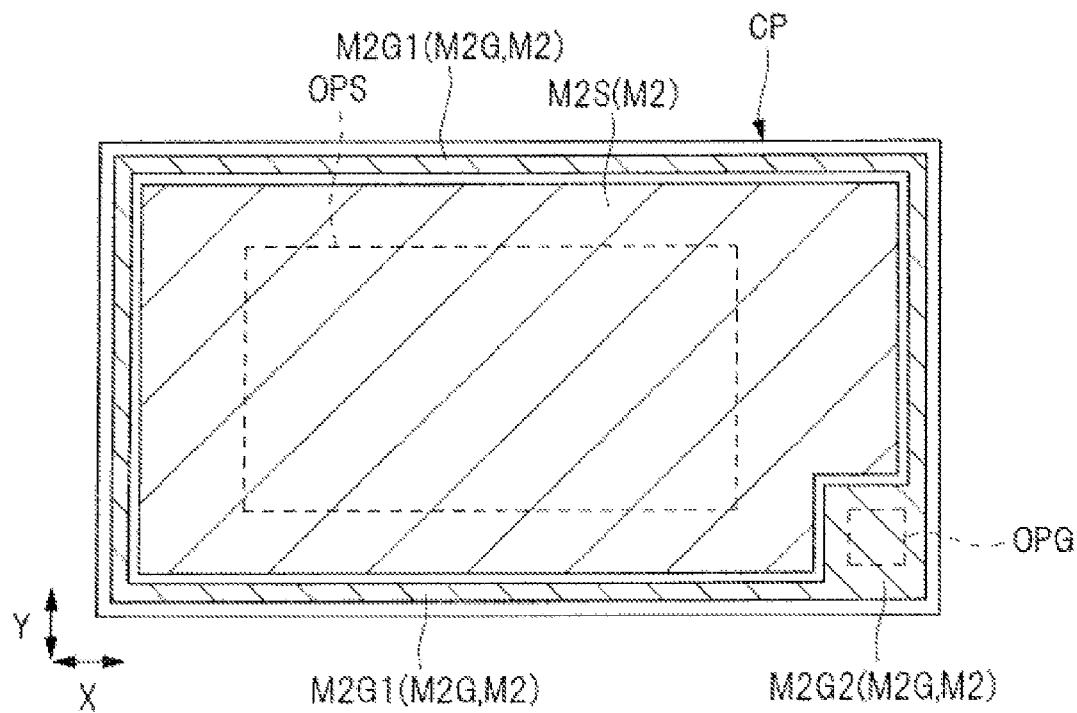
FIG. 2 is an overall plan view of the semiconductor device in the embodiment.
Figure 3:
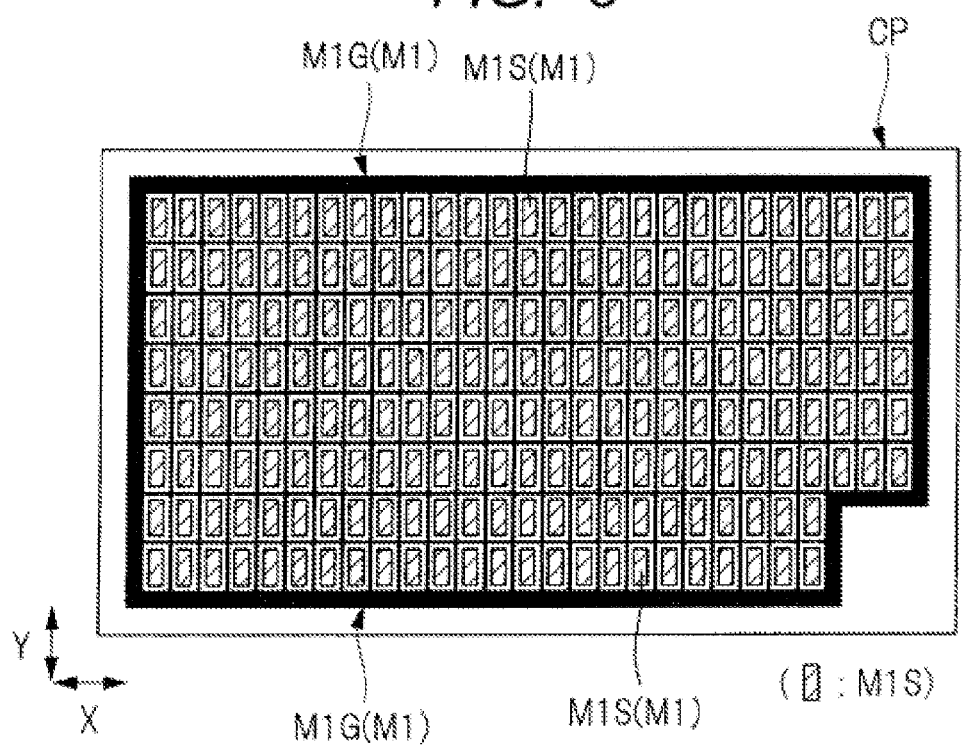
FIG. 3 is an overall plan view of the semiconductor device in the embodiment.
Figure 4:
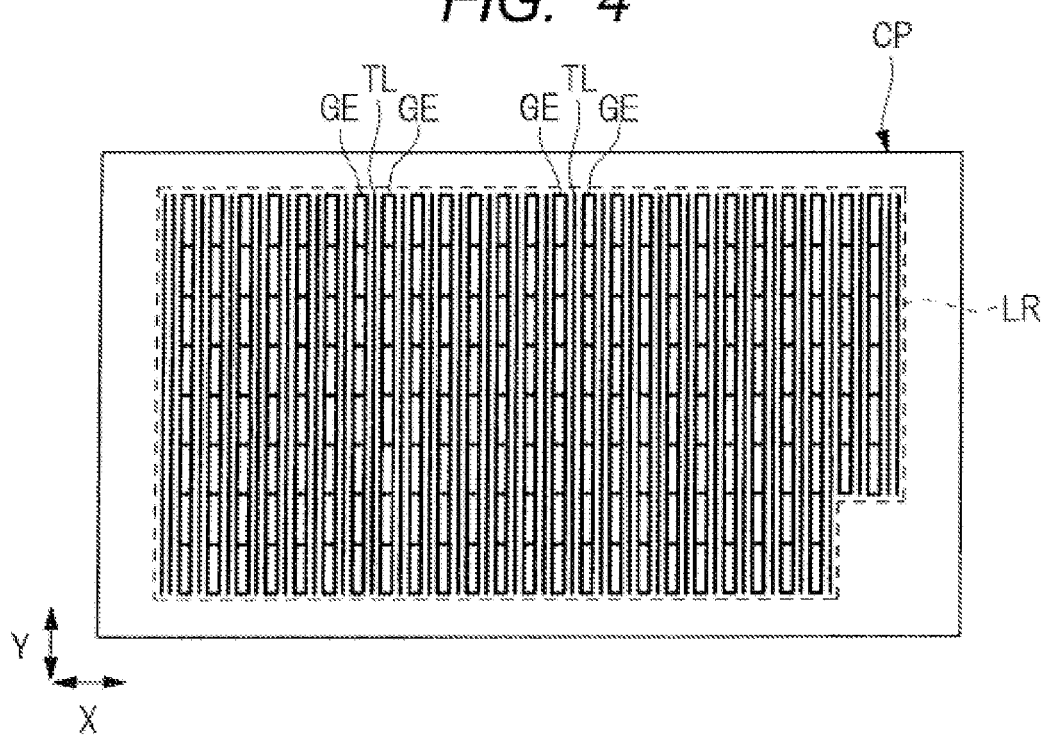
FIG. 4 is an overall plan view of the semiconductor device in the embodiment.
Figure 5:
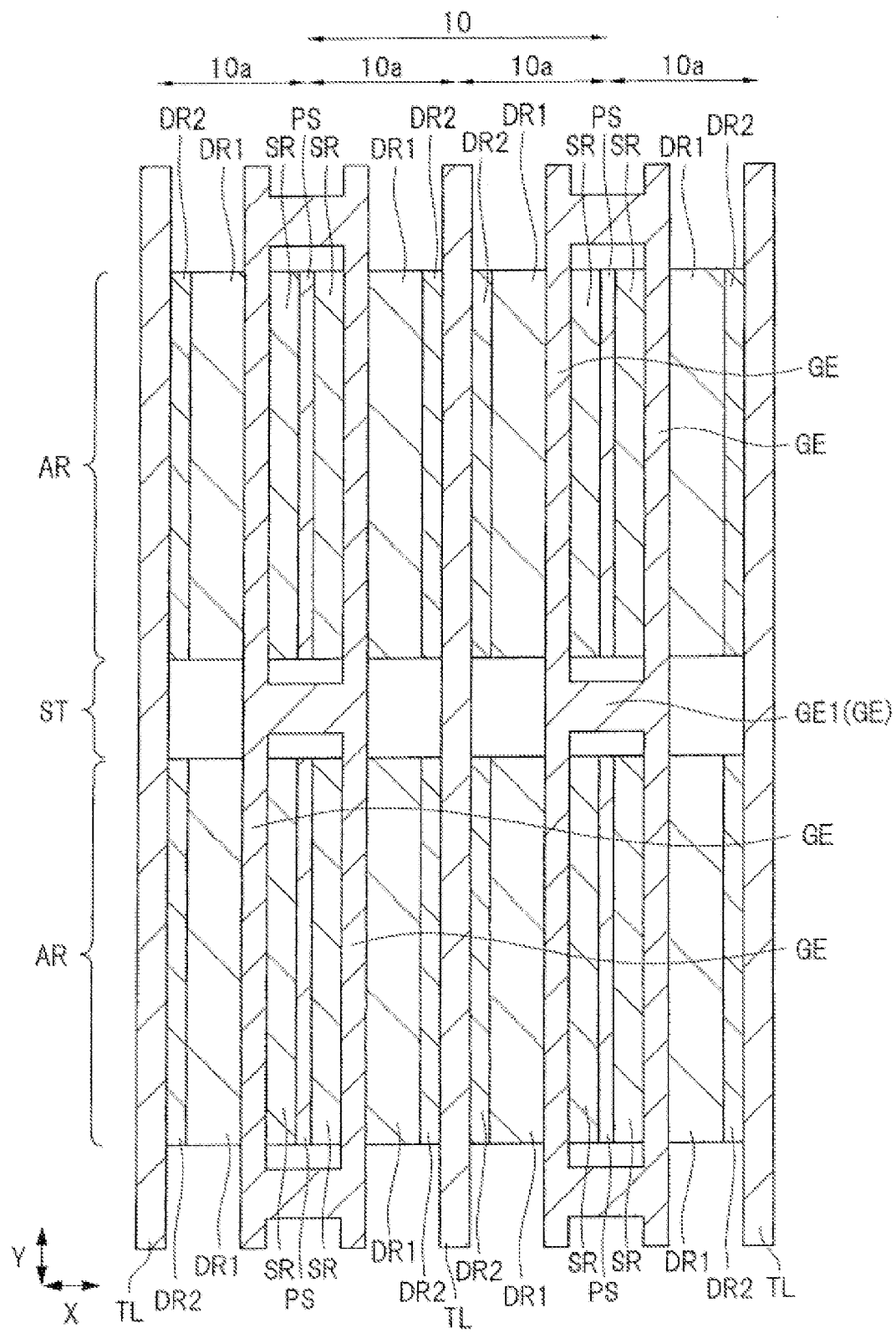
FIG. 5 is a main-portion plan view of the semiconductor device in the embodiment.
Figure 6:
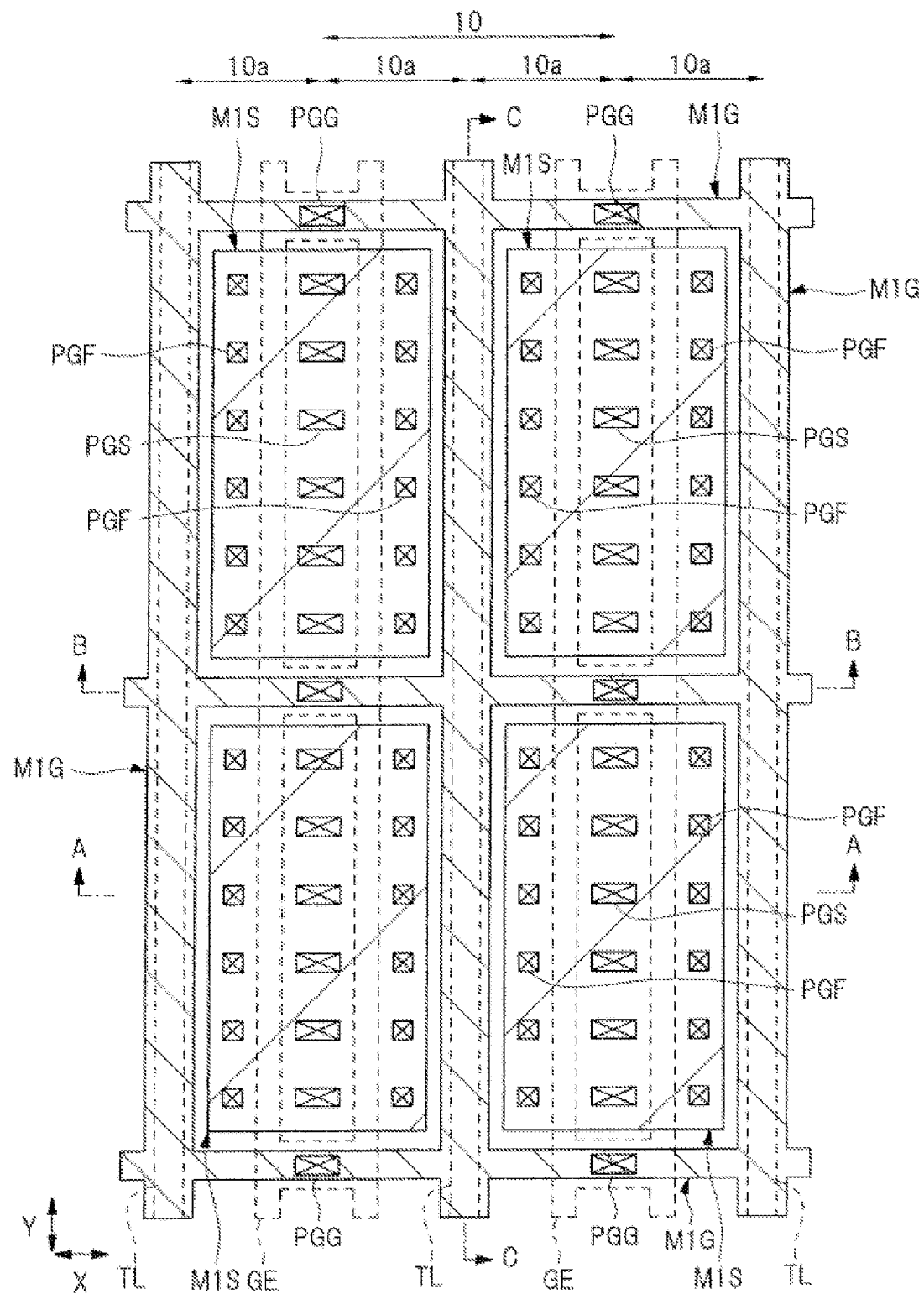
FIG. 6 is a main-portion plan view of the semiconductor device in the embodiment.
Figure 7:
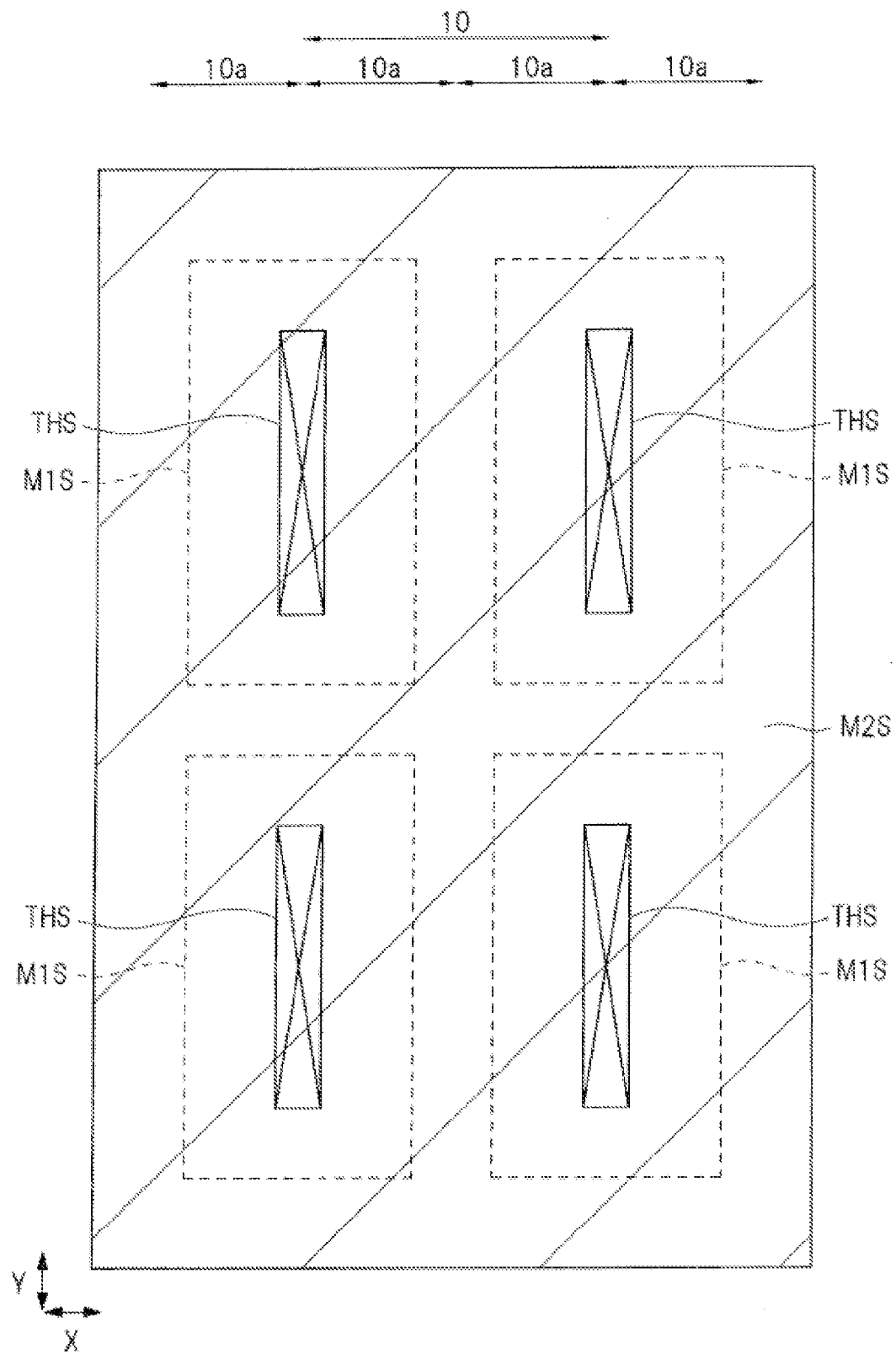
FIG. 7 is a main-portion plan view of the semiconductor device in the embodiment.

Referring to the drawings, a semiconductor device in the present embodiment will be described. FIG. 1 is an overall plan view of a semiconductor device (semiconductor chip) CP in the present embodiment, which shows an overall plan view of the upper surface side of the semiconductor device CP. FIGS. 2 to 4 are also overall plan views of the semiconductor device CP in Embodiment 1, but shows layers different from that in FIG. 1. FIGS. 5 to 7 are main-portion plan views of the semiconductor device CP in Embodiment 1. Enlarged illustration of a region RG1 enclosed in the two-dot-dash line shown in FIG. 1 corresponds to FIGS. 5 to 7, but FIGS. 5 to 7 show the layers different from each other. FIGS. 8 to 11 are main-portion cross-sectional views of the semiconductor device CP in the present embodiment.

FIGS. 1 to 4 show the plan views of the same region, of which FIG. 1 shows a top view of the semiconductor device CP and FIG. 2 shows a two-dimensional layout of interconnect lines M2 (i.e., a source interconnect line M2S and a gate interconnect line M2G). In FIG. 2, the positions of openings OP (i.e., a source opening OPS and a gate opening OPG) are shown by the dotted lines. FIG. 3 shows a two-dimensional layout of interconnect lines M1 (i.e., source interconnect lines M1S and a gate interconnect line M1G). FIG. 4 shows a two-dimensional layout of gate electrodes GE and plugs TL. In each of FIGS. 1 and 4, an LDMOSFET formation region LR is shown by the dotted line. FIGS. 2 and 3 are plan views but, for easier understanding, the source interconnect line M2S and the gate interconnect line M2G are obliquely hatched in FIG. 2, while the source interconnect lines M1S are obliquely hatched and the gate interconnect line M1G is shown by the solid line in FIG. 3. In FIG. 4, the gate electrodes GE and the plugs TL are shown by the sold lines.

FIGS. 5 to 7 show the plan views of the same region, but the layers shown therein are different. That is, FIG. 5 shows a two-dimensional layout of the gate electrodes GE, source regions ($n^+$-type source regions SR), and drain regions (lower-concentration n-type drain regions DR1 and higher-concentration $n^+$-type drain regions DR2), and the plugs TL. FIG. 5 is a plan view but, for easier understanding, each of the gate electrodes GE, the $n^+$-type source regions SR, the lower-concentration re-type drain regions DR1, the higher-concentration $n^+$-type drain regions DR2, and the plugs TL is hatched. FIG. 6 shows a two-dimensional layout of the interconnect lines M1 (i.e., the source interconnect lines M1S and the gate interconnect line M1G). FIG. 6 is a plan view but, for easier understanding, each of the source interconnect lines M1S and the gate interconnect line M1G is hatched. FIG. 7 shows a two-dimensional layout of the interconnect line M2 (which is the source interconnect line M2S in FIG. 7). FIG. 7 is a plan view but, for easier understanding, the source interconnect line M2S is hatched. Note that, for easier comparison between two-dimensional positions in FIGS. 5 to 7, the gate electrodes GE and the plugs TL are shown by the dotted lines in FIG. 6. In FIG. 7, the positions of source through holes THS located under the source interconnect line M2S are also shown and the source interconnect lines M1 located under the source interconnect line M2S are shown by the dotted lines.

Figure 8:
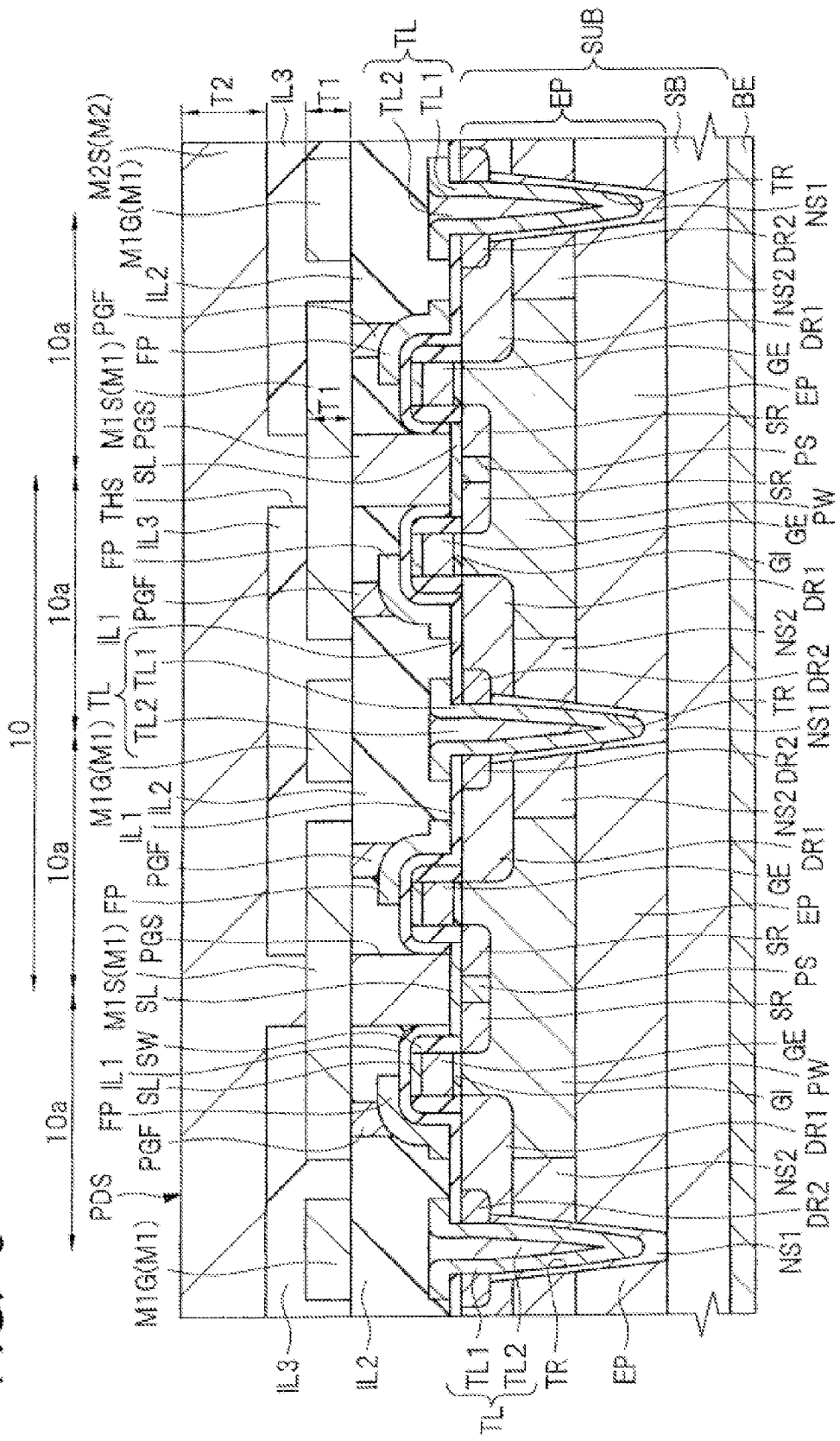
FIG. 8 is a main-portion cross-sectional view of the semiconductor device in the embodiment.
Figure 11:
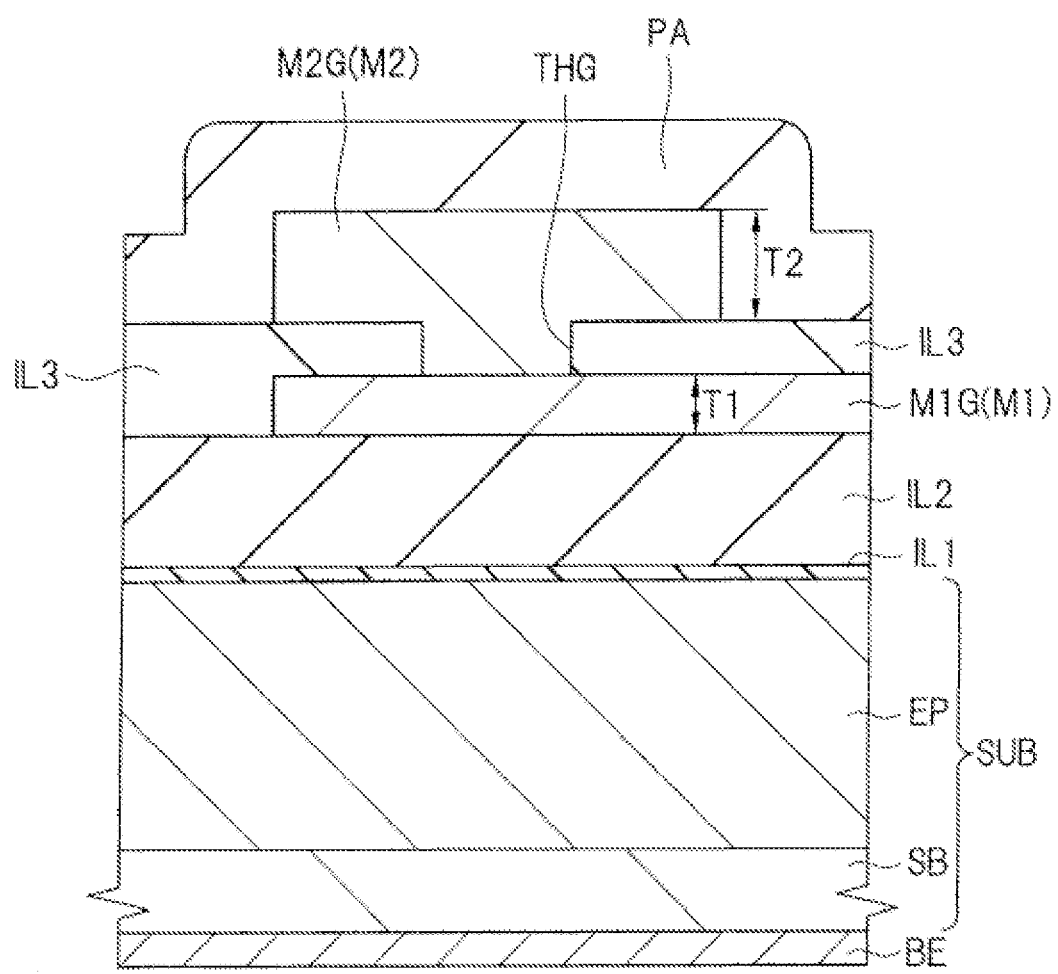
FIG. 11 is a main-portion cross-sectional view of the semiconductor device in the embodiment.

A cross-sectional view along the line A-A in FIG. 6 substantially corresponds to FIG. 8. A cross-sectional view along the line B-B in FIG. 6 substantially corresponds to FIG. 9. A cross-sectional view along the line C-C in FIG. 6 substantially corresponds to FIG. 10. FIG. 11 substantially corresponds to a cross-sectional view laterally traversing an interconnect line portion M2G1 of the gate interconnect line M2G shown in FIG. 2, which is a cross-sectional view generally perpendicular to the extending direction of the interconnect line portion M2G1 of the gate interconnect line M2G.

The X-direction and the Y-direction each shown in the plan views (FIGS. 1 to 7) are directions crossing each other and preferably orthogonal to each other. The Y-direction corresponds to the extending direction of each of the gate electrodes (GE) of LDMOSFETs formed in the LDMOSFET formation region LR, the drain regions (lower-concentration n-type drain regions DR1 and higher-concentration $n^+$-type drain regions DR2) thereof, and the source regions ($n^+$-type source regions SR) thereof.

As also shown in FIGS. 8 to 11, a semiconductor substrate SUB forming the semiconductor device (semiconductor chip) CP has a substrate main body (semiconductor substrate or semiconductor wafer) SB made of $n^+$-type single-crystal silicon into which, e.g., arsenic (As) has been introduced, and an epitaxial layer (semiconductor layer) EP made of, e.g., $n^-$-type single-crystal silicon and formed on the main surface of the substrate main body SB. Accordingly, the semiconductor substrate SUB is a so-called epitaxial wafer. The epitaxial layer EP can also be regarded as a part of the semiconductor substrate SUB. The substrate main body SB has an impurity concentration (n-type impurity concentration) higher than the impurity concentration (n-type impurity concentration) of the epitaxial layer EP.

In the main surface of the semiconductor substrate SUB, i.e., in the main surface of the epitaxial layer EP, the plurality of cells of the LDMOSFETs (Laterally Diffused Metal-Oxide-Semiconductor Field Effect Transistors), i.e., unit LDMOSFET elements are formed. The following is a specific description thereof.

In the upper part of the epitaxial layer EP, a p-type semiconductor region (p-type body layer) PW as a p-type well is formed. The p-type semiconductor region PW has the function of a punch-through stopper which inhibits a depletion layer from extending from the drain of each of the LDMOSFETs to the source thereof. Preferably, on the source side of the LDMOSFET and in the channel formation region thereof, a p-type well (which is the p-type semiconductor region PW herein) is formed to be used as the punch-through stopper. As a result, the bottom surface of the source region ($n^+$-type source region SR) is covered with the p-type well (which is the p-type semiconductor region PW herein). On the other hand, on the drain side of the LDMOSFET, the p-type well (p-type semiconductor region PW) is formed so as to come in contact with a part of the lower-concentration n-type drain region DR1.

Over the top surface of the epitaxial layer EP, the gate electrode GE of each of the LDMOSFETs is formed via a gate insulating film GI. The gate electrode GE is formed over the p-type semiconductor region PW via the insulating film GI. That is, in the epitaxial layer EP of the semiconductor substrate SUB, the source region ($n^+$-type source region SR) and the drain region (lower-concentration n-type drain region DR1 and higher-concentration $n^+$-type drain region DR2) of the LDMOSFET are formed. Over the epitaxial layer EP located between the source region and the drain region, the gate electrode GE is formed via the gate insulating film GI.

The gate insulating film GI is made of, e.g., a silicon dioxide film. The gate electrode GE is formed of, e.g., a single-layer film of an n-type polysilicon film, a multi-layer film including an n-type polysilicon film and a metal silicide layer, or the like. Over the side walls of the gate electrode GE, sidewall spacers (side-wall insulating films) SW each made of an insulating film (e.g., a silicon dioxide film) are formed.

In the internal areas of the epitaxial layer EP spaced apart from each other with the channel formation region (region immediately under the gate electrode GE) being interposed therebetween, the source region and the drain region of each of the LDMOSFETs are formed. The channel formation region corresponds to the area of the p-type semiconductor region PW located immediately under the gate electrode GE.

The drain region of each of the LDMOSFETs includes the lower-concentration n-type drain region ($n^-$-type drift region or $n^-$ type offset drain region) DR1 in contact with the channel formation region, and the higher-concentration $n^+$-type drain region DR2 formed to be in contact with the lower-concentration n-type drain region DR1 and spaced apart from the channel formation region. Each of the lower-concentration n-type drain region DR1 and the higher-concentration $n^+$-type drain region DR2 is an n-type semiconductor region (n-type impurity diffusion region) formed in the epitaxial layer EP. However, the higher-concentration $n^+$-type drain region DR2 has an impurity concentration (n-type impurity concentration) higher than the impurity concentration (n-type impurity concentration) of the lower-concentration n-type drain region DR1. Also, the higher-concentration $n^+$-type drain region DR2 is formed shallower than the lower-concentration n-type drain region DR1. As a result, the depth position of the bottom surface of the higher-concentration $n^+$-type drain region DR2 is shallower than the depth position of the bottom surface of the lower-concentration n-type drain region DR1.

The source region of each of the LDMOSFETs is formed of the $n^+$-type source region SR in contact with the channel formation region. The $n^+$-type source region SR is an n-type semiconductor region (n-type impurity diffusion region) formed in the epitaxial layer EP.

The lower-concentration n-type drain region DR1 is formed self-alignedly with the drain-side side wall of the gate electrode GE. The $n^+$-type source region SR is formed self-alignedly with the source-side side wall of the gate electrode GE. Here, the drain-side side wall of the gate electrode GE and the source-side side wall of the gate electrode GE are the side walls of the gate electrode GE opposite to each other. The lower-concentration n-type drain region DR1 and the $n^+$-type source region SR are spaced apart from each other with the channel formation region (region immediately under the gate electrode GE) being interposed therebetween. Over the channel formation region, the gate electrode GE is formed via the gate insulating film GI.

Note that, in the present application, when a MOSFET or LDMOSFET is mentioned, the MOSFET or LDMOSFET is assumed to include not only a MISFET (Metal Insulator Semiconductor Field Effect Transistor) using an oxide film (silicon dioxide film) as the gate insulating film thereof, but also a MISFET using an insulating film other than an oxide film (silicon oxide film) as the gate insulating film thereof. The LDMOSFET is a type of a MISFET (Metal Insulator Semiconductor Field Effect Transistor: MIS-type field effect transistor).

To be capable of a high-voltage operation in spite of a short channel length, the LDMOSFET has an LDD (Lightly doped drain) region formed on the drain side of the gate electrode GE. That is, the drain of the LDMOSFET includes an $n^+$-type region having a higher impurity concentration (which is the higher-concentration $n^+$-type drain region DR2 herein), and an LDD region having a lower impurity concentration (which is the lower-concentration n-type drain region DR1 herein). The $n^+$-type region (higher-concentration $n^+$-type drain region DR2) is formed to be spaced apart from the gate electrode GE (or the channel formation region under the gate electrode GE) via the LDD region. This can provide a high breakdown voltage. Preferably, a charge amount (impurity concentration) in the drain-side LDD region and the distance between the end portion of the gate electrode GE and the $n^+$-type region (higher-concentration $n^+$-type drain region DR2) along a plane (main surface of the epitaxial layer EP) are optimized such that the breakdown voltage of the LDMOSFET has a maximum value.

Each of the LDMOSFETs has a structure in which the source (which is the source region formed of the $n^+$-type source region SR) and the drain (which is the drain region including the lower-concentration n-type drain region DR1 and the higher-concentration $n^+$-type drain region DR2 herein) are asymmetrical with respect to the gate electrode GE.

At the end portion (end portion opposite to the end portion adjacent to the channel formation region with the lower-concentration n-type drain region DR1 being interposed therebetween) of the higher-concentration $n^+$-type drain region DR2, the conductive plug (punch-through layer or embedded conductor portion) TL is formed to be in contact with the higher-concentration $n^+$-type drain region DR2. The plug TL is a conductor portion (conductive layer) for electrically coupling the drain of each of the LDMOSFETs to the substrate main body SB. Each of the plugs TL is formed of a conductive film embedded in each of trenches TR formed in the semiconductor substrate SUB (epitaxial layer EP). Accordingly, the plug TL can also be regarded as a conductor portion (embedded conductor portion) embedded in the semiconductor substrate SUB.

Here, in each of the trenches TR formed in the semiconductor substrate SUB (epitaxial layer EP), a multi-layer film including a titanium nitride (TiN) film TL1 and a tungsten (W) film TL2 located over the titanium nitride film TL1 is embedded to form the plug TL. The plug TL is adjacent and electrically coupled to the higher-concentration n$^+$-type drain region DR2.

Each of the plugs TL is made of a conductive film embedded in each of the trenches TR of the semiconductor substrate SUB. More preferably, each of the plugs TL is formed of a metal film embedded in each of the trenches TR of the semiconductor substrate SUB. That is, each of the plugs TL is made of a conductor, and is more preferably made of a metal. By forming each of the plugs TL of a metal, the resistance of the plug TL can be reduced. This allows the drain of each of the LDMOSFETs to be coupled with a lower resistance to the substrate main body SB via the plug TL. That is, the resistance between the drain of the LDMOSFET and a back surface electrode BE can further be reduced. When each of the plugs TL is formed of a metal film, it is also possible to form a field plate electrode FP using the metal film for the plug TL and reduce the number of the steps of manufacturing the semiconductor device. Note that the metal film mentioned herein is a conductive film showing metallic conduction. Not only a pure metal film or an alloy film, but also a metal compound film showing metallic conduction can be regarded as a type of metal film. Accordingly, not only the tungsten film TL2, but also the titanium nitride film TL1 can be regarded as a metal film.

Around each of the trenches TR in which the plugs TL are embedded, an n$^+$-type semiconductor region NS1 can also be formed. FIG. 8 shows the case where, around each of the trenches TR in which the plugs TL are embedded, i.e., at a position adjacent to the side and bottom surfaces of the plug TL embedded in the trench TR, the n$^+$-type semiconductor region NS1 is formed. The n$^+$-type semiconductor region NS1 has an impurity concentration (n-type impurity concentration) higher than those of the lower-concentration n-type drain region DR1 and the n$^-$-type epitaxial layer EP. The plug TL is also adjacent to the lower-concentration n-type drain region DR1 but, when the n$^+$-type semiconductor region NS1 is formed, the plug TL is adjacent to the lower-concentration n-type drain region DR1 via the n$^+$-type semiconductor region SN1. There may also be a case where the n$^+$-type semiconductor region NS1 is formed at a position adjacent to the bottom surface of the plug TL, but is not formed at a position adjacent to the side surface of the plug TL.

In the case of FIG. 8, the tip portion (bottom portion) of each of the plugs TL has not reached the substrate main body SB. However, it may also be possible that the tip portion (bottom portion) of the plug TL has reached the substrate main body SB. When the tip portion (bottom portion) of each of the plugs TL has reached the substrate main body SB, it follows that the plug TL is electrically coupled directly to the substrate main body SB.

It may also be possible that the n$^+$-type semiconductor region NS1 is formed between the plug TL and the substrate main body SB to electrically couple the plug TL to the n$^+$-type substrate main body SB via the n$^+$-type semiconductor region NS1. The higher-concentration n$^+$-type drain region DR2 is electrically coupled to the n$^+$-type substrate main body SB via the plug TL (or via the plug TL and the n$^+$-type semiconductor region NS1).

At a position located under a part of the lower-concentration n-type drain region DR1 and adjacent to the plug TL via the n$^+$-type semiconductor region NS1, an n-type semiconductor region NS2 is formed. On the lateral sides (here, the gate length direction of each of the gate electrodes GE is assumed to be a lateral direction) of the n-type semiconductor region NS2, the p-type semiconductor region PW is located. Since the n-type semiconductor region NS2 is formed, under the part of the lower-concentration n-type drain region DR1 closer to the channel formation region, the p-type semiconductor region PW extends. On the other hand, under the part of the lower-concentration n-type drain region DR1, the n-type semiconductor region NS2, not the p-type semiconductor region PW, extends.

Over the back surface of the semiconductor substrate SUB, i.e., over the back surface (main surface opposite to the main surface formed with the epitaxial layer EP) of the substrate main body SB, the back surface electrode BE is formed. The back surface electrode BE is the drain back surface electrode of each of the LDMOSFETs and formed over the entire back surface of the semiconductor substrate SUB forming the semiconductor device CP. Note that the back surface of the semiconductor substrate SUB is identical with the back surface of the substrate main body SB and corresponds to the main surface opposite to the main surface formed with the LDMOSFETs (i.e., formed with the epitaxial layer EP).

Accordingly, the drain (lower-concentration n-type drain region DR1 and the higher-concentration n$^+$-type drain region DR2) of each of the LDMOSFETs formed in the epitaxial layer EP is electrically coupled to the back surface electrode BE via the plug TL and the substrate main body SB (or via the plug TL, the n$^+$-type semiconductor region NS1, and the substrate main body SB).

Over the main surface of the semiconductor substrate SUB, i.e., over the main surface of the epitaxial layer EP, an insulating film (interlayer insulating film) IL1 is formed so as to cover the gate electrodes GE and the sidewall spacers SW. The insulating film IL1 is made of, e.g., a silicon dioxide film or the like. The foregoing trenches TR and the plugs TL embedded in the trenches TR are formed continuously in each of the insulating film IL1 and the epitaxial layer so as to extend through the insulating film IL1.

Over the insulating film IL1, each of the field plate electrodes FP is formed. The field plate electrode FP is formed over the insulating film IL1 to continuously extend over a part of the gate electrode GE, over the sidewall spacer SW over the drain-side side wall of the gate electrode GE, and over a part of the lower-concentration n-type drain region DR1. That is, the field plate electrode FP is formed over the insulating film IL1 to cover the part (drain-side part) of the gate electrode GE, the sidewall spacer SW over the drain-side side wall of the gate electrode GE, and also the part of the lower-concentration n-type drain region DR1 located in the region uncovered with the sidewall spacer SW. Accordingly, one of the end portions of the field plate electrode FP in the gate length direction of each of the LDMOSFETs is located over the gate electrode GE, while the other end portion of the field plate electrode FP in the gate length direction of the LDMOSFET is located over the lower-concentration n-type drain region DR1 in the region uncovered with the sidewall spacer SW.

The field plate electrodes FP can also be formed using the conductive film for forming the plugs TL. For example, it is possible to form each of the plugs TL of the multi-layer film including the titanium nitride (TiN) film TL1 and the tungsten (W) film TL2 located thereover and form the field plate electrode FP of the titanium nitride (TiN) film in the same layer as that of the titanium nitride (TiN) film TL1 forming the plug TL.

In the epitaxial layer EP, at a position adjacent to each of the $n^+$-type source regions SR, a $p^+$-type semiconductor region PS is formed. The $p^+$-type region PS is formed on the opposite side of the channel formation region. That is, the $n^+$-type source region SR is adjacent to the channel formation region and, at the position on the opposite side of the channel formation region, the $p^+$-type semiconductor region PS is formed so as to be adjacent to the $n^+$-type source region SR. The $n^+$-type source region SR and the $p^+$-type semiconductor region PS are adjacent to each other. The bottom surface of each of $n^+$-type source region SR and the $p^+$-type semiconductor region PS is in contact with the p-type semiconductor region PW as a p-type well. The $p^+$-type semiconductor region PS has an impurity concentration (p-type impurity concentration) higher than that of the p-type semiconductor region PW.

Over the area of each of the $n^+$-type source regions SR uncovered with the sidewall spacers SW and over the $p^+$-type semiconductor region PS, metal silicide layers SL are formed. The metal silicide layers SL over the $n^+$-type source regions SR and the metal silicide layer SL over the $p^+$-type semiconductor region PS adjacent to the $n^+$-type source regions SR are integrally continued. Accordingly, the $n^+$-type source regions SR are electrically coupled to the $p^+$-type semiconductor region PS adjacent to the $n^+$-type source regions SR via the metal silicide layer SL formed thereover. When each of the gate electrodes GE is formed of a polysilicon film, over the polysilicon film forming the gate electrode GE also, the metal silicide layer SL can be formed. When the metal silicide layer SL is formed over the polysilicon film forming the gate electrode GE, the metal silicide layer SL over the polysilicon film forming the gate electrode GE can also be regarded as a part of the gate electrode GE.

Over the main surface of the semiconductor substrate SUB, i.e., over the insulating film IL1, an insulating film (interlayer insulating film) IL2 is formed so as to cover the field plate electrodes FP and the plugs TL. The insulating film IL2 is made of, e.g., a silicon oxide film or the like. The upper surface of the insulating film IL2 has been planarized.

The insulating film IL2 is formed with contact holes (openings, through holes, or through bores). In the contact holes, plugs (coupling embedded conductors) PGF, PGG, and PGS each mainly formed of a tungsten (W) film are embedded. The plugs PGF, PGG, and PGS embedded in the contact holes formed in the insulating film IL2 are formed respectively over the gate electrodes GE, the sources ($n^+$-type source regions SR), and the field plate electrodes EP.

Here, the plugs PGG embedded in the contact holes formed over the gate electrodes GE and electrically coupled to the gate electrodes GE are assumedly referred to as the gate plugs PGG. Also, the plugs PGS embedded in the contact holes formed over the $n^+$-type source regions SR and electrically coupled to the $n^+$-type source regions SR are assumedly referred to as the source plugs PGS. Also, the plugs PGF embedded in the contact holes formed over the field plate electrodes FP and electrically coupled to the field plate electrodes FP are assumedly referred to as the field plate plugs PGF.

The contact holes in which the gate plugs PGG are embedded are formed over the gate electrodes GE and the gate electrodes GE are exposed at the bottom portions of the contact holes. The gate plugs PGG embedded in the contact holes are in contact with the gate electrodes GE to be thus electrically coupled to the gate electrodes GE.

The contact holes in which the field plate plugs PGF are embedded are formed over the field plate electrodes FP and the field plate electrodes FP are exposed at the bottom portions of the contact holes. The field plate plugs PGF embedded in the contact holes are in contact with the field plate electrodes FP to be thus electrically coupled to the field plate electrodes FP.

The contact holes in which the source plugs PGS are embedded are formed over the $n^+$-type source regions SR and the $p^+$-type semiconductor regions PS adjacent thereto. That is, the source plugs PGS are formed continuously in each of the $n^+$-type source regions SR and the $p^+$-type semiconductor regions PS adjacent to the $n^+$-type source regions SR. At the bottom portions of the contact holes in which the source plugs PGS are embedded, both of the $n^+$-type source regions SR and the $p^+$-type semiconductor regions PS are exposed. The source plugs PGS embedded in the contact holes are in contact with both of the $n^+$-type source regions SR and the $p^+$-type semiconductor regions PS to be thus electrically coupled to both of the $n^+$-type source regions SR and the $p^+$-type semiconductor regions PS. When the metal silicide layers SL are formed over the $n^+$-type source regions SR and the $p^+$-type semiconductor regions PS, the source plugs PGS are in contact with the metal silicide layers SL over the $n^+$-type source regions SR and the $p^+$-type semiconductor regions PS to be thus electrically coupled to the $n^+$-type source regions SR and the $p^+$-type semiconductor regions PS.

As a result of the electrical coupling of the source plugs PGS not only to the $n'$-type source regions SR, but also to the $p^+$-type semiconductor regions PS, a source potential supplied to a source pad PDS is not only supplied from each of the source plugs PGS to the $n^+$-type source regions SR, but also supplied from the source plug PGS to the $p^+$-type semiconductor region PS to be thus supplied also to the p-type semiconductor region PW in contact with the $p^+$-type semiconductor region PS.

Over the insulating film IL2 in which the plugs PGF, PGG, and PGS are embedded, the interconnect lines (first-layer interconnect lines) M1 each formed of a conductive film made mainly of aluminum (Al), an aluminum alloy, or the like are formed. Accordingly, the interconnect lines M1 can be regarded as aluminum interconnect lines. Note that, when an aluminum alloy film is formed as the conductive film for the interconnect lines M1, an aluminum alloy film rich in aluminum (Al) is preferred. For example, an aluminum-rich Al—Cu alloy film can be used. Here, "rich in aluminum (Al)" means that the composition ratio of aluminum (Al) is higher than 50 atom %. The interconnect lines M1 are the interconnect lines in the first interconnect line layer.

The interconnect lines M1 are formed by, e.g., forming the conductive film over the insulating film IL2 in which the plugs PGF, PGG, and PGS are embedded and then patterning the conductive film. As each of the interconnect lines M1, an aluminum interconnect line is preferred. However, an interconnect line using another metal material, e.g., a tungsten interconnect line can also be used.

The interconnect lines M1 include the gate interconnect line M1G electrically coupled to the gate electrodes GE via the gate plugs PGG and the source interconnect lines (source electrodes) M1S electrically coupled to both of the $n^+$-type source regions SR and the $p^+$-type semiconductor regions PS via the source plugs PGS. The source interconnect lines M1S are electrically coupled to both of the $n^+$-type source regions SR and the $p^+$-type semiconductor regions PS via the source plugs PGS and are also electrically coupled to the field plate electrodes FP via the field plate plugs PGF. That is, the gate interconnect line M1G is electrically coupled to the gate electrodes GE via the gate plugs PGG, while the source interconnect lines M1S are electrically coupled to both of the $n^+$-type source regions SR and the $p^+$-type semiconductor regions PS via the source plugs PGS and also to the field plate electrodes FP via the field plate plugs PGF. The gate interconnect line M1G and the source interconnect lines M1S are in the same layer, but are spaced apart from each other. As the interconnect line M1, no drain interconnect line is formed which is electrically coupled to the drains (which are the drain regions including the lower-concentration n-type drain regions DR1 and the higher-concentration $n^+$-type drain regions DR2 herein).

Over the insulating film IL2, an insulating film (interlayer insulating film) IL3 is formed so as to cover the interconnect lines M1. The insulating film IL3 is made of, e.g., a silicon dioxide film or the like. The upper surface of the insulating film IL3 has been planarized. The insulating film IL3 is formed with through holes (openings or through bores) THG and THS and, at the bottom portions thereof, the interconnect lines M1 are partly exposed. Over the insulating film IL3 including the through holes THG and THS, the interconnect lines (second-layer interconnect lines) M2 each formed of a conductive film made mainly of aluminum (Al), an aluminum alloy, or the like are formed. Accordingly, the interconnect lines M2 can be regarded as aluminum interconnect lines. The through holes THG and THS are located at positions at which the interconnect lines M2 overlap the interconnect lines M1 in plan view and provided so as to electrically couple the interconnect lines M2 to the interconnect lines M1. The interconnect lines M2 are in the second interconnect line layer located over the first interconnect line layer. It follows therefore that, over the semiconductor substrate SUB, an interconnect line structure is formed which has the first interconnect line layer (interconnect lines M1) and the second interconnect line layer (interconnect lines M2) located over the first interconnect line layer (interconnect lines M1).

The interconnect lines M2 are formed by, e.g., forming the conductive film over the insulating film IL3 including the through holes THG and THS and then patterning the conductive film. Each of the interconnect lines M2 has a thickness T2 larger (thicker) than a thickness T1 of each of the interconnect lines M1. In other words, the thickness T1 of the interconnect line M1 is smaller (thinner) than the thickness T2 of the interconnect line M2. When a comparison is made between the thickness T2 of the interconnect line M2 and the thickness T1 of the interconnect line M1, T2>T1 is satisfied. Note that, when an aluminum alloy film is used as the conductive film for the interconnect lines M2, an aluminum alloy film rich in aluminum (Al) is preferred. For example, an aluminum-rich Al—Si alloy film can be used. Here, "rich in aluminum (Al)" means that the composition ratio of aluminum (Al) is higher than 50 atom %.

The through hole THG is located at a position overlapping the gate interconnect line M1G in plan view and assumedly referred to as the gate through hole THG. On the other hand, the through holes THS are located at positions overlapping the source interconnect lines M1S in plan view and assumedly referred to as the source through holes THS.

The interconnect lines M2 include the gate interconnect line M2G electrically coupled to the gate interconnect line M1G via a via portion (portion embedded in the gate through hole THG) and the source interconnect line M2S electrically coupled to the source interconnect lines M1S via via portions (portions embedded in the source through holes THS). That is, the source interconnect line M2S has the portions (via portions) embedded in the source through holes THS and is electrically coupled to the source interconnect lines M1S via the via portions (portions embedded in the source through holes THS). On the other hand, the gate interconnect line M2G has the portion (via portion) embedded in the gate through hole THG and is electrically coupled to the gate interconnect line M1G via the via portion (portion embedded in the gate through hole THG). The gate interconnect line M2G and the source interconnect line M2S are in the same layer, but are spaced apart from each other. As the interconnect lines M2, no drain interconnect line is formed which is electrically coupled to the drains (which are the drain regions including the lower-concentration n-type drain regions DR1 and the higher-concentration nt-type drain regions DR2 herein).

The interconnect lines M2 extend over the insulating film IL3 and have the portions thereof embedded in the through holes (THG and THS) of the insulating film IL3 to be in contact with and electrically coupled to the interconnect lines M1 at the bottom portions of the through holes. Thus, the interconnect lines M2 are integrally formed of the interconnect line portions extending over the insulating film IL3 and the via portions (coupling portions) embedded in the through holes of the insulating film IL3.

In another embodiment, the interconnect lines M2 can also be formed by embedding the same conductive plugs as the foregoing plugs PGF, PGG, and PGS in the through holes (THG and THS) of the insulating film IL3, forming the conductive film for forming the interconnect lines M2 over the insulating film IL3 in which the plugs are embedded, and patterning the conductive film. In this case, the gate interconnect line M2G is electrically coupled to the gate interconnect line M1G via the conductive plug embedded in the gate through hole THG and the source interconnect line M2S is electrically coupled to the source interconnect lines M1S via the conductive plugs embedded in the source through holes THS.

Over the insulating film IL3, an insulating film (surface protective film) PA is formed so as to cover the interconnect lines M2. The insulating film PA is formed of a multi-layer film including, e.g., a silicon oxide film and a silicon nitride film located thereover or the like and capable of functioning as a protective film (passivation film) forming the outermost surface of the semiconductor device CP. The insulating film PA is formed with pad openings OP. The pad openings OP extend through the insulating film PA and the interconnect lines M2 are exposed at the bottom portions of the openings OP. The openings OP include a source opening OPS exposing the source interconnect line M2S and a gate opening OPG exposing the gate interconnect line M2G.

At the bottom portion of the source opening OPS, the source interconnect line M2S is partly exposed. The source interconnect line M2S exposed from the source opening OPS forms the source pad (pad electrode or bonding pad) PDS. At the bottom portion of the gate opening OPG, the gate interconnect line M2G is partly exposed. The gate interconnect line M2G exposed from the gate opening OPG forms a gate pad (pad electrode or bonding pad) PDG. On the top surface side of the semiconductor device CP, the source pad PDS and the gate pad PDG are formed, but no drain pad is formed. On the back surface side of the semiconductor device CP, i.e., on the back surface of the semiconductor substrate SUB, the drain back surface electrode BE is formed. In short, the respective electrodes for leading out the source and gate of each of the LDMOSFETs formed in the semiconductor substrate SUB are formed as the source pad PDS and the gate pad PDG on the top surface side of the semiconductor device CP, while the electrode for leading out the drain of each of the LDMOSFETs formed in the semiconductor substrate SUB is formed as the drain back surface electrode BE on the back surface side of the semiconductor device CP.

Note that the gate interconnect line M2G integrally includes the interconnect line portion M2G1 extending around the LDMOSFET formation region LR along the outer periphery of the LDMOSFET formation region LR and a pad portion M2G2. The pad portion M2G2 of the gate interconnect line M2G is exposed from the gate opening OPG. The pad portion M2G2 of the gate interconnect line M2G exposed from the gate opening OPG forms the gate pad PDG. The interconnect line portion M2G1 of the gate interconnect line M2G is covered with the insulating film PA and is not exposed.

The sources ($n^+$-type source regions SR) of the LDMOSFETs formed in the epitaxial layer EP of the semiconductor substrate SUB are electrically coupled to the source interconnect line M2S via the source plugs PGS and the source interconnect lines M1S to be thus electrically coupled to the source pad PDS. The field plate electrodes FP are electrically coupled to the source interconnect line M2S via the field plate plugs PGF and the source interconnect lines M1S to be thus electrically coupled to the source pad PDS. Accordingly, the sources ($n^+$-type source regions SR) of the LDMOSFETs formed in the epitaxial layer EP of the semiconductor substrate SUB and the field plate electrodes FP are electrically coupled to the source interconnect line M2S via the plugs PGS and PGF and the source interconnect lines M1S to be thus electrically coupled to the source pad PDS. On the other hand, the gate electrodes GE of the LDMOSFETs formed over the epitaxial layer EP of the semiconductor substrate SUB are electrically coupled to the gate interconnect line M2G via the gate plugs PGG and the gate interconnect line M1G to be thus electrically coupled to the gate pad PDG. The drains (lower-concentration n-type drain regions DR1 and the higher-concentration $n^+$-type drain regions DR2) of the LDMOSFETs formed in the epitaxial layer EP of the semiconductor substrate SUB are electrically coupled to the back surface electrode BE via the plugs TL and the substrate main body SB (or via the plugs TL, the $n^+$-type semiconductor regions NS1, and the substrate main body SB).

<About Layout of LDMOSFETs and Interconnect Lines>

Next, a description will be given of a two-dimensional layout of the LDMOSFETs formed in the semiconductor substrate SUB and the interconnect lines M1 and M2 formed over the semiconductor substrate SUB.

In the main surface of the semiconductor substrate SUB, the LDMOSFETs are formed. The LDMOSFET formation region LR as the region (two-dimensional region) where the LDMOSFETs are formed includes active regions AR and isolation regions ST between the active regions AR (see FIGS. 4 and 5). Note that FIGS. 5 to 7 are enlarged views of the region RG1 enclosed in the two-dot-dash line in FIG. 1 described above. The structure shown in each of FIGS. 5 to 7 is repeated in the X-direction and the Y-direction to form the entire LDMOSFET formation region LR.

The active regions AR correspond to two-dimensional regions substantially functioning as the LDMOSFETs. Specifically, the active regions AR are the two-dimensional regions where the sources ($n^+$-type source regions SR) and the drain regions (lower-concentration n-type drain regions DR1 and higher-concentration $n^+$-type drain regions DR2) for the LDMOSFETs are formed in the epitaxial layer EP by ion implantation and the gate electrodes GE are formed over the channel formation regions between the sources and the drains via the gate insulating films GI.

On the other hand, the isolation regions ST correspond to two-dimensional regions which do not substantially function as the LDMOSFETs. For example, in the epitaxial layer EP in the isolation regions ST, the sources ($n^+$-type source regions SR) and the drain regions (lower-concentration n-type drain regions DR1 and higher-concentration $n^+$-type drain regions DR2) for the LDMOSFETs are not formed so that the isolation regions LDMOSFET do not function as the LDMOSFETs.

Note that, in the isolation regions ST also, the gate electrodes GE are formed over the epitaxial layer EP (via the gate insulating films GI). However, the gate electrodes GE in the isolation regions ST do not substantially function as the gate electrodes of the LDMOSFETs, while the gate electrodes GE in the active regions AR substantially function as the gate electrodes of the LDMOSFETs.

In the LDMOSFET formation region LR, the area occupied by the isolation regions ST between the active regions AR is relatively small so that the LDMOSFET formation region LR is formed mainly of the active regions AR. The two-dimensional shape of the LDMOSFET formation region LR can be, e.g., a generally rectangular shape (more specifically a rectangular shape having parallel sides in the X-direction and parallel sides in the Y-direction) or a two-dimensional shape based on a rectangle and slightly deformed. The LDMOSFET formation region LR is partitioned into the plurality of active regions AR by the isolation regions ST extending in the X-direction in the LDMOSFET formation region LR. In other words, substantially the entire LDMOSFET formation region LR corresponds to the active regions AR and is partitioned into the plurality of active regions AR by the isolation regions ST extending in the X-direction.

In the active regions AR, in the epitaxial layer EP, the sources ($n^+$-type source regions SR) and the drains (lower-concentration n-type drain regions DR1 and higher-concentration $n^+$-type drain regions DR2) of the LDMOSFETs are formed and, over the channel formation regions between the sources and the drains, the gate electrodes GE are formed via the gate insulating films GI (see FIGS. 5 and 8).

As shown in FIGS. 5 and 8, each of the gate electrodes GE of the LDMOSFETs extends in the Y-direction. Each of the drains (lower-concentration n-type drain regions DR1 and higher-concentration $n^+$-type drain regions DR2) of the LDMOSFETs is formed in the area of the active region AR which is located between the adjacent gate electrodes GE to extend in the Y-direction. Each of the sources ($n^+$-type source regions SR) of the LDMOSFETs is formed in another area of the active region AR which is located between the adjacent gate electrodes GE to extend in the Y-direction. Each of the plugs TL is formed in the region between the higher-concentration $n^+$-type drain regions DR of the adjacent LDMOSFETs.

In the LDMOSFET formation region LR, the structure (layout) of a unit cell (repetition unit, repetition pitch, basic cell, unit region, or unit cell of the LDMOSFET) 10 as shown in each of FIGS. 5 to 8 is repeated in the X-direction. One unit cell 10 forms two unit LDMOSFETs (unit LDMOSFET elements, LDMOSFET cells, or unit MISFET elements) 10a. That is, the unit of repetition is the unit cell 10 and each unit cell 10 includes the two unit LDMOSFETs 10a having structures which share the plug TL and are symmetrical in the X-direction. Note that, since the LDMOSFETs are MISFET elements, the unit LDMOSFETs 10a can also be regarded as unit MISFET elements.

In the LDMOSFET formation region LR, by repeating the structure (layout) of the unit cell 10 in the X-direction, the large number of (plurality of) unit LDMOSFETs 10a are formed (arranged) and coupled in parallel to each other. That is, in the LDMOSFET formation region LR, the unit LDMOSFETs 10a are repeatedly arranged in the X-direction and the plurality of unit LDMOSFETs 10a arranged in the LDMOSFET formation region LR are coupled in parallel to each other.

To couple in parallel the plurality of unit LDMOSFETs 10a formed in the LDMOSFET formation region LR to each other, the respective gate electrodes GE of the plurality of unit LDMOSFETs 10a in the LDMOSFET formation region LR are electrically coupled to each other via the gate plugs PGG and the gate interconnect line M1G and are also electrically coupled to the gate interconnect line M2G via the gate interconnect line M1G. Also, the respective sources ($n^+$-type source regions SR) of the plurality of unit LDMOSFETs 10a formed in the LDMOSFET formation region LR are electrically coupled to each other via the source plugs PGS and the source interconnect lines M1S and M2S. Also, the respective drains (lower-concentration n-type drain regions DR1 and higher-concentration $n^+$-type drain regions DR2) of the plurality of unit LDMOSFETs 10a formed in the LDMOSFET formation region LR are electrically coupled to each other via the plugs TL, the substrate main body SB, and the back surface electrode BE (or via the plugs TL, the $n^+$-type semiconductor regions NS1, the substrate main body SB, and the back surface electrode BE).

The plurality of unit LDMOSFETs 10A formed in the LDMOSFET formation region LR (active regions AR) are coupled in parallel to each other to form one MISFET (power MISFET). The MISFET (power MISFET) can be used as, e.g., a switching MISFET or an amplifying (power amplifying) MISFET. For example, the MISFET is applicable to either one or each of a power MISFET for a HIGH-side switch and a power MISFET for a LOW-side switch in a non-insulated DC-DC converter.

As shown in FIGS. 5, 6, and 8, over the sources ($n^+$-type source regions SR) of the LDMOSFETs formed in the active regions AR, the source interconnect lines M1S are formed. The source interconnect lines M1S are electrically coupled to the sources ($n^+$-type source regions SR) of the LDMOSFETs located thereunder via the source plugs PGS placed over the $n^+$-type source regions SR.

Between the two gate electrodes GE adjacent to each other in the X-direction with the source being interposed therebetween, the $n^+$-type source region SR, the $p^+$-type semiconductor region PS, and the $n^+$-type source region SR are arranged in this order in the X-direction, while each extending in the Y-direction. That is, between the two gate electrodes GE adjacent to each other in the X-direction with the source being interposed therebetween, a structure is placed in which the $p^+$-type semiconductor region PS extending in the Y-direction is interposed between the pair of $n^+$-type source regions SR each extending in the Y-direction. Each of the source plugs PGS is placed between the two gate electrodes adjacent to each other in the X-direction with the source being interposed therebetween to be in contact with and electrically coupled to the $p^+$-type semiconductor region PS and the pair of $n^+$-type source regions SR between which the $p^+$-type semiconductor region PS is interposed.

Each of the source interconnect lines M1S is continuously formed to extend from over one of the two gate electrodes GE adjacent to each other in the X-direction with the source being interposed therebetween to over the other gate electrode GE. Consequently, over the region between the two gate electrodes GE adjacent to each other in the X-direction with the source being interposed therebetween, the source interconnect line M1S extends. The source interconnect line M1S is electrically coupled to the $p^+$-type semiconductor region PS located between the two gate electrodes GE adjacent to each other in the X-direction with the source being interposed therebetween and to the pair of $n^+$-type source regions SR between which the $p^+$-type semiconductor region PS is interposed via the source plug PGS.

The field plate electrodes FP are electrically coupled to the source interconnect lines M1S via the field plate plugs PGF. Therefore, the source interconnect lines M1S need to be formed not only over the sources ($n^+$-type source regions SR) and the $p^+$-type semiconductor regions SR, but also over the field plate electrodes FP. As a result, each of the source interconnect lines M1S is continuously formed to extend from over the source ($n^+$-type source region SR) to over the field plate electrode FP in such a manner as to pass over the gate electrode GE between the source and the field plate electrode FP.

Consequently, each of the source interconnect lines M1S is continuously formed to extend from over the field plate electrode FP located on the drain side of one of the two gate electrodes GE adjacent to each other in the X-direction with the source being interposed therebetween to over the field plate electrode FP located on the drain side of the other gate electrode GE. This results in a state where the source interconnect line M1S extends continuously over the region between the two gate electrodes GE adjacent to each other in the X-direction with the source being interposed therebetween, over the two gate electrodes GE, and over the field plate electrodes FP located on the drain side of the two gate electrodes GE. The $p^+$-type semiconductor region PS and the pair of $n^+$-type source regions SR which are located between the two gate electrodes GE adjacent to each other in the X-direction with the source being interposed therebetween are electrically coupled to the source interconnect line M1S via the source plug PGS. The source interconnect line M1S is electrically coupled to the field plate electrodes FP located on the drain side of the two gate electrodes GE via the field plate plugs PGF.

In the active regions AR, each of the sources ($n^+$-type source regions SR), the $p^+$-type semiconductor regions PS, and the field plate electrodes FP extends in the Y-direction. Accordingly, the source interconnect lines M1S also extend in the Y-direction over the active regions AR, but are not formed over the plugs TL. Over the plugs TL, not the source interconnect lines M1S, but the gate interconnect line M1G is placed (see FIGS. 5, 6, and 8). Over the isolation regions ST between the active regions AR, the source interconnect lines M1S are not formed. Over the isolation regions ST between the active regions AR, not the source interconnect lines M1S, but the gate interconnect line M1G is placed (see FIGS. 5, 6, and 9).

That is, over the isolation regions ST between the active regions AR, the source interconnect lines M1S are not formed, but the gate interconnect line M1G extends there (over the isolation regions ST) in the X-direction. Also, over the plugs TL, the source interconnect lines M1S are not formed, but the gate interconnect line M1G extends there (over the plugs TL) in the Y-direction.

As a result, the source interconnect lines M1S are in discrete patterns (discrete source interconnect lines) separate from each other with the gate interconnect line M1G being interposed therebetween (see FIGS. 3 and 6). That is, the source interconnect lines M1S are in the discrete patterns (discrete source interconnect lines) and peripherally surrounded by the gate interconnect line M1G in plan view. In the LDMOSFET formation region LR, the plurality of source interconnect lines M1S in the discrete patterns (discrete source interconnect lines) are formed and the source interconnect line M2S is placed so as to cover the plurality of source interconnect lines M1S. The two-dimensional shape of each of the source interconnect lines M1S in the discrete patterns (discrete source interconnect lines) can be, e.g., a rectangular shape (rectangular shape having short sides in the X-direction and long sides in the Y-direction).

As described above, in the LDMOSFET formation region LR, the plurality of unit cells 10 (unit LDMOSFETs 10a) are formed. The respective sources ($n^+$-type source regions SR) of the plurality of unit cells 10 (unit LDMOSFETs 10a) are electrically coupled to the source interconnect lines M1S via the source plugs PGS. However, since the source interconnect lines M1S are in the discrete patterns peripherally surrounded by the gate interconnect line M1G, without the source interconnect line M2S, the respective sources ($n^+$-type source regions SR) of the plurality of unit cells 10 (unit LDMOSFETs 10a) formed in the LDMOSFET formation region LR are not electrically coupled to each other. Accordingly, the source interconnect lines M1S are electrically coupled to the source interconnect line M2S in the layer located over the source interconnect lines M1S and, using the source interconnect line M2S, the respective sources ($n^+$-type source regions SR) of the plurality of unit cells 10 (unit LDMOSFETs 10a) formed in the LDMOSFET formation region LR are electrically coupled to each other. The source interconnect line M2S forms the source pad PDS.

As shown in FIGS. 2, 4, and 7 to 10, the source interconnect line M2S in the uppermost layer is formed so as to cover substantially the entire LDMOSFET formation region LR. Accordingly, each of the source interconnect lines M1S overlaps the source interconnect line M2S in plan view. Over the individual active regions AR of the LDMOSFET formation region LR, the source interconnect lines M1S in the discrete patterns are formed. As shown in FIGS. 7 and 8, the source interconnect lines M1S are electrically coupled to the source interconnect line M2S in the uppermost layer formed over the source interconnect lines M1S to cover substantially the entire LDMOSFET formation region LR via the via portions (portions embedded in the source through holes THS) of the source interconnect line M2S. As a result, the individual source interconnect lines M1S formed in the LDMOSFET formation region LR are electrically coupled to each other via the source interconnect line M2S. The source interconnect line M2S is partly exposed from the source opening OPS of the insulating film PA. The source interconnect line M2S partly exposed from the source opening OPS serves as the source pad PDS.

Thus, in the LDMOSFET formation region LR, the plurality of unit cells 10 (unit LDMOSFETs 10a) are formed. The respective sources ($n^+$-type source regions SR) of the plurality of unit cells 10 (unit LDMOSFETs 10a) are led up to the source interconnect line M2S via the source plugs PGS and the source interconnect lines M1S and electrically coupled to each other by the source interconnect line M2S. The source interconnect line M2S is exposed from the source opening OPS of the insulating film PA to form the source pad PDS. This allows a common source potential (source voltage) to be supplied from the source pad PDS to each of the sources ($n^+$-type source regions SR) of the plurality of unit cells 10 (unit LDMOSFETs 10a) formed in the LDMOSFET formation region LR through the source interconnect line M2S, the source interconnect lines M1S, and the source plugs PGS.

As interconnect lines for the drains (lower-concentration n-type drain regions DR1 and higher-concentration $n^+$-type drain regions DR2) of the LDMOSFETs formed in the active regions AR, no interconnect line is formed either as the interconnect line. M1 or as the interconnect line M2. That is, as interconnect lines to be coupled to the drains (lower-concentration n-type drain regions DR1 and higher-concentration $n^+$-type drain regions DR2) of the LDMOSFETs formed in the active regions AR, no interconnect line is formed either as the interconnect line M1 or as the interconnect line M2.

Figure 9:
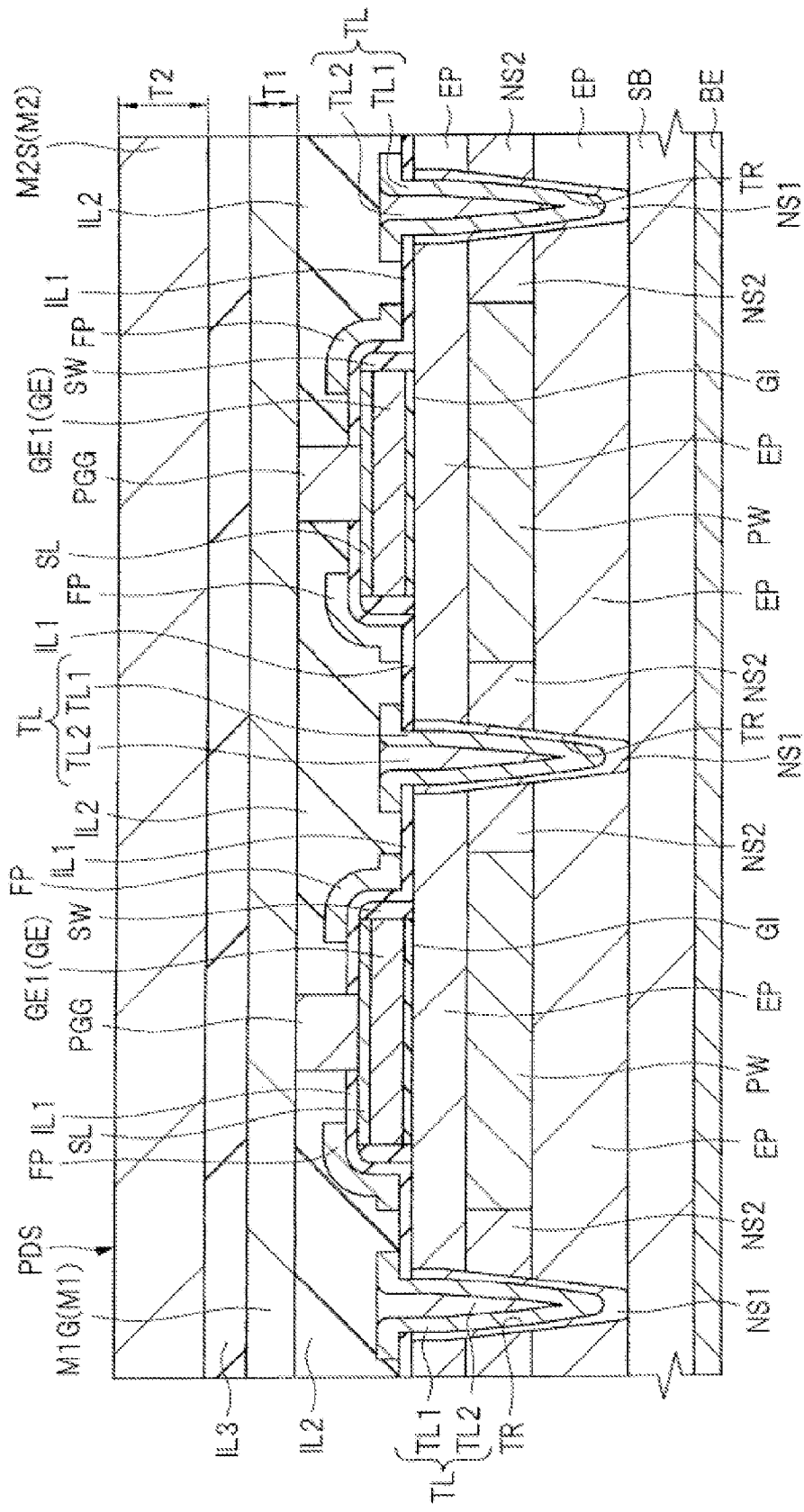
FIG. 9 is a main-portion cross-sectional view of the semiconductor device in the embodiment.
Figure 10:
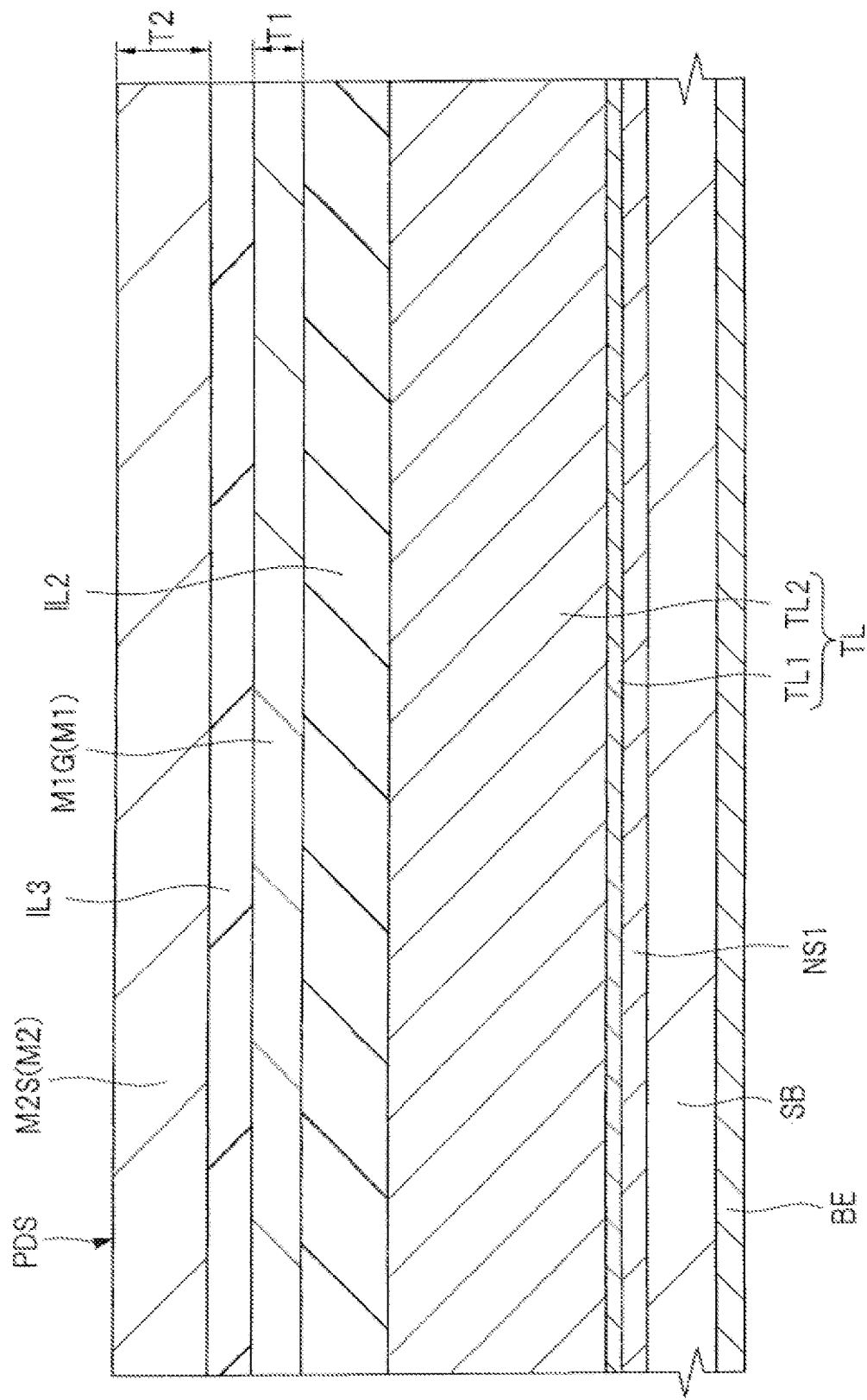
FIG. 10 is a main-portion cross-sectional view of the semiconductor device in the embodiment.

As shown in FIGS. 5, 6, and 9, the gate electrodes GE extend in the Y-direction and are electrically coupled to the gate interconnect line M1G via the gate plugs PGG at the portions thereof located in the isolation regions ST between the active regions AR. In the case of FIG. 5, the two gate electrodes GE adjacent to each other in the X-direction with the source being interposed therebetween are connected by a connecting portion GE1 extending in the X-direction in the isolation region ST between the active regions AR. Over the connecting portion GE1, the gate plug PGG is located. The connecting portion GE1 extends in the Y-direction to connect the two gate electrodes GE adjacent to each other in the X-direction with the source being interposed therebetween and is formed integrally with the two gate electrodes GE. Accordingly, the gate electrodes GE and the connecting portions GE1 are each formed of the same conductive film in the same step. Each of the connecting portions GE1 can also be regarded as a part of each of the gate electrodes GE. Note that, as described above, the portions of the gate electrodes GE located in the active regions AR can function as the gate electrodes GE of the LDMOSFETs, but the portions (including the connecting portions GE1) of the gate electrodes GE located in the isolation regions ST between the active regions AR do not function as the gate electrodes of the LDMOSFETs.

The gate interconnect line M1G extends around the LDMOSFET formation region LR along the outer periphery of the LDMOSFET formation region LR, extends over the isolation regions ST between the active regions AR in the LDMOSFET formation region LR, and extends over the plugs TL in the LDMOSFET formation region LR (see FIGS. 3 and 6). That is, the gate interconnect line M1G integrally includes a portion extending around the LDMOSFET formation region LR along the outer periphery of the LDMOSFET formation region LR, portions extending over the isolation regions ST between the active regions AR in the LDMOSFET formation region LR, and portions extending over the plugs TL in the LDMOSFET formation region LR.

In the LDMOSFET formation region LR, the isolation regions S between the active regions AR extend in the X-direction so that the gate interconnect line M1G extends in the X-direction over the isolation regions ST. That is, the gate interconnect line M1G extends in the X-direction so as to overlap the isolation regions ST between the active regions AR in plan view. On the other hand, in the LDMOSFET formation region LR, the plugs TL extend in the Y-direction so that the gate interconnect line M1G extends in the Y-direction over the plugs TL. That is, the gate interconnect line M1G extends in the Y-direction so as to overlap the plugs TL extending in the Y-direction in plan view. In the LDMOSFET formation region LR, the plugs TL extend in the Y-direction between the gate electrodes GE adjacent to each other in the X-direction with the drains being interposed therebetween. Consequently, in plan view, the gate interconnect line M1G extends in the Y-direction between the gate electrodes GE (specifically over the plugs TL) adjacent to each other in the X-direction with the drains being interposed therebetween. The gate interconnect line M1G is integrally formed of the portions each extending in the X-direction over the isolation regions ST between the active regions AR, the portions each extending in the Y-direction over the plugs TL, and the portion extending along the outer periphery of the LDMOSFET formation region LR.

In the LDMOSFET formation region LR, the individual gate electrodes GE extending in the Y-direction are electrically coupled to the portions of the gate interconnect line M1G each extending in the X-direction via the gate plugs PGG. That is, in the LDMOSFET formation region LR, at the portions (which are the connecting portions GE1 herein) where the portions of the gate interconnect line M1G each extending in the X-direction two-dimensionally overlap the gate electrodes GE extending in the Y-direction, the gate plugs PGG are placed and, through the gate plugs PGG, the gate electrodes GE are electrically coupled to the portions of the gate interconnect line M1G each extending in the X-direction. The portions of the gate interconnect line M1G each extending in the X-direction and the portions of the gate interconnect line M1G each extending in the Y-direction are integrally connected. As a result, the plurality of gate electrodes GE formed in the LDMOSFET formation region LR are electrically coupled to each other via the gate interconnect line M1G.

Thus, in the present embodiment, over the LDMOSFET formation region LR, the gate interconnect line M1G integrally includes the portions each extending in the Y-direction and the portions each extending in the X-direction. The portions of the gate interconnect line M1G each extending in the Y-direction extend in the Y-direction over the plugs TL. The portions of the gate interconnect line M1G each extending in the X-direction are electrically coupled to the gate electrodes GE via the gate plugs PGG. What has been described above can also be expressed otherwise as follows. That is, over the LDMOSFET formation region LR, the gate interconnect line M1G has a two-dimensional structure in which the plurality of interconnect line portions each extending in the Y-direction and the plurality of interconnect line portions each extending in the X-direction are integrally connected. The interconnect line portions each extending in the Y-direction extend over the plugs TL in the Y-direction, while the interconnect line portions each extending in the X-direction are electrically coupled to the gate electrodes GE via the gate plugs PGG. As a result, the plurality of gate electrodes GE formed in the LDMOSFET formation region LR are electrically coupled to each other via the gate interconnect line M1G. That is, the respective gate electrodes GE of the plurality of unit LDMOSFETs 10a formed in the LDMOSFET formation region LR are electrically coupled to each other via the gate interconnect line M1G. It is preferable that, over the LDMOSFET formation region LR, the gate interconnect line M1G has the two-dimensional structure in which the plurality of interconnect line portions each extending in the Y-direction and arranged at predetermined intervals (more preferably, at equal intervals) in the X-direction and the plurality of interconnect line portions each extending in the X-direction and arranged at predetermined intervals (more preferably, at equal intervals) in the Y-direction are integrally connected.

It follows therefore that, in plan view, in the LDMOSFET formation region LR, the gate interconnect line M1G is formed in a generally grid-like shape. However, each of the quadrilateral components forming the grid-like shape of the gate interconnect line M1G need not be a square shape and may be a rectangular shape (e.g., rectangular shape having a dimension in the Y-direction which is larger than a dimension in the X-direction).

The source interconnect lines M1S are peripherally surrounded by the gate interconnect line M1G in plan view. That is, as described above, the source interconnect lines M1S are in the discrete patterns. In plan view, the state is established in which the source interconnect lines M1S are peripherally surrounded by the portions of the gate interconnect line M1G each extending in the X-direction and the portions of the gate interconnect line M1G each extending in the Y-direction. That is, the state is established in which, in the individual quadrilateral grid components of the gate interconnect line M1G having the generally grid-like shape, the source interconnect lines M1S in the discrete patterns are placed.

The gate interconnect line M1G can be placed over the plugs TL because the source interconnect lines M1S are not formed over the plugs TL and, as interconnect lines for drains to be coupled to the plugs TL, no interconnect line is formed as the interconnect line M1.

That is, in the present embodiment, the drains (lower-concentration n-type drain regions DR1 and higher-concentration $n^+$-type drain regions DR2) of the LDMOSFETs formed in the active regions AR are electrically coupled to the substrate main body SB and the back surface electrode BE via the plugs TL and, as interconnect lines for the drains of the LDMOSFETs, no interconnect line is formed either as the interconnect line M1 or as the interconnect line M2. In the two-dimensional layout of the source interconnect lines M1S, the source interconnect lines M1S are arranged not in the entire active regions AR, and the source interconnect lines M1S are not placed over the plugs TL. As a result, the spaces over the plugs TL are neither used as the regions where the source interconnect lines M1S are placed nor used as the regions where interconnect lines for the drains are placed. This allows the gate interconnect line M1G to be placed over the plugs TL.

As described above, in the LDMOSFET formation region LR, the plurality of unit cells 10 (unit LDMOSFETs 10a) are formed. The respective gate electrodes GE of the plurality of unit cells 10 (unit LDMOSFETs 10a) are electrically coupled to the gate interconnect line M1G via the gate plugs PGG and are also electrically coupled to each other via the gate interconnect line M1G. In other words, even when the gate interconnect line M2G is not provided, the respective gate electrodes GE of the plurality of unit cells 10 (unit LDMOSFETs 10a) formed in the LDMOSFET formation region LR can be electrically coupled to each other via the gate plugs PGG and the gate interconnect line M1G. However, since the gate electrodes GE need to be led up to the gate pad PDG, the gate interconnect line M1G is electrically coupled to the gate interconnect line M2G in the layer located over the gate interconnect line M1G and the gate pad PDG is formed of the gate interconnect line M2G.

Since the gate interconnect line M1G needs to be electrically coupled to the gate interconnect line M2G, it is necessary for at least a part of the gate interconnect line M1G to overlap the gate interconnect line M2G in plan view. In other words, it is necessary for at least a part of the gate interconnect line M2G to overlap the gate interconnect line M1G in plan view. In the region where the gate interconnect line M2G overlaps the gate interconnect line M1G in plan view, the gate through hole THG is placed to allow the gate interconnect line M2G to be electrically coupled to the gate interconnect line M1G via the via portion (portion embedded in the gate through hole THG) of the gate interconnect line M2G.

As shown in FIG. 2, the gate interconnect line M2G has the interconnect line portion M2G1 extending around the LDMOSFET formation region LR along the outer periphery of the LDMOSFET formation region LR, and the pad portion MG2. The interconnect line portion M2G1 and the pad portion M2G2 of the gate interconnect line M2G are integrally formed so that the interconnect line portion M2G1 is connected to the pad portion M2G2. Consequently, the interconnect line portion M2G1 is electrically coupled to the pad portion M2G2.

The source interconnect line M2S is placed so as to cover substantially the entire LDMOSFET formation region LR. The gate interconnect line M2G is formed in the same layer as that of the source interconnect line M2S, but is spaced apart from the source interconnect line M2S. As a result, the gate interconnect line M2G is not formed in the LDMOSFET formation region LR, the interconnect line portion M2G1 of the gate interconnect line M2G extends around the LDMOSFET formation region LR along the outer periphery of the LDMOSFET formation region LR, and the pad portion M2G2 of the gate interconnect line M2G is located at a position which is, e.g., adjacent to the LDMOSFET formation region LR in plan view. Under the interconnect line portion M2G1 of the gate interconnect line M2G extending along the outer periphery of the LDMOSFET formation region LR, the gate interconnect line M1G is provided to extend to allow the gate interconnect line M2G to be electrically coupled to the gate interconnect line M1G via the via portion (portion embedded in the gate through hole THG) of the gate interconnect line M2G, as shown in FIG. 11.

Specifically, the gate interconnect line M1G has the portion extending around the LDMOSFET formation region LR along the outer periphery of the LDMOSFET formation region LR. The portion of the gate interconnect line M1G extending along the outer periphery of the LDMOSFET formation region LR overlaps the interconnect line portion M2G1 of the gate interconnect line M2G extending along the outer periphery of the LDMOSFET formation region LR in plan view. In the region where the gate interconnect line M1G overlaps the interconnect line portion M2G1 of the gate interconnect line portion M2G1 in plan view, the gate through hole THG is placed. The gate interconnect line M1G is electrically coupled to the interconnect line portion M2G1 of the gate interconnect line M2G via the via portion (portion embedded in the gate through hole THG) of the gate interconnect line M2G. Consequently, the pad portion M2G2 of the gate interconnect line M2G is also electrically coupled to the gate interconnect line M1G.

The gate through hole THG also extends, together with the gate interconnect line M1G and the interconnect line portion M2G1 of the gate interconnect line M2G, along the outer periphery of the LDMOSFET formation region LR. While the gate interconnect line M1G and the interconnect line portion M2G1 of the gate interconnect line M2G continuously extend along the outer periphery of the LDMOSFET formation region LR, the gate through hole THG may either continuously extend along the outer periphery of the LDMOSFET formation region LR or discontinuously extend along the outer periphery of the LDMOSFET formation region LR.

The gate interconnect line M1G has the portions each extending over the isolation regions ST between the active regions AR in the X-direction and the portions each extending over the plugs TL in the Y-direction in the LDMOSFET formation region LR. Over these portions, the gate interconnect line M2G is not placed, but the source interconnect line M2S is placed (see FIGS. 2, 3, and 6 to 10). That is, the source interconnect line M2S is placed so as to cover substantially the entire LDMOSFET formation region LR. Under the source interconnect line M2S, the source interconnect lines M1S are placed. The portions of the gate interconnect line M1G each extending over the isolation regions ST between the active regions AR in the X-direction and the portions of the gate interconnect line M1G each extending over the plugs TL in the Y-direction are also placed under the source interconnect line M2S. However, the gate interconnect line M1G also has the portion extending around the LDMOSFET formation region LR along the outer periphery of the LDMOSFET formation region LR. This portion of the gate interconnect line M1G does not overlap the source interconnect line M2S in plan view, but overlaps the interconnect line portion M2G1 of the gate interconnect line M2G in plan view. In other words, each of the gate interconnect lines M1G and M2G has the portion extending around the LDMOSFET formation region LR along the outer periphery of the LDMOSFET formation region LR. That is, each of the gate interconnect lines M1G and M2G has the portion extending around the source interconnect line M2S along the outer periphery of the source interconnect line M2S in plan view. This allows the portion of the gate interconnect line M1G extending along the outer periphery of the LDMOSFET formation region LR (i.e., the outer periphery of the source interconnect line M2S) to be electrically coupled to the interconnect line portion M2G1 of the gate interconnect line M2G extending along the outer periphery of the LDMOSFET formation region LR (i.e., the outer periphery of the source interconnect line M2S) via the via portion of the gate interconnect line M2G (interconnect line portion M2G1). In this manner, the gate interconnect line M1G can be electrically coupled to the interconnect line M2G.

As shown in FIGS. 1 and 2, the gate interconnect line M2G also has the pad portion M2G2 intended to serve as the gate pads PDG. At least a part of the pad portion M2G2 of the gate interconnect line M2G is exposed from the gate opening OPG of the insulating film PA to serve as the gate pad PDG. The pad portion M2G2 of the gate interconnect line M2G is in a generally rectangular pattern having sides each larger than the interconnect line width of the interconnect line portion M2G1 of the gate interconnect line M2G. Here, the interconnect line width of the interconnect line portion M2G1 corresponds to the dimension of the interconnect line portion M2G1 when the interconnect line portion M2G1 is viewed in a direction generally perpendicular to the extending direction of the interconnect line portion M2G1. The pad portion M2G2 of the gate interconnect line M2G is integrally formed with the interconnect line portion M2G1 of the gate interconnect line M2G extending along the outer periphery of the LDMOSFET formation region LR.

The pad portion M2G2 of the gate interconnect line M2G and also the gate pad PDG are placed at positions not overlapping the LDMOSFET formation region LR in plan view. For example, as shown in FIG. 2, the gate pad PDG (pad portion M2G2 of the gate interconnect line M2G) can be placed at the corner portion of the main surface (upper surface) of the semiconductor device CP or at a position along the side of the main surface (upper surface) of the semiconductor device CP. On the other hand, the source pad PDS is placed at the position overlapping the LDMOSFET formation region LR in plan view. The two-dimensional size (two-dimensional area) of the pad portion M2G2 of the gate interconnect line M2G is smaller than the two-dimensional size (two-dimensional area) of the source interconnect line M2S. The two-dimensional size (two-dimensional area) of the gate pad PDG is smaller than the two-dimensional size (two-dimensional area) of the source pad PDS.

Thus, in the LDMOSFET formation region LR, the plurality of unit cells 10 (unit LDMOSFETs 10a) are formed. The respective gate electrodes GE of the plurality of unit cells 10 (unit LDMOSFETs 10a) are electrically coupled to each other using the gate plugs PGG and the gate interconnect line M1G and are also led up to the gate interconnect line M2G.

By exposing the gate interconnect line M2G (pad portion M2G2) from the gate opening OPG of the insulating film PA, the gate pad PDG is formed. This allows the common gate potential (gate voltage) to be supplied from the gate pad PDG to each of the gate electrodes GE of the plurality of unit cells 10 (unit LDMOSFETs 10a) formed in the LDMOSFET formation region LR through the gate interconnect line M2G, the gate interconnect line M1G, and the gate plugs PGG.

<About Manufacturing Process of Semiconductor Device>

Next, referring to FIGS. 12 to 28, a description will be given of an example of a manufacturing process of the semiconductor device in the present embodiment. FIGS. 12 to 28 are main-portion cross-sectional views of the semiconductor device in the present embodiment during the manufacturing process thereof and show cross-sectional views each substantially corresponding to FIG. 8 described above. Here, the description will be given of a preferred example of the manufacturing process of the semiconductor device in the present embodiment. However, the manufacturing process of the semiconductor device in the present embodiment is not limited thereto and can variously be modified.

Figure 12:
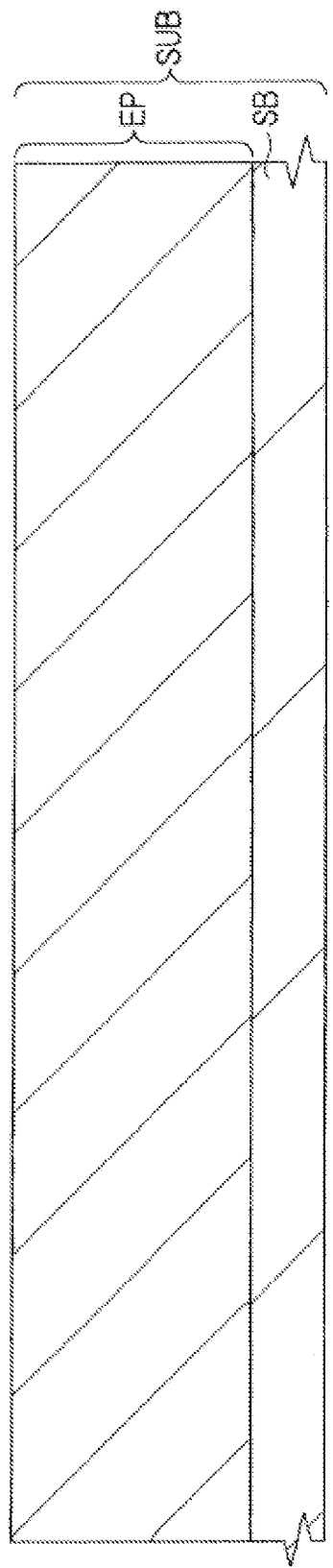
FIG. 12 is a main-portion cross-sectional view of the semiconductor device in the embodiment during a manufacturing process thereof.

To manufacture the semiconductor device, first, as shown in FIG. 12, the semiconductor substrate SUB is prepared which includes the substrate main body (semiconductor substrate or semiconductor wafer) SB made of, e.g., $n^+$-type single-crystal silicon or the like, and the epitaxial layer (semiconductor layer) EP made of $n^-$-type single-crystal silicon and formed over the main surface of the substrate main body SB. The semiconductor substrate SUB is a so-called epitaxial wafer. The substrate main body SB is a low-resistance substrate having a resistivity (specific resistance) of, e.g., about 1 to 10 Ωcm. The epitaxial layer EP is a semiconductor layer having an impurity concentration lower than the impurity concentration of the substrate main body SB and a resistivity higher than the resistivity of the substrate main body SB. The resistivity of the epitaxial layer EP can be set to, e.g., about 20 Ωcm. The thickness of the epitaxial layer EP can be set to, e.g., about 2 μm.

Figure 13:
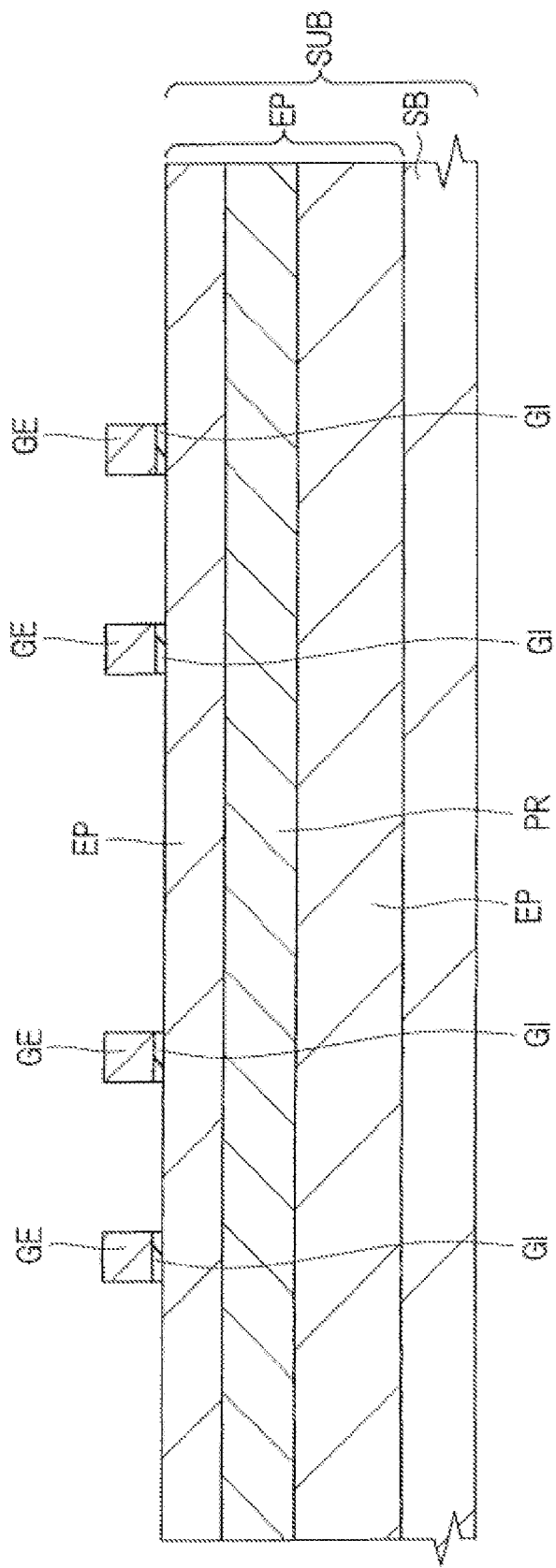
FIG. 13 is a main-portion cross-sectional view of the semiconductor device during the manufacturing process thereof, which is subsequent to FIG. 12.

Next, as shown in FIG. 13, in the epitaxial layer EP of the semiconductor substrate SUB, the p-type semiconductor layer (p-type body layer) PR is formed using an ion implantation method. The p-type semiconductor layer PR is formed at a position slightly deeper than the top surface (top surface layer portion) of the epitaxial layer EP.

Next, over the top surface of the epitaxial layer EP of the semiconductor substrate SUB, the gate electrodes GE are formed via the gate insulating films GI. For example, over the top surface of the epitaxial layer EP of the semiconductor substrate SUB, an insulating film for the gate insulating films GI is formed. Then, over the insulating film, a conductive film (e.g., polysilicon film) for the gate electrodes GE is formed and then patterned using a photolithographic technique and an etching technique. In this manner, the gate insulating films GI and the gate electrodes GE can be formed. The gate electrodes GE can also be formed of a multi-layer film including a conductive film and an insulating film located over the conductive film.

Figure 14:
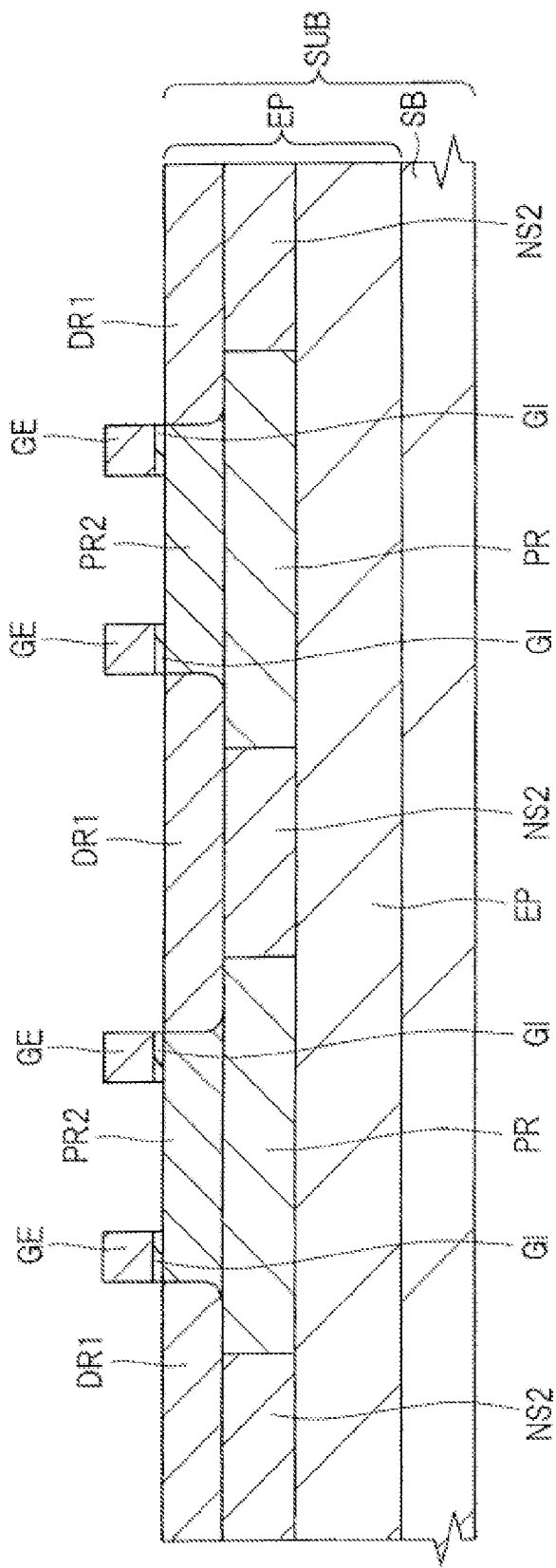
FIG. 14 is a main-portion cross-sectional view of the semiconductor device during the manufacturing process thereof, which is subsequent to FIG. 13.

Next, as shown in FIG. 14, the n-type semiconductor regions NS2 are formed using a photolithographic method and an ion implantation method. Each of the n-type semiconductor regions NS2 is formed at a position slightly deeper than the top surface (top surface layer portion) of the epitaxial layer EP to have substantially the same depth as that of each of the p-type semiconductor layers PR. At this time, an n-type impurity is implanted into the areas of the regions where the p-type semiconductor layers PR are formed in which the plugs TL are to be formed to form the n-type semiconductor regions NS2. As a result, the areas of the regions where the p-type semiconductor layers PR are formed in which the plugs TL are to be formed become the n-type semiconductor regions NS2.

Next, in the drain-side top surface layer portions of the epitaxial layer EP of the semiconductor substrate SUB, using a photolithographic method and an ion implantation method, the lower-concentration n-type drain regions DR1 are formed. In addition, in the areas (source-side areas and areas immediately under the gate electrodes GE) of the top surface layer portion of the epitaxial layer EP of the semiconductor substrate SUB in which the lower-concentration n-type drain regions DR1 are not to be formed, using a photolithographic method and an ion implantation method, p-type semiconductor regions PR2 are formed.

Figure 15:
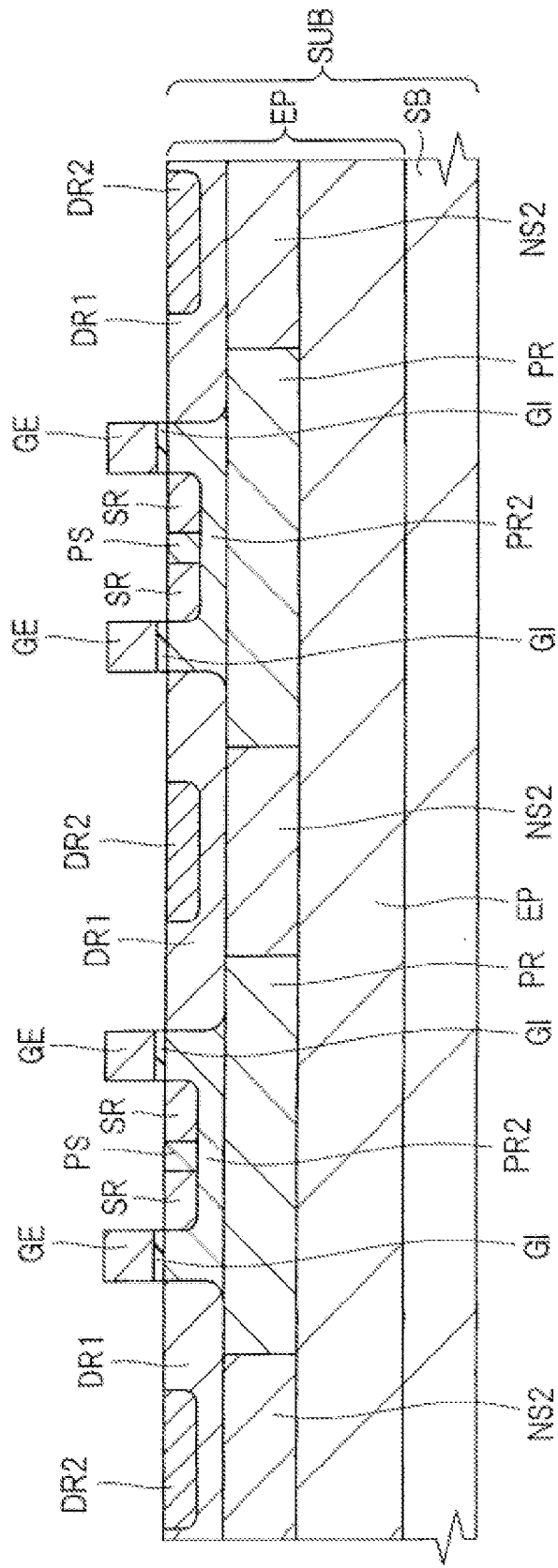
FIG. 15 is a main-portion cross-sectional view of the semiconductor device during the manufacturing process thereof, which is subsequent to FIG. 14.

Next, as shown in FIG. 15, in the source-side top surface layer portion of the epitaxial layer EP of the semiconductor substrate SUB, the $n^+$-type source regions SR are formed using a photolithographic method and an ion implantation method. Also, in the source-side top surface layer portion of the epitaxial layer EP of the semiconductor substrate SUB, the $p^+$-type semiconductor regions PS are formed using a photolithographic method and an ion implantation method. On the other hand, in the drain-side top surface layer portion of the epitaxial layer EP of the semiconductor substrate SUB, using a photolithographic method and an ion implantation method, the higher-concentration $n^+$-type drain regions DR2 are formed.

Figure 16:
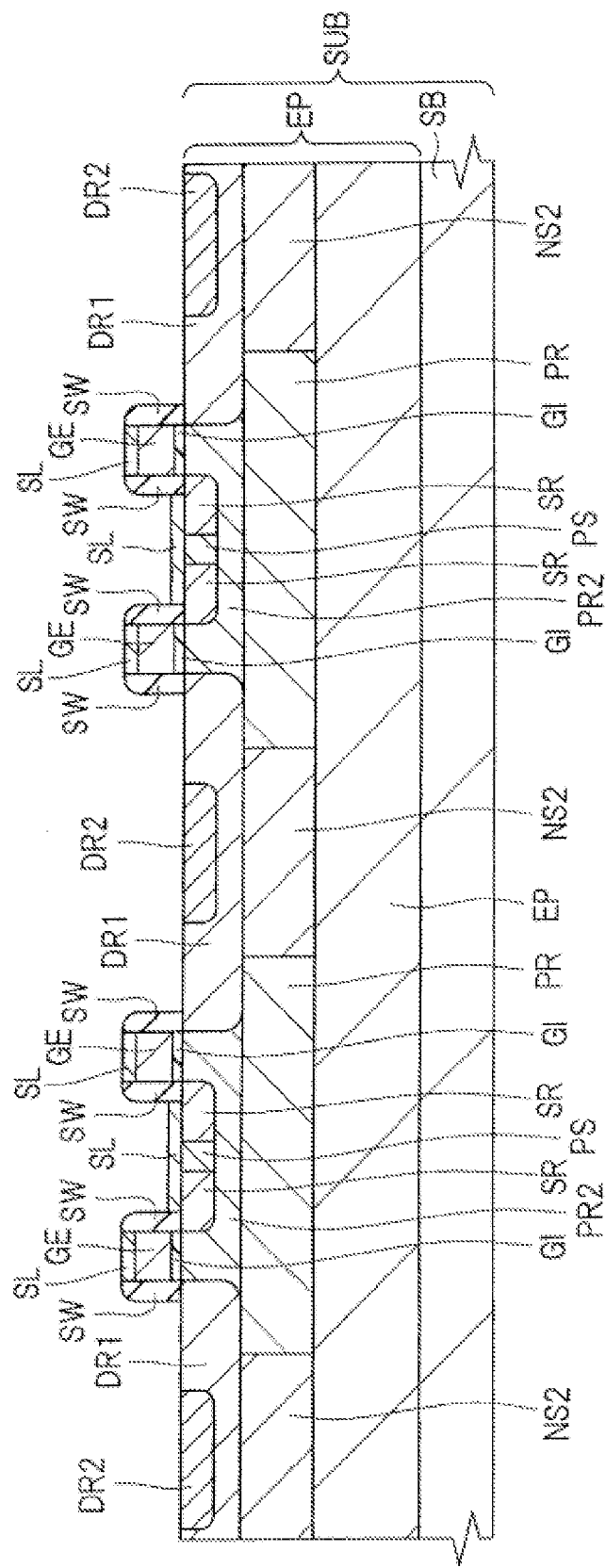
FIG. 16 is a main-portion cross-sectional view of the semiconductor device during the manufacturing process thereof, which is subsequent to FIG. 15.

Next, as shown in FIG. 16, over the side walls of the gate electrodes GE, the sidewall spacers (side-wall insulating films) SW are formed. For example, over the main surface of the semiconductor substrate SUB, i.e., over the epitaxial layer EP, an insulating film for forming the sidewall spacers SW is formed so as to cover the gate electrodes GE and then etched back using an anisotropic etching technique to be selectively left over the side walls of the gate electrodes GE. In this manner, the sidewall spacers SW can be formed.

Next, using a Salicide (Self Aligned Silicide) technique, the metal silicide layers SL are formed. The metal silicide layers SL can be formed over the $n^+$-type source regions SR and the $p^+$-type semiconductor regions PS in the region uncovered with the sidewall spacers SW. It is also possible to form each of the gate electrodes GE of a polysilicon film and form the metal silicide layers SL over the gate electrodes GE each formed of the polysilicon film. When the metal silicide layers SL are formed over the gate electrodes GE, the metal silicide layers SL can also be regarded as parts of the gate electrodes GE.

Figure 17:
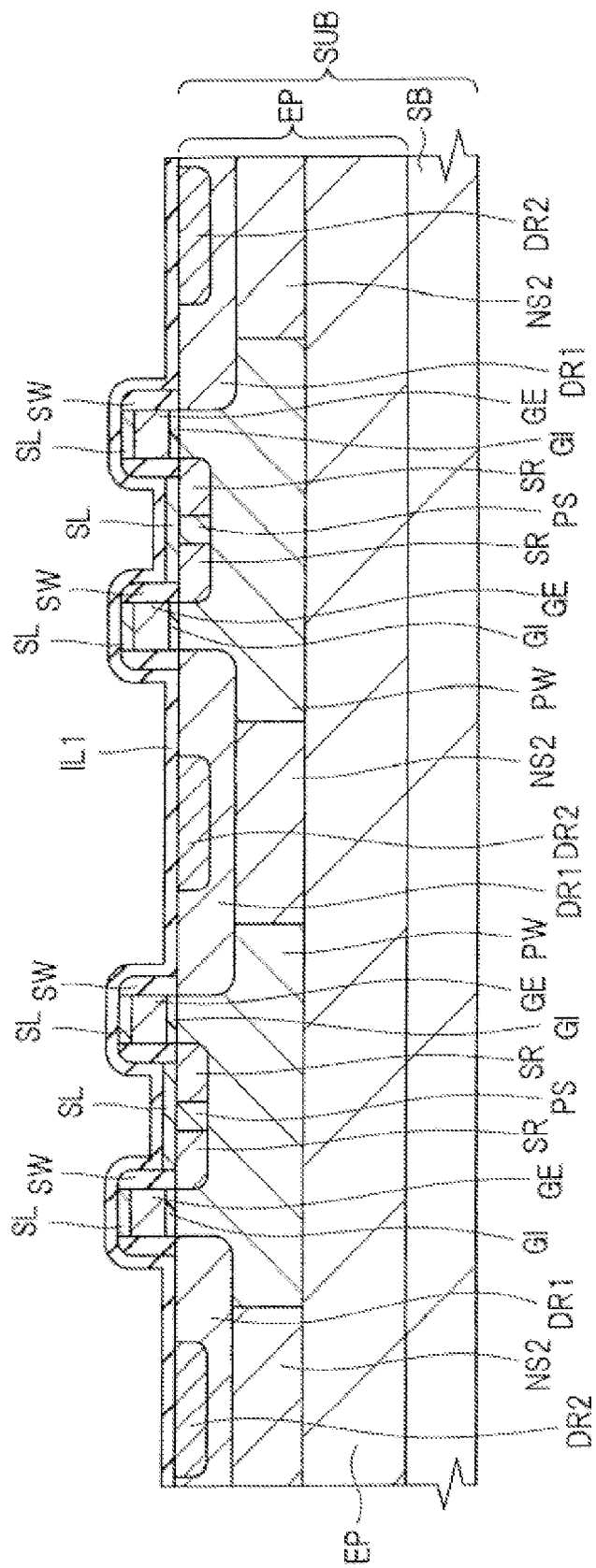
FIG. 17 is a main-portion cross-sectional view of the semiconductor device during the manufacturing process thereof, which is subsequent to FIG. 16.

Next, as shown in FIG. 17, over the main surface of the semiconductor substrate SUB, i.e., over the epitaxial layer EP, the insulating film IL1 is formed so as to cover the gate electrodes GE, the sidewall spacers SW, and the metal silicide layers SL. The insulating film IL1 is made of, e.g., a silicon dioxide film and can be formed using a plasma CVD method or the like.

Note that in FIG. 17 and the drawings subsequent thereto, a combination of the P-type semiconductor layer PR and the p-type semiconductor region PR2 is shown as each of the p-type semiconductor regions PW. The p-type semiconductor region PW can function as a p-type well region.

Figure 18:
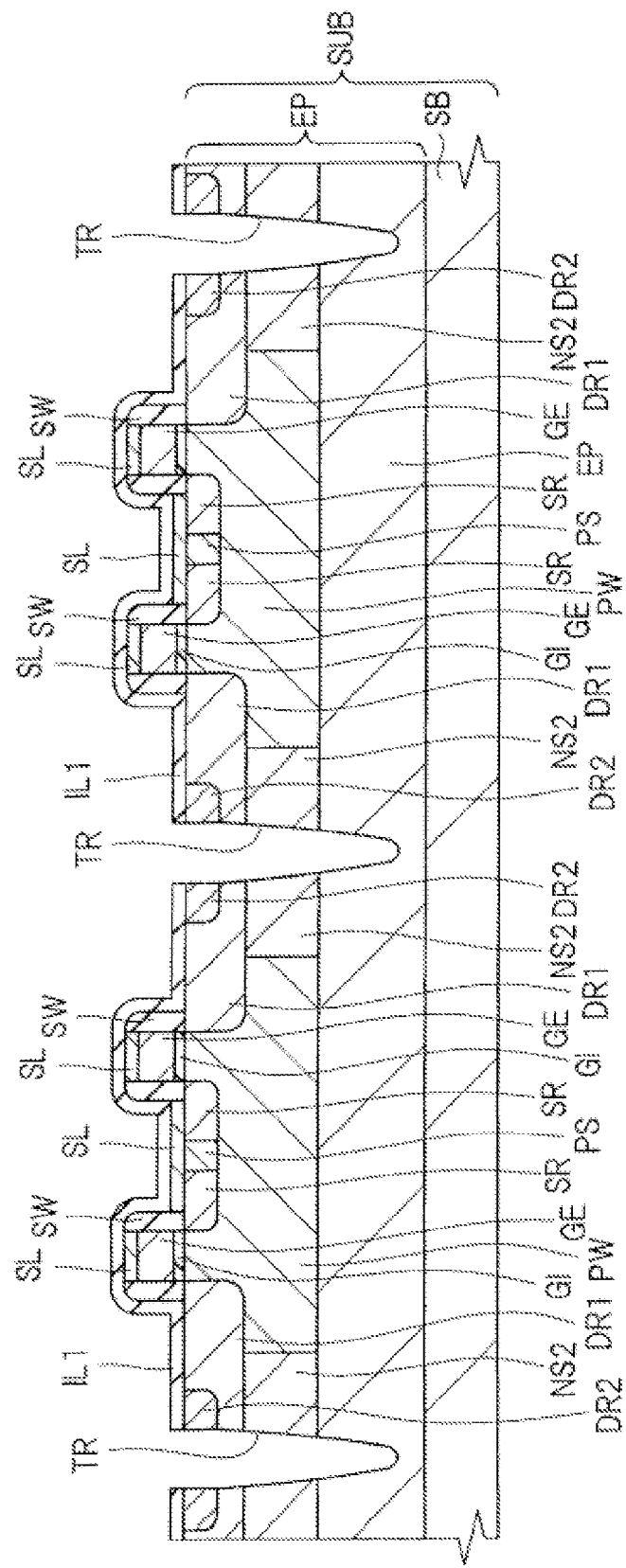
FIG. 18 is a main-portion cross-sectional view of the semiconductor device during the manufacturing process thereof, which is subsequent to FIG. 17.

Next, as shown in FIG. 18, over the insulating film IL1, a photoresist layer (not shown) having openings corresponding to the regions where the trenches TR are to be formed is formed using a photolithographic technique. Then, using the photoresist layer as an etching mask, the insulating film IL1 and the epitaxial layer EP are etched (preferably dry-etched)

to be formed with the trenches TR. The trenches TR are formed so as to extend through the higher-concentration n+-type drain regions DR2. As a result, when the trenches TR are formed, the trenches TR adjoin the higher-concentration n+-type drain regions DR2.

FIG. 18 shows the case where the trenches TR extend through the insulating film IL1 and the bottom portions of the trenches TR have reached positions close to the substrate main body SB, but are located midway in the epitaxial layer EP in the thickness direction thereof. In another embodiment, there may also be a case where the trenches TR extend through the insulating film IL1 and the epitaxial layer EP and the bottom portions of the trenches TR have reached the substrate main body SB. Note that, since the n-type semiconductor regions NS2 have been formed in the regions where the plugs TL are to be formed, the trenches TR are formed so as to extend through the n-type semiconductor regions NS2. As a result, when the trenches TR are formed, the trenches TR do not adjoin the p-type semiconductor layers PR (p-type semiconductor regions PW), but adjoin the n-type semiconductor regions NS2.

Note that FIG. 18 shows the case where each of the trenches TR has a tapered shape. This allows a conductive film to be easily embedded in the trench TR. In another embodiment, there may also be a case where each of the trenches TR does not have a tapered shape.

Figure 19:
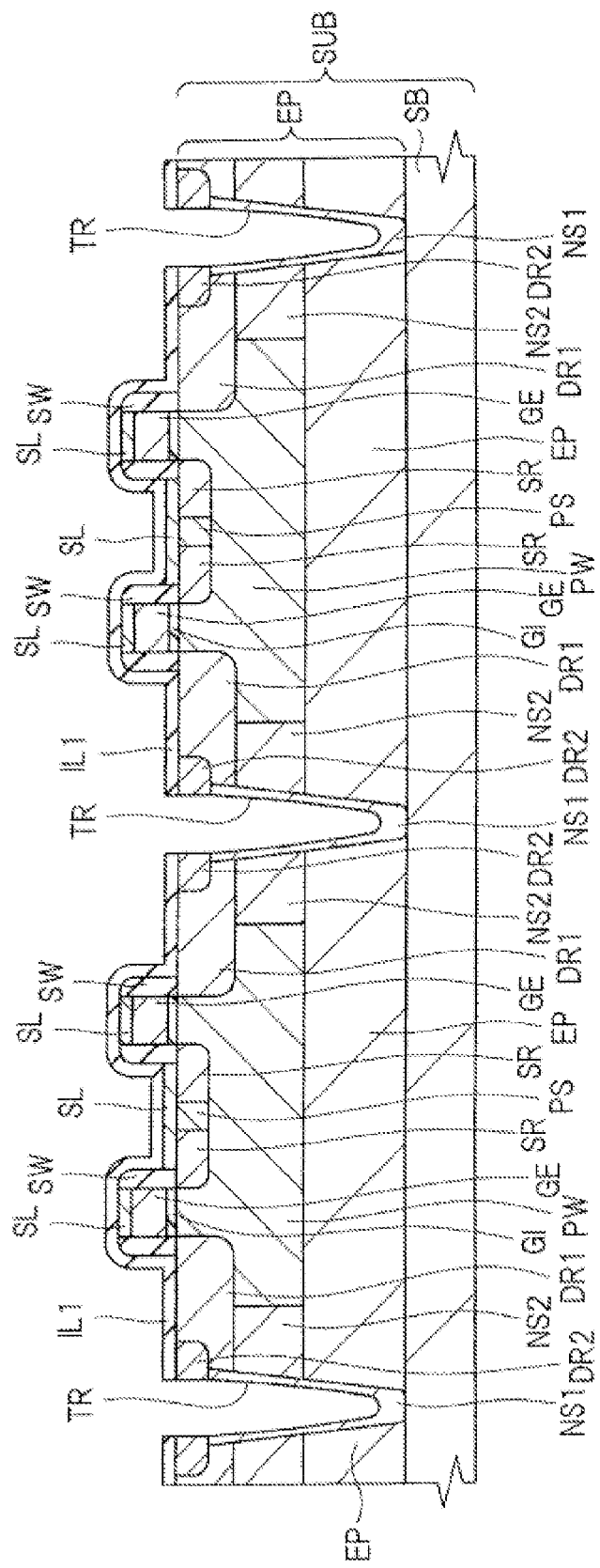
FIG. 19 is a main-portion cross-sectional view of the semiconductor device during the manufacturing process thereof, which is subsequent to FIG. 18.

Next, an n-type impurity is ion-implanted into the epitaxial layer EP exposed from the trenches TR. As a result, as shown in FIG. 19, in the epitaxial layer EP of the semiconductor substrate SUB, the n+-type semiconductor regions NS1 are formed around the trenches TR, i.e., at positions adjacent to the side and bottom surfaces of the trenches TR. The n+-type semiconductor regions NS1 have impurity concentrations (n-type impurity concentrations) higher than those of the lower-concentration n-type drain regions DR1 and the n−-type epitaxial layer EP. The n+-type semiconductor regions NS1 are formed at positions adjacent to the bottom surfaces of the trenches TR, but there may also be a case where the n+-type semiconductor regions NS1 are not formed at positions adjacent to the side surfaces of the trenches.

Figure 20:
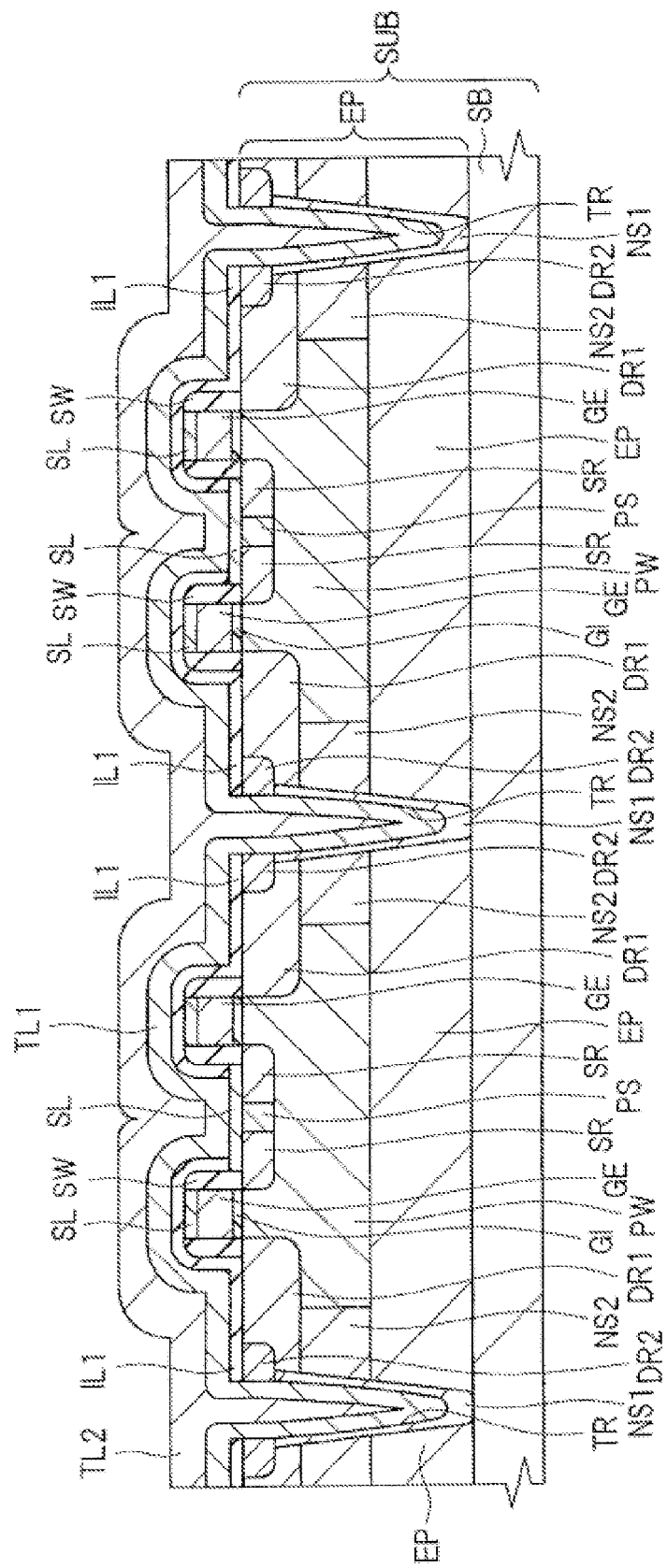
FIG. 20 is a main-portion cross-sectional view of the semiconductor device during the manufacturing process thereof, which is subsequent to FIG. 19.

Next, as shown in FIG. 20, over the semiconductor substrate SUB, i.e., over the insulating film IL1 including the bottom surfaces and side walls of the trenches TR, the titanium nitride (TiN) film TL1 is formed as a conductive film. Then, over the titanium nitride film TL1, the tungsten (W) film TL2 is formed as a conductive film so as to be embedded in the trenches TR. When the titanium nitride film TL1 and the tungsten film TL2 are formed, a state is established in which, over the insulating film IL1, the multi-layer film including the titanium nitride film TL1 and the tungsten film TL2 located over the titanium nitride film TL1 is formed while, in each of the trenches TR, the multi-layer film including the titanium nitride film TL1 and the tungsten film TL2 located over the insulating film IL1 is embedded.

Figure 21:
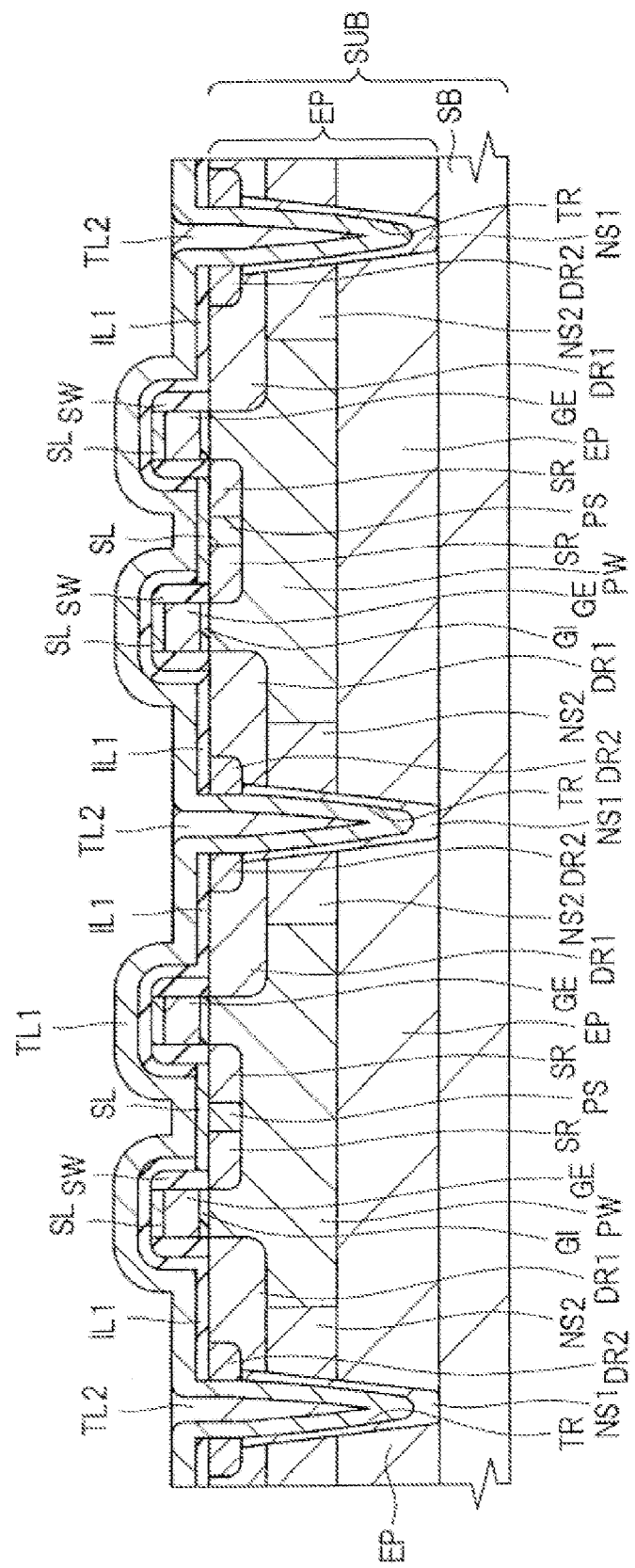
FIG. 21 is a main-portion cross-sectional view of the semiconductor device during the manufacturing process thereof, which is subsequent to FIG. 20.

Next, as shown in FIG. 21, the tungsten film TL2 is etched back to be removed from outside the trenches TR and left in the trenches TR. When the etch-back process is performed, by using etching conditions under which the titanium nitride film TL1 is less likely to be etched than the tungsten film TL2, it is possible to selectively remove the tungsten film TL2 outside the trenches TR and leave the titanium nitride film TL1 by suppressing the etching thereof.

Figure 22:
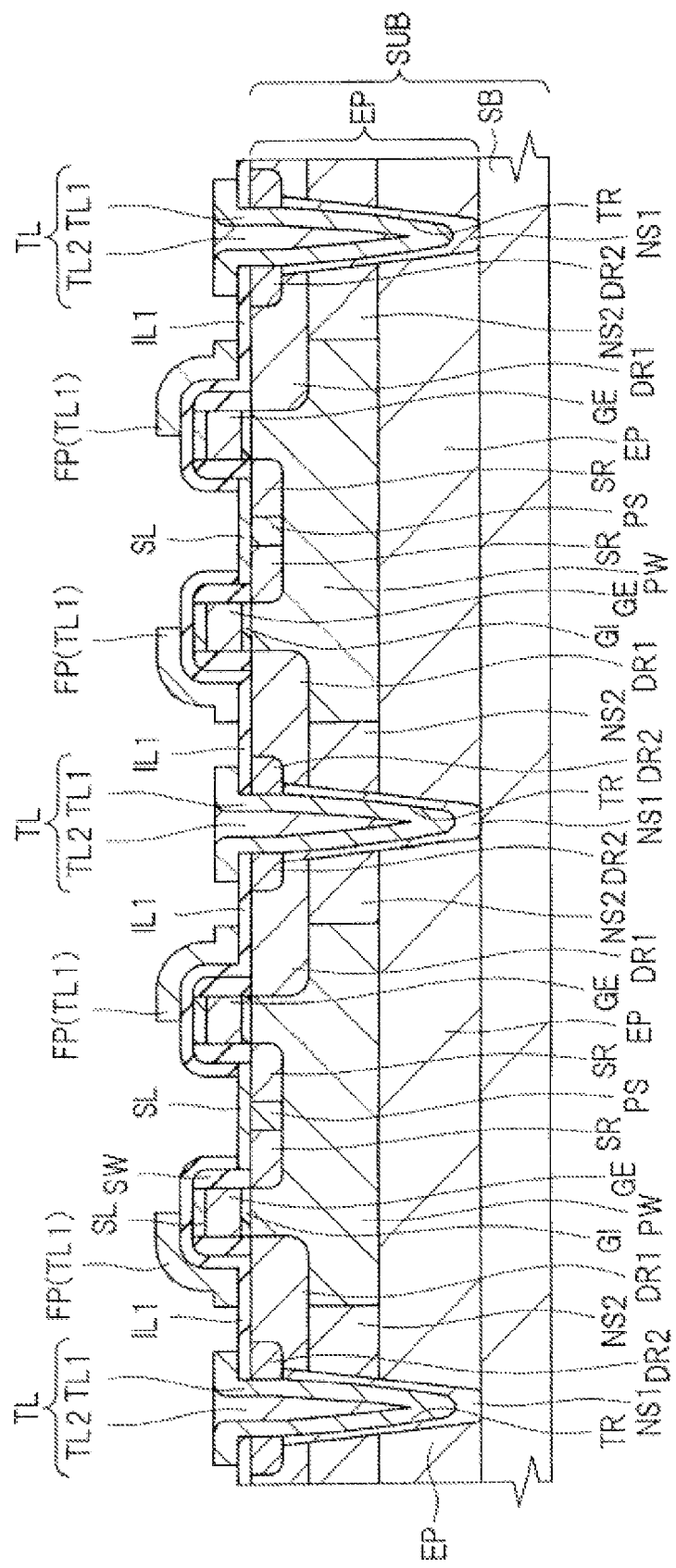
FIG. 22 is a main-portion cross-sectional view of the semiconductor device during the manufacturing process thereof, which is subsequent to FIG. 21.

Next, as shown in FIG. 22, using a photoresist layer (not shown) formed over the titanium nitride film TL1 using a photolithographic technique as an etching mask, the titanium nitride film TL1 is etched to be patterned. At this time, the titanium nitride film TL is removed except for the portions thereof serving as the plugs TL and serving as the field plate electrodes FP. As a result, the plugs TL each made of the titanium nitride film TL1 and the tungsten film TL2 which are embedded in the trenches TR are formed, while the field plate electrodes FP each made of the patterned titanium nitride film TL1 are formed. When the plugs TL and the field plate electrodes FP are formed by patterning the titanium nitride film TL1, the titanium nitride film TL1 forming the plugs TL and the titanium nitride film TL1 forming the field plate electrodes FP are in a discrete and mutually separated state. Since the plugs TL and the field plate electrodes FP are formed by patterning the titanium nitride film TL1, each of the titanium nitride film TL1 and the tungsten film TL2 which form the plugs TL has a portion thereof protruding from the upper surface of the insulating film IL1. That is, each of the plugs TL has a portion thereof protruding from the upper surface of the insulating film IL1. In another embodiment, there may also be a case where the upper surfaces of the plugs TL are substantially as high as the upper surface of the insulating film IL1 and the plugs TL do not protrude from the upper surface of the insulating film IL1. This structure is obtained when the plugs TL are formed by forming a conductive film (metal film) so as to fill the trenches TR therewith and then etching back the conductive film (metal film).

Each of the plugs TL is formed of the conductive film embedded in the trenches TR formed in the epitaxial layer EP. Here, as the conductive film, metal films (specifically the titanium nitride film TL1 and the tungsten film TL2) are used. By forming each of the plugs TL of the metal films, it is possible to reduce the resistance of the plug TL. By forming each of the plugs TL of the metal films, it is possible to reduce the resistance of the plug TL. By forming each of the plugs TL of the metal films, it is also possible to form each of the field plate electrodes FP using the metal films for the plugs TL. This can reduce the number of steps in the manufacturing process of the semiconductor device.

Figure 23:
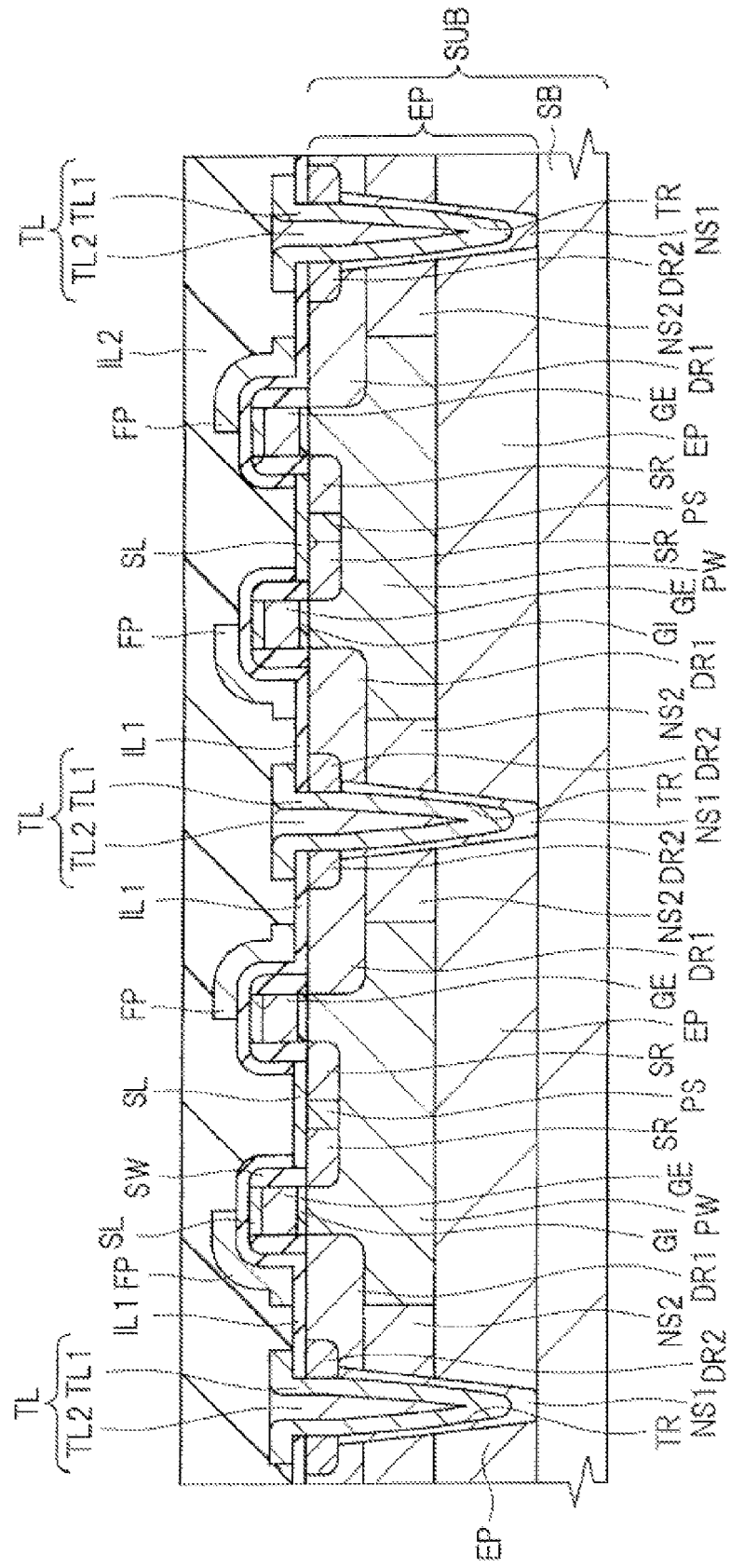
FIG. 23 is a main-portion cross-sectional view of the semiconductor device during the manufacturing process thereof, which is subsequent to FIG. 22.

Next, as shown in FIG. 23, over the semiconductor substrate SUB, i.e., over the insulating film IL1, the insulating film (interlayer insulating film) IL2 is formed so as to cover the plugs TL and the field plate electrodes FP. The insulating film IL2 is an interlayer insulating film and made of, e.g., a silicon dioxide film or the like. After the formation of the insulating film IL2, the top surface (upper surface) of the insulating film IL2 is subjected to polishing by a CMP (Chemical Mechanical Polishing) method or the like to be planarized.

Figure 24:
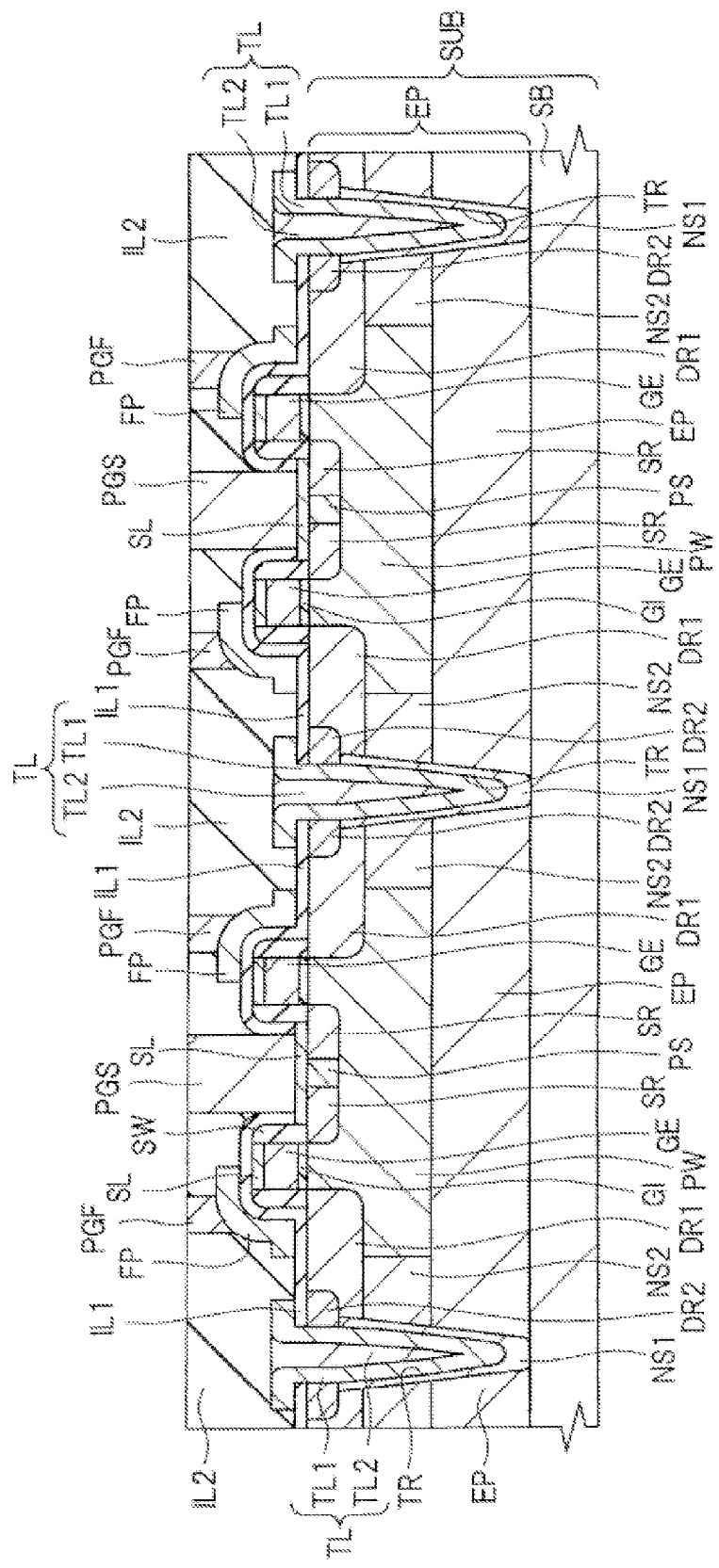
FIG. 24 is a main-portion cross-sectional view of the semiconductor device during the manufacturing process thereof, which is subsequent to FIG. 23.

Next, as shown in FIG. 24, using a photoresist layer (not shown) formed over the insulating film IL2 using a photolithographic technique as an etching mask, the insulating film IL2 or the insulating films IL2 and IL1 are etched to be formed with contact holes.

The contact holes into which the gate plugs PGG are to be embedded are formed so as to extend through the insulating films IL2 and IL1. At the bottom portions of the contact holes, the gate electrodes GE are exposed. The contact holes into which the source plugs PGS are to be embedded are formed so as to extend through the insulating films IL2 and IL1. At the bottom portions of the contact holes, the n+-type source regions SR and the p+-type semiconductor regions PS (or the n+-type source regions SR and the metal silicide layers SL over the p+-type semiconductor regions PS when the metal silicide layers SL have been formed) are exposed. The contact holes into which the field plate plugs PGF are to be embedded are formed so as to extend through the insulating film IL2. At the bottom portions of the contact holes, the field plate electrodes FP are exposed.

Next, in the contact holes, the conductive plugs (coupling conductor portions) PGF, PGG, and PGS each made of tungsten (W) or the like are formed. To form the plugs PGF, PGG, and PGS, e.g., over the insulating film IL2 including the inner portion (bottom portion and side wall) of each of the contact holes, a barrier conductor film (e.g., a titanium film, a titanium nitride film, or a multi-layer film thereof) is formed by a sputtering method, a plasma CVD method, or the like. Then, a main conductor film made of a tungsten film or the like is formed over the barrier conductor film by a CVD method or the like so as to be embedded in each of the contact holes. Then, the unneeded main conductor film and the unneeded barrier conductor film which are located outside the contact holes (over the insulating film IL2) are removed by a CMP method, an etch-back method, or the like. In this manner, the plugs PGF, PGG, and PGS are formed of the barrier conductor film and the main conductor film which are left and embedded in the contact holes. In FIG. 24, for simplified illustration, the main conductor film and the barrier conductor film of each of the plugs PGF, PGG, and PGS are integrally shown. The source plugs PGS have the bottom portions thereof which are in contact with and electrically coupled to the $n^+$-type source regions SR and the $p^+$-type semiconductor regions PS. Note that, when the metal silicide layers SL have been formed over the $n^+$-type source regions SR and the $p^+$-type semiconductor regions PS, the source plugs PGS are in contact with the metal silicide layers SL over the $n^+$-type source regions SR and the $p^+$-type semiconductor regions PS to be electrically coupled to the $n^+$-type source regions SR and the $p^+$-type semiconductor regions PS. On the other hand, the field plate plugs PGF have the bottom portions thereof which are in contact with and electrically coupled to the field plate electrodes FP. In FIG. 24, the gate plugs PGG are not shown, but have the bottom portions thereof which are in contact with and electrically coupled to the gate electrodes GE.

Figure 25:
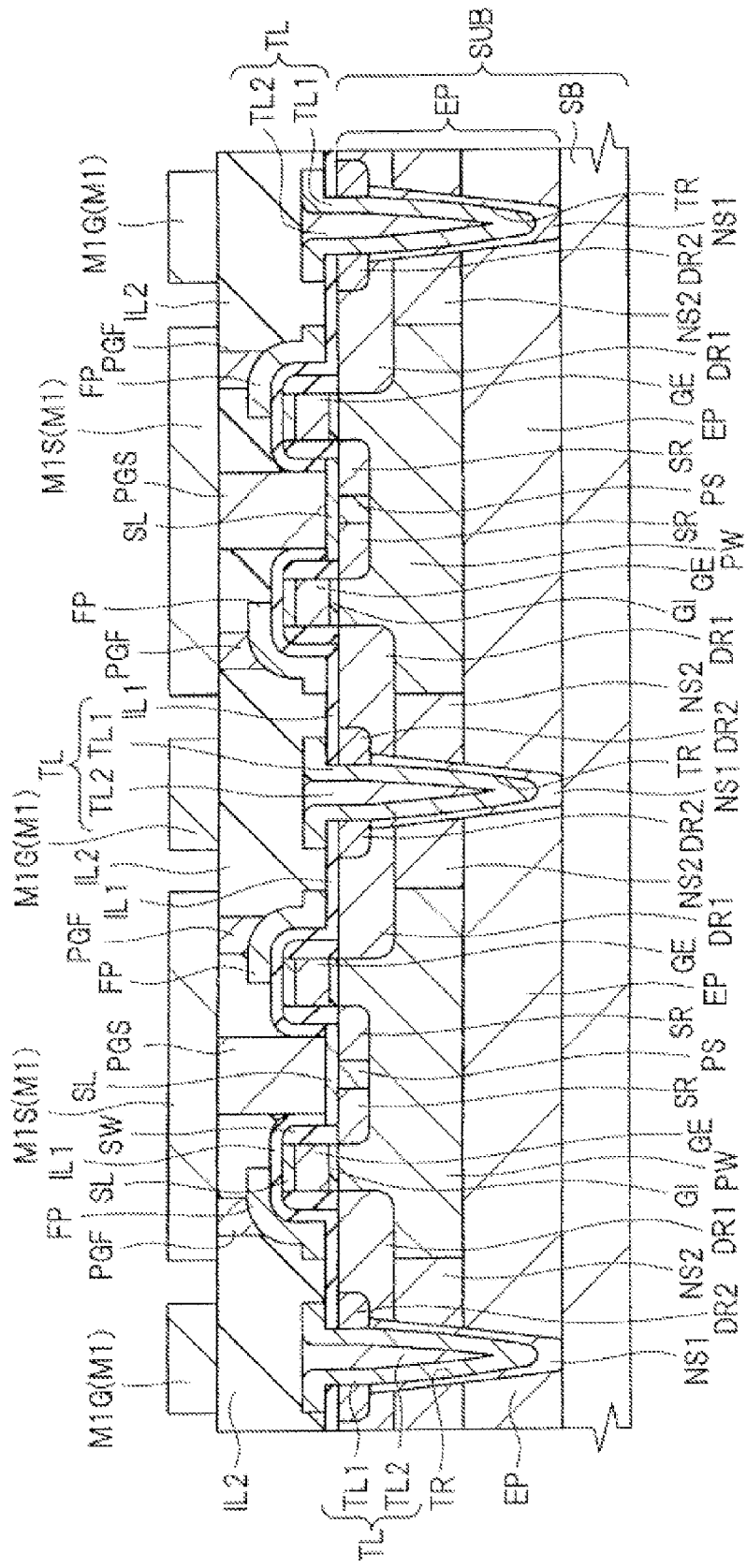
FIG. 25 is a main-portion cross-sectional view of the semiconductor device during the manufacturing process thereof, which is subsequent to FIG. 24.

Next, as shown in FIG. 25, over the insulating film IL2 in which the plugs PGF, PGG, and PGS are embedded, the interconnect lines M1 are formed. For example, by forming a conductive film for forming the interconnect lines M1 over the insulating film IL2 in which the plugs PGF, PGG, and PGS are embedded and then patterning the conductive film using a photolithographic technique and an etching technique, the interconnect lines M1 each made of the patterned conductive film can be formed. As the conductive film for forming the interconnect lines M1, e.g., a multi-layer film including a barrier conductor film, a main conductor film over the barrier conductor film, and a barrier conductor film over the main conductor film can be used. As each of the barrier conductor films, e.g., a titanium film, a titanium nitride film, or a multi-layer film thereof can be used. As the main conductor film, e.g., an aluminum film or an aluminum alloy film can be used. In FIG. 25, for simplified illustration, as each of the interconnect lines M1, the main conductor film and the barrier conductor films are integrally shown. As described above, the interconnect lines M1 include the gate interconnect line M1G and the source interconnect lines M1S.

Figure 26:
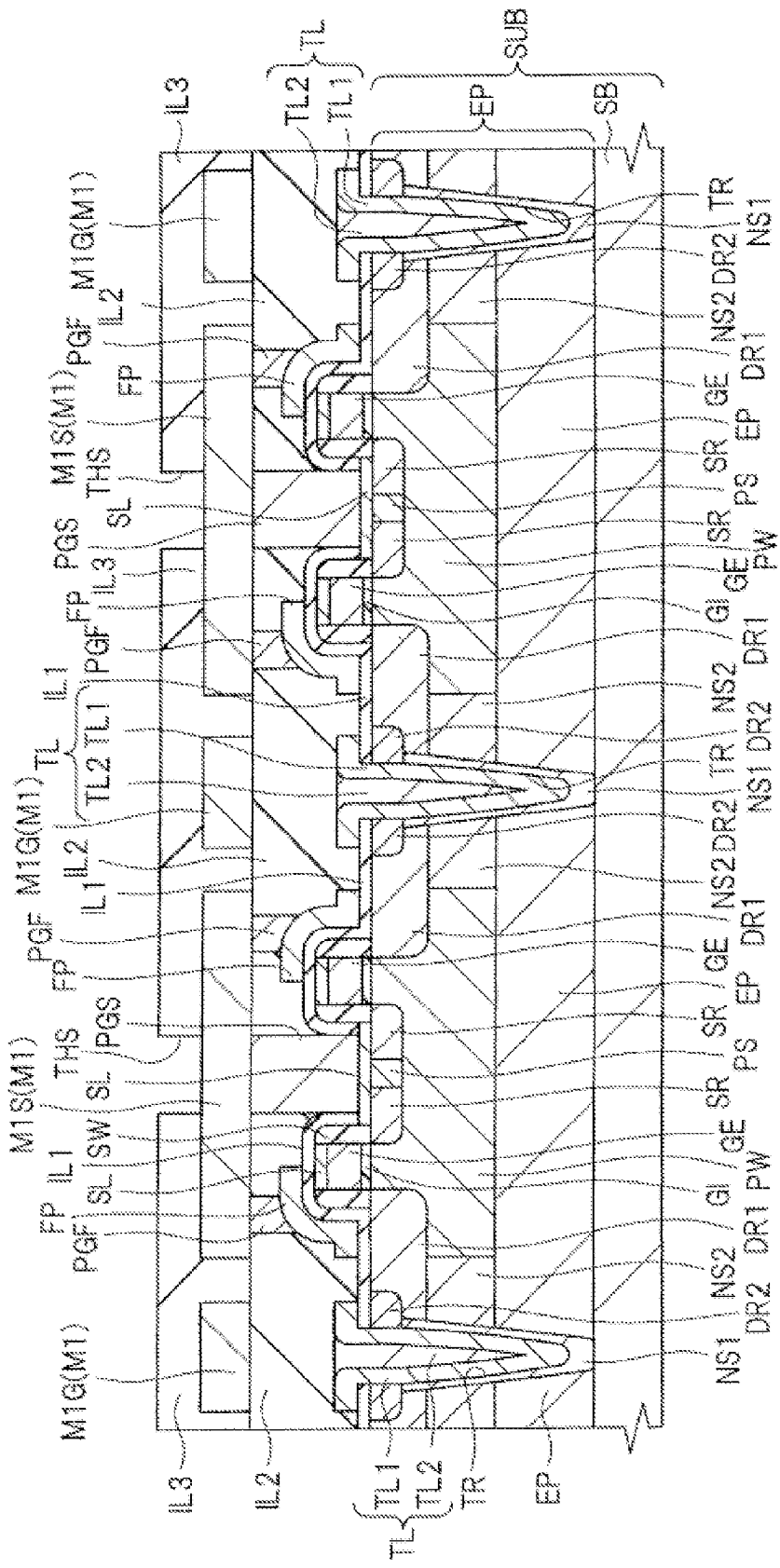
FIG. 26 is a main-portion cross-sectional view of the semiconductor device during the manufacturing process thereof, which is subsequent to FIG. 25.

Next, as shown in FIG. 26, over the insulating film IL2, the insulating film (interlayer insulating film) IL3 is formed so as to cover the interconnect lines M1. The insulating film IL3 is the interlayer insulating film and made of, e.g., a silicon dioxide film or the like. After the formation of the insulating film IL3, the top surface (upper surface) of the insulating film IL3 is polished by a CMP method or the like to be planarized.

Next, using a photoresist layer (not shown) formed over the insulating film IL3 using a photolithographic technique as an etching mask, the insulating film IL3 is etched to be formed with the through holes THG and THS. The through holes THG and THS are formed so as to extend through the insulating film IL3. At the bottom portions of the source through holes THS, the source interconnect lines M1S are exposed. At the bottom portion of the gate through hole THG (not shown in FIG. 26), the gate interconnect line M1G is exposed.

Figure 27:
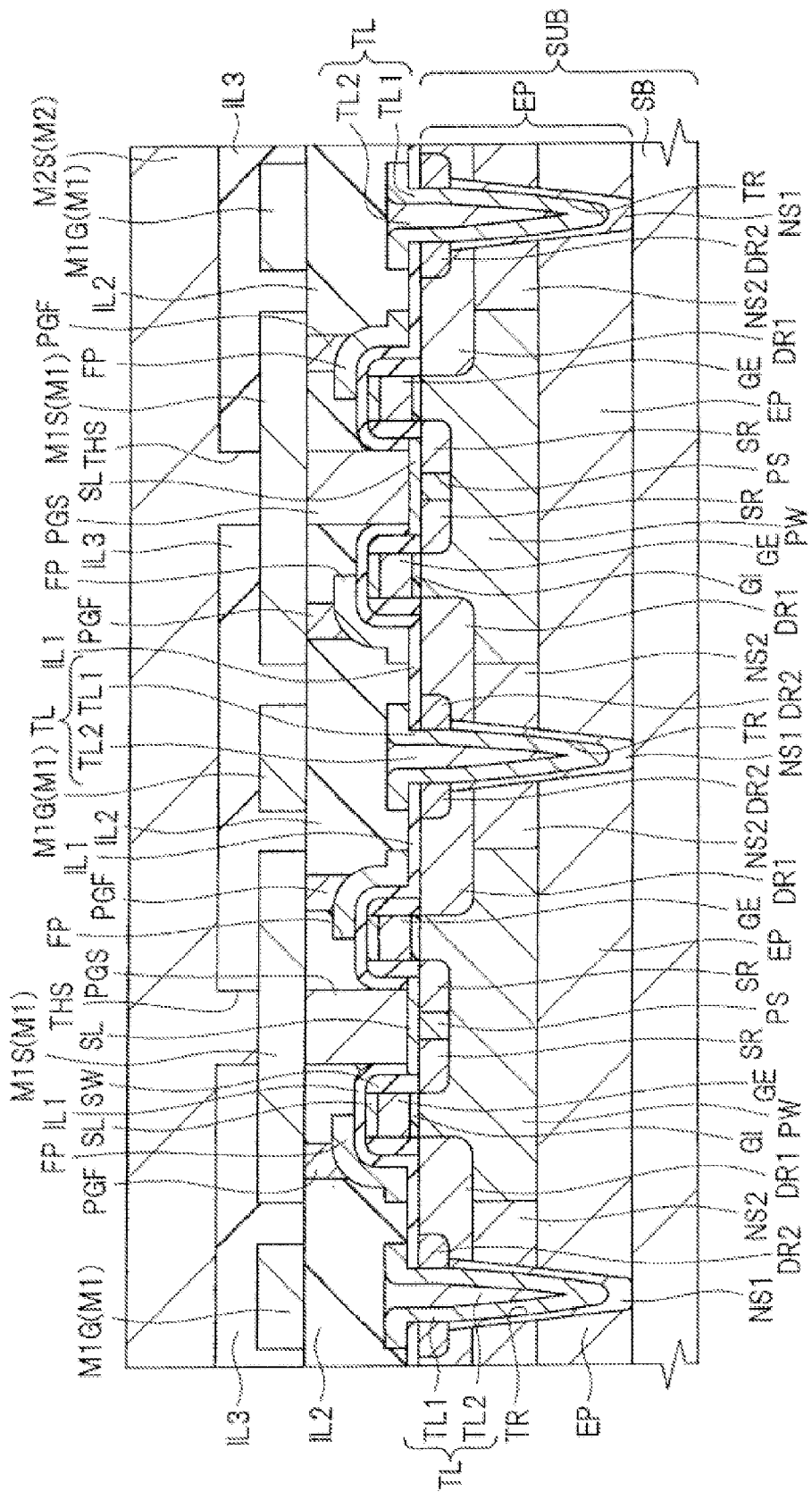
FIG. 27 is a main-portion cross-sectional view of the semiconductor device during the manufacturing process thereof, which is subsequent to FIG. 26.

Next, as shown in FIG. 27, over the insulating film IL3, the interconnect lines M2 are formed. For example, by forming a conductive film for forming the interconnect lines M2 over the insulating film IL3 including the through holes THG and THS and then patterning the conductive film using a photolithographic technique and an etching technique, the interconnect lines M2 each made of the patterned conductive film can be formed. As the conductive film for forming the interconnect lines M2, e.g., a multi-layer film including a barrier conductor film and a main conductor film over the barrier conductor film can be used. As the barrier conductor film, e.g., a tungsten nitride film can be used. As the main conductor film, e.g., an aluminum film or an aluminum alloy film can be used. In FIG. 27, for simplified illustration, as each of the interconnect lines M2, the main conductor film and the barrier conductor film are integrally shown. As described above, the interconnect lines M2 include the gate interconnect line M2G and the source interconnect line M2S. The gate interconnect line M2G is not shown in FIG. 27.

The interconnect lines M2 are partly embedded in the through holes of the insulating film IL3 to be in contact with and electrically coupled to the interconnect lines M1 at the bottom portions of the through holes. Accordingly, as the interconnect lines M2, interconnect line portions extending over the insulating film IL3 and the via portions embedded in the through holes of the insulating film IL3 are integrally formed.

The source interconnect line M2S is electrically coupled to the source interconnect lines M1S via the via portions (portions embedded in the source through holes THS). On the other hand, the gate interconnect line M2G is electrically coupled to the gate interconnect line M1G via the via portion (portion embedded in the gate through hole THG), though not shown in FIG. 27.

The interconnect lines M2 can also be formed by forming the through holes THG and THS in the insulating film IL3, then forming conductive plugs in the through holes THG and THS using the same technique as used to form the foregoing plugs PGF, PGG, and PGS, then forming the conductive film for forming the interconnect lines over the insulating film IL3 in which the plugs have been embedded, and patterning the conductive film. In this case, the source interconnect line M2S is electrically coupled to the source interconnect lines M1S via the conductive plugs embedded in the source through holes THS, while the gate interconnect line M2G is electrically coupled to the gate interconnect line M1G via the conductive plug embedded in the gate through hole THG.

Figure 28:
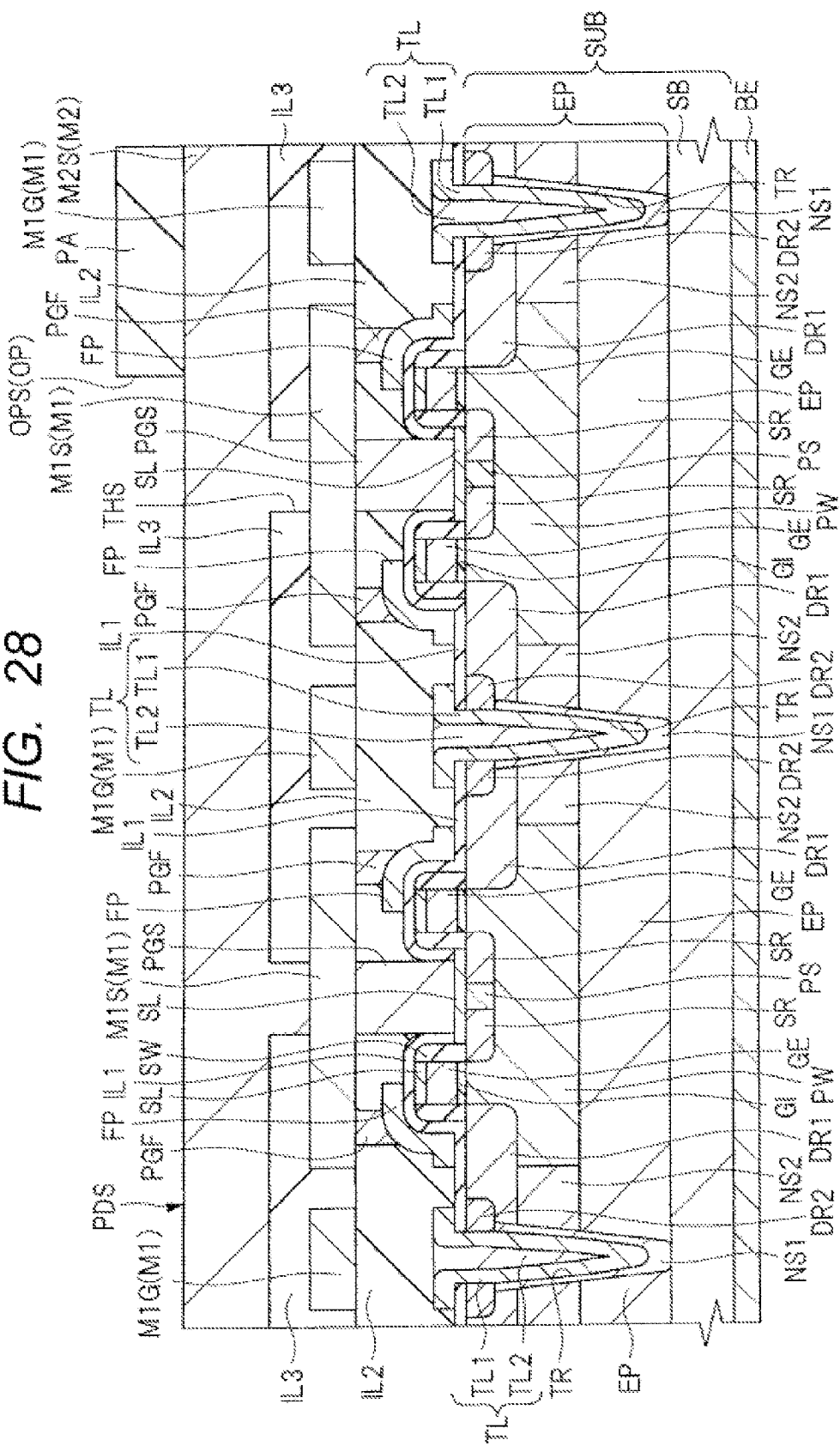
FIG. 28 is a main-portion cross-sectional view of the semiconductor device during the manufacturing process thereof, which is subsequent to FIG. 27.

Next, as shown in FIG. 28, over the insulating film IL3, the insulating film (surface protective film or passivation film) PA is formed so as to cover the interconnect lines M2. The insulating film is made of, e.g., a multi-layer film including a silicon dioxide film and a silicon nitride film located thereover or the like and can be formed by a CVD method or the like. Then, using a photoresist layer (not shown) formed over the insulating film PA as an etching mask, the insulating film PA is etched to be formed with openings OP (source opening OPS and gate opening OPG). The openings OP have reached the interconnect lines M2 and, at the bottom portions of the openings OP, the interconnect lines M2 are partly exposed.

As shown in FIG. 28, at the bottom portion of the source opening OPS, the source interconnect line M2S is partly exposed. The source interconnect line M2S exposed from the source opening OPS forms the source pad (pad electrode or bonding pad) PDS. At the bottom portion of the gate opening OPG, a part of the gate interconnect line M2G (pad portion M2G2) is exposed, though not shown in FIG. 28. The gate interconnect line M2G exposed from the gate opening OPG forms the gate pad (pad electrode or bonding pad) PDG.

In FIG. 8 described above, a cross section in the region included in the source opening OPS in plan view is shown so that the insulating film PA is not shown. On the other hand, in FIG. 28, a cross-sectional view laterally traversing the source opening OPS is shown so that the insulating film PA is shown.

Next, the back surface of the semiconductor substrate SUB (i.e., back surface of the substrate main body SB) is polished as necessary. Then, over the entire back surface of the semiconductor substrate SUB (i.e., back surface of the substrate main body SB), the back surface electrode BE is formed. The back surface electrode BE can be formed by successively depositing, e.g., a nickel (Ni) film, a titanium (Ti) film, a nickel (Ni) film, and a gold (Au) film by a sputtering method. Here, the back surface of the semiconductor substrate SUB is identical with the back surface of the substrate main body SB and corresponds to the main surface on the side opposite to the side on which the epitaxial layer EP is formed.

By the process steps described heretofore, the semiconductor device in the present embodiment is substantially completed.

Then, the semiconductor substrate SUB is singulated into semiconductor chips by dicing or the like. Each of the semiconductor chips is mounted on a wired substrate or a chip mounting portion of a lead frame.

<About Example of Configuration of Semiconductor Package>

Figure 29:
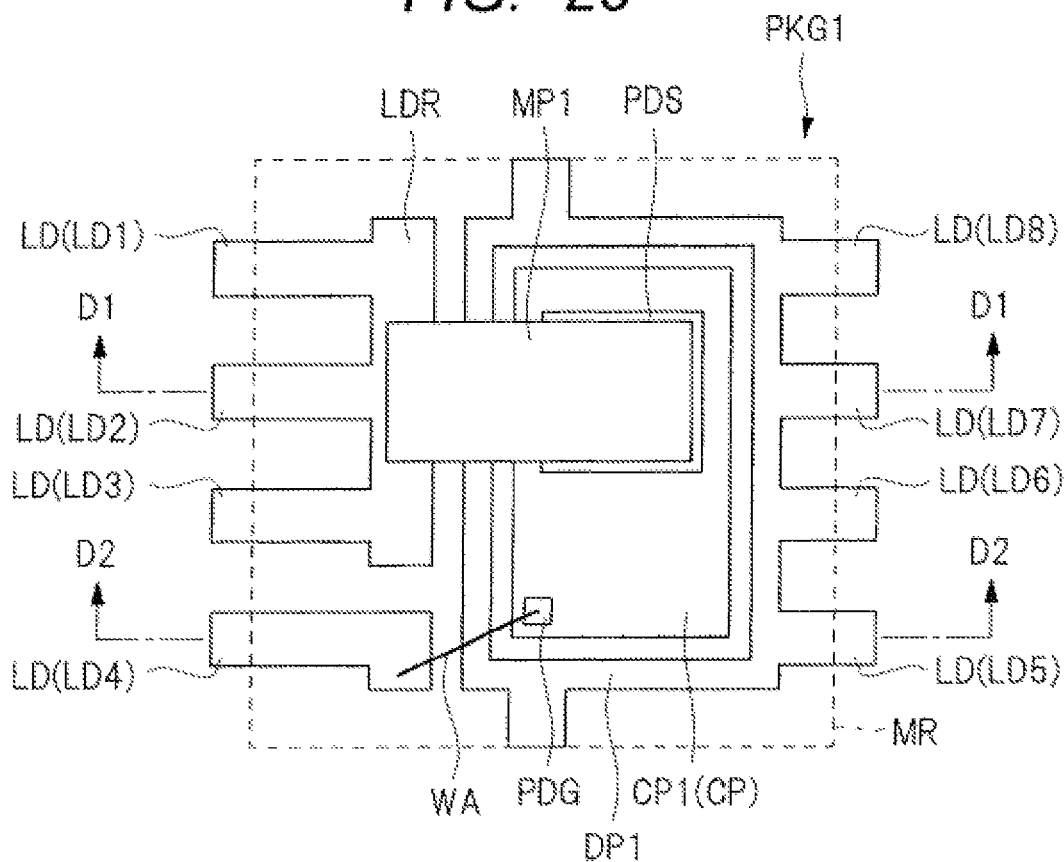
FIG. 29 is a plan perspective view of a semiconductor device in which a semiconductor chip in the embodiment has been packaged.
Figure 30:
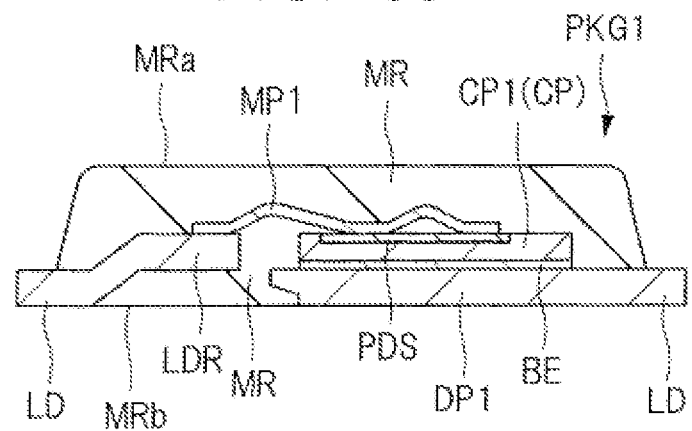
FIG. 30 is a cross-sectional view of the semiconductor device in FIG. 29.
Figure 31:
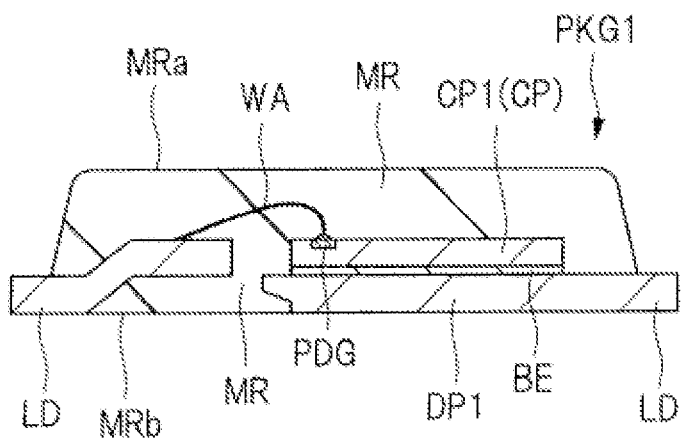
FIG. 31 is a cross-sectional view of the semiconductor device in FIG. 29.

FIG. 29 is a two-dimensional perspective view of a semiconductor device (semiconductor package) PKG1 in which a semiconductor chip CP1 corresponding to the semiconductor device CP in the present embodiment has been packaged. FIG. 29 shows a plan view (top view) in which the semiconductor device PKG1 is viewed from above the upper surface through a sealing portion MR. In FIG. 29, the outer peripheral position of the sealing portion MR is shown by the dotted line. FIGS. 30 and 31 are cross-sectional views of the semiconductor device PKG1. A cross-sectional view along the line D1-D1 in FIG. 29 substantially corresponds to FIG. 30. A cross-sectional view along the line D2-D2 in FIG. 29 substantially corresponds to FIG. 31.

As shown in FIGS. 29 to 31, the semiconductor device PKG1 has a die pad (chip mounting portion) DP1, the semiconductor chip CP1 mounted over the upper surface of the die pad DP1, a metal plate (conductor plate) MP1, a bonding wire (hereinafter referred to simply as wire) WA, a plurality of leads LD, and the sealing portion (sealing resin portion) MR for sealing the die pad DP1, the semiconductor chip CP1, the metal plate MP1, the wire WA, and the leads LD.

Since the semiconductor chip CP1 has the same configuration as that of the semiconductor device (semiconductor chip) CP described above, a repeated description thereof is omitted herein.

The sealing portion MR is made of a resin material such as, e.g., a thermosetting resin material and can also contain a filler or the like. For example, the sealing portion MR can be formed using an epoxy resin containing a filler or the like.

The sealing portion MR has an upper surface MRa as one of the main surfaces, a back surface MRb as the main surface opposite to the upper surface MRa, and side surfaces (four side surfaces) crossing the upper surface MRa and the back surface MRb. The sealing portion MR is formed such that each of the upper and back surfaces MRa and MRb has, e.g., a rectangular two-dimensional shape. The corners of the rectangular shape (rectangular two-dimensional shape) may also be cut off or rounded.

The plurality of leads LD are arranged along the two sides of the rectangular two-dimensional shape of the sealing portion MR. The leads LD partly project outwardly from the two sides of the rectangular two-dimensional shape of the sealing portion MR. At the back surface MRb of the sealing portion MR, the lower surface of each of the leads LD is exposed. At the back surface MRb of the sealing portion MR, the lower surface (back surface) of the die pad (chip mounting portion) DP1 having, e.g., a generally rectangular two-dimensional shape is also exposed.

Among the plurality of leads LD of the semiconductor device PKG1, leads LD1, LD2, and LD3 are integrally connected via a connecting portion LDR formed integrally with the leads LD1, LD2, and LD3. Among the plurality of leads LD of the semiconductor device PKG1, leads LD5, LD6, LD7, and LD8 are integrally connected to the die pad DP1. Among the plurality of leads LD of the semiconductor device PKG1, a lead LD4 is the detached lead LD which is not connected to any of the other leads LD1, LD2, LD3, LD5, LD6, LD7, and LD8, the connecting portion LDR, and the die pad DP1 via a conductor and separated therefrom via the sealing portion MR. The leads LD5, LD6, LD7, and LD8 connected to the die pad DP1 are arranged along one of the four sides of the rectangular two-dimensional shape of the sealing portion MR. The leads LD1, LD2, LD3, and LD4 are arranged along another one of the four sides of the rectangular two-dimensional shape of the sealing portion MR. The side along which the leads LD5, LD6, LD7, and LD8 are arranged and the side along which the leads LD1, LD2, LD3, and LD4 are arranged are opposed to each other.

Over the upper surface of the die pad DP1, the semiconductor chip CP1 is mounted in the state where the top surface thereof as the main surface formed with the source pad PDS and the gate pad PDG faces upward and the back surface thereof as the main surface formed with the back surface electrode BE faces the die pad DP1. That is, the semiconductor chip CP1 is mounted over (face-up bonded onto) the die pad DP1 via a conductive adhesive layer (not shown) and bonded (fixed) thereto. Over the back surface (entire back surface) of the semiconductor chip CP1, the back surface electrode BE is formed. The back surface electrode BE is bonded and electrically coupled to the die pad DP1 via a conductive adhesive layer (not shown). Consequently, the back surface electrode BE of the semiconductor chip CP1 is electrically coupled to the die pad DP1 and the leads LD5, LD6, LD7, and LD8. As a result, the leads LD5, LD6, LD7, and LD8 function as drain leads. The adhesive layer (not shown) for bonding the semiconductor chip CP1 to the die pad DP1 is made of a conductive bonding material (adhesive material), which is preferably a solder. As the conductive bonding material, a paste-type conductive adhesive material (paste-type adhesive material in a cured state), such as a silver paste, can also be used.

The die pad DP1, the leads LD, and the connecting portion LDR are each formed of a conductor, which is preferably made of a metal material such as copper (Cu) or a copper alloy. When the die pad DP1, the leads LD, and the connecting portion LDR are formed of the same material (the same metal material), the semiconductor device PKG1 can be manufactured using the same lead frame, resulting in easy manufacturing of the semiconductor device PKG1.

The gate pad PDG of the semiconductor chip CP1 is electrically coupled to the lead LD4 via the wire WA. Specifically, the wire WA has one end thereof coupled to the gate pad PDG of the semiconductor chip CP1 and the other end thereof coupled to the lead LD4. In this manner, the gate pad PDG is electrically coupled to the lead LD4 via the wire WA. As a result, the lead LD4 functions as a gate lead. The wire WS is formed of a metal wire (metal thin wire) such as, e.g., a gold (Au) wire.

The source pad PDS of the semiconductor chip CP1 is electrically coupled to the connecting portion LDR via the metal plate MP1. Specifically, the metal plate MP1 has one end portion (edge side) thereof coupled to the source pad PDS of the semiconductor chip CP1 and the other end portion (edge side) coupled to the upper surface of the connecting portion LDR. In this manner, the source pad PDS of the semiconductor chip CP1 is electrically coupled to the connecting portion LDR via the metal plate MP1. As a result, the source pad PDS of the semiconductor chip CP1 is electrically coupled to the leads LD1, LD2, and LD3 through the metal plate MP1 and the connecting portion LDR. As a result, the leads LD1, LD2, and LD3 function as source leads.

In another embodiment, it is also possible to electrically couple the source pad PDS of the semiconductor chip CP1 to the connecting portion LDR or the leads LD through the wire WA (preferably the plurality of wires WA). However, as shown in FIGS. 29 to 31, the use of the metal plate MP1 for electrically coupling the source pad PDS of the semiconductor chip CP1 to the connecting portion LDR allows a reduction in resistance. As a result, it is possible to reduce package resistance and reduce a conduction loss.

As the metal plate MP1, an aluminum ribbon (aluminum belt) made of e.g., aluminum (Al) or an aluminum (Al) alloy can be used. In this case, the aluminum ribbon forming the metal plate MP1 can be directly coupled (bonded) to the respective upper surfaces of the source pad PDS of the semiconductor chip CP1 and the connecting portion LDR by compression bonding or the like without using a conductive adhesive material.

When the aluminum ribbon is used as the metal plate MP1, the aluminum ribbon can be coupled in the manner of wire bonding. That is, after one end of a long belt of aluminum is bonded to either one of the source pad PDS of the semiconductor chip CP1 and the connecting portion LDR by compression bonding or the like, the belt of aluminum is bonded to the other of the source pad PDS of the semiconductor chip CP1 and the connecting portion LDR and then cut. In this manner, using the aluminum ribbon made of the cut belt of aluminum, the source pad PDS of the semiconductor chip CP1 can be electrically coupled to the connecting portion LDR.

Figure 32:
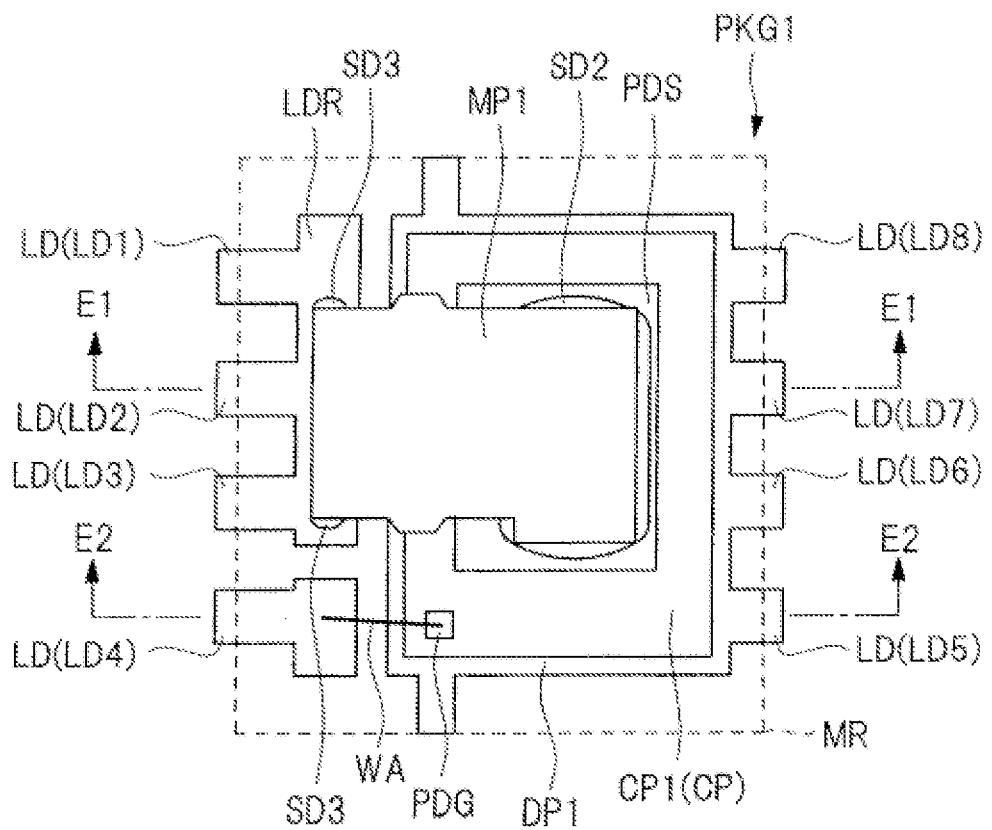
FIG. 32 is a plan perspective view showing a modification of the semiconductor device in FIG. 29.
Figure 33:
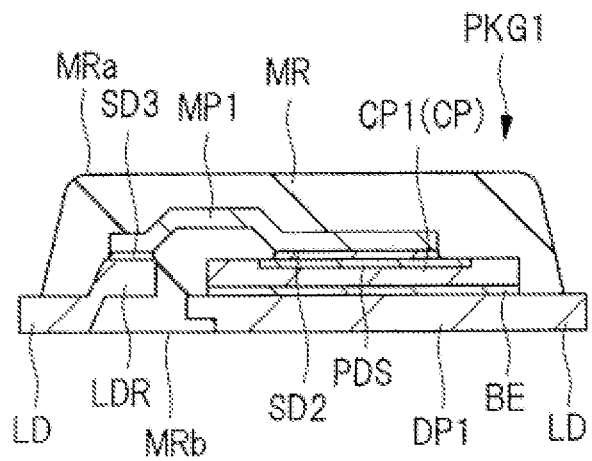
FIG. 33 is a cross-sectional view of the semiconductor device in FIG. 32.
Figure 34:
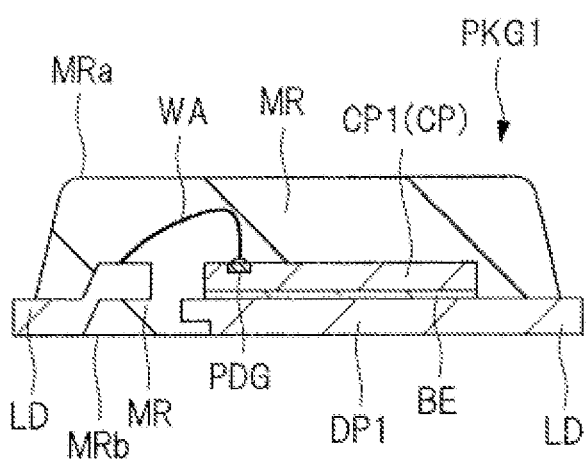
FIG. 34 is a cross-sectional view of the semiconductor device in FIG. 32.

FIGS. 32 to 34 are a two-dimensional perspective view (FIG. 32) and cross-sectional views (FIGS. 33 and 34) each showing a modification of the semiconductor device PKG1 and respectively correspond to FIGS. 29 to 31 described above. A cross-sectional view along the line E1-E1 in FIG. 32 substantially corresponds to FIG. 33. A cross-sectional view along the line E2-E2 in FIG. 32 substantially corresponds to FIG. 34.

In the case of the semiconductor device PKG1 in FIGS. 32 to 34, as the metal plate MP1, a copper clip made of copper (Cu) or a copper (Cu) alloy is used. The copper clip forming the metal plate MP1 is coupled (bonded) to the source pad PDS of the semiconductor chip CP1 via a conductive adhesive layer (bonding material) SD2 and also coupled (bonded) to the upper surface of the connecting portion LDR via a conductive adhesive material (bonding material) SD3. The adhesive layers SD2 and SD3 are made of a conductive adhesive material (bonding material), which is preferably a solder. However, it is also possible to use a paste-type conductive adhesive material (paste-type adhesive material in a cured state), such as a silver paste. In the case of using the copper clip as the metal plate MP1, the copper clip worked in advance can be coupled (bonded) to the source pad PDS of the semiconductor chip CP1 and the connecting portion LDR via the adhesive layers SD2 and SD3.

Figure 35:
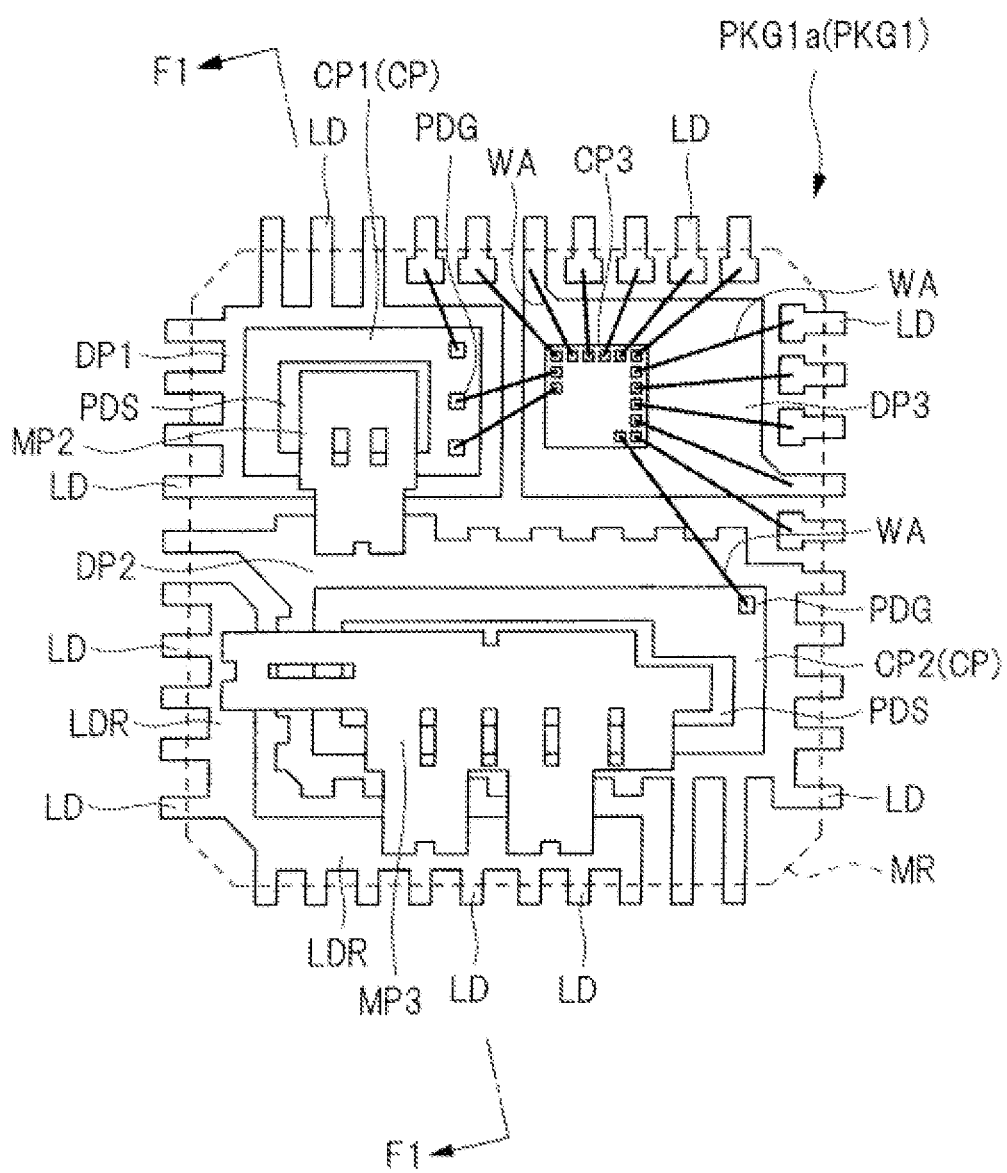
FIG. 35 is a plan perspective view showing another modification of the semiconductor device in FIG. 29.
Figure 36:
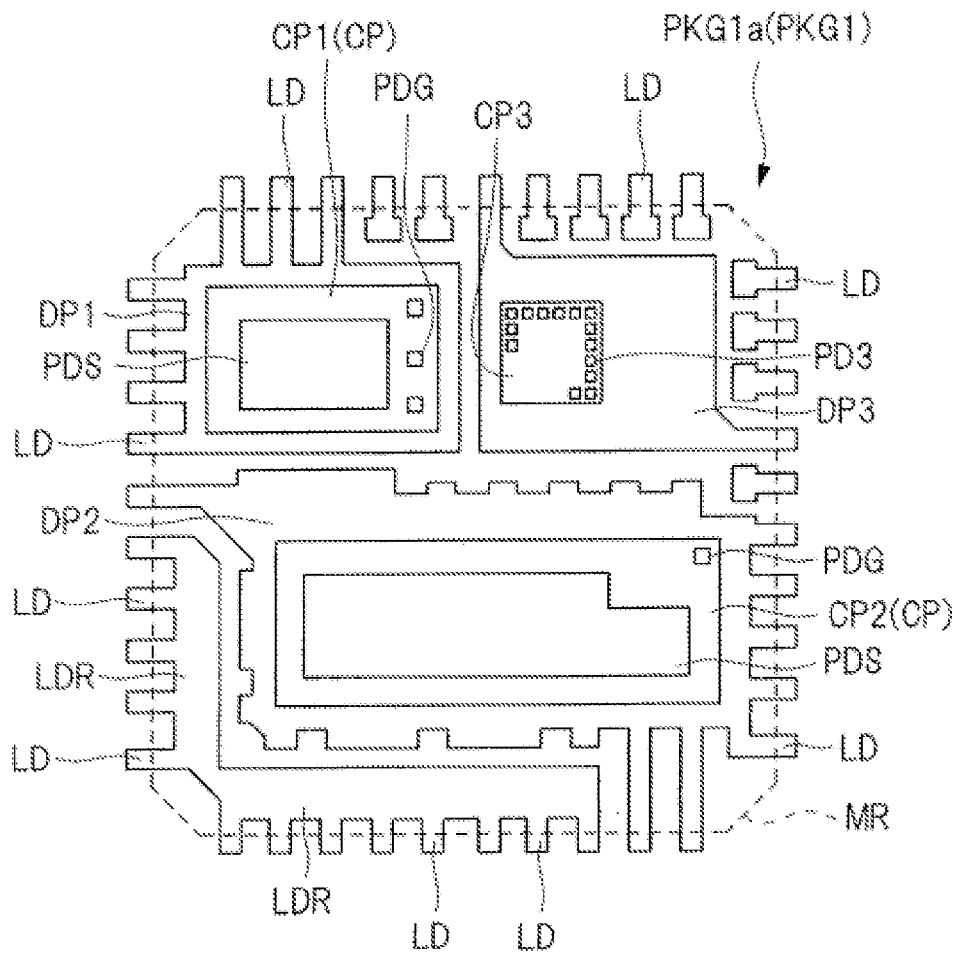
FIG. 36 is a plan perspective view showing the other modification of the semiconductor device in FIG. 29.
Figure 37:
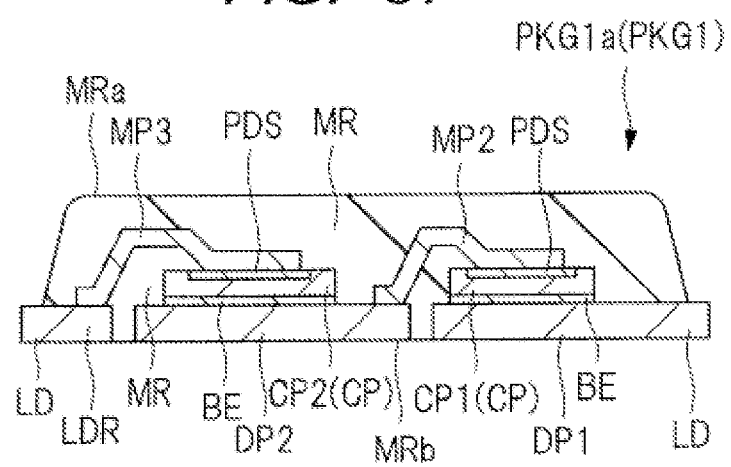
FIG. 37 is a cross-sectional view of the semiconductor device in FIGS. 35 and 36.

FIGS. 35 to 37 are two-dimensional perspective views (FIGS. 35 and 36) and a cross-sectional view (FIG. 37) each showing another modification of the semiconductor device PKG1. FIG. 35 corresponds to FIG. 29 described above and shows a plan view (top view) in which the semiconductor device PKG1 is viewed from above the upper surface through the sealing portion MR. FIG. 36 corresponds to a view obtained by removing metal plates MP2 and MP3 and the wires WA from FIG. 35. A cross-sectional view along the line F1-F1 in FIG. 35 substantially corresponds to FIG. 37. It is assumed that the semiconductor device PKG1 in the other modification shown in FIGS. 35 to 37 is designated by a reference numeral PKG1a and referred to as a semiconductor device PKG1a.

As shown in FIGS. 35 to 37, the semiconductor device PKG1a has die pads (chip mounting portions) DP1, DP2, and DP3, semiconductor chips CP1, CP2, and CP3 mounted over the die pads DP1, DP2, and DP3, metal plates (conductor plates) MP2 and MP3, the plurality of wires WA, the plurality of leads LD, and the sealing portion (sealing resin portion) MR for sealing the die pads DP1, DP2, and DP3, the semiconductor chips CP1, CP2, and CP3, the metal plates MP2 and MP3, the wires WA, and the leads LD.

The semiconductor device PKG1a is a semiconductor device used for a non-insulated DC-DC converter. The semiconductor chip CP1 is formed with a power MISFET for a HIGH-side switch. The semiconductor chip CP2 is formed with a power MISFET for a LOW-side switch. The semiconductor chip CP3 is formed with a control circuit. Each the semiconductor chips CP1 and CP2 has the same configuration as the configuration of the semiconductor device (semiconductor chip) CP described above so that a repeated description thereof is omitted. The foregoing plurality of unit LDMOSFETs 10a formed in the foregoing LDMOSFET formation region LR in the semiconductor chip CP1 are coupled in parallel to each other to form the power MISFET for the HIGH-side switch. Also, the foregoing plurality of unit LDMOSFETs 10a formed in the foregoing LDMOSFET formation region LR in the semiconductor chip CP2 are coupled in parallel to each other to form the power MISFET for the LOW-side switch.

As a result, the gate pad PDG of the semiconductor chip CP1 is electrically coupled to the gate of the power MISFET for the HIGH-side switch formed in the semiconductor chip CP1, while the source pad PDS of the semiconductor chip CP1 is electrically coupled to the source of the power MISFET for the HIGH-side switch formed in the semiconductor chip CP1. The back surface electrode BE of the semiconductor chip CP1 is electrically coupled to the drain of the power MISFET for the HIGH-side switch formed in the semiconductor chip CP1.

On the other hand, the gate pad PDG of the semiconductor chip CP2 is electrically coupled to the gate of the power MISFET for the LOW-side switch formed in the semiconductor chip CP2, while the source pad PDS of the semiconductor chip CP2 is electrically coupled to the source of the power MISFET for the LOW-side switch formed in the semiconductor chip CP2. The back surface electrode BE of the semiconductor chip CP2 is electrically coupled to the drain of the power MISFET for the LOW-side switch formed in the semiconductor chip CP2. One of pads PD3 of the semiconductor chip CP3 is electrically coupled to a circuit (e.g., control circuit) formed in the semiconductor chip CP3.

The plurality of leads LD are arranged along the four sides of the rectangular two-dimensional shape of the sealing portion MR. Each of the leads LD partly projects outwardly from the four sides of the rectangular two-dimensional shape of the sealing portion MR. At the back surface MRb of the sealing portion MR, the lower surface of each of the leads LD is exposed. At the back surface MRb of the sealing portion MR, the lower surfaces (back surfaces) of the die pads DP1, DP2, and DP3 each having, e.g., a generally rectangular two-dimensional shape are also exposed.

The plurality of leads LD of the semiconductor device PKG1a include the plurality of leads LD integrally connected to the die pad DP1, the plurality of leads LD integrally connected to the die pad DP2, the plurality of leads LD integrally connected to the die pad DP3, the plurality of leads LD integrally connected via the connecting portion, and the plurality of detached leads LD.

Each of the die pads DP1, DP2, and DP3, the leads LD, and the connecting portion LDR is formed of a conductor, which is preferably a metal material such as copper (Cu) or a copper alloy. When the die pads DP1, DP2, and DP3, the leads LD, and the connecting portion LDR are formed of the same material (the same metal material), the semiconductor device PKG1a can be manufactured using the same lead frame, resulting in easy manufacturing of the semiconductor device PKG1a.

Over the upper surface of the die pad DP1, the semiconductor chip CP1 is mounted in the state where the top surface thereof as the main surface formed with the source pad PDS and the gate pad PDG faces upward and the back surface thereof as the main surface formed with the back surface electrode BE faces the die pad DP1. That is, the semiconductor chip CP1 is mounted over (face-up bonded onto) the die pad DP1 via a conductive adhesive layer (not shown) and bonded (fixed) thereto. Over the back surface (entire back surface) of the semiconductor chip CP1, the back surface electrode BE is formed. The back surface electrode BE is electrically coupled to the die pad DP1 via a conductive adhesive layer (not shown). Consequently, the back surface electrode BE of the semiconductor chip CP1 is electrically coupled to the die pad DP1 and the leads LD integrally connected to the die pad DP1.

Over the upper surface of the die pad DP2, the semiconductor chip CP2 is mounted in the state where the top surface thereof as the main surface formed with the source pad PDS and the gate pad PDG faces upward and the back surface thereof as the main surface formed with the back surface electrode BE faces the die pad DP2. That is, the semiconductor chip CP2 is mounted over (face-up bonded onto) the die pad DP2 via a conductive adhesive layer (not shown) and bonded (fixed) thereto. Over the back surface (entire back surface) of the semiconductor chip CP2, the back surface electrode BE is formed. The back surface electrode BE is electrically coupled to the die pad DP2 via a conductive adhesive layer (not shown). Consequently, the back surface electrode BE of the semiconductor chip CP2 is electrically coupled to the die pad DP2 and the leads LD integrally connected to the die pad DP2.

Over the upper surface of the die pad DP3, the semiconductor chip CP3 is mounted in the state where the top surface thereof as the main surface formed with the pads PD3 faces upward and the back surface thereof faces the die pad DP3. That is, the semiconductor chip CP3 is mounted over (face-up bonded onto) the die pad DP3 via an adhesive layer (not shown) and bonded (fixed) thereto. Since no back surface electrode is formed over the back surface of the semiconductor chip CP3, the adhesive layer (bonding material) for bonding the semiconductor chip CP3 to the die pad DP3 may be either conductive or insulating. On the other hand, since the back surface electrode (BE) is formed over each of the back surfaces of the semiconductor chips CP1 and CP2, it is necessary for each of the adhesive layer (bonding material) for bonding the semiconductor chip CP1 to the die pad DP1 and the adhesive layer (bonding material) for bonding the semiconductor chip CP2 to the die pad DP2 to have conductivity.

The gate pad PDG of the semiconductor chip CP1 is electrically coupled to one of the pads (PD3) of the semiconductor chip CP3 via the wire WA. Specifically, the wire WA has one end thereof coupled to the gate pad PDG of the semiconductor chip CP1 and the other end thereof coupled to the pad (PD3) of the semiconductor chip CP3. Thus, the gate pad PDG of the semiconductor chip CP1 is electrically coupled to the pad (PD3) of the semiconductor chip CP3 via the wire WA.

The source pad PDS of the semiconductor chip CP1 is electrically coupled to the die pad DP2 through the metal plate MP2. Specifically, the metal plate MP2 having one end portion (edge side) thereof coupled to the source pad PDS of the semiconductor chip CP1 has the other end portion (edge side) thereof coupled to the upper surface of the die pad DP2. In this manner, the source pad PDS of the semiconductor chip CP1 is electrically coupled to the die pad DP2 via the metal plate MP2. As a result, the source pad PDS of the semiconductor chip CP1 is electrically coupled to the back surface electrode BE (drain back surface electrode) of the semiconductor chip CP2 through the metal plate MP2 and the die pad DP2.

The gate pad PDG of the semiconductor chip CP2 is electrically coupled to one of the pads (PD3) of the semiconductor chip CP3 via the wire WA. Specifically, the wire WA having one end thereof coupled to the gate pad PDG of the semiconductor chip CP2 has the other end thereof coupled to the pad (PD3) of the semiconductor chip CP3. Thus, the gate pad PDG of the semiconductor chip CP2 is electrically coupled to the pad (PD3) of the semiconductor chip CP3 via the wire WA.

The source pad PDS of the semiconductor chip CP2 is electrically coupled to the connecting portion LDR through the metal plate MP3. Specifically, the metal plate MP3 has one end portion (edge side) thereof coupled to the source pad PDS of the semiconductor chip CP2 and the other end portion (edge side) thereof coupled to the top surface of the connecting portion LDR. In this manner, the source pad PDS of the semiconductor chip CP2 is electrically coupled to the connecting portion LDR and the plurality of leads LD integrally connected to the connecting portion LDR through the metal plate MP3.

Among the plurality of pads (PD3) of the semiconductor chip CP3, the pads (PD3) coupled to none of the pads of the semiconductor chips CP1 and CP2 are electrically coupled to the leads LD (mainly to the detached leads LD) via the wires WA.

As each of the metal plates MP2 and MP3, the same metal plate as the metal plate MP1 used in the semiconductor device PKG1 in FIGS. 29 to 31 described above or as the metal plate MP1 used in the semiconductor device PKG1 in FIGS. 32 to 34 described above can be used.

<About Background to Study>

Figure 38:
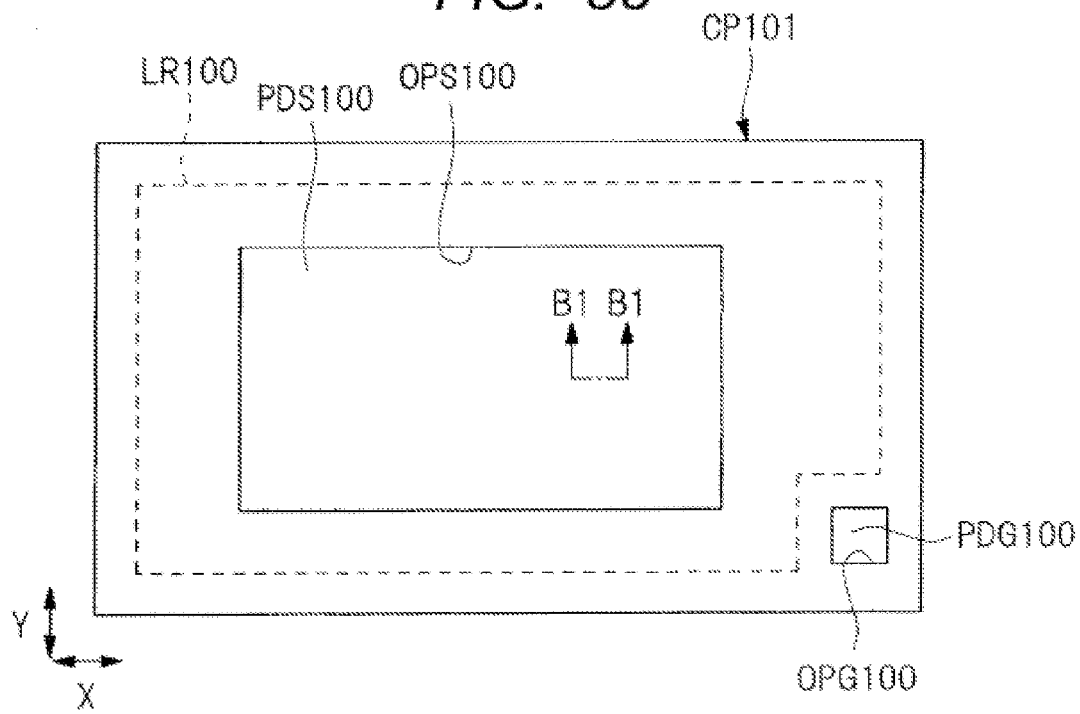
FIG. 38 is an overall plan view of a semiconductor device in a first studied example.
Figure 39:
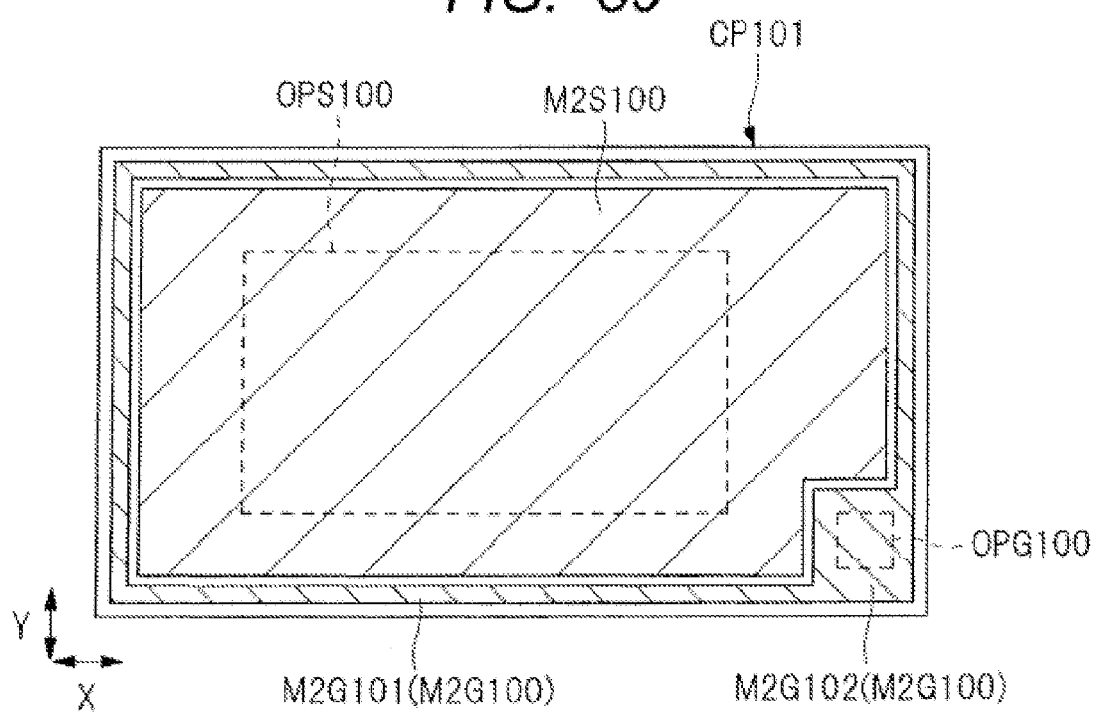
FIG. 39 is an overall plan view of the semiconductor device in the first studied example.
Figure 40:
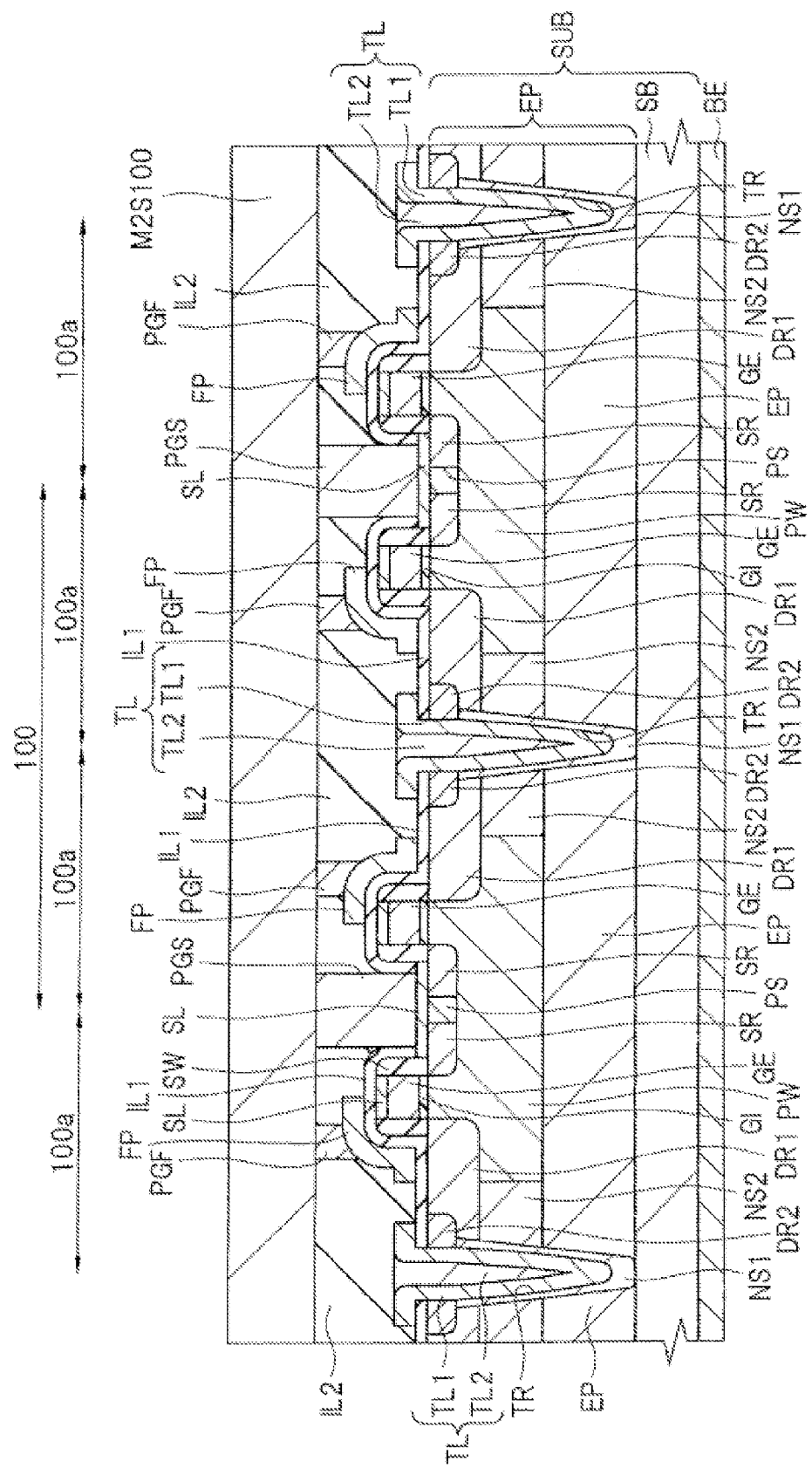
FIG. 40 is a main-portion cross-sectional view of the semiconductor device in the first studied example.

FIG. 38 is a top view of a semiconductor device CP101 in a first studied example studied by the present inventors, which corresponds to FIG. 1 described above. In FIG. 38, an LDMOSFET formation region LR100 is shown by the dotted line. FIG. 39 is an overall plan view of the semiconductor device CP101 in the first studied example and shows the plan view of the same region as shown in FIG. 38. However, FIG. 39 shows a two-dimensional layout of interconnect lines (i.e., a source interconnect line M2S100 and a gate interconnect line M2G100). The source interconnect line M2S100 and the gate interconnect line M2G100 are hatched. In addition, FIG. 39 shows the positions of a source opening OPS100 and a gate opening OPG100 by dotted lines. FIG. 40 is a main-portion cross-sectional view of the semiconductor device CP101 in the first studied example. A cross-sectional view along the line B1-B1 in FIG. 38 substantially corresponds to FIG. 40.

In the semiconductor device CP101 in the first studied example shown in FIGS. 38 to 40, the LDMOSFETs formed in the semiconductor SUB have substantially the same configurations as in the semiconductor device CP in the present embodiment so that a repeated description thereof is omitted herein.

In the semiconductor device CP100 in the first studied example also, in the LDMOSFET formation region LR100 corresponding to the foregoing LDMOSFET formation region LR, a unit cell 100 corresponding to the foregoing unit cell 10 is repeated in the X-direction. One unit cell 100 forms two unit LDMOSFETs 100a corresponding to the foregoing unit LDMOSFETs 10a. In the LDMOSFET formation region LR100, the unit LDMOSFETs 100a are repeatedly arranged in the X-direction. The plurality of unit LDMOSFETs 100a arranged in the LDMOSFET formation region LR100 are coupled in parallel to each other.

However, the semiconductor device CP101 in the first studied example has an interconnect line structure different from that of the semiconductor device CP in the present embodiment.

In the semiconductor device CP101 in the first studied example, only one interconnect line layer is formed so that the source interconnect line M2S100 and the gate interconnect line M2G100 are formed in the same layer. In the semiconductor device CP101 in the first studied example, there is neither an interconnect line layer located under the source interconnect line M2S100 and the gate interconnect line M2G100 nor an interconnect line layer located over the source interconnect line M2S100 and the gate interconnect line M2G100.

In the semiconductor device CP101 in the first studied example, the plurality of unit LDMOSFETs 100a formed in the LDMOSFET formation region LR100 have the source regions ($n^+$-type source regions SR) electrically coupled to each other via the source plugs PGS and the source interconnect line M2S100. The plurality of unit LDMOSFETs 100a formed in the LDMOSFET formation region LR100 also have the drains (lower-concentration n-type drain regions DR1 and higher-concentration $n^+$-type drain regions DR2) electrically coupled to each other via the plugs TL, the substrate main body SB, and the back surface electrode BE (or the plugs TL, the $n^+$-type semiconductor regions NS1, the substrate main body SB, and the back surface electrode BE). The plurality of unit LDMOSFETs 100a formed in the LDMOSFET formation region LR100 also have the gate electrodes GE electrically coupled to each other via a gate plug (not shown) and the gate interconnect line M2G100.

The source interconnect line M2S100 is continuously formed over the entire LDMOSFET formation region LR100. Therefore, the source regions ($n^+$-type source regions SR) of the plurality of unit LDMOSFETs 100a formed in the LDMOSFET formation region LR100 can be electrically coupled to the source interconnect line M2S100. By exposing the source interconnect line M2S100 from the source opening OPS100 of a surface protective film (corresponding to the foregoing insulating film PA), a source pad PDS100 is formed. Note that the source interconnect line M2S100 is electrically coupled to the $n^+$-type source regions SR and the $p^+$-type semiconductor regions PS via the source plugs PGS and are also electrically coupled to the field plate electrodes FP via the field plate plugs PGF.

On the other hand, the gate interconnect line M2G100 integrally includes an interconnect line portion M2G101 extending along the outer periphery of the LDMOSFET formation region LR100, and a pad portion M2G102. The interconnect line portion M2G101 of the gate interconnect line M2G100 two-dimensionally overlaps the end portions of the individual gate electrodes GE of the plurality of unit LDMOSFETs 100a formed in the LDMOSFET formation region LR100. In the regions where the interconnect line portion M2G101 overlaps the end portions of the gate electrodes GE, gate plugs (corresponding to the foregoing gate plugs PGG) are placed and, via the gate plugs, the individual gate electrodes GE are electrically coupled to the interconnect line portion M2G101 of the gate interconnect line M2G100. The pad portion M2G102 of the gate interconnect line M2G100 integrally coupled to the interconnect line portion M2G101 is exposed from the gate opening OPG100 of the surface protective film (corresponding to the foregoing insulating film PA) to form a gate pad PDG100.

The semiconductor device CP101 in the first studied example has the following problem. That is, when the plurality of unit LDMOSFETs formed in the semiconductor substrate are coupled in parallel to each other to form one power MISFET, it is desirable to minimize gate resistance. When the gate resistance is high, the operating speed of the power MISFET is low to degrade the performance of the semiconductor device. When the gate resistance is high, considerable differences occur between the resistances (gate resistances) between the individual gate electrodes GE in the LDMOSFET formation region LR100 and the gate pad PDG100. For example, a considerable difference occurs between the resistance (gate resistance) between the gate electrode GE in the center portion of the LDMOSFET formation region LR100 and the gate pad PDG100 and the resistance (gate resistance) between the gate electrode GE in the peripheral portion of the LDMOSFET formation region LR100 and the gate pad PDG100. In this case, phase differences occur between the gate electrodes GE formed in the LDMOSFET formation region LR100 and increase. This also degrade the performance of the semiconductor device.

Therefore, it is desirable to minimize the gate resistance but, in the semiconductor device CP101 in the first studied example shown in FIGS. 38 to 40, it is difficult to reduce the gate resistance. This is because, in the outer peripheral portion of the LDMOSFET formation region LR100, the gate electrodes GE formed in the LDMOSFET formation region LR100 are coupled to the interconnect line portion M2G101 of the gate interconnect line M2G100 extending along the outer periphery of the LDMOSFET formation region LR100. Since each of the gate electrodes GE has a resistance higher than that of the gate interconnect line M2G100, in the semiconductor device CP101 in the first studied example in which the gate electrodes GE are coupled to the gate interconnect line M2G100 only in the outer peripheral portion of the LDMOSFET formation region LR10, it is difficult to reduce the gate resistance.

Figure 41:
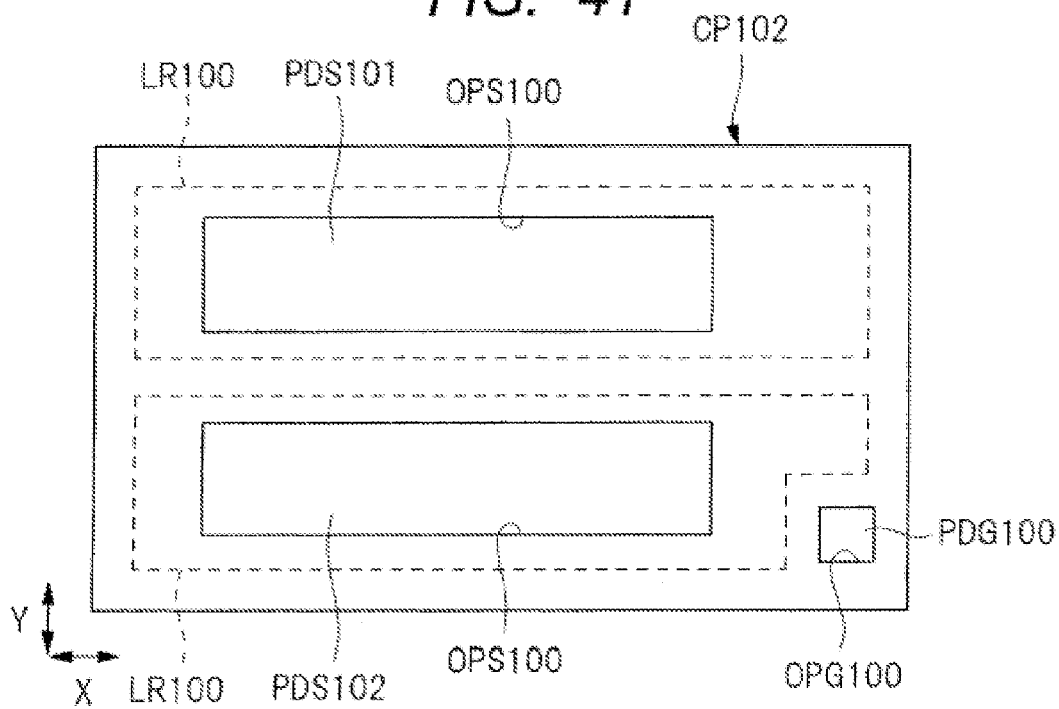
FIG. 41 is an overall plan view of a semiconductor device in a second studied example.
Figure 42:
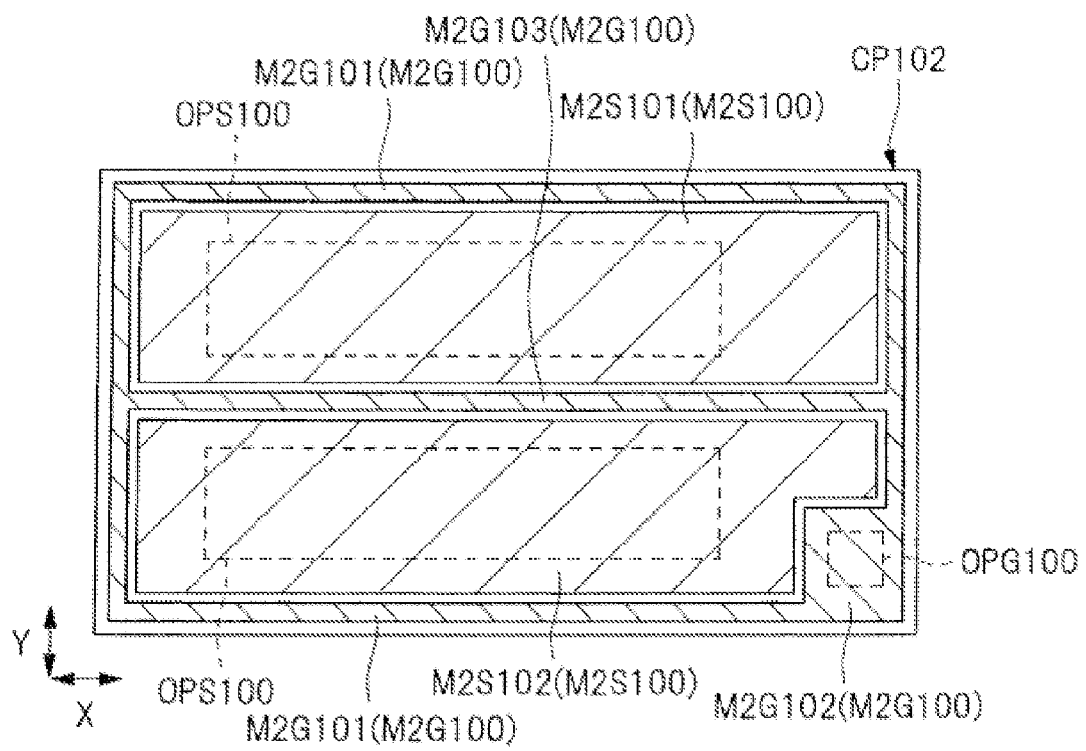
FIG. 42 is an overall plan view of the semiconductor device in the second studied example.
Figure 43:
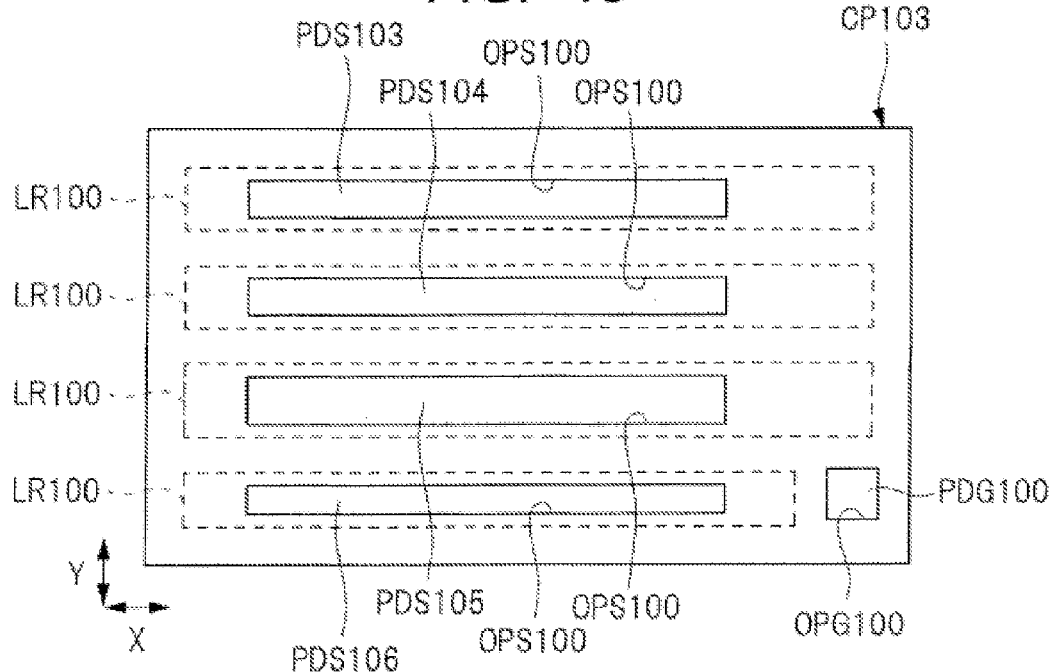
FIG. 43 is an overall plan view of a semiconductor device in a third studied example.
Figure 44:
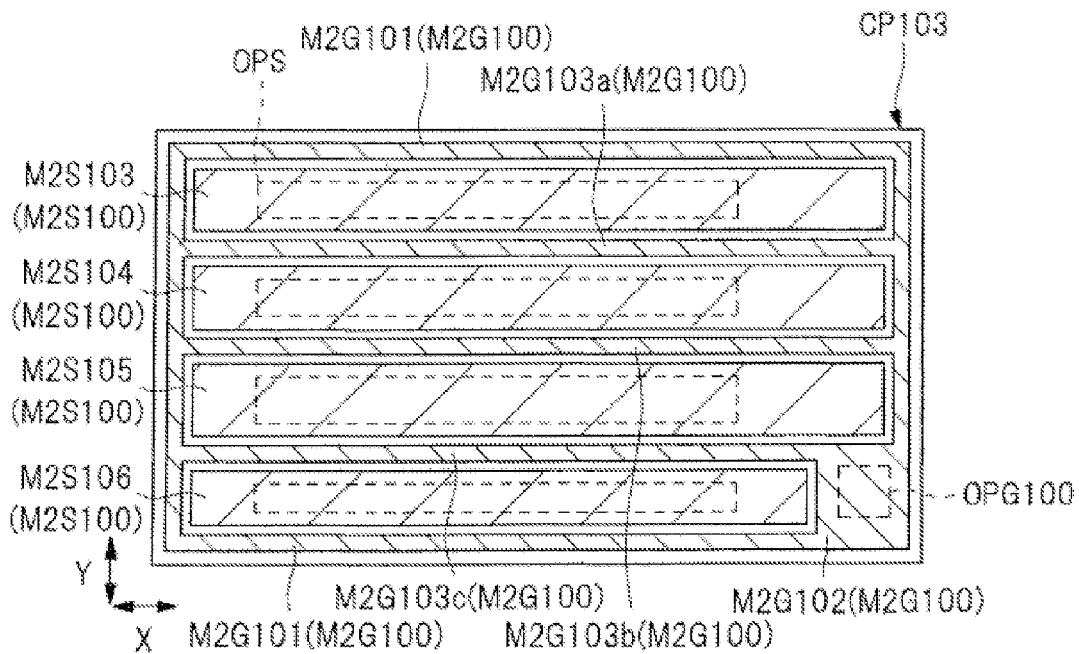
FIG. 44 is an overall plan view of the semiconductor device in the third studied example.

FIGS. 41 and 42 are plan views of a semiconductor device CP102 in a second studied example studied by the present inventors, which respectively correspond to FIGS. 38 and 39 described above. FIGS. 43 and 44 are plan views of a semiconductor device CP103 in a third studied example studied by the present inventors, which respectively correspond to FIGS. 38 and 39 described above.

In the semiconductor device CP102 in the second studied example shown in FIGS. 41 and 42, the gate interconnect line M2G100 includes not only the pad portion M2G102 and the interconnect line portion M2G101 extending in a circular pattern along the outer periphery of the main surface of the semiconductor device CP102, but also an interconnect line portion M2G103. The interconnect line portion M2G103 extends in the X-direction between a source interconnect line M2S101 and a source interconnect line M2S102 in plan view. The interconnect line portion M2G103 has both ends integrally connected to the interconnect line portion M2G101. The interconnect line portion M2G103 is electrically coupled to the gate electrodes GE immediately under the interconnect line portion M2G103 via gate plugs.

In the semiconductor device CP102 in the second studied example, the gate interconnect line M2G100 also has the interconnect line portion M2G103. As a result, the source interconnect line M2S100 is divided into the source interconnect lines M2S101 and M2S102 with the interconnect line portion M2G103 of the gate interconnect line M2G100 being interposed therebetween. The source openings OPS100 are formed in a surface protective film (corresponding to the foregoing insulating film PA) respectively for the source interconnect lines M2S101 and M2S102. The source interconnect line M2S101 is exposed from the source opening OPS100 to form a source pad PDS101. The source interconnect line M2S102 is exposed from the source opening OPS100 to form a source pad PDS102.

In the semiconductor device CP102 in the second studied example shown in FIGS. 41 and 42, the gate interconnect line M2G100 also has the interconnect line portion M2G103. Accordingly, the gate resistance can be reduced to be lower than in the semiconductor device CP101 in the first studied example of FIGS. 38 to 40.

In the semiconductor device CP102 in the second studied example, the gate resistance can be reduced to be lower than in the semiconductor device CP101 in the first studied example, but the following problem arises. That is, the two-dimensional region where the source interconnect lines M2S101 and M2S102 are not placed, i.e., the two-dimensional region required for the placement of the interconnect line portion M2G103 of the gate interconnect line M2G100 cannot effectively be used as the LDMOSFET formation region LR100. This is because, even when source regions are formed, the source regions cannot be led up to the source interconnect lines M2S101 and M2S102. Accordingly, in the semiconductor device CP102 in the second studied example shown in FIGS. 41 and 42, since the gate interconnect line M2G100 also has the interconnect line portion M2G103, the effective area of the LDMOSFET formation region LR100 in the semiconductor device is smaller than in the semiconductor device CP101 in the first studied example in FIGS. 38 to 40. A reduction in the effective area of the LDMOSFET formation region LR100 leads to a reduction in a current flowing when the power MISFET is ON, resulting in an increase in ON resistance.

To suppress the reduction in the effective area of the LDMOSFET formation region LR100, it is effective to reduce the width (dimension in a direction perpendicular to the extending direction of the interconnect line portion M2G103, which is the dimension in the Y-direction herein) of the interconnect line portion M2G103 of the gate interconnect line M2G100. However, to reduce the width of the interconnect line portion M2G103 of the gate interconnect line M2G100, it is also necessary to reduce the thickness of the interconnect line portion M2G103 of the gate interconnect line M2G100. That is, when the thickness of an interconnect line is large, a minimum feature size increases so that it is difficult to reduce the width of the interconnect line. Therefore, the interconnect line having a small width needs to also have a reduced thickness. However, it is undesirable to thin the interconnect line portion M2G103 of the gate interconnect line M2G100 for the following reason. That is, the gate interconnect line M2G100 and the source interconnect line M2S100 are respectively used as the gate pad and the source pad. However, if the pads are thin, when coupling members (such as, e.g., the foregoing wires WA and metal plates MP1 to MP3) are coupled to the pads, couplability may deteriorate or the LDMOSFET elements under the pads (especially the source pad) may be damaged. In addition, reductions in the thicknesses of the gate interconnect line M2G100 and the source interconnect lines M2S100 lead to increases in source resistance and gate resistance. Thus, reductions in the thicknesses of the gate interconnect line M2G100 and the source interconnect line M2S100 result in numerous disadvantages. Therefore, it is difficult to thin the interconnect line portion M2G103 of the gate interconnect line M2G100.

As a result, the interconnect line portion M2G103 of the gate interconnect line M2G100 has a considerably large width. When the gate interconnect line M2G100 thus has the interconnect line portion M2G103 as in the semiconductor device CP102 in the second studied example, the effective area of the LDMOSFET formation region LR100 decreases to reduce a current flowing when the power MISFET is ON, resulting in increased ON resistance.

In the semiconductor device CP103 in the third studied example shown in FIGS. 43 and 44, the gate interconnect line M2G100 includes not only the pad portion M2G102 and the interconnect line portion M2G101 extending in a circular pattern along the outer periphery of the main surface of the semiconductor device CP103, but also interconnect line portions M2G103a, M2G103b, and M2G103c. The interconnect line portions M2G103a, M2G103b, and M2G103c correspond to the interconnect line portion M2G103 in the semiconductor device CP102 in the second studied example. The semiconductor device CP103 in the third studied example corresponds to the case where the semiconductor device CP102 in the second studied example has a larger number of the interconnect line portions M2G103. As a result, the three interconnect line portions M2G103 are provided.

The interconnect line portion M2G103a extends in the X-direction between a source interconnect line M2S103 and a source interconnect line M2S104 in plan view. The interconnect line portion M2G103b extends in the X-direction between the source interconnect line M2S104 and a source interconnect line M2S105 in plan view. The interconnect line portion M2G103c extends in the X-direction between the source interconnect line M2S105 and a source interconnect line M2S106 in plan view. Each of the interconnect line portions M2G103a, M2G103b, and M2G103c has both ends integrally connected to the interconnect line portion M2G101. The interconnect line portions M2G103a, M2G103b, and M2G103c are electrically coupled to the respective gate electrodes GE located immediately thereunder via gate plugs.

In the semiconductor device CP103 in the third studied example, the gate interconnect line M2G100 also has the interconnect line portions M2G103a, M2G103b, and M2G103c. As a result, the source interconnect line M2S100 is divided into the source interconnect lines M2S103, M2S104, M2S105, and M2S106 which are separated from each other by any of the interconnect line portions M2G103a, M2G103b, and M2G103c interposed therebetween.

The source openings OPS100 are formed in a surface protective film (corresponding to the foregoing insulating film PA) respectively for the source interconnect lines M2S103, M2S104, M2S105, and M2S106. The source interconnect line M2S103 is exposed from the source opening OPS100 to form a source pad PDS103. The source interconnect line M2S104 is exposed from the source opening OPS100 to form a source pad PDS104. The source interconnect line M2S105 is exposed from the source opening OPS100 to form a source pad PDS105. The source interconnect line M2S106 is exposed from the source opening OPS100 to form a source pad PDS106.

In the semiconductor device CP103 in the third studied example shown in FIGS. 43 and 44, the gate interconnect line M2G100 also has the interconnect line portions M2G103a, M2G103b, and M2G103c. Accordingly, gate resistance can be reduced to be lower than in the semiconductor device CP101 in the first studied example in FIGS. 38 to 40 and in the semiconductor device CP102 in the second studied example in FIGS. 41 and 42.

However, in the third studied example in FIGS. 43 and 44, the gate interconnect line M2G100 also has the interconnect line portions M2G103a, M2G103b, and M2G103c in the semiconductor device CP103. Accordingly, the effective area of the LDMOSFET formation region LR100 is smaller and a current flowing when the power MISFET is ON further decreases, leading to a further increase in ON resistance.

Thus, providing the gate interconnect line M2G100 with the interconnect line portion M2G103 and increasing the number of the interconnect line portions M2G103 is effective in reducing gate resistance, but leads to increased ON resistance.

The number of the source pads is smallest in the first semiconductor device CP101 in the first studied example and increases in the order of the first semiconductor device CP101 in the first studied example<the semiconductor device CP102 in the second studied example<the semiconductor device CP103 in the third studied example. However, this results in a constraining factor when coupling members (e.g., the foregoing metal plates MP1 to MP3) are coupled to the source pads during the packaging of the semiconductor devices (semiconductor chips). Accordingly, there is a limit to increasing the number of the interconnect line portions M2G103 when consideration is given to the packaging of the semiconductor devices (semiconductor chips). That is, there is a limit to reducing gate resistance by increasing the number of the interconnect line portions M2G103 when consideration is given to the packaging of the semiconductor devices (semiconductor chips). In other words, when consideration is given to the packaging of the semiconductor devices (semiconductor chips), the number of the interconnect line portions M2G103 that can be placed is limited and, in some cases, the interconnect line portions M2G103 may not be able to be placed.

<About Main Characteristic Features and Effects>

The semiconductor device CP in the present embodiment includes the semiconductor substrate SUB, and the plurality of unit LDMOSFETs 10a (unit MISFET elements) formed in the LDMOSFET formation region LR (first MISFET formation region) of the main surface of the semiconductor substrate SUB and coupled in parallel with each other. The semiconductor device CP in the present embodiment further includes an interconnect line structure formed over the semiconductor substrate SUB and having a first interconnect line layer (interconnect lines M1), and a second interconnect line layer (interconnect lines M2) in a layer located over the first interconnect line layer (interconnect lines M1). The first interconnect line layer corresponds to the foregoing interconnect lines M1 and includes the source interconnect lines M1S (first source interconnect line) and the gate interconnect line M1G (first gate interconnect line). The second interconnect line layer corresponds to the foregoing interconnect lines M2 and includes the source interconnect line M2S (second source interconnect line) and the gate interconnect line M2G (second gate interconnect line). Each of the source interconnect lines M1S and the gate interconnect line M1G has the thickness (T1) smaller (thinner) than the thickness (T2) of each of the source interconnect line M2S and the gate interconnect line M2G.

Each of the plurality of unit LDMOSFETs 10a formed in the LDMOSFET formation region LR includes the source region ($n^+$-type source region SR) formed in the semiconductor substrate SUB, the drain region (n-type lower-concentration drain region DR1 and the higher-concentration $n^+$-type drain region DR2) formed in the semiconductor substrate SUB, and the gate electrode GE formed over the semiconductor substrate SUB located between the source region and the drain region via the gate insulating film GI. The plurality of unit LDMOSFETs 10a formed in the LDMOSFET formation region LR have the respective drain regions electrically coupled to the back surface electrode BE via the conductive plugs TL embedded in the trenches TR of the semiconductor substrate SUB to be electrically coupled to each other. The plurality of unit LDMOSFETs 10a formed in the LDMOSFET formation region LR have the respective source regions electrically coupled to each other via the source interconnect lines M1S and the source interconnect line M2S. The plurality of unit LDMOSFETs 10a formed in the LDMOSFET formation region LR have the respective gate electrodes GE electrically coupled to each other via the gate interconnect line M1G and are also electrically coupled to the gate interconnect line M2G via the gate interconnect line M1G.

One of the main characteristic features of the semiconductor device in the present embodiment is that the interconnect line structure formed over the semiconductor substrate SUB has the first interconnect line layer (interconnect lines M1), and the second interconnect line layer (interconnect lines M2) in the layer located over the first interconnect line layer (interconnect lines M1), the first interconnect line layer (interconnect lines M1) includes the source interconnect lines M1S and the gate interconnect line M1G, and the second interconnect line layer has the source interconnect line M2S and the gate interconnect line M2G.

Another one of the main characteristic features of the semiconductor device in the present embodiment is that each of the source interconnect lines M1S and the gate interconnect line M1G has the thickness (T1) smaller (thinner) that the thickness (T2) of each of the source interconnect line M2S and the gate interconnect line M2G.

Still another one of the main characteristic features of the semiconductor device in the present embodiment is that the gate interconnect line M1G (first gate interconnect line) extends over the plugs TL.

In each of the semiconductor devices CP101, CP102, and CP103 in the foregoing first to third studied examples, only one interconnect line layer is formed so that the source interconnect line M2S100 and the gate interconnect line M2G100 are formed in the same layer. As a result, in each of the semiconductor devices CP101, CP102, and CP103 in the foregoing first to third studied examples, the source interconnect lines and the gate interconnect lines cannot be placed so as to overlap each other in plan view.

By contrast, in the present embodiment, the interconnect line layer has the first interconnect line layer (interconnect lines M1) and the second interconnect line layer (interconnect lines M2). This allows the gate interconnect lines and the source interconnect lines to overlap each other in plan view. That is, in each of the first to third studied examples, at a position overlapping the source interconnect line M2S100 in plan view, the gate interconnect line M2G100 cannot be placed. By contrast, in the present embodiment, the source interconnect lines M1S and the gate interconnect line M1G are provided in the layer located under the source interconnect line M2S and the gate interconnect line M2G. This allows the gate interconnect line M1G to be placed at a position overlapping the source interconnect line M2S in plan view. Thus, the gate interconnect line M1G can be provided under the source interconnect line M2S and, as a result of providing the gate interconnect line M1G, the gate resistance can accordingly be reduced.

In addition, each of the interconnect lines M1 has the thickness T1 smaller (thinner) than the thickness T2 of each of the interconnect lines M2. Accordingly, each of the source interconnect lines M1S and the gate interconnect line M1G has the thickness (T1) smaller (thinner) than the thickness (T2) of each of the source interconnect line M2S and the gate interconnect line M2G. This allows the gate interconnect line M1G having a small thickness to be subjected to microfabrication and allows a reduction in the width thereof (dimension in a direction perpendicular to the extending direction thereof). As a result, even when the gate interconnect line M1G is provided to extend in the LDMOSFET formation region LR, it is possible to suppress a reduction in the effective area of the LDMOSFET formation region LR compared to the case where the gate interconnect line M2G is provided to extend in the LDMOSFET formation region LR.

Moreover, since the gate interconnect line M1G is placed in the layer located under the source interconnect line M2S, even when the gate interconnect line M1G is provided to extend in the LDMOSFET formation region LR, the source interconnect line M2S need not be divided due to the gate interconnect line M1G. As a result, even when there is a limit to the number of the source pads, the area occupied thereby, or the positions thereof due to constraints encountered when coupling members (e.g., the foregoing metal plates MP1 to MP3) are coupled to the source pads during the packaging of the semiconductor device (semiconductor chip), the gate interconnect line M1G can be provided to extend in the LDMOSFET formation region LR despite such a limit. In other words, since the layout of the gate interconnect line M1G in the LDMOSFET formation region LR does not limit the number of the source pads, the area occupied thereby, or the positions thereof, the source pads (PDS) can be provided under optimum conditions (number, area, and positions) in consideration of the packaging of the semiconductor device (semiconductor chip).

Additionally, each of the interconnect lines M2 has the thickness T2 larger (thicker) than the thickness T1 of each of the interconnect lines M1. Accordingly, each of the source interconnect line M2S and the gate interconnect line M2G has the thickness (T2) larger (thicker) than the thickness (T1) of each of the source interconnect lines M1S and the gate interconnect line M1G. As a result, even though the thicknesses of the source interconnect lines M1S and the gate interconnect line M1G in the lower layer are reduced so as to allow miniaturization, the thicknesses of the source interconnect line M2S and the gate interconnect line M2G are increased to be able to reduce the possibility of encountering problems when the source interconnect line M2S and the gate interconnect line M2G are respectively used as the source pad and the gate pad. For example, if the pads are thin, when coupling members (such as, e.g., the foregoing wires WA or the metal plates MP1 to MP3) are coupled to the pads, it may be possible that couplability deteriorates or the LDMOSFET elements under the pads (especially the source pad) are damaged. However, by increasing the thicknesses of the source interconnect line M2S and the gate interconnect line M2G, such a possibility can be eliminated. In addition, increasing the thicknesses of the source interconnect line M2S and the gate interconnect line M2G leads to reductions in source resistance and gate resistance.

In the present embodiment, to reduce the gate resistance, the gate interconnect line M1G is provided to extend in the LDMOSFET formation region LR and the layout thereof has been inventively modified.

That is, in the present embodiment, the gate interconnect line M1G extends over the plugs TL. More specifically, the gate interconnect line M1G extends over the plugs TL in the Y-direction.

Here, the Y-direction corresponds to the extending direction of each of the gate electrodes GE. The plugs TL extend in the Y-direction between the gate electrodes GE adjacent to each other (in the X-direction) with the drain region being interposed therebetween.

In the present embodiment, one of the main characteristic features is that the gate interconnect line M1G extends over the plugs TL. When the gate interconnect line M1G extends (more specifically, extends in the Y-direction) over the plugs TL, it is possible to allow the gate interconnect line M1G to extend (more specifically extend in the Y-direction) without increasing the size of each of the unit cells 10 as the unit of repetition in the LDMOSFET formation region LR.

In the present embodiment, the respective drain regions of the plurality of unit LDMOSFETs 10a formed in the LDMOSFET formation region LR are electrically coupled to the back surface electrode BE via the plugs TL or the like. In the first interconnect line layer (interconnect lines M1), no drain interconnect line (interconnect line coupled to the drains of the unit LDMOSFETs 10a) is provided. Accordingly, there is no need to provide an interconnect line coupled to the plugs TL over the plugs TL. As the first interconnect line layer (interconnect lines M1), the source interconnect lines M1S are formed. However, the source interconnect lines M1S are not extended to positions over the plugs TL. Over the plugs TL, the source interconnect lines M1S are not provided, but the gate interconnect line M1G is placed such that no vacant space is formed over the plugs TL.

In the case where the interconnect line structure of the semiconductor device CP101 in the foregoing first studied example is to be changed to an interconnect line structure having two interconnect line layers, when the drain interconnect line need not be formed, it is assumed that, similarly to the source interconnect line M2S100 in FIG. 40, the source interconnect line is formed all over in each of the lower interconnect line layer and the upper interconnect line layer in the same cross section as the cross section of FIG. 40 described above. That is, it is assumed that, over the plugs TL, each of the lower-layer source interconnect line and the upper-layer source interconnect line is placed. This is because, when a reduction in gate resistance is not recognized as a task to be achieved, it is assumed that the source interconnect line M2S100 in FIG. 40 described above is used as each of the lower-layer source interconnect line and the upper-layer source interconnect line without modification.

However, the present inventors appropriately use the interconnect line structure having the first interconnect line layer (interconnect lines M1) and the second interconnect line layer (interconnect lines M2), while giving consideration to a reduction in gate resistance. The present inventors use the interconnect line structure of the semiconductor device CP101 in the foregoing first studied example for the layout of the upper second interconnect line layer (interconnect lines M2), while inventively modifying the layout of the lower first interconnect line layer (interconnect lines M1). In the first interconnect line layer, the region over the plugs TL is used not as the region where the source interconnect lines M1S are placed, but as the region where the gate interconnect line M1G is placed. Having noticed that it is unnecessary to place an interconnect line to be coupled to the plugs TL and that it is necessary to reduce the gate resistance, the present inventors have provided the gate interconnect line M1G which extends over the plugs TL. This allows the gate interconnect line M1G to extend (in the Y-direction) in the LDMOSFET formation region LR without increasing the size (dimension in the X-direction) of each of the unit cells 10 as the unit of repetition in the LDMOSFET formation region LR.

Figure 45:
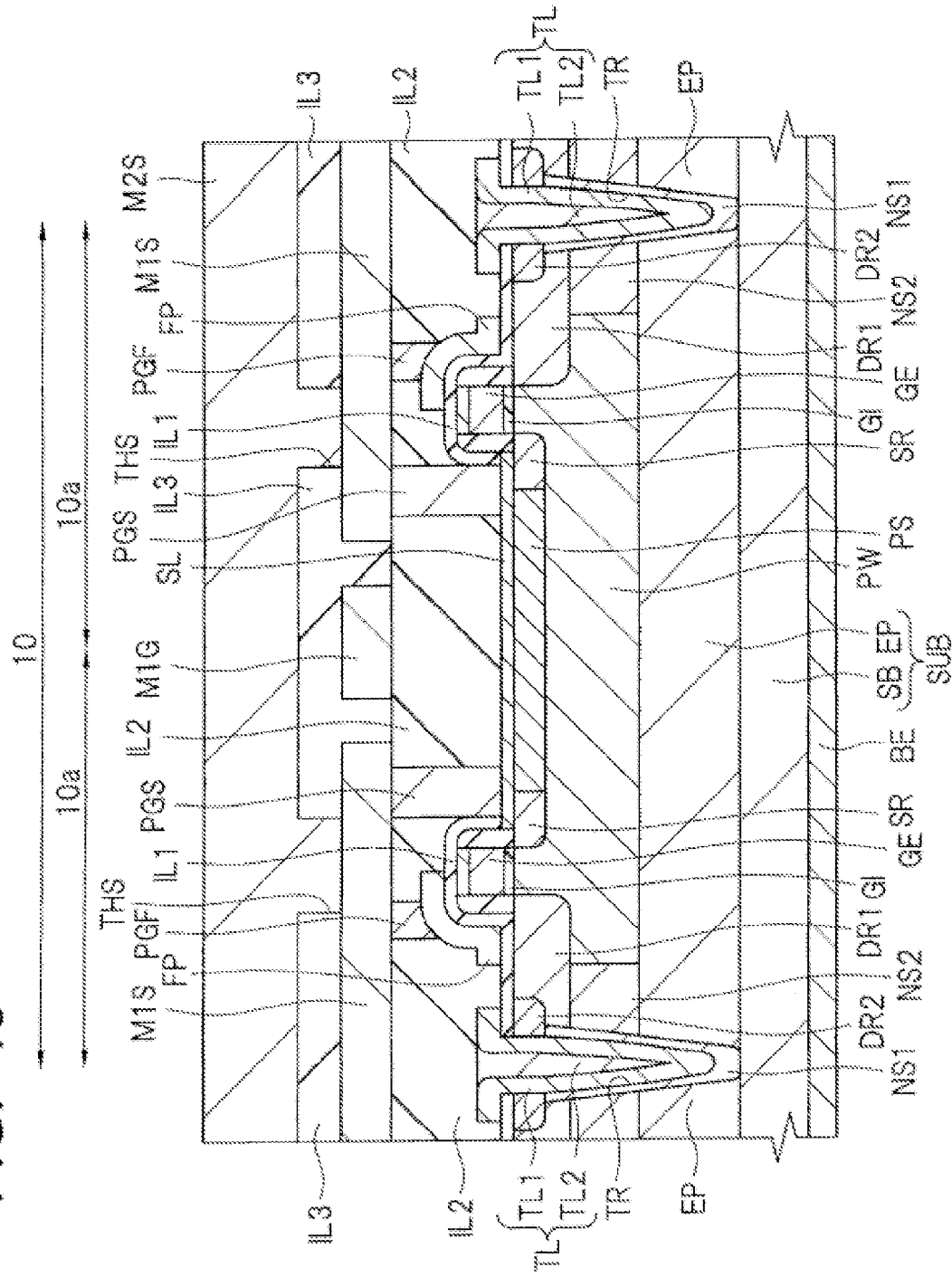
FIG. 45 is a main-portion cross-sectional view of a semiconductor device in a fourth studied example.

FIG. 45 is a main-portion cross-sectional view of a semiconductor device in a fourth studied example studied by the present inventors. FIG. 45 shows a cross-sectional view corresponding to FIG. 8 described above.

In the semiconductor device in the fourth studied example shown in FIG. 45, unlike in the present embodiment, the gate interconnect line M1G is placed not over the plugs TL, but on the source side, while the source interconnect lines M1S are provided to extend also over the plugs TL.

In the case of the semiconductor device in the fourth studied example shown in FIG. 45, the gate interconnect line M1G is provided on the source side to extend in the Y-direction (a direction perpendicular to the surface of a paper sheet with FIG. 45 corresponds to the Y-direction). However, as can be seen from a comparison with the present embodiment shown in FIG. 8, the size (dimension in X-direction) of each of the unit cells 10 as the unit of repetition in the LDMOSFET formation region LR has increased. As a result, in the case of the semiconductor device in the fourth studied example shown in FIG. 45, compared to the case of the semiconductor device in the present embodiment shown in FIG. 8, the number of the unit LDMOSFETs 10a that can be placed in the LDMOSFET formation region LR is reduced. This leads to a reduction in the current flowing when the power MISFET is ON and leads to an increase in ON resistance.

By contrast, in the present embodiment, having noticed that the drain region is electrically coupled to the back surface electrode BE via the plugs TL and it is unnecessary to provide a drain interconnect, the present inventors have provided the gate interconnect line M1G which extends (more specifically, extends in the Y-direction) over the plugs TL. As a result, there is no increase in the size of each of the unit cells 10 due to the gate interconnect line M1G placed over the plugs TL.

Also in the present embodiment, the present inventors have provided the gate interconnect line M1G which extends over the plugs TL. As a result, the source interconnect line M1S cannot be placed over the plugs TL. Accordingly, the area occupied by the source interconnect lines M1S is smaller in the present embodiment shown in FIG. 8 than in the fourth studied example shown in FIG. 45. However, since the source interconnect lines M1S are coupled to the source interconnect line M2S located immediately thereover, even when the area occupied by the source interconnect lines M1S is reduced, the reduced area is unlikely to lead to an increase in source resistance. Therefore, a disadvantage is unlikely to arise.

Also in the present embodiment, over the LDMOSFET formation region LR, the gate interconnect line M1G integrally has the portions each extending in the Y-direction and the portions each extending in the X-direction. The portions of the gate interconnect line M1G each extending in the Y-direction extend over the plugs TL in the Y-direction. In other words, in the present embodiment, over the LDMOSFET formation region LR, the gate interconnect line M1G has a two-dimensional structure in which the plurality of interconnect line portions each extending in the Y-direction and the plurality of interconnect line portions each extending in the X-direction are integrally connected. The interconnect line portions each extending in the Y-direction extend over the plugs TL in the Y-direction.

Of the gate interconnect line M1G, the portions extending over the plugs TL (more specifically, the portions each extending in the Y-direction) are located immediately over the plugs TL and therefore do not function to reduce the effective area of the LDMOSFET formation region LR. On the other hand, of the gate interconnect line M1G, the portions each extending in the X-direction are located immediately over the regions which do not function as the LDMOSFETs and therefore function to reduce the effective area of the LDMOSFET formation region LR. However, as described above, the gate interconnect line M1G has the thickness smaller (thinner) than the thickness of each of the gate interconnect line M2G and the source interconnect line M2S. Accordingly, the width of the gate interconnect line M1G can be reduced. Thus, in the LDMOSFET formation region LR, the width of the gate interconnect line M1G extending in the X-direction can be reduced. As a result, it is possible to suppress a reduction in the effective area of the LDMOSFET formation region LR due to the gate interconnect line M1G extending in the X-direction.

Even when the number of the interconnect line portions each extending in the X-direction is increased in the gate interconnect line M1G, the shape and size of the source interconnect line M2S are not affected thereby. As a result, it is possible to increase the number of the interconnect line portions extending in the X-direction in the gate interconnect line M1G without affecting the source interconnect line M2S and the source pad.

Since the thickness of the gate interconnect line M1G is small, in the gate interconnect line M1G, the width of each of the interconnect line portions extending in the X-direction can be reduced to be smaller (narrower) than the width of the interconnect line portion M2G103 in the second studied example in FIGS. 41 and 42 described above. Accordingly, when the effective area of the LDMOSFET formation region LR is set equal to the effective area of the foregoing LDMOSFET formation region LR100, the number of the interconnect line portions of the gate interconnect line M1G each extending in the X-direction can be increased to be larger than the number of the interconnect line portions M2G103 in the second studied example in FIGS. 41 and 42 described above. As a result, when the present embodiment and the second studied example in FIGS. 41 and 42 described above are compared to each other, the present invention allows a larger number of gate interconnect lines (each corresponding to the gate interconnect line M1G in the present embodiment and corresponding to the interconnect line portion M2G103 in the second studied example) to be provided to extend in the X-direction in the LDMOSFET formation region (LR or LR100), while ensuring the effective area of the LDMOSFET formation region LR. Therefore, it can be said that, when the present embodiment and the second studied example in FIGS. 41 and 42 described above are compared to each other, the present embodiment can achieve a further reduction in gate resistance, while ensuring the effective area of the LDMOS- FET formation region LR. It can also be said that the present embodiment can achieve a further increase in the effective area of the LDMOSFET formation region LR, while ensuring low gate resistance. An increase in the effective area of the LDMOSFET formation region LR leads to an increase in the current flowing in the ON state and leads to a reduction in ON resistance. As a result, in the present embodiment, it is possible to achieve both a reduction in gate resistance and a reduction in ON resistance. Therefore, it is possible to improve the performance of the semiconductor device.

Also in the present embodiment, the portions of the gate interconnect line M1G each extending in the Y-direction are located not over the gate electrodes GE, but over the plugs TL. Accordingly, the source interconnect lines M1S can also be provided to extend over the gate electrodes GE. As a result, compared to the case where the portions of the gate interconnect line M1G each extending in the Y-direction are placed over the gate electrodes GE, the present embodiment in which the portions of the gate interconnect line M1G each extending in the Y-direction are placed over the plugs TL can achieve a further increase in the dimension of each of the source interconnect lines M1S in the X-direction and can accordingly achieve an increase in the area occupied by the source interconnect lines M1S.

In the present embodiment, the portions of the gate interconnect line M1G each extending in the Y-direction are placed not over the gate electrodes GE, but over the plugs TL. As a result, the source interconnect lines M1S can easily be coupled not only to the source regions ($n^+$-type source regions SR), but also to the field plate electrodes FP.

That is, each of the unit LDMOSFETs 10a has the source region ($n^+$-type source region SR), the drain region (lower-concentration n-type drain region DR1 and higher-concentration $n^+$-type drain region DR2), and the gate electrode GE formed over the semiconductor substrate SUB located between the source region and the drain region via the gate insulating film GI. Preferably, each of the unit LDMOSFET 10a further has the field plate electrode FP. By having the field plate electrode FP, each of the unit LDMOSFETs 10a is allowed to have a further improved breakdown voltage. Each of the field plate electrodes FP is coupled to the source interconnect line M1S to have the same potential as that of the source region ($n^+$-type source region SR). By placing the portions of the gate interconnect line M1G each extending in the Y-direction over the plugs TL as in the present embodiment, each of the source interconnect lines M1S is allowed to extend continuously from over the source region ($n^+$-type source region SR) to over the field plate electrode FP. This allows the source interconnect line M1S to be coupled easily and properly to each of the source region ($n^+$-type source region SR) and the field plate electrode FP.

In the present embodiment, each of the interconnect lines M2 (which are the source interconnect line M2S and the gate interconnect line M2G herein) has the thickness T2 larger (thicker) than the thickness T1 of each of the interconnect lines M1 (which are the source interconnect lines M1S and the gate interconnect line M1G herein). Preferably, the thickness T2 of each of the interconnect lines M2 (which are the source interconnect line M2S and the gate interconnect line M2G herein) is not less than double the thickness T1 of each of the interconnect lines M1 (which are the source interconnect lines M1S and the gate interconnect line M1G). Since each of the interconnect lines M1 is thinner than each of the interconnect lines M2, the minimum feature size of the interconnect line M1 is smaller than the minimum feature size of the interconnect line M2.

By way of example, the thickness of each of the interconnect lines M1 can be set to about 0.5 μm and the thickness of each of the interconnect lines M2 can be set to about 3.5 μm. In this case, the minimum feature size of the interconnect line M1 is about 0.5 μm and the minimum feature size of the interconnect line M2 is about 5 to 15 μm so that the minimum feature size of the interconnect line M1 is not more than 1/10 of the minimum feature size of the interconnect line M2. As a result, when the present embodiment is compared to the foregoing second studied example, even if the number of the interconnect line portions of the gate interconnect line M1G each extending in the X-direction in the present embodiment is assumed to be 10, the effective area of the LDMOSFET formation region LR can be set equal to or larger than the effective area of the foregoing LDMOSFET formation region LR100 in the foregoing second studied example. Thus, when the present embodiment is compared to the foregoing first to third studied examples, it can be said that the present embodiment can achieve a further reduction in gate resistance, while ensuring the effective area of the LDMOSFET formation region LR or can achieve a further increase in the effective area of the LDMOSFET formation region LR, while ensuring low gate resistance. Therefore, in the present embodiment, it is possible to achieve each of a reduction in gate resistance and a reduction in ON resistance. For example, when the present embodiment and Embodiments 2 and 3 described later are compared to the foregoing first to third studied examples, the present embodiment and Embodiments 2 and 3 can reduce the gate resistance in the foregoing first to third studied examples to about half, while maintaining the effective area of the LDMOSFET formation region LR.

Embodiment 2

Figure 46:
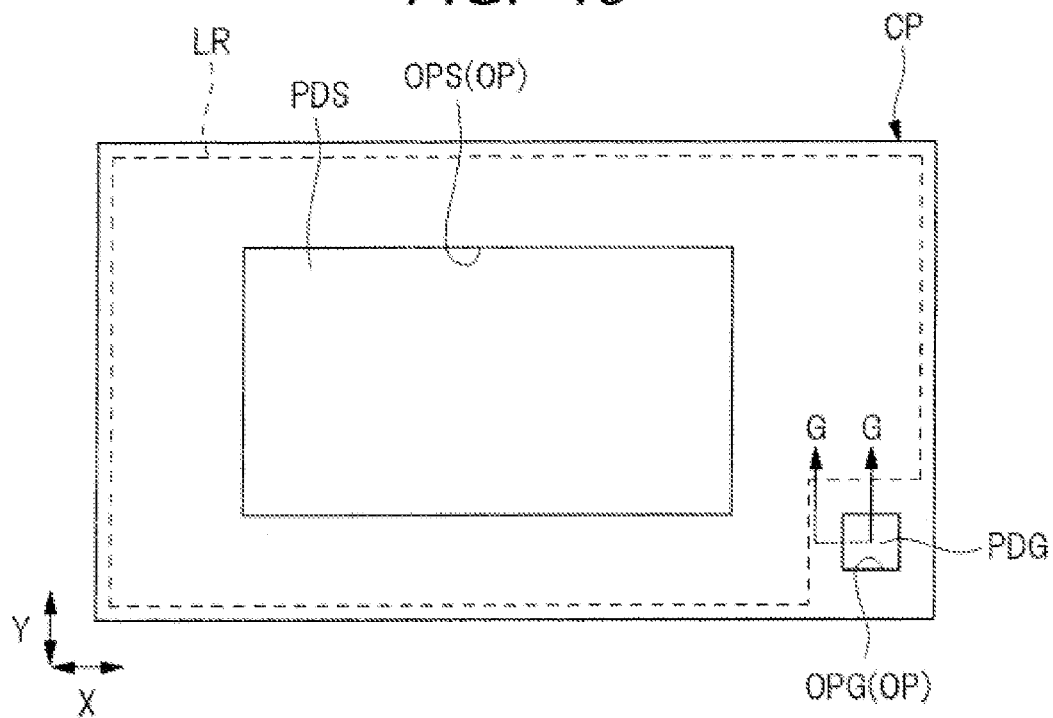
FIG. 46 is an overall plan view of a semiconductor device in another embodiment.
Figure 47:
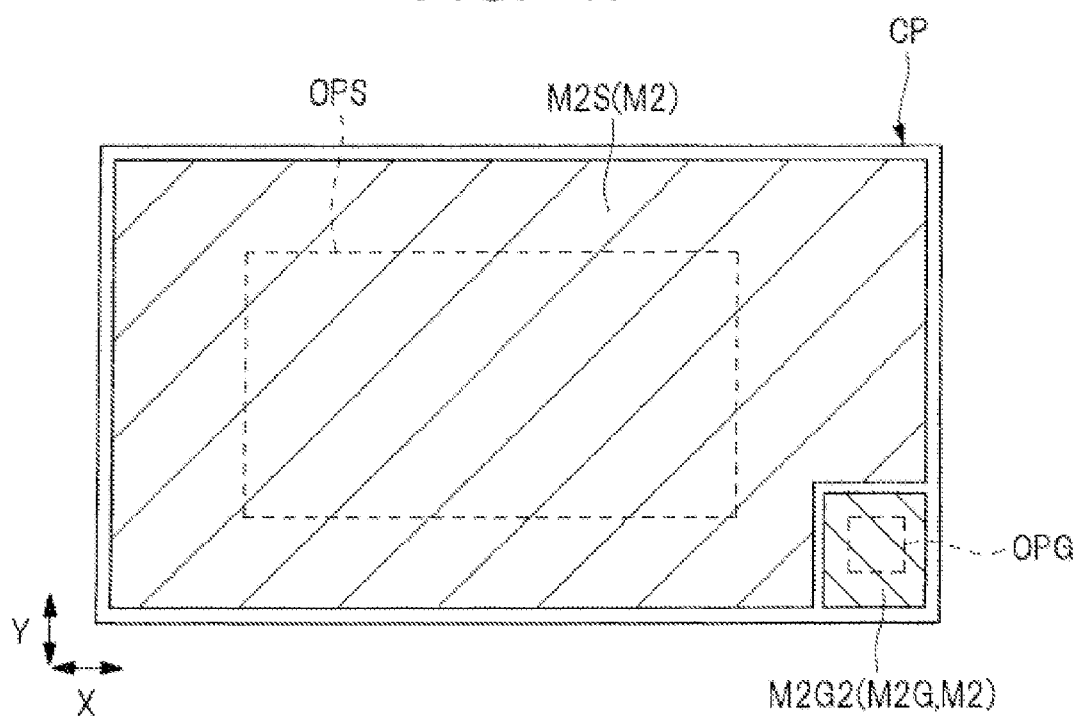
FIG. 47 is an overall plan view of the semiconductor device in the other embodiment.
Figure 48:
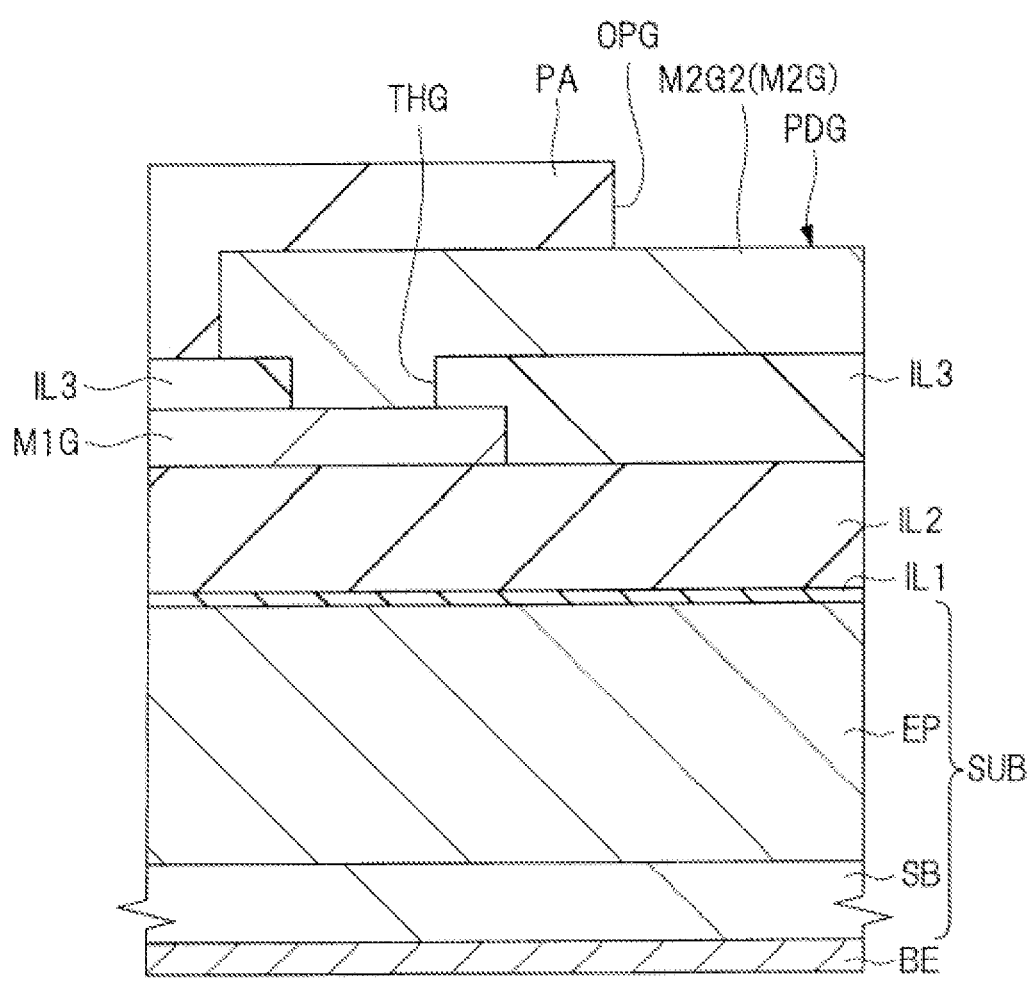
FIG. 48 is a main-portion cross-sectional view of the semiconductor device in the other embodiment.

FIGS. 46 and 47 are overall plan views of the semiconductor device (semiconductor chip) CP in Embodiment 2, which respectively correspond to FIGS. 1 and 2 in Embodiment 1 each described above. FIG. 48 is a main-portion cross-sectional view of the semiconductor device CP in Embodiment 2. A cross-sectional view along the line G-G in FIG. 46 substantially corresponds to FIG. 48.

In Embodiment 1 described above, as can also be seen from FIG. 2 described above, the gate interconnect line M2G has not only the pad portion M2G2, but also the interconnect line portion M2G1 extending around the LDMOSFET formation region LR along the outer periphery of the LDMOSFET formation region LR. In the semiconductor device CP, the major part of the main surface serves as the LDMOSFET formation region LR. Accordingly, the interconnect line portion M2G1 of the gate interconnect line M2G extending around the LDMOSFET formation region LR along the outer periphery of the LDMOSFET formation region LR extends in a circular pattern along the outer periphery of the main surface of the semiconductor device CP.

Embodiment 2 is the same as Embodiment 1 in that the gate interconnect line M2G has the pad portion M2G2 and the pad portion M2G2 of the gate interconnect line M2G is exposed from the gate opening OPG of the insulating film PA to serve as the gate pad PDG.

However, as can also be seen from FIG. 47, in Embodiment 2, the gate interconnect line M2G has no equivalent to the foregoing interconnect line portion M2G1 in Embodiment 1 described above. That is, in Embodiment 2, the gate interconnect line M2G does not extend around the LDMOSFET formation region LR along the outer periphery of the LDMOSFET formation region LR, As a result, in Embodiment 2, the gate interconnect line M2G does not extend in a circular pattern along the outer periphery of the main surface of the semiconductor device CP.

In Embodiment 2, at least a part of the pad portion M2G2 of the gate interconnect line M2G overlaps the gate interconnect line M1G in plan view. In the region where the pad portion M2G2 overlaps the gate interconnect line M1G, the gate interconnect line M2G (pad portion M2G2) is electrically coupled to the gate interconnect line M1G via the via portion (portion embedded in the gate through hole THG) of the gate interconnect line M2G. That is, by causing a part of the gate interconnect line M1G to overlap the pad portion M2G2 of the gate interconnect line M2G and placing the gate through hole THG in the region where the pad portion M2G2 overlaps the gate interconnect line M1G, the pad portion of the gate interconnect line M2G is electrically coupled to the gate interconnect line M1G located thereunder via the via portion (portion embedded in the gate through hole THG) of the gate interconnect line M2G. Specifically, a part of the gate interconnect line M1G is extended to a position overlapping the pad portion M2G2 of the gate interconnect line M2G in plan view, and the pad portion M2G2 of the gate interconnect line M2G is electrically coupled to the gate interconnect line M1G located thereunder via the via portion of the gate interconnect line M2G.

Thus, in Embodiment 2, from the gate interconnect line M2G, the foregoing interconnect line portion M2G1 extending around the LDMOSFET formation region LR along the outer periphery of the LDMOSFET formation region LR is omitted. Also, in Embodiment 2, the gate interconnect line M1G has a part overlapping the pad portion M2G2 of the gate interconnect line M2G in plan view and the pad portion M2G2 of the gate interconnect line M2G is electrically coupled to the gate interconnect line M1G located immediately thereunder via the via portion of the gate interconnect line M2G. Otherwise, the semiconductor device CP2 in Embodiment 2 has basically the same configuration as that of the semiconductor device CP in Embodiment 1 described above so that a repeated description thereof is omitted herein.

In the same manner as in Embodiment 1 described above, in Embodiment 2 also, the plurality of unit LDMOSFETs 10a are formed in the LDMOSFET formation region LR. The plurality of unit LDMOSFETs 10a have the respective gates GE electrically coupled to the gate interconnect line M1G via the gate plugs PGG and are also electrically coupled to each other via the gate interconnect line M1G. That is, in the same manner as in Embodiment 1 described above, in Embodiment 2 also, even when the gate interconnect line M2G is not provided, the respective gate electrodes GE of the plurality of unit LDMOSFETs 10a formed in the LDMOSFET formation region LR can be electrically coupled to each other via the gate plugs PGG and the gate interconnect line M1G.

As a result, in Embodiment 2, the gate interconnect line M2G does not extend around the LDMOSFET formation region LR along the outer periphery of the LDMOSFET formation region LR. However, the respective gate electrodes GE of the plurality of unit LDMOSFETs 10a formed in the LDMOSFET formation region LR can be electrically coupled to each other via the gate plugs PGG and the gate interconnect line M1G. Therefore, from the gate pad PDG, a common gate potential (gate voltage) can be supplied to the gate electrodes GE of the plurality of unit LDMOSFETs 10a formed in the LDMOSFET formation region LR through the gate interconnect line M1G and the gate plugs PGG.

In Embodiment 2, substantially the same effect as obtained in Embodiment 1 described above can be obtained. In addition, the following effect can also be obtained in Embodiment 2.

That is, in Embodiment 2, the gate interconnect line M2G does not extend around the LDMOSFET formation region LR along the outer periphery of the LDMOSFET formation region LR, i.e., the gate interconnect line M2G does not extend along the outer periphery of the main surface of the semiconductor device CP. This allows a reduction in the area occupied by the region where the gate interconnect line M2G is placed. It is to be noted here that the region immediately under the gate interconnect line M2G cannot be used as the foregoing active regions AR. This is because, since the source interconnect lines M1S need to be formed immediately over the foregoing $n^+$-type source regions SR of the LDMOSFET formation region LR and the source interconnect line M2S needs to be placed immediately over the source interconnect lines M1S, the gate interconnect line M2G cannot be placed immediately over the foregoing $n^+$-type source region SR and therefore it is difficult to place the gate interconnect line M2G immediately over the foregoing active regions AR. In Embodiment 2, from the gate interconnect line M2G, the portion corresponding to the foregoing interconnect line portion M2G1 is omitted. This allows the foregoing active regions AR to be placed even under the region where the forgoing interconnect line portion M2G1 has been placed and thus allows an increase in the area (effective area) of the LDMOSFET formation region LR. As a result, it is possible to increase the total value of the current flowing in the ON state and further reduce ON resistance. Also in Embodiment 2, by omitting the portion corresponding to the foregoing interconnect line portion M2G1 from the gate interconnect line M2G, it is also possible to reduce the area of the semiconductor device (semiconductor chip), while maintaining the area of the LDMOSFET formation region LR. Therefore, Embodiment 2 is also advantageous in terms of reducing the size (area) of the semiconductor device.

On the other hand, in Embodiment 1, the gate interconnect line M2G has the interconnect line portion M2G1 to allow a further reduction in gate resistance compared to the case where the gate interconnect line M2G does not have the interconnect line portion M2G1. Therefore, in terms of minimizing the gate resistance, Embodiment 1 described above is advantageous over Embodiment 2.

FIGS. 49 and 50 are overall plan views of a semiconductor device (semiconductor chip) CP in a modification of Embodiment 2, which respectively correspond to FIGS. 46 and 47 described above.

In the case of the semiconductor device CP in FIGS. 46 and 47 described above, on the corner portion of the main surface of the semiconductor device CP, the pad portion M2G2 of the gate interconnect line M2G is placed and consequently the gate pad PDG is also placed on the corner portion of the main surface of the semiconductor device CP. The pad portion M2G2 of the gate interconnect line M2G is placed at the position adjacent to the LDMOSFET formation region LR, but is not peripherally surrounded by the LDMOSFET formation region LR.

By contrast, in the case of the semiconductor device CP in FIGS. 49 and 50, the pad portion M2G2 has been moved to a position on the main surface of the semiconductor device CP which is interior to (closer to the center than) that in the case of the semiconductor device CP in FIGS. 46 and 47 described above. As a result, in the case of the semiconductor device CP in FIGS. 49 and 50, the pad portion M2G2 is peripherally surrounded by the LDMOSFET formation region LR. In such a case also, as shown in FIG. 48 described above, it is possible to electrically couple the pad portion M2G2 to the gate interconnect line M1G via the via portion of the gate interconnect line M2G (pad portion M2G2) in the region where the pad portion M2G2 overlaps the gate interconnect line M1G in plan view.

In Embodiment 2, no equivalent to the foregoing interconnect line portion M2G1 is formed. As a result, there is no need to route the pad portion M2G2 using the interconnect line portion along the outer periphery of the semiconductor device CP. This can enhance the degree of freedom in determining the position on the main surface of the semiconductor device CP where the pad portion M2G2 is to be placed. That is, in Embodiment 2, since the gate interconnect line M2G has no interconnect line portion connected to the pad portion M2G2, the pad portion M2G2 can be placed at any position on the main surface of the semiconductor device CP. This allows the gate pad PDG to be placed at any position on the main surface of the semiconductor device CP. Accordingly, the gate pad PDG can be placed at an optimum position on the main surface of the semiconductor device CP in consideration of the coupling of a coupling member (e.g., wire WA) to the gate pad PDG.

Embodiment 3

Figure 51:
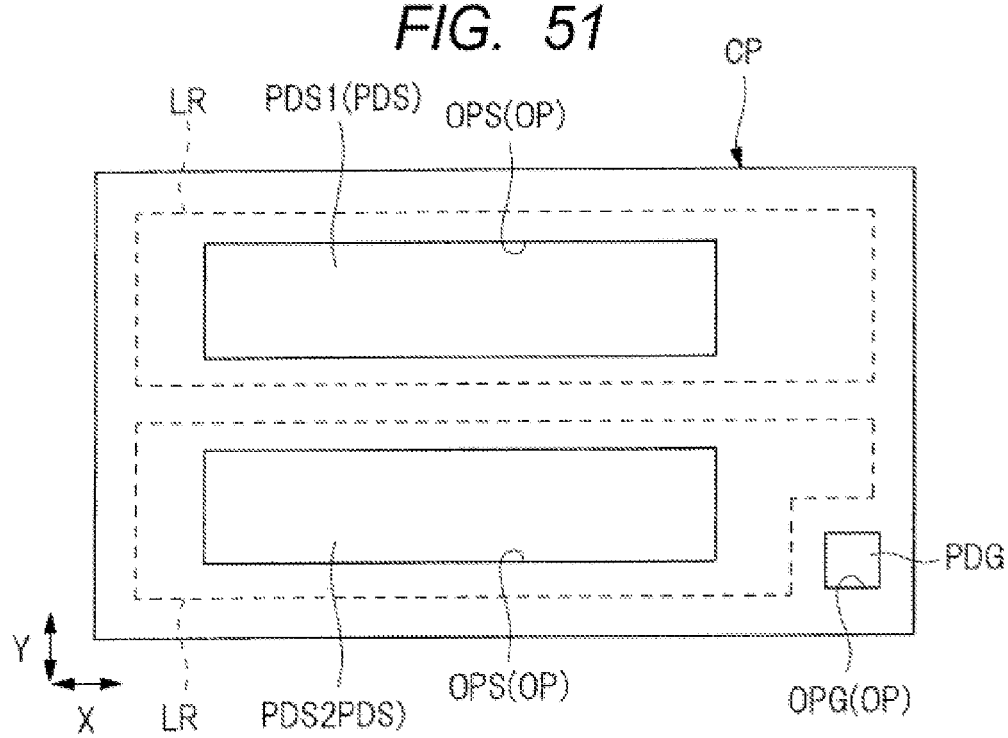
FIG. 51 is an overall plan view of a semiconductor device in yet another embodiment.
Figure 52:
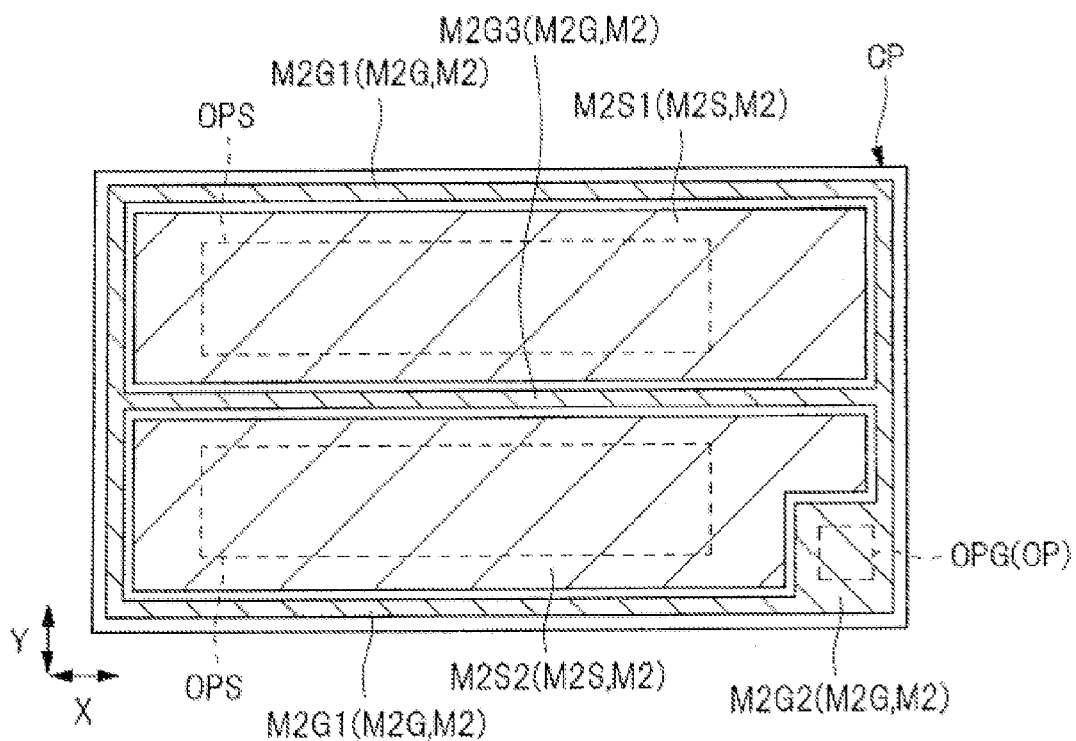
FIG. 52 is an overall plan view of the semiconductor device in the yet other embodiment.

FIGS. 51 and 52 are overall plan views of the semiconductor device (semiconductor chip) CP in Embodiment 3, which respectively correspond to FIGS. 1 and 2 in Embodiment 1 each described above.

In Embodiment 1 described above, the gate interconnect line M2G has not only the pad portion M2G2, but also the interconnect line portion M2G1 extending around the LDMOSFET formation region LR along the outer periphery of the LDMOSFET formation region LR. Also, in Embodiment 1 described above, the major part of the main surface of the semiconductor device CP serves as the LDMOSFET formation region LR. Consequently, the interconnect line portion M2G1 of the gate interconnect line M2G extending around the LDMOSFET formation region LR along the outer periphery of the LDMOSFET formation region LR extends in a circular pattern along the outer periphery of the main surface of the semiconductor device CP.

Embodiment 3 is the same as Embodiment 1 in that the gate interconnect line M2G has the pad portion M2G2 and the pad portion M2G2 of the gate interconnect line M2G is exposed from the gate opening OPG to serve as the gate pad PDG.

However, in Embodiment 3, the gate interconnect line M2G not only has the pad portion M2G2 and the interconnect line portion M2G1 extending in a circular pattern along the outer periphery of the main surface of the semiconductor device CP, but also has an interconnect line portion M2G3. The interconnect line portion M2G3 extends between source interconnect lines M2S1 and M2S2 (specifically, extends in the X-direction) in plan view. The interconnect line portion M2G3 has both ends integrally connected to the interconnect line portion M2G1. The gate interconnect line M1G extends immediately under the interconnect line portion M2G3. The interconnect line portion M2G3 is electrically coupled to the gate interconnect line M1B via the via portion of the interconnect line portion M2G3. The interconnect line portion M2G3 is electrically coupled to the gate interconnect line M1G immediately under the interconnect line portion M2G3 via the via portion (portion embedded in the gate through hole THG). That is, the gate through hole THG is located in the region where the interconnect line portion M2G3 overlaps the gate interconnect line M1G in plan view. The interconnect line portion M2G3 is electrically coupled to the gate interconnect line M1G via the via portion (portion embedded in the gate through hole THG).

The source interconnect line M2S needs to be spaced apart from the gate interconnect line M2G. Accordingly, in the case of Embodiment 3, the source interconnect line M2S is divided into the two source interconnect lines M2S1 and M2S2 between which the interconnect line portion M2G3 of the gate interconnect line M2G is interposed. That is, between the source interconnect lines M2S1 and M2S2, the interconnect line portion M2G3 of the gate interconnect line M2G extends (specifically, extends in the X-direction). The source interconnect lines M2S1 and M2S2 are each peripherally surrounded by the gate interconnect line M2G in plan view.

In the insulating film PA, the respective source openings OPS are provided for the source interconnect lines M2S1 and M2S2. The source interconnect line M2S1 exposed from the source opening OPS provided for the source interconnect line M2S1 forms a source pad PDS1. The source interconnect line M2S2 exposed from the source opening OPS provided for the source interconnect line M2S2 forms a source pad PDS2. Thus, in the semiconductor device CP in FIGS. 51 and 52, as the source pad PDS, the source pads PDS1 and PDS2 are formed. The interconnect line portion M2G3 of the gate interconnect line M2G extends between the source pads PDS1 and PDS2 (specifically, extends in the X-direction) in plan view.

When the semiconductor device CP is viewed as a discrete and independent element, the source interconnect lines M2S1 and M2S2 are detached and are not coupled to each other via a conductor. However, in a semiconductor package in which the semiconductor device CP has been packaged, to the source interconnect lines M2S1 and M2S2, a common potential (voltage) is applied. That is, in the semiconductor package in which the semiconductor device CP has been packaged, the source interconnect lines M2S1 and M2S2 are electrically coupled to each other via a conductor (conductive coupling member). For example, in the case of the foregoing semiconductor device PKG1, the foregoing metal plate MP1 is coupled to each of the source pads PDS1 and PDS2. As a result, the source interconnect lines M2S1 and M2S2 are electrically coupled to each other via the foregoing metal plate MP1. In the case of the foregoing semiconductor device PKG1a, in the semiconductor chip CP1, the foregoing metal plate MP2 is coupled to each of the source pads PDS1 and PDS2. As a result, the source interconnect lines M2S1 and M2S2 are electrically coupled to each other via the foregoing metal plate MP2. Also, in the case of the foregoing semiconductor device PKG1a, in the semiconductor chip CP2, the foregoing metal plate MP3 is coupled to each of the source pads PDS1 and PDS2. As a result, the source interconnect lines M2S1 and M2S2 are electrically coupled to each other via the foregoing metal plate MP3.

In Embodiment 3, substantially the same effect as obtained in Embodiment 1 described above can be obtained. In addition, the following effect can also be obtained in Embodiment 3.

That is, in Embodiment 3, by inventively modifying the gate interconnect line M1G in the same manner as in Embodiment described above, the gate resistance can be reduced. In addition, by further having the interconnect line portion M2G3, the gate interconnect line M2G can achieve a further reduction in gate resistance. Therefore, in terms of minimizing the gate resistance, Embodiment 3 is advantageous over Embodiment 1.

However, in terms of increasing the effective area of the LDMOSFET formation region LR and reducing the ON resistance, Embodiments 1 and 2 described above are advantageous over Embodiment 3.

That is, in Embodiment 3, even when the source regions are formed, the source regions cannot be led up to the source interconnect line M2S. Accordingly, the two-dimensional region required for the placement of the gate interconnect line portion M2G3 of the gate interconnect line M2G cannot effectively be used as the LDMOSFET formation region LR. In other words, the region immediately under the interconnect line portion M2G3 of the gate interconnect line M2G is formed not of the foregoing active regions AR, but of the foregoing isolation regions ST between the active regions AR. Accordingly, in the case of Embodiment 3, the effective area of the LDMOSFET formation region LR in the semiconductor device is smaller than in the case of Embodiments 1 and 2 described above in which there is no equivalent to the interconnect line portion M2G3.

By contrast, in Embodiments 1 and 2 described above, the gate interconnect line M2G has no equivalent to the interconnect line portion M2G3. Accordingly, in Embodiments 1 and 2 described above, the foregoing active regions AR can be placed even in the two-dimensional region required for the provision of the interconnect line portion M2G3 in Embodiment 3. As a result, in Embodiments 1 and 2 described above, the effective area of the LDMOSFET formation region LR can be increased and the current flowing in the ON state can be increased to allow a further reduction in ON resistance. Also, in Embodiments 1 and 2 described above, the portion corresponding to the interconnect line portion M2G3 is omitted. This allows a reduction in the area of the semiconductor device (semiconductor chip), while maintaining the same effective area of the LDMOSFET formation region LR. Therefore, Embodiments 1 and 2 are also advantageous in terms of reducing the size (area) of the semiconductor device.

In a modification of Embodiment 3, the number of the interconnect line portions M2G3 extending in the X-direction can also be increased. That is, in the case of FIGS. 51 and 52, the number of the interconnect line portions M2G3 is one and the one interconnect line portion M2G3 extending in the X-direction extends between the two source interconnect lines (i.e., between the source interconnect lines M2S1 and M2S2) into which the source interconnect line M2S has been divided. The number of the interconnect line portions M2G3 can also be set to two or more. For example, when the number of the interconnect line portions M2G3 is set to two, the source interconnect line M2S is divided into three source interconnect lines such that the interconnect line portions M2G3 extending in the X-direction are interposed therebetween. Consequently, the interconnect line portions M2G3 extend in the X-direction between the source interconnect lines into which the source interconnect line M2S has been divided. At this time, the respective source pads PDS are provided for the three source interconnect lines into which the source interconnect line M2S has been divided. Using the same way of thinking, the number of the interconnect line portions M2G3 can be increased.

Embodiment 4

In each of Embodiments 1 to 3 described above, the LDMOSFETs are formed in the semiconductor device (semiconductor chip) CP, the drains of the LDMOSFETs are coupled to the back surface electrode BE, the gates of the LDMOSFETs are led up to the gate pad using the gate interconnect lines, and the sources of the LDMOSFETs are led up to the source pad using the source interconnect lines.

On the other hand, in Embodiment 4, the LDMOSFETs are formed in the semiconductor device (semiconductor chip) CP, the sources of the LDMOSFET are coupled to the back surface electrode BE, the gate electrodes of the LDMOSFETs are led up to a gate pad using gate interconnect lines, and the drains of the LDMOSFETs are led up to a drain pad using drain interconnect lines.

Referring to the drawings, a description will be given below of the semiconductor device (semiconductor chip) in Embodiment 4.

Figure 55:
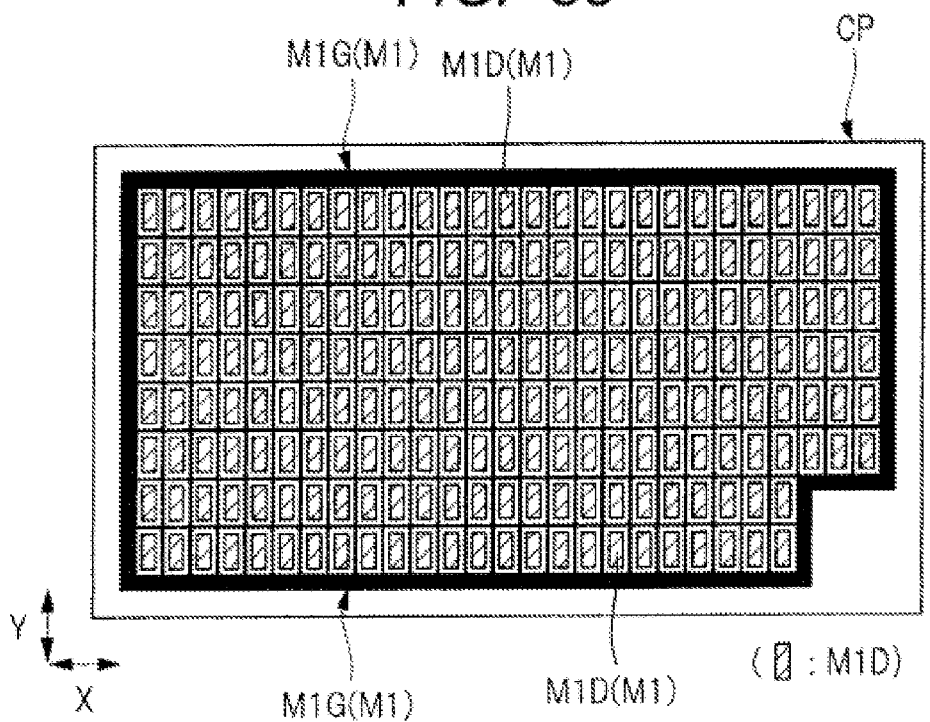
FIG. 55 is an overall plan view of the semiconductor device in the still other embodiment.
Figure 56:
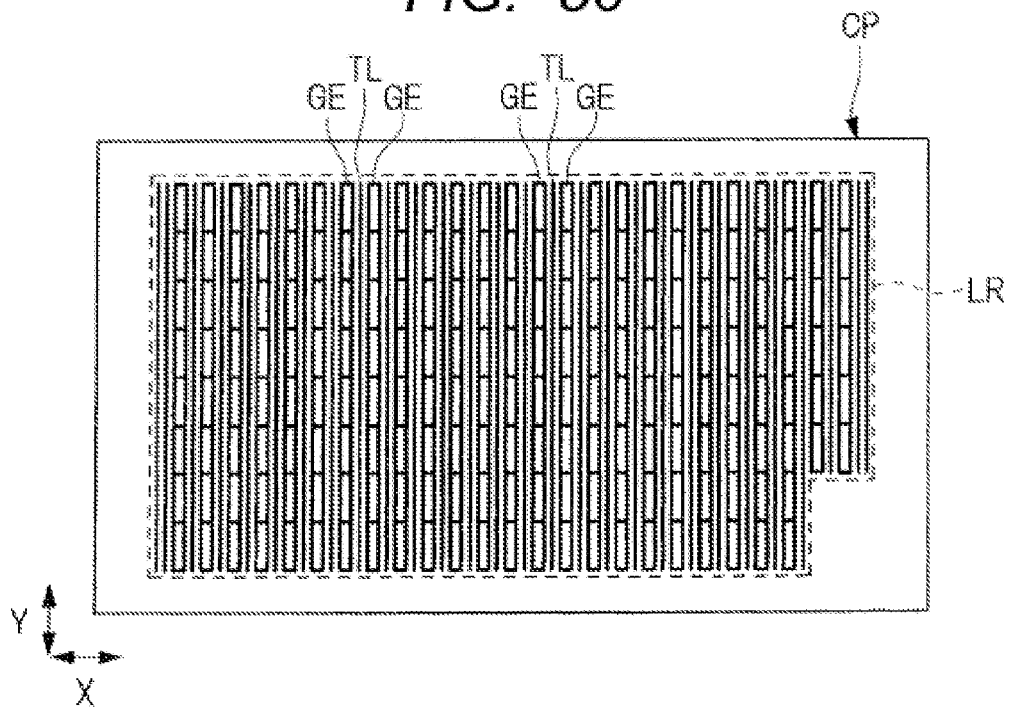
FIG. 56 is an overall plan view of the semiconductor device in the still other embodiment.
Figure 57:
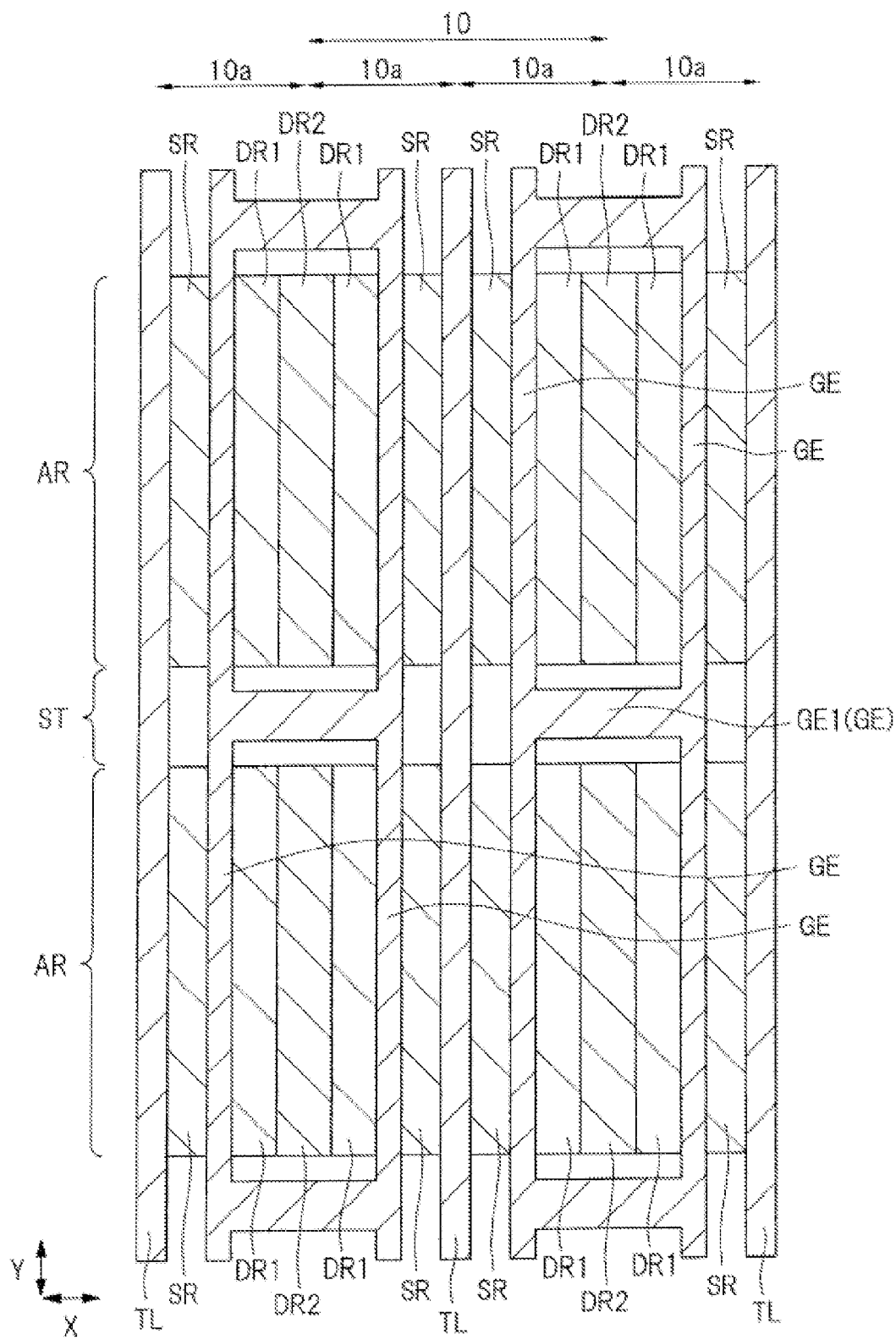
FIG. 57 is a main-portion plan view of the semiconductor device in the still other embodiment.
Figure 58:
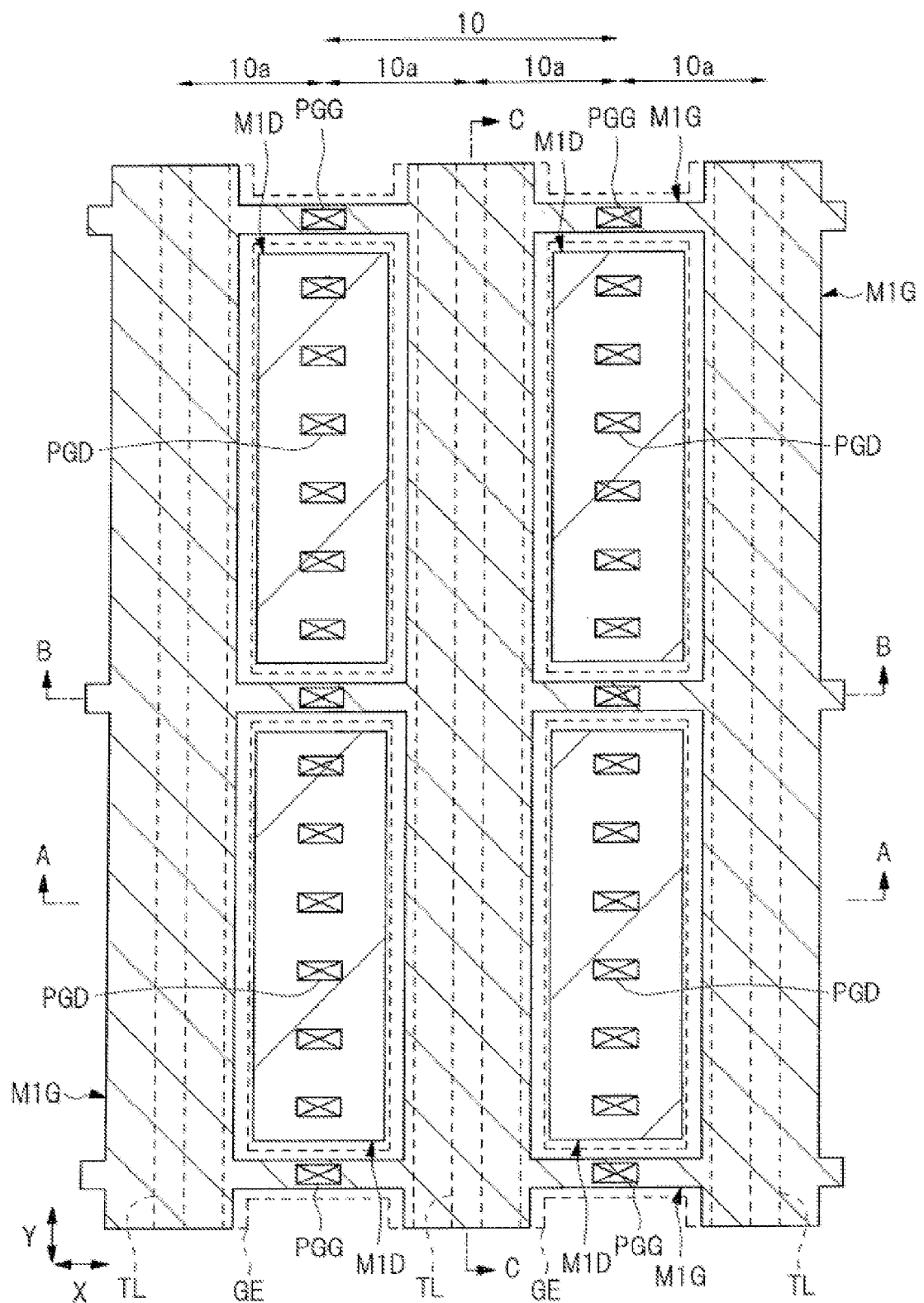
FIG. 58 is a main-portion plan view of the semiconductor device in the still other embodiment.
Figure 59:
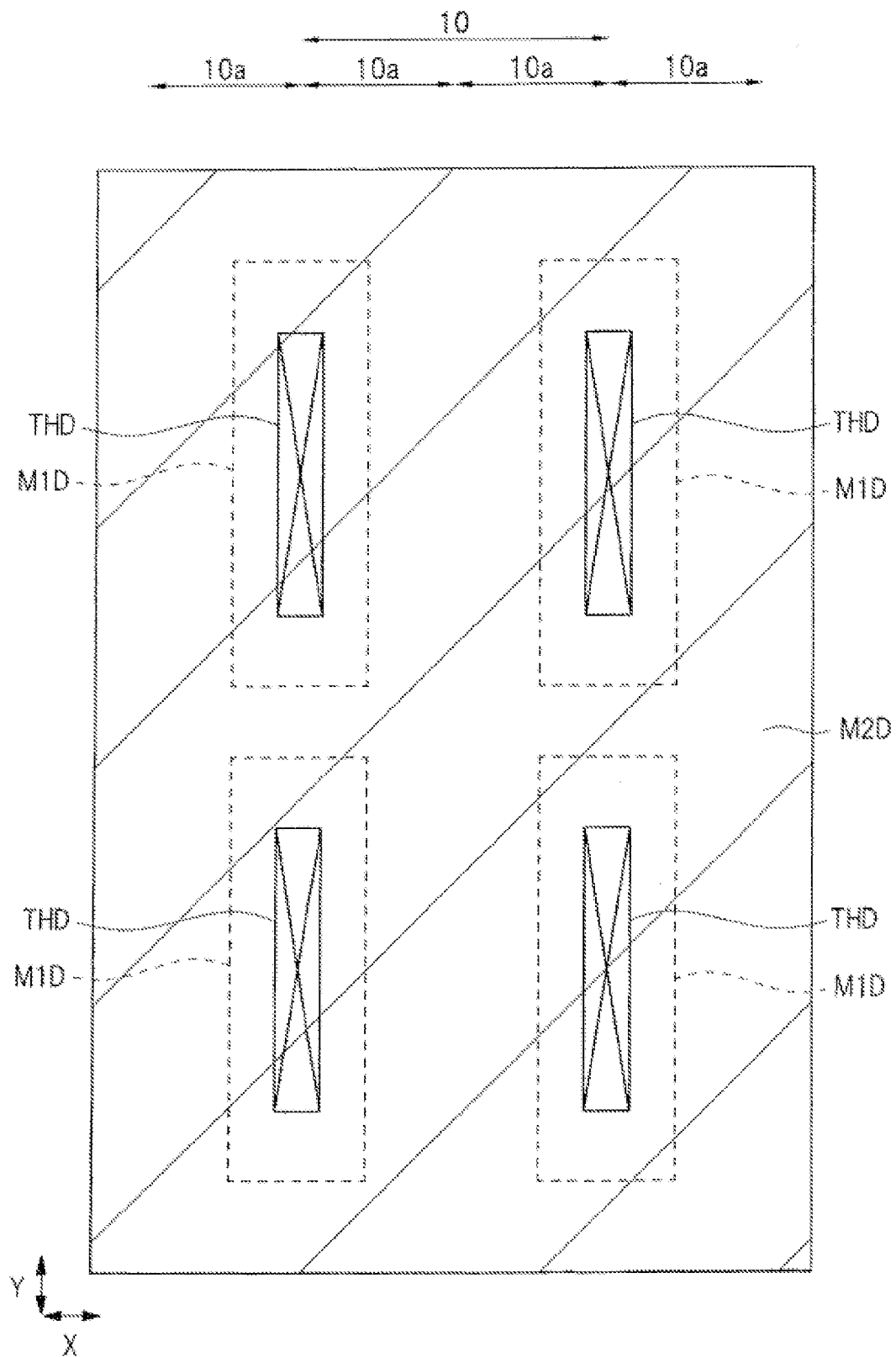
FIG. 59 is a main-portion plan view of the semiconductor device in the still other embodiment.

FIGS. 53 to 56 are overall plan views of the semiconductor device (semiconductor chip) CP in Embodiment 4, which respectively correspond to FIGS. 1 to 4 in Embodiment 1 each described above. FIGS. 57 to 59 are main-portion plan views of the semiconductor device CP in Embodiment 4, which respectively correspond to FIGS. 5 to 7 in Embodiment 1 each described above. FIGS. 60 to 63 are main-portion cross-sectional views of the semiconductor device CP in Embodiment 4, which respectively correspond to FIGS. 8 to 11 in Embodiment 1 each described above.

Figure 53:
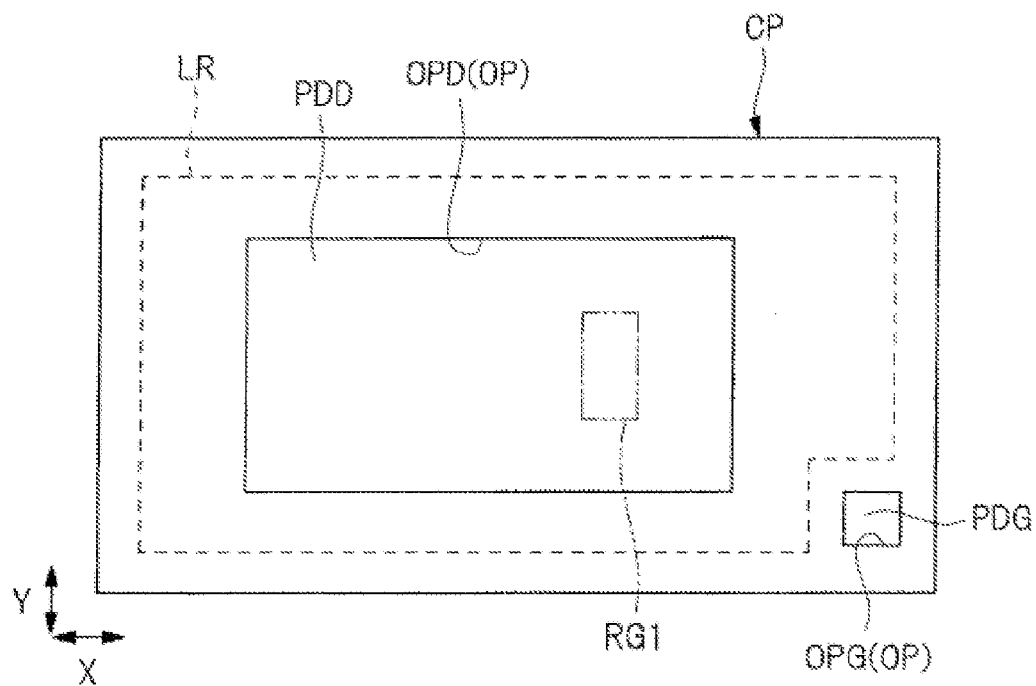
FIG. 53 is an overall plan view of a semiconductor device in still another embodiment.
Figure 54:
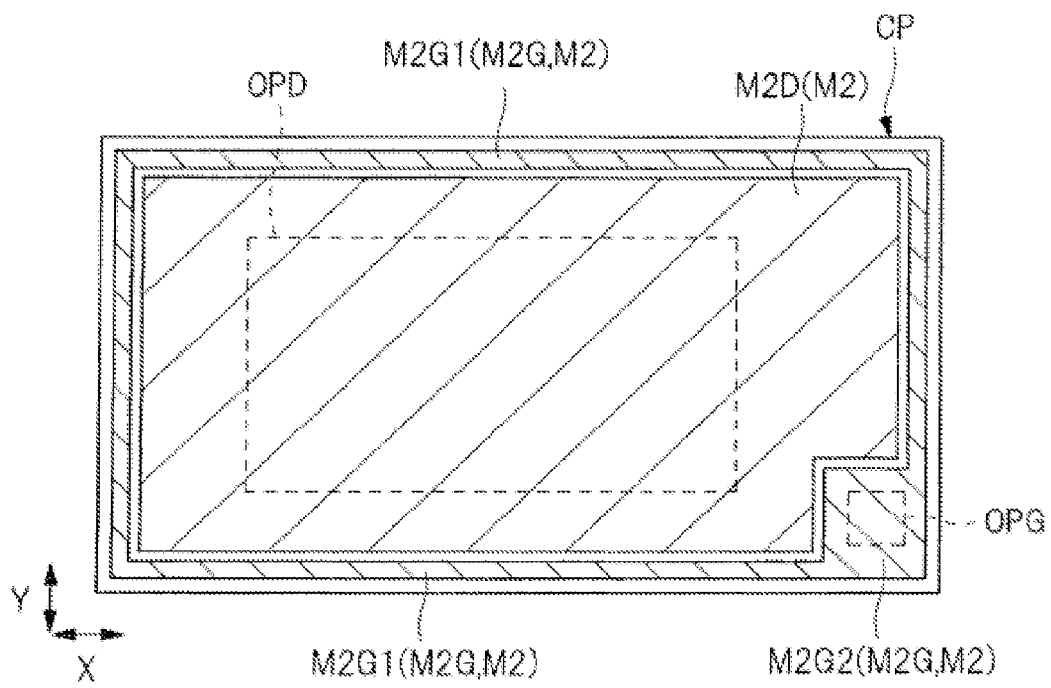
FIG. 54 is an overall plan view of the semiconductor device in the still other embodiment.

FIG. 53 shows a top view of the semiconductor device CP. FIG. 54 shows a two-dimensional layout of the interconnect lines M2 (which are a drain interconnect line M2D and the gate interconnect line M2G). FIG. 55 shows a two-dimensional layout of the interconnect lines M1 (which are drain interconnect lines M1D and the gate interconnect line M1G). FIG. 56 shows a two-dimensional layout of the gate electrodes GE and the plugs TL. FIGS. 54 and 55 are plan views but, for easier understanding thereof, the drain interconnect line M2D and the gate interconnect line M2G are obliquely hatched in FIG. 54, while the drain interconnect lines M1D are obliquely hatched and the gate interconnect line M1G is shown by the thick solid line in FIG. 55. Also, in FIG. 56, the gate electrodes GE and the plugs TL are shown by the solid lines.

Enlarged illustration of the region RG1 enclosed in the two-dot-dash line shown in FIG. 53 corresponds to FIGS. 57 to 59. FIGS. 57 to 59 show different layers. That is, FIG. 57 shows a two-dimensional layout of the gate electrodes GE, the source regions ($n^+$-type source regions SR), the drain regions (lower-concentration n-type drain regions DR1 and higher-concentration $n^+$-type drain regions DR2), and the plugs TL, which are hatched. FIG. 58 shows a two-dimensional layout of the interconnect lines M1 (i.e., drain interconnect lines M1D and gate interconnect line M1G), which are hatched. FIG. 59 shows a two-dimensional layout of the interconnect line M2 (which is the drain interconnect line M2D in FIG. 59). In FIG. 59, the drain interconnect line M2D is hatched.

Figure 60:
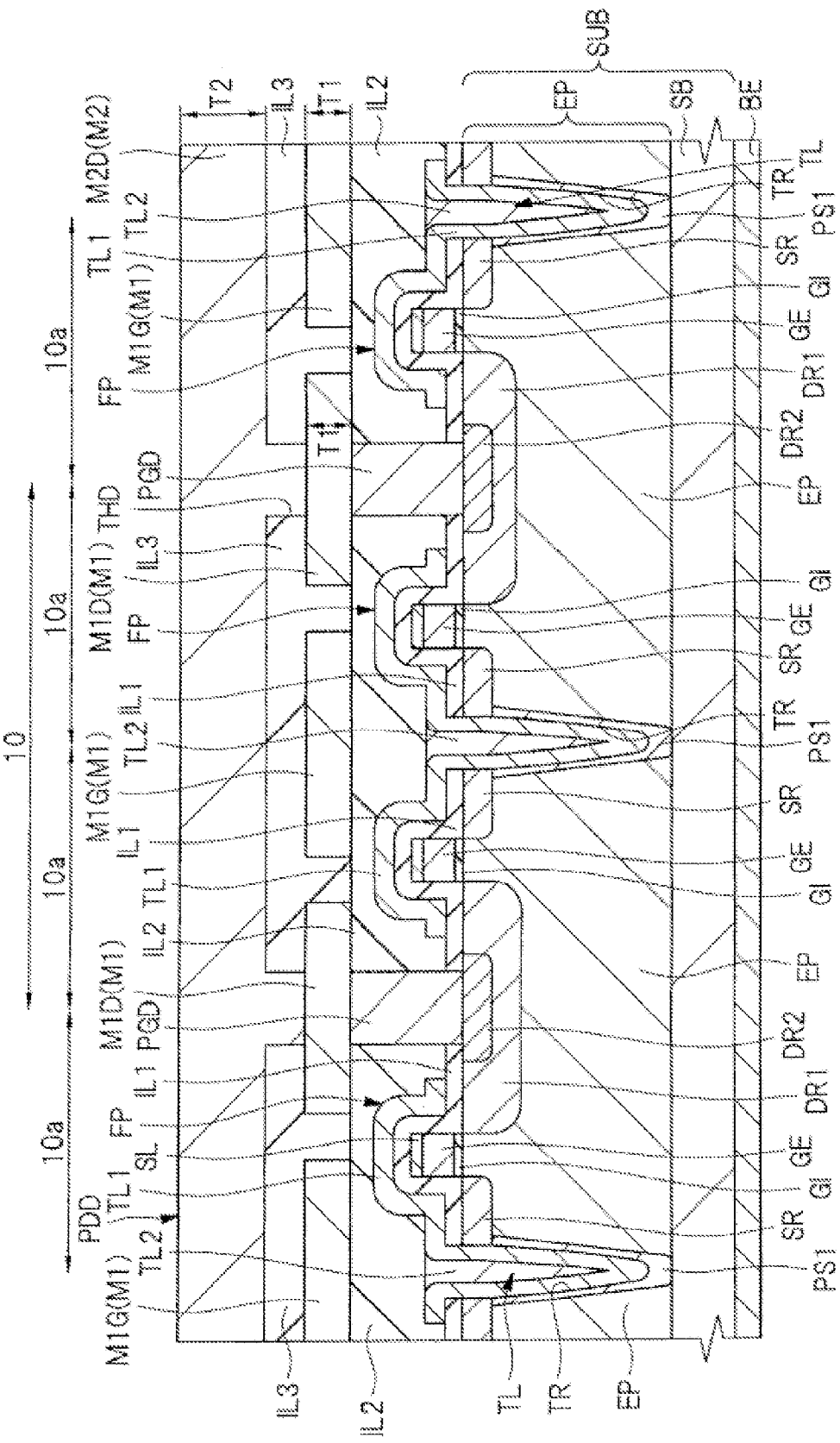
FIG. 60 is a main-portion cross-sectional view of the semiconductor device in the still other embodiment.
Figure 61:
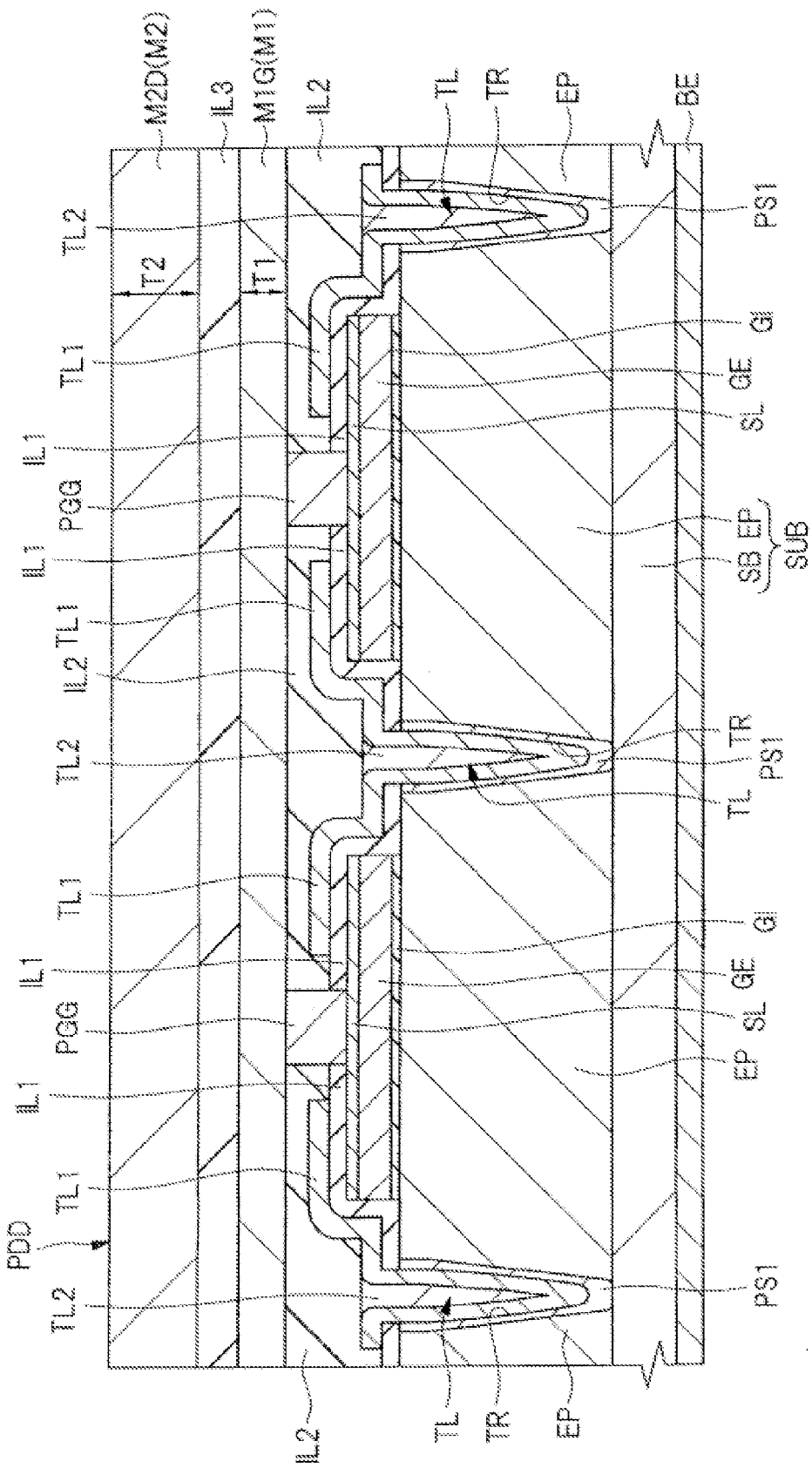
FIG. 61 is a main-portion cross-sectional view of the semiconductor device in the still other embodiment.
Figure 62:
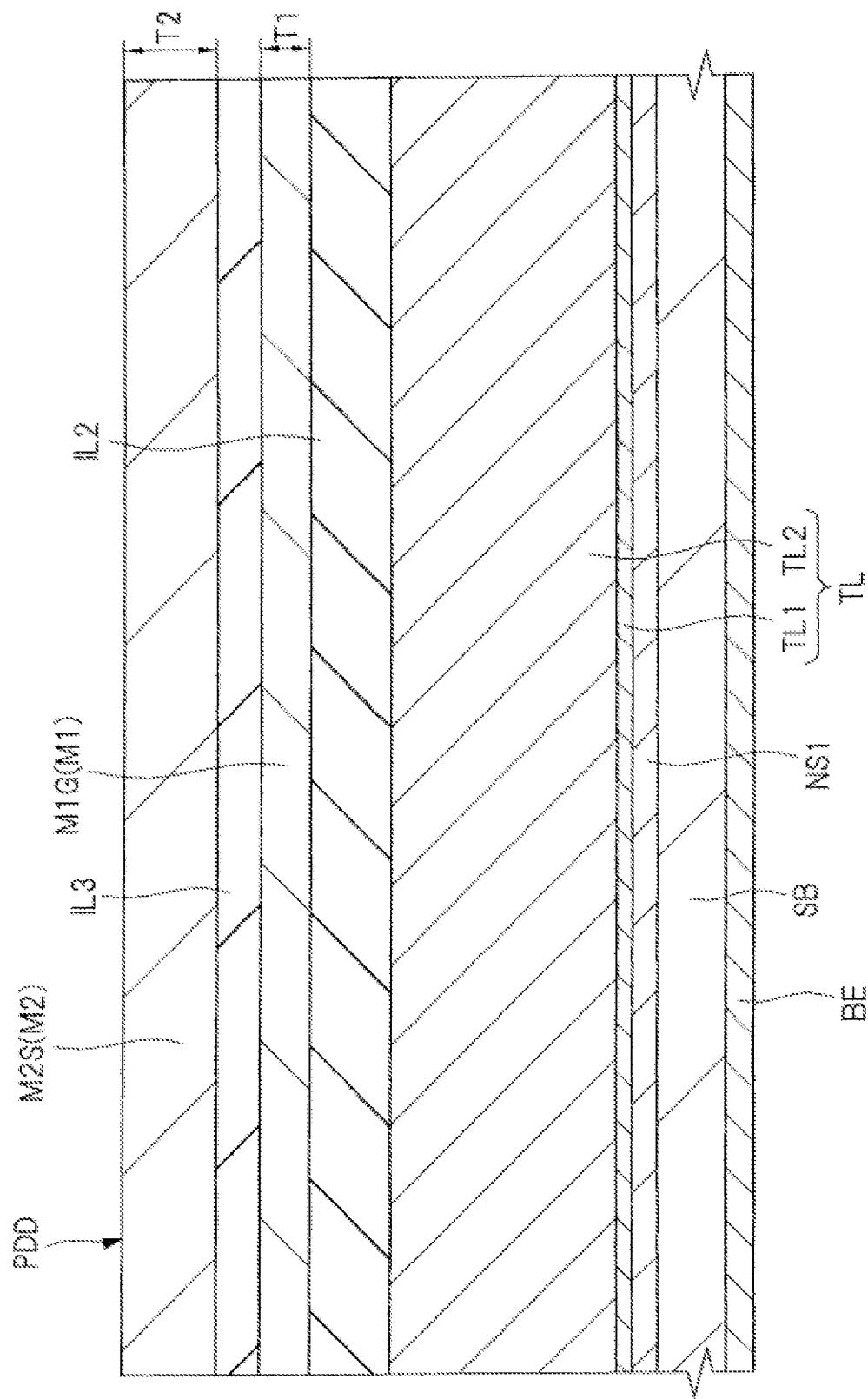
FIG. 62 is a main-portion cross-sectional view of the semiconductor device in the still other embodiment.
Figure 63:
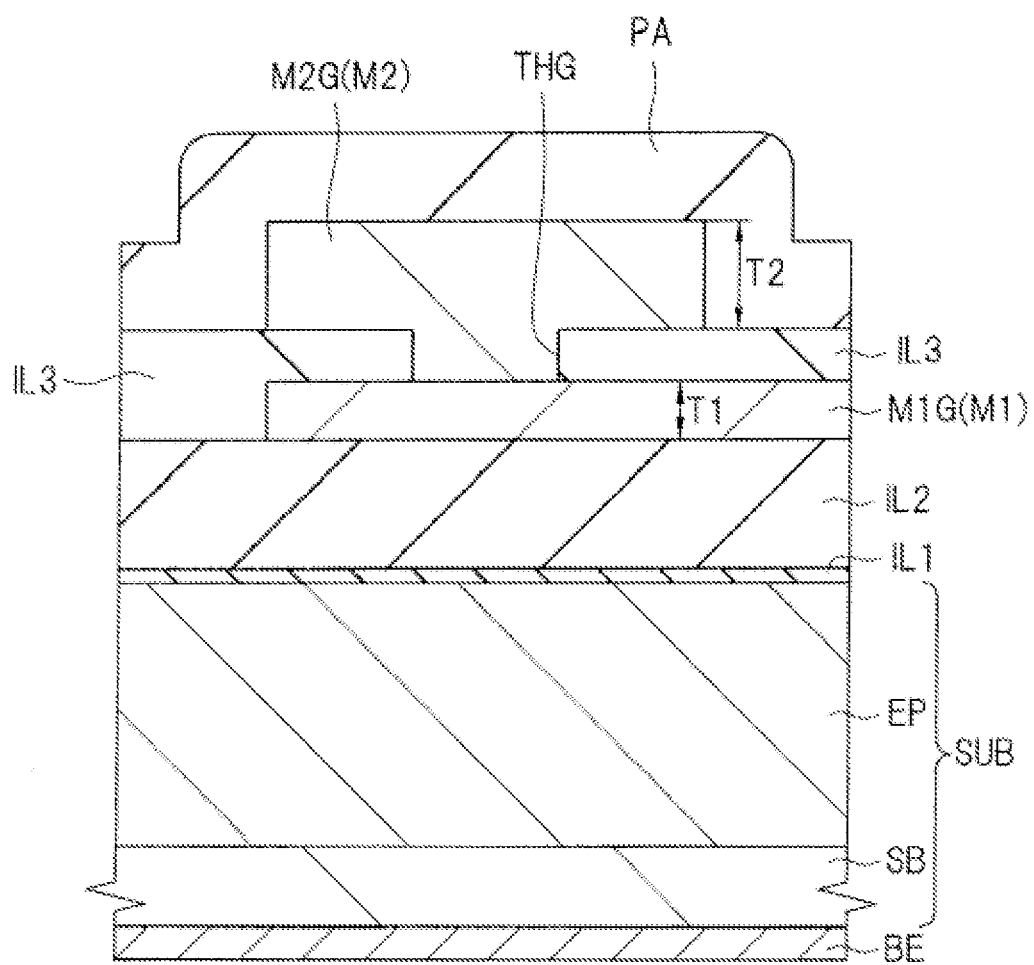
FIG. 63 is a main-portion cross-sectional view of the semiconductor device in the still other embodiment.

A cross-sectional view along the line A-A in FIG. 58 substantially corresponds to FIG. 60. A cross-sectional view along the line B-B in FIG. 58 substantially corresponds to FIG. 61. A cross-sectional view along the line C-C in FIG. 58 substantially corresponds to FIG. 62. FIG. 63 is a cross-sectional view generally perpendicular to the extending direction of the interconnect line portion M2G1 of the gate interconnect line M2G, which substantially corresponds to a cross-sectional view laterally traversing the interconnect line portion M2G1 of the gate interconnect line M2G shown in FIG. 54.

FIGS. 57 to 59 are enlarged views of the region RG1 enclosed in the two-dot-dash line in FIG. 53 shown above. The structure shown in each of FIGS. 57 to 59 is repeated in the X-direction and Y-direction to form the entire LDMOSFET formation region LR.

As shown in FIGS. 60 to 63, the semiconductor substrate SUB forming the semiconductor device (semiconductor chip) CP in embodiment 4 is a so-called epitaxial wafer having the substrate main body (semiconductor substrate or semiconductor wafer) SB made of single-crystal silicon or the like, and the epitaxial layer (semiconductor layer) EP formed over the main surface of the substrate main body SB. However, in Embodiment 1 described above, the substrate main body SB is of an $n^+$-type and the epitaxial layer EP is of an $n^-$-type while, in Embodiment 4, the substrate main body SB is of a $p^+$-type and the epitaxial layer EP is of a $p^-$-type. The substrate main body SB has an impurity concentration (which is the p-type impurity concentration) higher than the impurity concentration (which is the p-type impurity concentration) of the epitaxial layer EP.

In the main surface of the semiconductor substrate SUB, i.e., in the main surface of the epitaxial layer EP, the plurality of cells of the LDMOSFETs, i.e., the unit LDMOSFETs 10a are formed. The following is a specific description thereof.

Over the top surface of the epitaxial layer EP of the semiconductor substrate SUB, the gate electrode GE of each of the LDMOSFETs is formed via the gate insulating film GI. That is, in the epitaxial layer EP of the semiconductor substrate SUB, the source region and the drain region of the LDMOSFET are formed. Over the epitaxial layer EP located between the source region and the drain region, the gate electrode GE is formed via the gate insulating film GI. The source region and the drain region of each of the LDMOSFETs are formed in the internal areas of the epitaxial layer EP spaced apart from each other with the channel formation region (region immediately under the gate electrode GE) being interposed therebetween.

The drain region of each of the LDMOSFETs includes the lower-concentration n-type drain region DR1 in contact with the channel formation region, and the higher-concentration $n^+$-type drain region DR2 formed to be in contact with the lower-concentration n-type drain region DR1 and spaced apart from the channel formation region. Each of the lower-concentration n-type drain region DR1 and the higher-concentration $n^+$-type drain region DR2 is an n-type semiconductor region formed in the epitaxial layer EP. However, the higher-concentration $n^+$-type drain region DR2 has an impurity concentration (n-type impurity concentration) higher than the impurity concentration (n-type impurity concentration) of the lower-concentration n-type drain region DR1. Also, the higher-concentration $n^+$-type drain region DR2 is formed shallower than the lower-concentration n-type drain region DR1.

The source region of each of the LDMOSFETs is formed of the $n^+$-type source region SR in contact with the channel formation region. The $n^+$-type source region SR is an n-type semiconductor region formed in the epitaxial layer EP.

The lower-concentration n-type drain region DR1 is formed self-alignedly with the drain-side side wall of the gate electrode GE. The $n^+$-type source region SR is formed self-alignedly with the source-side side wall of the gate electrode GE. The lower-concentration n-type drain region DR1 and the $n^+$-type source region SR are spaced apart from each other with the channel formation region (region immediately under the gate electrode GE) being interposed therebetween. Over the channel formation region, the gate electrode GE is formed via the gate insulating film GI.

In Embodiment 1 described above, each of the plugs TL is formed on the drain side of each of the LDMOSFETs and at the position adjacent to each of the higher-concentration $n^+$-type drain regions DR. The drain (lower-concentration n-type drain region DR1 and higher-concentration $n^+$-type drain region DR2) of the LDMOSFET is electrically coupled to the substrate main body SB via the plug TL and consequently electrically coupled to the back surface electrode BE provided over the back surface of the substrate main body SB. Accordingly, the back surface electrode BE is the back surface electrode for the drain.

By contrast, in Embodiment 4, each of the plugs TL is formed not on the drain side, but on the source side of each of the LDMOSFETs and at the position adjacent to each of the $n^+$-type source regions SR. The source ($n^+$-type source region SR) of each of the LDMOSFETs is electrically coupled to the substrate main body SB via the plug TL and consequently electrically coupled to the back surface electrode BE provided over the back surface of the substrate main body SB. Accordingly, the back surface electrode BE is the source back surface electrode.

That is, in Embodiment 4, at the end portion (end portion opposite to the end portion in contact with the channel formation region) of the $n^+$-type source region SR, the plug TL is formed to be in contact with the $n^+$-type source region SR. The plug TL is a conductive layer for electrically coupling the source of each of the LDMOSFETs to the substrate main body SB. The plug TL is formed of a conductive film embedded in each of the trenches TR formed in the epitaxial layer EP. In the same manner as in Embodiment 1 described above, in Embodiment 4 also, a multi-layer film including the titanium nitride film TL1 and the tungsten film TL2 located over the titanium nitride film TL1 is embedded in each of the trenches TR formed in the epitaxial layer EP to form the plug TL. However, in Embodiment 4, each of the plugs TL is in contact not with the drain region, but with the $n^+$-type source region SR to be electrically coupled to the $n^+$-type source region SR.

Around each of the trenches TR in which the plugs TL are embedded, the $p^+$-type semiconductor region PS1 can also be formed. FIG. 60 shows the case where, around each of the trenches TR in which the plugs TL are embedded, i.e., at the position adjacent to the side and bottom surfaces of the plug TL embedded in the trench TR, the $p^+$-type semiconductor region PS1 is formed. The $p^+$-type semiconductor region PS1 has an impurity concentration (p-type impurity concentration) higher than that of the $p^-$-type epitaxial layer EP.

In the case of FIG. 60, the tip portion (bottom portion) of each of the plugs TL has not reached the substrate main body SB. However, it may also be possible that the tip portion (bottom portion) of each of the plugs TL has reached the substrate main body SB. When the tip portion (bottom portion) of the plug TL has reached the substrate main body SB, it follows that the plug TL is electrically coupled directly to the substrate main body SB. It may also be possible that the $p^+$-type semiconductor region PS1 is formed between each of the plugs TL and the substrate main body SB to electrically couple the plug TL to the $p^+$-type substrate main body SB via the $p^+$-type semiconductor region PS1. The $n^+$-type source region SR is electrically coupled to the $p^+$-type substrate main body SB via the plug TL (or the plug TL and the $p^+$-type semiconductor region PS1).

Over the back surface of the semiconductor substrate SUB, i.e., over the back surface of the substrate main body SB, the same back surface electrode BE as formed in Embodiment 1 described above is formed. The back surface electrode BE is formed over the entire back surface of the semiconductor substrate SUB forming the semiconductor device CP. In Embodiment 1 described above, the back surface electrode BE functions as the drain back surface electrode of each of the LDMOSFETs. By contrast, in embodiment 4, the back surface electrode BE functions as the source back surface electrode of each of the LDMOSFETs. As a result, in Embodiment 4, the source (n$^+$-type source region SR) of each of the LDMOSFETs formed in the epitaxial layer EP is electrically coupled to the back surface electrode BE via the plug TL and the substrate main body SB (or via the plug TL, the p$^+$-type semiconductor region PS1, and the substrate main body SB).

Over the main surface of the semiconductor substrate SUB, i.e., over the main surface of the epitaxial layer EP, the insulating film IL1 is formed so as to cover the gate electrodes GE. The trenches TR and the plugs TL embedded in the trenches TR are formed continuously in each of the insulating film IL1 and the epitaxial layer EP so as to extend through the insulating film IL1.

Over the insulating film IL1, the field plate electrodes FP are formed. Each of the field plate electrodes FP is integrally formed with the titanium nitride film TL1 forming each of the plugs TL to cover the gate electrode GE and also cover a part of the lower-concentration n-type drain region DR1. That is, the titanium nitride film TL1 forming each of the plugs TL extends over the insulating film IL1 so as to cover the gate electrode GE and a part of the lower-concentration n-type drain region DR1 and thus form each of the field plate electrodes FP. As a result, the plug TL is electrically coupled to the field plate electrode FP and a source potential (source voltage) is applied to the field plate electrode FP. That is, the portion of the titanium nitride film TL1 which covers the gate electrode GE and a part of the n-type lower-concentration drain region DR1 via the insulating film IL1 forms each of the field plate electrodes FP. On the other hand, the portions of the titanium nitride film TL1 and the tungsten film TL2 which are embedded in each of the trenches TR form each of the plugs TL.

In Embodiment 1 described above, the field plate electrodes FP are electrically coupled to the source interconnect lines M1S via the field plate plugs PGF. By contrast, in Embodiment 4, as interconnect lines to be coupled to the field plate electrodes FP, no interconnect line is provided either as the interconnect line M1 or as the interconnect line M2. Each of the field plate electrodes FP is electrically coupled to the plug TL via the titanium nitride film TL1 and thus electrically coupled to the back surface electrode BE and the n$^+$-type source region SR.

Over the main surface of the semiconductor substrate SUB, i.e., over the insulating film IL1, the insulating film (interlayer insulating film) IL2 is formed so as to cover the field plate electrodes FP and the plugs TL. The upper surface of the insulating film IL2 has been planarized.

The insulating films IL2 and IL1 are formed with contact holes (through holes). In the contact holes, conductive plugs PGD and PGG are embedded. The contact holes and the plugs PGD and PGG embedded therein are formed over the gate electrodes GE and the drains (higher-concentration n$^+$-type drain regions DR2).

It is assumed here that the plugs PGG are plugs embedded in the contact holes formed over the gate electrodes GE and electrically coupled to the gate electrodes GE and referred to as the gate plugs PGG. It is also assumed that the plugs PGD are plugs embedded in the contact holes formed over the higher-concentration n$^+$-type drain regions DR2 and electrically coupled to the higher-concentration n$^+$-type drain regions DR2 and referred to as the drain plugs PGD. In Embodiment 1 described above, there are the gate plugs PGG, the source plugs PGS, and the field plate plugs PFG, but the drain plugs PGD are not formed. By contrast, in Embodiment 4, there are the gate plugs PGG and the drain plugs PGD, but the source plugs PGS and the field plate plugs PGF are not formed. In embodiment 4, since the foregoing source plugs PGS are not formed, the foregoing p$^+$-type semiconductor regions PS are not formed, either.

Over the insulating film IL2 in which the plugs PGD and PGG are embedded, the interconnect lines (first-layer interconnect line) M1 are formed. The material, film configuration, thickness, formation method, and the like of the interconnect lines M1 are the same in each of Embodiment 4 and Embodiment 1 described above.

The interconnect lines M1 include the gate interconnect line M1G electrically coupled to the gate electrodes GE via the gate plugs PGG, and the drain interconnect lines (drain electrodes) M1D electrically coupled to the higher-concentration n$^+$-type drain regions DR2 via the drain plugs PGD. The gate interconnect line M1G and the drain interconnect lines M1D are in the same layer, but are spaced apart from each other.

In Embodiment 1 described above, as the interconnect lines M1, there are the gate interconnect line M1G and the source interconnect lines M1S, but the drain interconnect lines M1D are not formed. By contrast, in Embodiment 4, as the interconnect lines M1, there are the gate interconnect line M1G and the drain interconnect lines M1D, but the source interconnect lines M1S are not formed. That is, in Embodiment 4, as the interconnect lines M1, no source interconnect line is formed which is electrically coupled to the sources (n$^+$-type source regions SR) of the LDMOSFETs.

Over the insulating film IL2, the insulating film (interlayer insulating film) IL3 is formed so as to cover the interconnect lines M1. The upper surface of the insulating film IL3 has been planarized. The insulating film IL3 is formed with through holes (through bores) THD and THG and, at the bottom portions thereof, the interconnect lines M1 are party exposed. Over the insulating film IL3 including the through holes THD and THG, the interconnect lines (second-layer interconnect line) M2 are formed. The through holes THD and THG are placed at positions where the interconnect lines M1 and M2 overlap each other in plan view and provided so as to electrically couple the interconnect lines M2 and M1 to each other. The material, film configuration, thickness, formation method, and the like of the interconnect lines M2 are the same in each of Embodiment 4 and Embodiment 1 described above. Accordingly, each of the interconnect lines M1 (which are the drain interconnect lines M1D and the gate interconnect line M1G herein) has the thickness T1 smaller (thinner) than the thickness T2 of each of the interconnect lines M2 (which are the drain interconnect line M2D and the gate interconnect line M2G herein).

Each of the interconnect lines M2 includes the gate interconnect line M2G electrically coupled to the gate interconnect line M1G via the via portion (portion embedded in the gate through hole THG) and the drain interconnect line M2D electrically coupled to the drain interconnect lines M1D via the via portions (portions embedded in the drain through holes THD). The gate interconnect line M2G and the drain interconnect line M2D are in the same layer, but are spaced apart from each other.

In Embodiment 1, as the interconnect lines M2, there are the gate interconnect line M2G and the source interconnect line M2S, but the drain interconnect line M2D is not formed. By contrast, in Embodiment 4, as the interconnect lines M2, there are the gate interconnect line M2G and the drain interconnect line M2D, but the source interconnect line M2S is not formed.

The through hole THG is located at a position overlapping the gate interconnect line M1G in plan view and assumedly referred to as the gate through hole THG. On the other hand, the through holes THS are located at positions overlapping the drain interconnect lines M1D in plan view and assumedly referred to as the drain through holes THD.

The drain interconnect line M2D has portions (via portions) thereof embedded in the drain through holes THD and is electrically coupled to the drain interconnect lines M1D via the via portions (portions embedded in the drain through holes THD). The gate interconnect line M2G has a portion (via portion) thereof embedded in the drain through hole THG and is electrically coupled to the gate interconnect line M1G via the via portion (portion embedded in the gate through hole THG).

In another embodiment, it is also possible to embed the same conductive plugs as the foregoing plugs PGD and PGG in the through holes THD and THG and electrically couple the interconnect lines M2 and M1 to each other via the plugs.

Over the insulating film IL3, the insulating film (surface protective film) PA is formed so as to cover the interconnect lines M2. The insulating film PA is capable of functioning as a protective film (passivation film) forming the outermost surface of the semiconductor device CP. The insulating film PA is formed with the pad openings OP. The openings OP include a drain opening OPS exposing the drain interconnect line M2D and the gate opening OPG exposing the gate interconnect line M2G.

At the bottom portion of the drain opening OPD, the drain interconnect line M2D is partly exposed. The drain interconnect line M2D exposed from the drain opening OPD forms a drain pad PDD (pad electrode or bonding pad). At the bottom portion of the gate opening OPG, a part (pad portion M2G2) of the gate interconnect line M2G is exposed. The gate interconnect line M2G (pad portion M2G2) exposed from the gate opening OPG forms the gate pad (pad electrode or bonding pad) PDG.

In Embodiment 1 described above, on the top surface side of the semiconductor device CP, the source pad PDS and the gate pad PDG are formed, but no drain pad is formed. By contrast, in Embodiment 4, on the top surface side of the semiconductor device CP, the drain pad PDD and the gate pad PDG are formed, but no source pad is formed.

In Embodiment 4, the electrode for leading out the drains of the LDMOSFETs formed in the semiconductor substrate SUB and the electrode for leading out the gates thereof are formed as the drain pad PDD and the gate pad PDG on the top surface side of the semiconductor device CP. On the other hand, the electrode for leading out the sources of the LDMOSFETs formed in the semiconductor substrate SUB is formed as the source back surface electrode BE on the back surface side of the semiconductor device CP.

Specifically, the gate electrodes GE of the LDMOSFETs formed in the epitaxial layer EP is electrically coupled to the gate interconnect line M2G via the gate plugs PGG and the gate interconnect line M1G and thus electrically coupled to the gate pad PDG. The drains (lower-concentration n-type drain regions DR1 and higher-concentration $n^+$-type drain regions DR2) of the LDMOSFETs formed in the epitaxial layer EP are electrically coupled to the drain interconnect line M2D via the drain plugs PGD and the drain interconnect lines M1D and thus electrically coupled to the drain pad PDD. The sources ($n^+$-type source regions SR) of the LDMOSFETs formed in the epitaxial layer EP and the field plate electrodes FP are electrically coupled to the back surface electrode BE via the plugs TL and the substrate main body SB (or via the plugs TL, the $p^+$-type semiconductor regions PS1, and the substrate main body SB).

In Embodiment 4, as the two-dimensional layout of the interconnect lines M1 and M2, the two-dimensional layout of the interconnect lines M1 and M2 in Embodiment 1 described above are used. However, in Embodiment 4, the source interconnect lines M1S in Embodiment 1 described above are replaced with the drain interconnect lines M1D and the source interconnect line M2S in Embodiment 1 described above is replaced with the drain interconnect line M2D. The two-dimensional layout of the gate interconnect lines M1G and M2G in Embodiment 4 is basically the same as that in Embodiment 1 described above.

Embodiment 4 is the same as Embodiment 1 described above in that the gate interconnect line M1G extends over the plugs TL (specifically, extends in the Y-direction). However, Embodiment 4 and 1 are different in that the plugs TL are the source plugs in the case of Embodiment 4, while the plugs TL are the drain plugs in the case of Embodiment 1 described above.

The description in the foregoing section "About Layout of LDMOSFETs and Interconnect Lines" can also be applied to Embodiment 4. However, in that case, it is necessary to replace the source interconnect lines M1S with the drain interconnect lines M1D, replace the source interconnect line M2S with the drain interconnect line M2D, replace the drain plugs TL with the source plugs TL, replace the source plugs PGS with the drain plugs PGD, and replace the source through holes THS with the drain through holes THD. It is also necessary to replace the source opening OPS with the drain opening OPD and replace the source pad PDS with the drain pad PDD. It is also necessary to replace the sources (source regions) of the LDMOSFETs (unit LDMOSFETs 10a) with the drains (drain regions) of the LDMOSFETs (unit LDMOSFETs 10a) and replace the drains (drain regions) of the LDMOSFETs (unit LDMOSFETs 10a) with the sources (source regions) of the LDMOSFETs (unit LDMOSFETs 10a). It is also necessary to replace the $n^+$-type semiconductor regions NS1 with the $p^+$-type semiconductor regions PS1. In other words, by replacing the drain with the source, the description in Embodiment 1 can basically be applied to Embodiment 4.

The following is a brief description thereof.

In the same manner as in Embodiment 1 described above, in Embodiment 4 also, in the LDMOSFET formation region LR, a structure (layout) of the unit cells 10 as shown in each of FIGS. 57 to 60 is repeated in the X-direction. Each of the unit cells 10 is formed of two unit LDMOSFETs 10a having structures which share the plug TL and are symmetrical in the X-direction. As a result, in the LDMOSFET formation region LR, the plurality of unit LDMOSFETs 10a are formed and coupled in parallel to each other. Each of the unit LDMOSFETs 10a has the source region ($n^+$-type source region SR) formed in the semiconductor substrate SUB, the drain region (lower-concentration n-type drain region DR1 and higher-concentration $n^+$-type drain region DR2) formed in the semiconductor substrate SUB, and the gate electrode GE formed over the semiconductor substrate SUB located between the source region and the drain region via the gate insulating film GI. In the LDMOSFET formation region LR, each of the gate electrodes GE extends in the Y-direction, each of the drains (lower-concentration n-type drain regions DR1 and higher-concentration $n^+$-type drain regions DR2) is formed in the area of the active region AR which is located between the adjacent gate electrodes GE to extend in the Y-direction, and each of the sources ($n^+$-type source regions SR) is formed in the other area of the active region AR which is located between the adjacent gate electrodes GE to extend in the Y-direction.

Note that, in Embodiment 4, the higher-concentration $n^+$-type drain regions DR2 are shared by the unit LDMOSFETs 10a adjacent to each other with the drains being interposed therebetween. The plugs TL adjacent to the sources (n+-type source regions SR) are shared by the unit LDMOSFETs 10a adjacent to each other with the sources being interposed therebetween.

To couple in parallel the plurality of unit LDMOSFETs 10a formed in the LDMOSFET formation region LR to each other, the respective gate electrodes GE of the plurality of unit LDMOSFETs 10a in the LDMOSFET formation region LR are electrically coupled to each other via the gate plugs PGG and the gate interconnect line M1G and are also electrically coupled to the gate interconnect line M2G via the gate interconnect line M1G. The respective drains (lower-concentration n-type drain regions DR1 and higher-concentration n+-type drain regions DR2) of the plurality of unit LDMOSFETs 10a formed in the LDMOSFET formation region LR are electrically coupled to each other via the drain plugs PGD and the drain interconnect lines M1D and M2D. The respective sources (n+-type source regions SR) of the plurality of unit LDMOSFETs 10a formed in the LDMOSFET formation region LR are electrically coupled to each other via the plugs TL, the substrate main body SB, and the back surface electrode BE (or the plugs TL, the n+-type semiconductor regions NS1, the substrate main body SB, and the back surface electrode BE). That is, the respective drain regions of the plurality of unit LDMOSFETs 10a formed in the LDMOSFET formation region LR are electrically coupled to the back surface electrode BE via the conductive plugs TL embedded in the trenches TR of the semiconductor substrate SUB and thus electrically coupled to each other.

In the same manner as in Embodiment 1 described above, in Embodiment 4 also, the gate interconnect line M1G extends over the plugs TL in the Y-direction. More specifically, over the LDMOSFET formation region LR, the gate interconnect line M1G integrally includes portions each extending in the Y-direction and portions each extending in the X-direction. The portions of the gate interconnect line M1G each extending in the Y-direction extend over the plugs TL in the Y-direction, while the portions of the gate interconnect line M1G each extending in the X-direction are electrically coupled to the gate electrodes GE via the gate plugs PGG. That is, over the LDMOSFET formation region LR, the gate interconnect line M1G has a two-dimensional structure in which the plurality of interconnect line portions each extending in the Y-direction and the plurality of interconnect line portions each extending in the X-direction are integrally connected. The interconnect line portions each extending in the Y-direction extend over the plugs TL in the Y-direction, while the interconnect line portions each extending in the X-direction are electrically coupled to the gate electrodes GE via the gate plugs PGG. Thus, the respective gate electrodes GE of the plurality of unit LDMOSFETs 10a formed in the LDMOSFET formation region LR are electrically coupled to each other via the gate interconnect line M1G. It is preferable that, over the LDMOSFET formation region LR, the gate interconnect line M1G has the two-dimensional structure in which the plurality of interconnect line portions each extending in the Y-direction and arranged in the X-direction at predetermined intervals (more preferably, at equal intervals) and the plurality of interconnect line portions each extending in the X-direction and arranged in the Y-direction at predetermined intervals (more preferably, at equal intervals) are integrally connected.

The drain interconnect lines M1D are in discrete patterns (discrete drain interconnect lines) separate from each other with the gate interconnect line M1G being interposed therebetween (see FIGS. 55 and 58). That is, the drain interconnect lines M1D are in the discrete patterns (discrete drain interconnect lines) and peripherally surrounded by the gate interconnect line M1G in plan view. Specifically, the drain interconnect lines M1D in the discrete patterns are peripherally surrounded by the portions of the gate interconnect line M1G each extending in the Y-direction and the portions of the gate interconnect line M1G each extending in the X-direction. The drain interconnect lines M1D in the discrete patterns are located over the respective drain regions of the plurality of unit LDMOSFETs 10a formed in the LDMOSFET formation region LR and electrically coupled to the drain regions via the drain plugs PGD. In Embodiment 1 described above, each of the source interconnect lines M1S in the discrete patterns is shared by the unit LDMOSFETs 10a adjacent to each other with the source being interposed therebetween. However, in Embodiment 4, each of the drain interconnect lines M1D in the discrete patterns is shared by the unit LDMOSFETs 10a adjacent to each other with the drain being interposed therebetween. The two-dimensional shape of each of the drain interconnect lines M1D in the discrete patterns (discrete drain interconnect lines) can be, e.g., a rectangular shape (rectangular shape having short sides in the X-direction and long sides in the Y-direction).

In the LDMOSFET formation region LR, the plurality of drain interconnect lines M1D in the discrete patterns (discrete drain interconnect lines) are formed. The drain interconnect line M2D is placed so as to cover the plurality of drain interconnect lines M1D. Each of the plurality of drain interconnect lines M1D formed in the LDMOSFET formation region LR is electrically coupled to the common drain interconnect line M2D via the via portions (portions embedded in the drain through holes THD) of the drain interconnect line M2D and electrically coupled to each other via the drain interconnect line M2D. The drain interconnect line M2D is partly exposed from the drain opening OPD of the insulating film PA. The drain interconnect line M2D exposed from the drain opening OPD serves as the drain pad PDD.

In Embodiment 1 described above, the source interconnect lines M1S are coupled not only to the source regions (n+-type source regions SR), but also to the field plate electrodes FP. Accordingly, the portions of the gate interconnect line M1G each extending in the Y-direction do not overlap the gate electrodes GE in plan view. By contrast, in Embodiment 4, the field plate electrodes FP are not coupled to the drain interconnect lines M1D. Accordingly, the portions of the gate interconnect line M1G each extending in the Y-direction may or may not overlap the gate electrodes GE in plan view.

The semiconductor device CP in Embodiment 4 can also be applied to the foregoing semiconductor devices PKG1 and PKG1a. In that case, it follows that, in the semiconductor devices PKG1 and PKG1a in FIGS. 29 to 37 described above, the source pad PDS is replaced with the drain pad PDD.

Embodiment 4 also has basically the same characteristic features (characteristic features related to the interconnect lines M1 and M2) as those of Embodiment 1 described above, except that the source and the drain have been interchanged. As a result, in Embodiment 4 also, basically the same effects as obtained in Embodiment 1 described above can be obtained. Briefly, in Embodiment 4 also, it is possible to reduce gate resistance, while ensuring the effective area of the LDMOSFET formation region LR. It is also possible to increase the effective area of the LDMOSFET formation region LR, while ensuring low gate resistance. This can achieve each of a reduction in gate resistance and a reduction in ON resistance. Therefore, it is possible to improve the performance of the semiconductor device.

It is also possible to apply the technique in Embodiment 2 or 3 described above to Embodiment 4.

Embodiment 5

In Embodiments 1 to 4 described above, the semiconductor device (semiconductor chip) CP is formed with the LDMOSFETs, and the gate electrodes GE of the LDMOSFETs are formed over the main surface of the semiconductor substrate SUB (epitaxial layer EP) via the gate insulating films GI.

In Embodiment 5, a description will be given of the case where, in the semiconductor substrate forming the semiconductor device (semiconductor chip) CP, not LDMOSFETs, but trench-gate MISFETs are formed.

Referring to the drawings, a description will be given of the semiconductor device (semiconductor chip) CP in Embodiment 5.

Figure 66:
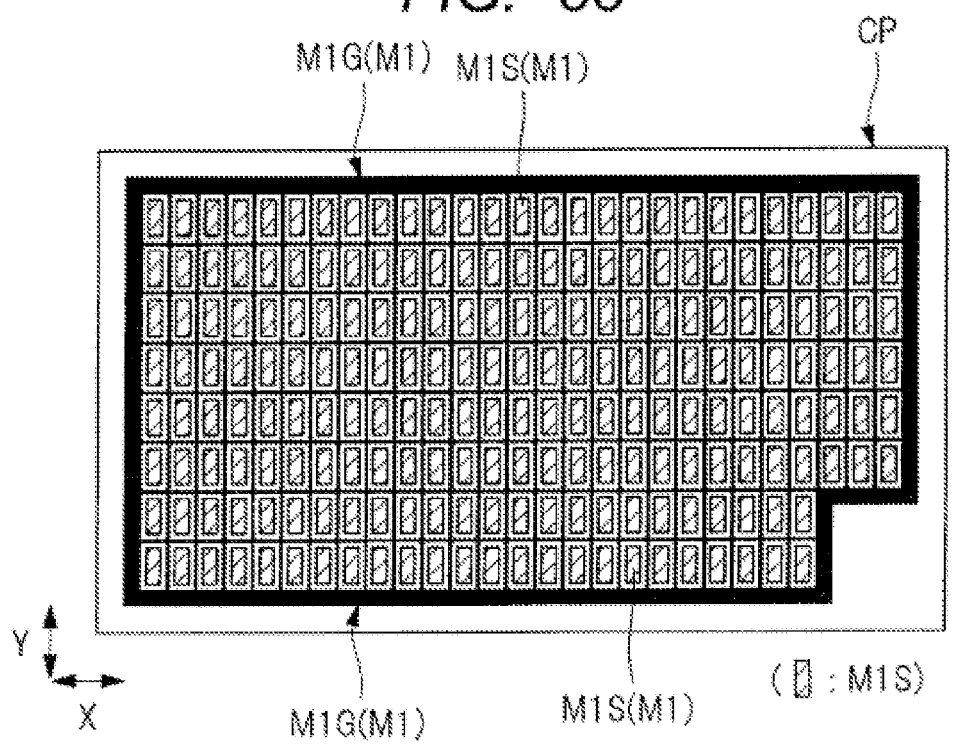
FIG. 66 is an overall plan view of the semiconductor device in the yet other embodiment.
Figure 67:
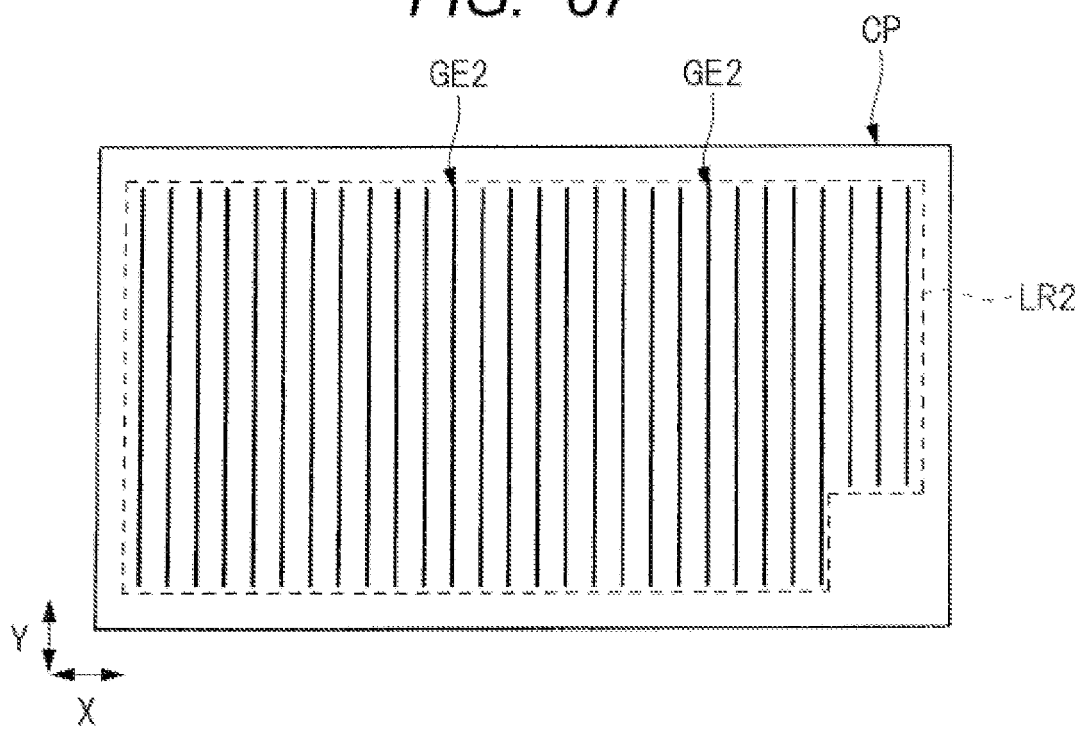
FIG. 67 is an overall plan view of the semiconductor device in the yet other embodiment.
Figure 68:
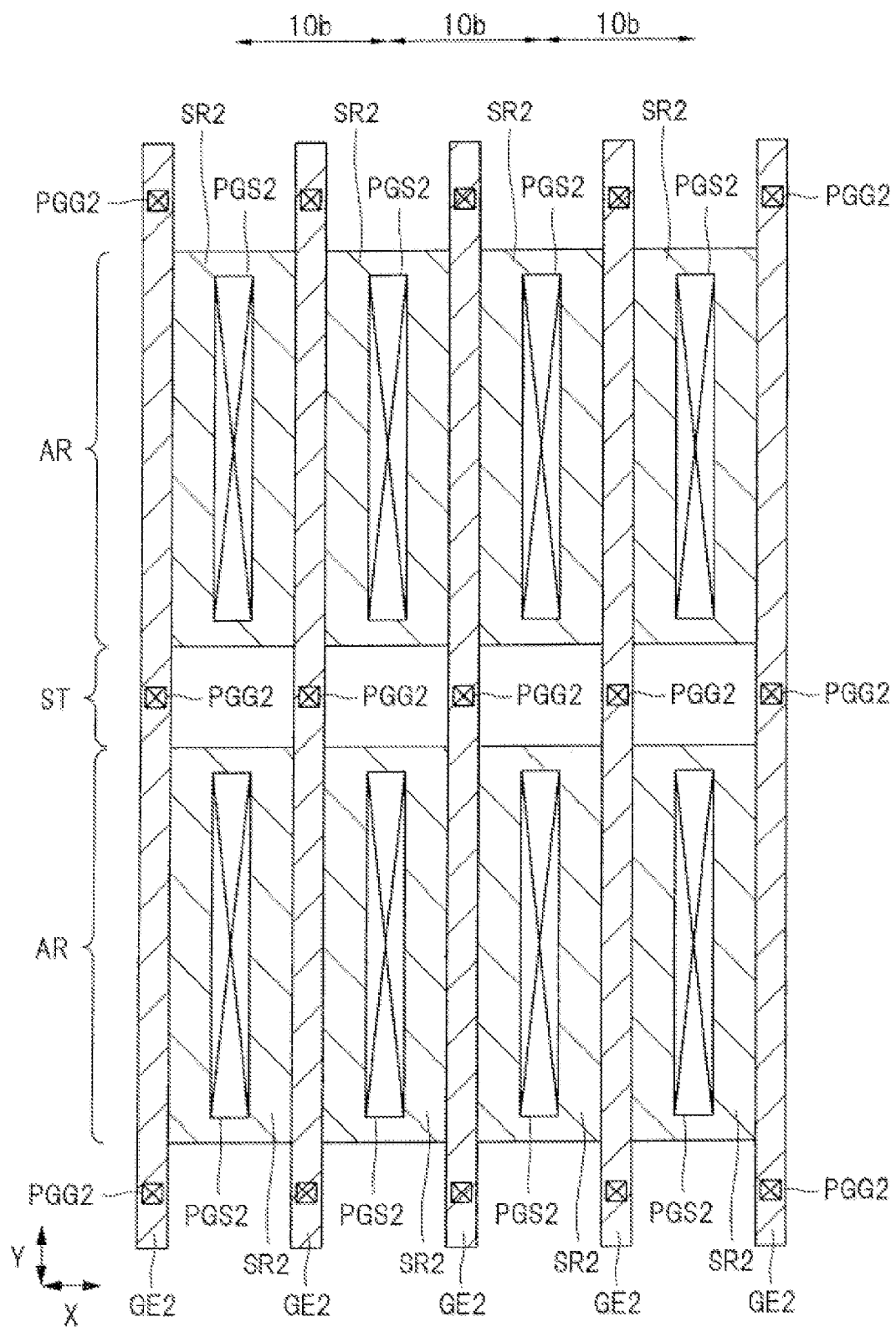
FIG. 68 is a main-portion plan view of the semiconductor device in the yet other embodiment.
Figure 69:
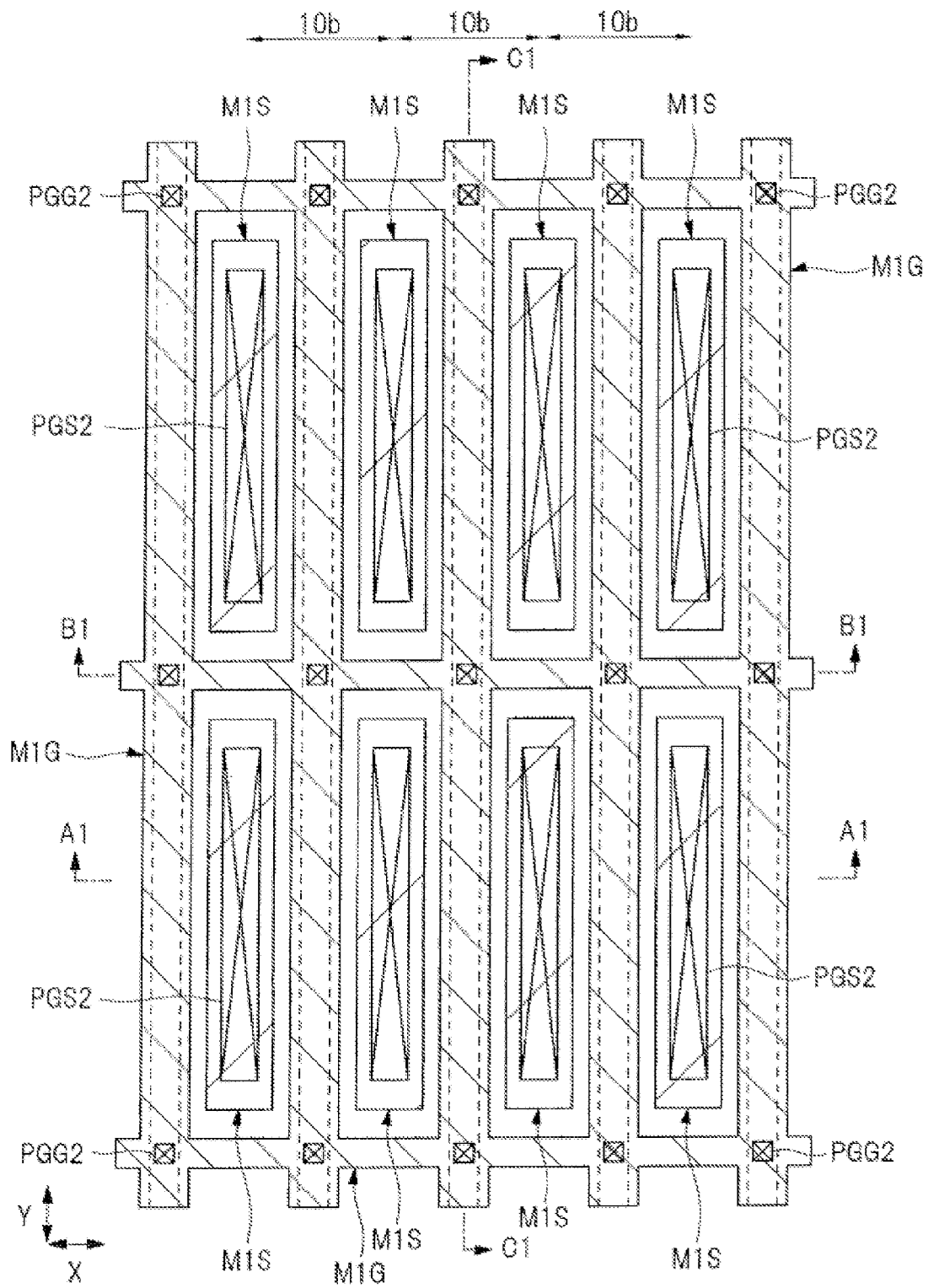
FIG. 69 is a main-portion plan view of the semiconductor device in the yet other embodiment.
Figure 70:
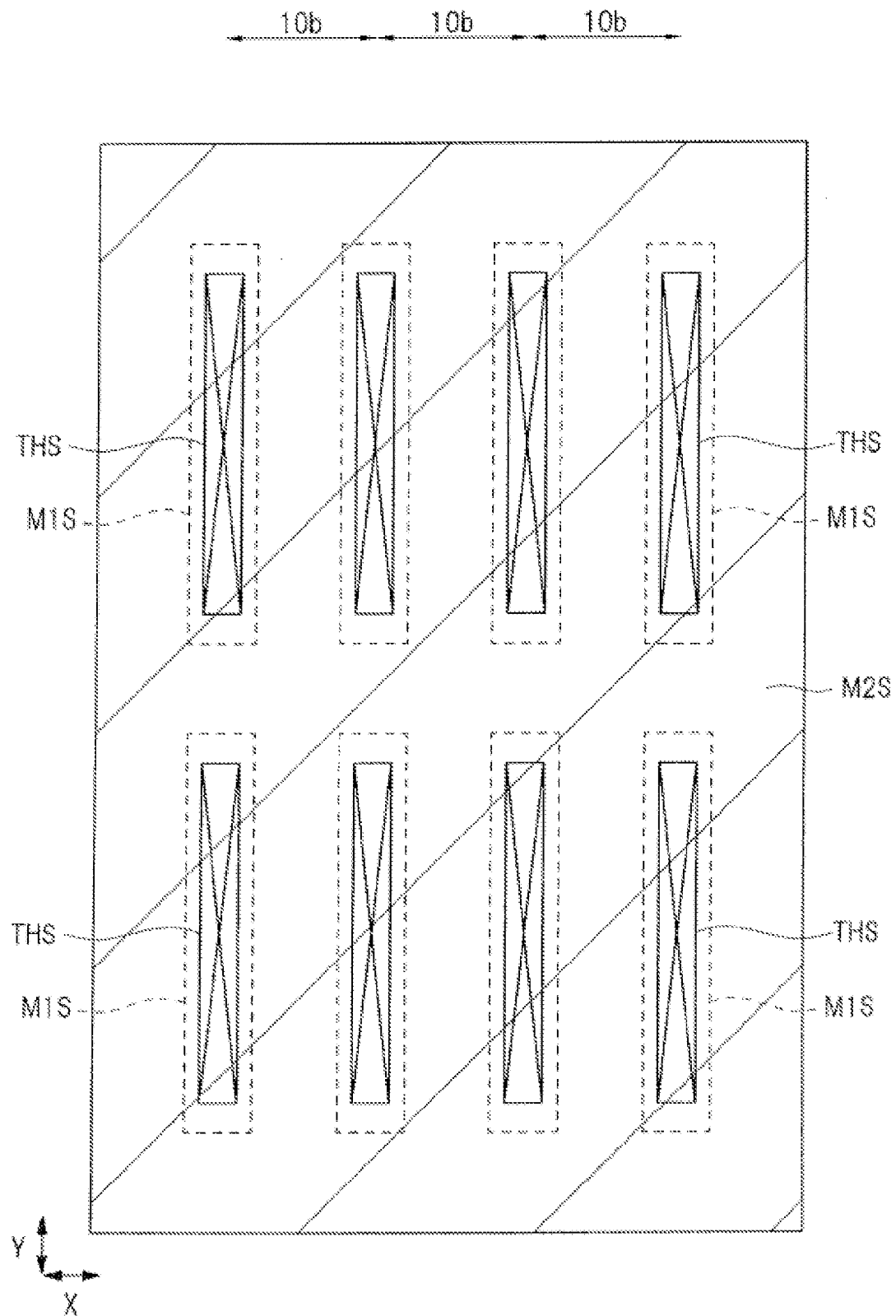
FIG. 70 is a main-portion plan view of the semiconductor device in the yet other embodiment.

FIGS. 64 to 67 are overall plan views of the semiconductor device (semiconductor chip) CP in Embodiment 5, which respectively correspond to FIGS. 1 to 4 in Embodiment 1 each described above. FIGS. 68 to 70 are main-portion plan views of the semiconductor device CP in Embodiment 5, which respectively correspond to FIGS. 5 to 7 in Embodiment 1 each described above. FIGS. 71 to 74 are main-portion cross-sectional views of the semiconductor device CP in Embodiment 5, which respectively correspond to FIGS. 8 to 11 in Embodiment 1 each described above.

Figure 64:
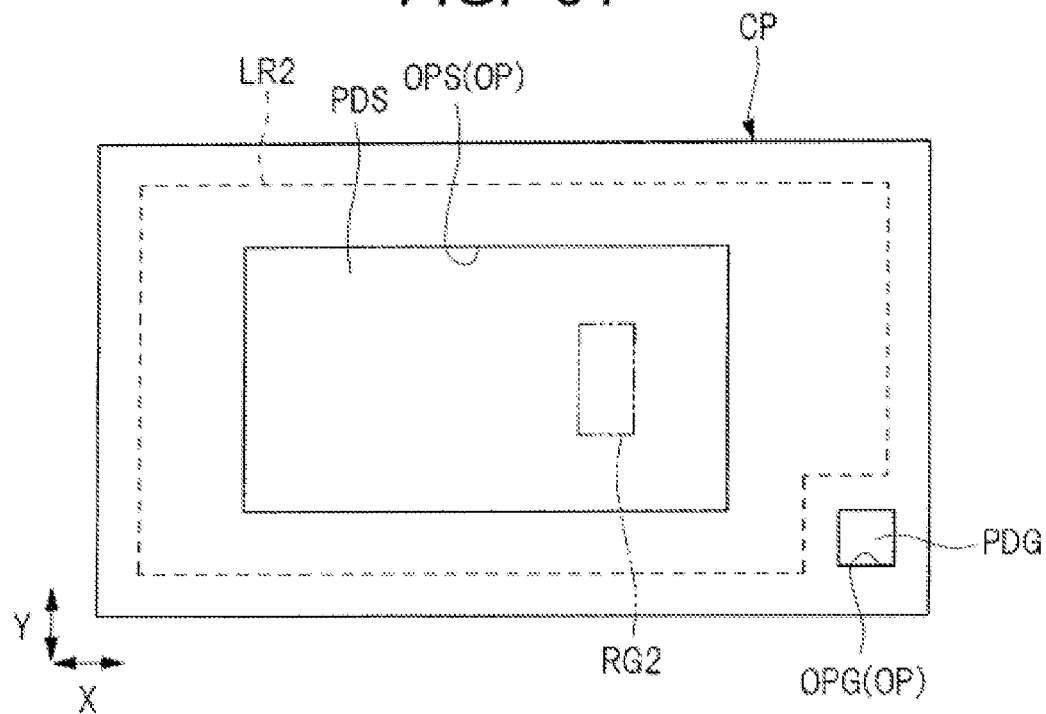
FIG. 64 is an overall plan view of a semiconductor device in yet another embodiment.
Figure 65:
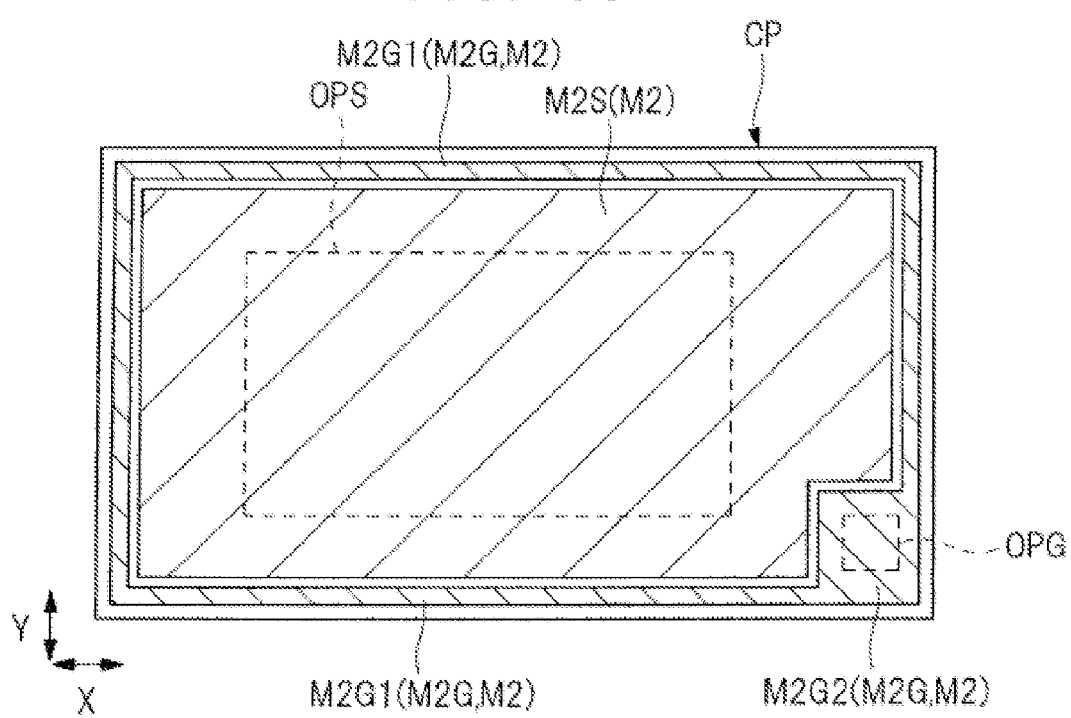
FIG. 65 is an overall plan view of the semiconductor device in the yet other embodiment.

FIG. 64 shows a top view of the semiconductor device CP in Embodiment 5. FIG. 65 shows a two-dimensional layout of the interconnect lines M2 (which are the source interconnect line M2S and the gate interconnect line M2G herein). FIG. 66 shows a two-dimensional layout of the interconnect lines M1 (which are the source interconnect lines M1S and the gate interconnect line M1G herein). FIG. 67 shows a two-dimensional layout of gate electrodes GE2. FIGS. 65 and 66 are plan views but, for easier understanding, the source interconnect line M2S and the gate interconnect line M2G are obliquely hatched in FIG. 65, while the source interconnect lines M1S are obliquely hatched and the gate interconnect line M1G is shown by the solid line in FIG. 66. In FIG. 67, the gate electrodes GE2 are shown by the sold lines.

Enlarged illustration of a region RG2 enclosed in the two-dot-dash line shown in FIG. 64 corresponds to FIGS. 68 to 70. FIGS. 68 to 70 show different layers. That is, FIG. 68 shows a two-dimensional layout of the gate electrodes GE2 and source regions ($n^+$-type source regions SR2), which are hatched. FIG. 69 shows a two-dimensional layout of the interconnect lines M1 (i.e., source interconnect lines M1S and gate interconnect line M1G), which are hatched. FIG. 70 shows a two-dimensional layout of the interconnect line M2 (which is the source interconnect line M2S in FIG. 70). In FIG. 70, the source interconnect line M2S is hatched.

Figure 71:
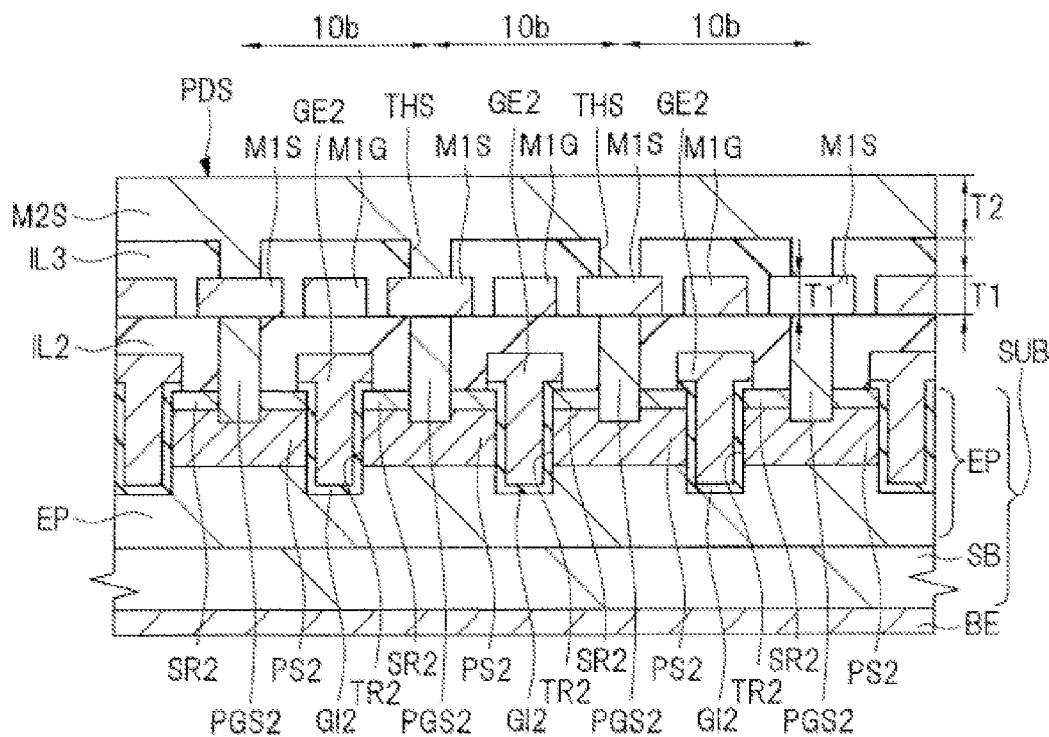
FIG. 71 is a main-portion cross-sectional view of the semiconductor device in the yet other embodiment.
Figure 74:
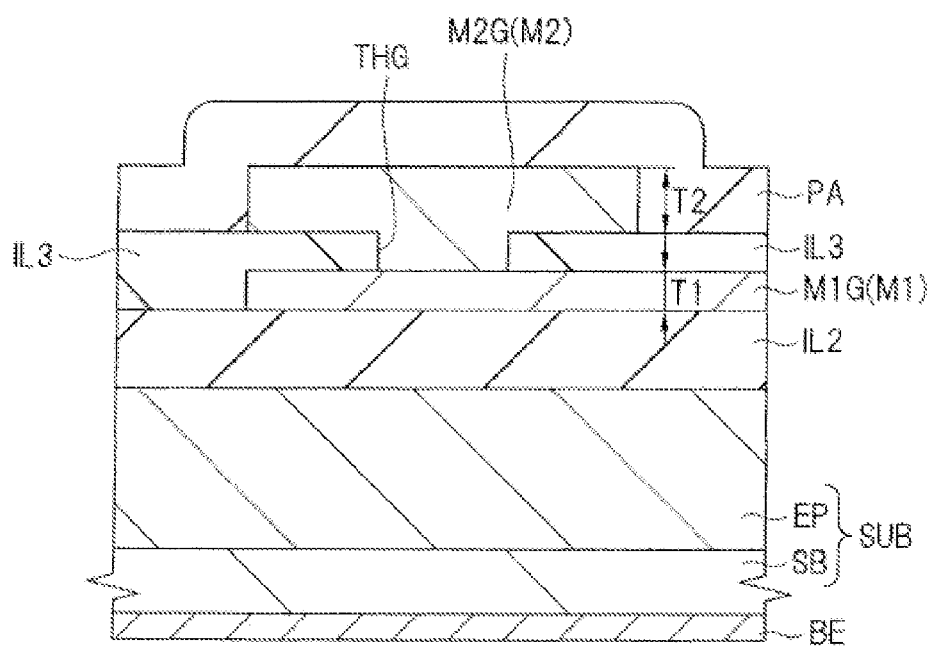
FIG. 74 is a main-portion cross-sectional view of the semiconductor device in the yet other embodiment.

A cross-sectional view along the line A1-A1 in FIG. 69 substantially corresponds to FIG. 71. A cross-sectional view along the line B1-B1 in FIG. 69 substantially corresponds to FIG. 72. A cross-sectional view along the line C1-C1 in FIG. 69 substantially corresponds to FIG. 73. FIG. 74 is a cross-sectional view generally perpendicular to the extending direction of the interconnect line portion M2G1 of the gate interconnect line M2G, which substantially corresponds to a cross-sectional view laterally traversing the interconnect line portion M2G1 of the gate interconnect line M2G shown in FIG. 65.

Note that FIGS. 68 to 70 are enlarged views of the region RG2 enclosed in the two-dot-dash line in FIG. 64 described above. The structure shown in FIGS. 68 to 70 is repeated in the X-direction and the Y-direction to form an entire MOSFET formation region LR2.

As shown in FIGS. 71 to 74, the semiconductor substrate SUB forming the semiconductor device (semiconductor chip) CP in Embodiment 5 includes the substrate main body (semiconductor substrate or semiconductor wafer) SB made of, e.g., $n^+$-type single-crystal silicon into which, e.g., arsenic (As) has been introduced or the like, and the epitaxial layer (semiconductor layer) EP made of, e.g., $n^-$-type single-crystal silicon formed over the main surface of the substrate main body SB in the same manner as in Embodiment 1 described above. Accordingly, the semiconductor substrate SUB is, e.g., a so-called epitaxial wafer. The substrate main body SB has an impurity concentration (n-type impurity concentration) higher than the impurity concentration (n-type impurity concentration) of the epitaxial layer EP.

In the MOSFET formation region LR2 of the main surface of the semiconductor substrate SUB, a plurality of unit transistor cells (unit transistors or unit MISFETs) 10b are formed. The plurality of unit transistor cells 10b provided in the MOSFET formation region LR2 are coupled in parallel to each other to form a power MISFET. The MOSFET formation region LR2 corresponds to the foregoing LDMOSFET formation region LR. In the foregoing LDMOSFET formation region LR also, the plurality of unit transistor cells are formed. The plurality of unit transistor cells provided in the LDMOSFET formation region LR are coupled in parallel to each other to form the power MISFET. However, the unit transistor cells formed in the foregoing LDMOSFET formation region LR are the foregoing unit LDMOSFETs 10a and correspond to the unit transistor cells made of the LDMOSFETs. On the other hand, in Embodiment 5, the unit transistor cells 10b formed in the MOSFET formation region LR2 of the main surface of the semiconductor substrate SUB are formed of the trench-gate MISFETs.

The substrate main body SB and the epitaxial layer EP of the semiconductor substrate SUB have the function of the drain region of each of the unit transistor cells (unit transistor cells made of the trench-gate MISFETs) 10b. Over the back surface (entire back surface) of the semiconductor substrate SUB, the back surface electrode BE is formed. The back surface electrode BE is the drain back surface electrode.

In the MOSFET formation region LR2, each of p-type semiconductor regions PS2 formed in the epitaxial layer EP has the function of the channel formation region of each of the unit transistor cells 10b. In the epitaxial layer EP, each of the $n^+$-type semiconductor regions SR2 formed over the p-type semiconductor region PS2 has the function of the source region of each of the unit transistor cells 10b. Accordingly, the $n^+$-type semiconductor region SR2 is the source semiconductor region.

Also in the MOSFET formation region LR2, in the semiconductor substrate SUB, trenches TR2 are formed to extend from the main surface thereof in the thickness direction of the semiconductor substrate SUB. The trenches TR2 are formed so as to extend from the upper surfaces of the nt-type semiconductor regions SR2 through the nt-type semiconductor regions SR2 and the p-type semiconductor regions PS2 and terminate in the epitaxial layer EP in the layer located thereunder. Over the bottom and side surfaces of the trenches TR2, gate insulating films GI2 each made of silicon dioxide or the like are formed. In the trenches TR2, the gate electrodes GE2 are embedded via the gate insulating films GI2. Each of the gate electrodes GE2 is made of a polysilicon film into which, e.g., an n-type impurity has been introduced. The gate electrode GE2 has the function of the gate electrode of each of the unit transistor cells 10b.

Figure 72:
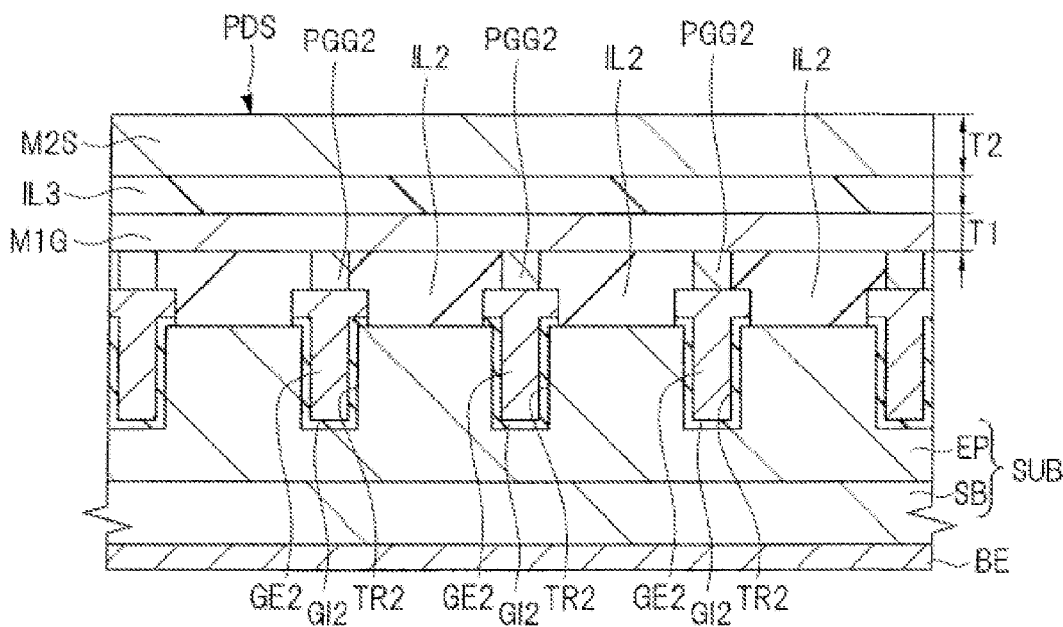
FIG. 72 is a main-portion cross-sectional view of the semiconductor device in the yet other embodiment.
Figure 73:
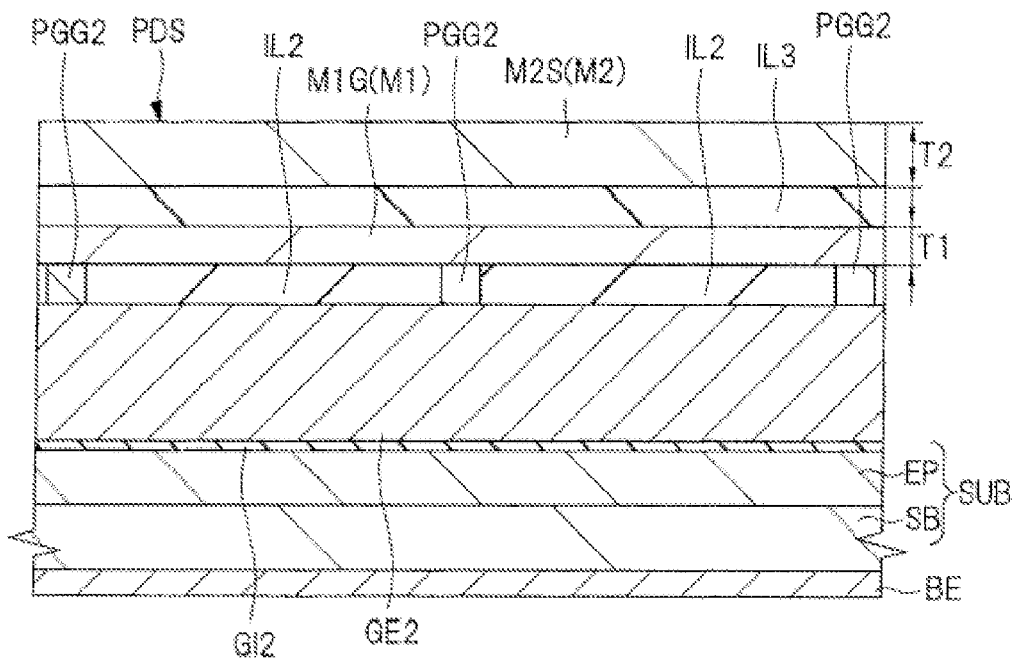
FIG. 73 is a main-portion cross-sectional view of the semiconductor device in the yet other embodiment.

FIGS. 71 and 72 show the case where the upper portions of the gate electrodes GE2 protrude from the upper surface of the epitaxial layer EP. This structure is obtained in such a case where the gate electrodes GE2 are formed by forming a conductive film (conductive film for the gate electrodes GE2) over the main surface of the semiconductor substrate SUB so as to fill the trenches TR2 therewith and then patterning the conductive film.

In another embodiment, there may also be a case where the upper surfaces of the gate electrodes GE2 are at substantially the same positions as that the upper surface of the epitaxial layer EP or at positions lower than the position of the upper surface of the epitaxial layer EP. The structure is obtained in such a case where the gate electrodes GE2 are formed by forming a conductive film (conductive film for the gate electrodes GE2) over the main surface of the semiconductor substrate SUB so as to fill the trenches TR2 therewith and then etching back the conductive film.

Over the semiconductor substrate SUB, i.e., over the epitaxial layer EP, the insulating film (interlayer insulating film) IL2 is formed so as to cover the gate electrodes GE2. The upper surface of the insulating film IL2 has been planarized. The insulating film IL2 is formed with contact holes (through holes) and, in the contact holes, conductive plugs PGG2 and PGS2 are embedded.

Here, the plugs PGG2 are embedded in the contact holes formed over the gate electrodes GE2 and electrically coupled to the gate electrodes GE2 and assumedly referred to as the gate plugs PGG2. The gate plugs PGG2 are formed over the gate electrodes GE2. The gate plugs PGG2 have bottom portions which are in contact with the gate electrodes GE2 to be electrically coupled to the gate electrodes GE2.

The plugs PG2S coupled to the source regions ($n^+$-type semiconductor regions SR2) are assumedly referred to as the source plugs PGS2. The source plugs PGS2 are located between the gate electrodes GE2 adjacent to each other in plan view and formed to extend through the insulating film IL2 and also extend through the $n^+$-type semiconductor regions SR2 located between the adjacent gate electrodes GE2 such that the bottom portions of the source plugs PGS2 reach the p-type semiconductor regions PS2. The source plugs PGS2 are in contact with the $n^+$-type semiconductor regions SR2 to be electrically coupled to the $n^+$-type semiconductor regions SR2 and are also in contact with the p-type semiconductor regions PS2 to be electrically coupled to the p-type semiconductor regions PS2. It may also be possible to form $p^+$-type semiconductor regions (not shown) each having an impurity concentration higher than that of each of the p-type semiconductor regions PS2 at positions adjacent to the bottom portions of the source plugs PGS2 and electrically couple the source plugs PGS2 to the p-type semiconductor regions PS2 via the $p^+$-type semiconductor regions.

Over the insulating film IL2 in which the plugs PGG2 and PGS2 are embedded, the interconnect lines (first-layer interconnect line) M1 are formed. The material, film configuration, thickness, formation method, and the like of each of the interconnect lines M1 are the same in each of Embodiment 5 and Embodiment 1 described above.

The interconnect lines M1 include the gate interconnect line M1G electrically coupled to the gate electrodes GE2 via the gate plugs PGG2 and the source interconnect lines (source electrodes) M1S electrically coupled to the source regions (nt-type semiconductor regions SR2) via the source plugs PGS2. The gate interconnect line M1G and the source interconnect lines M1S are in the same layer, but are spaced apart from each other. In Embodiment 5, as drain interconnect lines electrically coupled to the drains of the trench-gate MISFETs, no drain interconnect line is formed either as the interconnect line M1 or as the interconnect line M2.

Over the insulating film IL2, the insulating film (interlayer insulating film) IL3 is formed so as to cover the interconnect lines M1. The upper surface of the insulating film IL3 has been planarized. In the insulating film IL3, the through holes THG and THS are formed and, at the bottom portions of the through holes THG and THS, the interconnect lines M1 are partly exposed. Over the insulating film IL3 including the through holes THG and THS, the interconnect lines (second-layer interconnect line) M2 are formed. The material, film configuration, thickness, formation method, and the like of each of the interconnect lines M2 are the same in each of Embodiment 5 and Embodiment 1 described above. Accordingly, each of the interconnect lines M1 (which are the source interconnect lines M1S and the gate interconnect line M1G herein) has the thickness T1 smaller (thinner) than the thickness T2 of each of the interconnect lines M2 (which are the source interconnect line M2S and the gate interconnect line M2G herein).

The interconnect lines M2 include the gate interconnect line M2G electrically coupled to the gate interconnect line M1G via the via portion (portion embedded in the gate through hole THG) and the source interconnect line M2S electrically coupled to the source interconnect lines M1S via the via portions (portions embedded in the source through holes THS). The gate interconnect line M2G and the source interconnect line M2S are in the same layer, but are spaced apart from each other.

Here, the through hole THG is located at a position overlapping the gate interconnect line M1G in plan view and assumedly referred to as the gate through hole THG. On the other hand, the through holes THS are located at positions overlapping the source interconnect lines M1S in plan view and assumedly referred to as the source through holes THS.

The source interconnect line M2S has portions (via portions) embedded in the source through holes THS and electrically coupled to the source interconnect lines M1S via the via portions (portions embedded in the source through holes THS). The gate interconnect line M2G has a portion (via portion) embedded in the gate through hole THG and electrically coupled to the gate interconnect line M1G via the via portion (portion embedded in the gate through hole THG).

In another embodiment, it is also possible to embed the same conductive plugs as the foregoing plugs PGG2 and PGS2 in the through holes THG and THS and electrically couple the interconnect lines M2 and M1 to each other via the plugs.

Over the insulating film IL3, the insulating film (surface protective film) PA is formed so as to cover the interconnect lines M2. The insulating film PA can function as a protective film (passivation film) forming the uppermost surface of the semiconductor device CP. The insulating film PA is formed with the pad openings OP. The openings OP include the source opening OPS exposing the source interconnect line M2S and the gate opening OPG exposing the gate interconnect line M2G.

At the bottom portion of the source opening OPS, the source interconnect line M2S is partly exposed. The source interconnect line M2S exposed from the source opening OPS forms the source pad (pad electrode or bonding pad) PDS. At the bottom portion of the gate opening OPG, a part of the gate interconnect line M2G (pad portion) is exposed. The gate interconnect line M2G (pad portion) exposed from the gate opening OPG forms the gate pad (pad electrode or bonding pad) PDG. Note that the gate interconnect line M2G integrally includes the interconnect line portion M2G1 and the pad portion M2G2. The interconnect line portion M2G1 extends around the MOSFET formation region LR2 along the outer periphery of the MOSFET formation region LR2. The pad portion M2G2 of the gate interconnect line M2G is exposed from the gate opening OPG. The pad portion M2G2 of the gate interconnect line M2G exposed from the gate opening OPG forms the gate pad PDG.

In Embodiment 5, the electrode for leading out the sources of the trench-gate MISFETs formed in the semiconductor substrate SUB and the electrode for leading out the gates thereof are formed as the source pad PDS and the gate pad PDG on the top surface side of the semiconductor device CP. On the other hand, the electrode for leading out the drains of the trench-gate MISFETs formed in the semiconductor substrate SUB is formed as the drain back surface electrode BE on the back surface side of the semiconductor device CP.

Specifically, the gate electrodes GE2 of the trench-gate MISFETs formed in the semiconductor substrate SUB are electrically coupled to the gate interconnect line M2G via the gate plugs PGG2 and the gate interconnect line M1G and thus electrically coupled to the gate pad PDG. The sources ($n^+$-type semiconductor regions SR2) of the trench-gate MISFETs formed in the semiconductor substrate SUB are electrically coupled to the source interconnect line M2S via the source plugs PGS2 and the source interconnect lines M1S and thus electrically coupled to the source pad PDS. The drains (epitaxial layer EP and substrate main body SB) of the trench-gate MISFETs formed in the semiconductor substrate SUB are electrically coupled to the back surface electrode BE.

In the semiconductor device CP having such a configuration, an operating current for each of the unit transistor cells 10b flows in the thickness direction of the semiconductor substrate SUB between the drain epitaxial layer EP and each of the source $n^+$-type semiconductor regions SR2 along each of the side surfaces of the gate electrode GE2 (i.e., side surfaces of the trench TR2). As a result, a channel is formed along the thickness direction of the semiconductor substrate SUB.

Thus, the semiconductor device CP in Embodiment 5 is a semiconductor chip formed with the vertical MISFETs each having a trench-gate structure. Here, each of the vertical MISFETs corresponds to a MISFET in which the current between the source and the drain flows in the thickness direction of the semiconductor substrate (SUB) (direction generally perpendicular to the main surface of the semiconductor substrate).

In Embodiment 5, as the two-dimensional layout of the interconnect lines M1 and M2, the two-dimensional layout of the interconnect lines M1 and M2 in Embodiment 1 described above is used. This allows the description of the two-dimensional layout of the interconnect lines M1 and M2 in Embodiment 1 described above to be applied also to Embodiment 5. However, in Embodiment 1, the portions of the gate interconnect line M1G each extending in the Y-direction extend over the plugs TL while, in Embodiment 5, the portions of the gate interconnect line M1G each extending in the Y-direction extend over the gate electrodes GE2 embedded in the semiconductor substrate SUB. With regard to this point, the description in Embodiment 1 described above needs to be modified.

The following is a brief description thereof.

In Embodiment 5, in the MOSFET formation region LR2, a structure (layout) of the unit transistor cells 10b as shown in FIGS. 68 to 71 is repeated in the X-direction. As a result, in the MOSFET formation region LR2, the plurality of unit transistor cells 10b (unit MISFET elements) are formed and coupled in parallel to each other. Each of the plurality of unit transistor cells 10b (unit MISFET elements) formed in the MOSFET formation region LR2 is the trench-gate MISFET element and has the gate electrode GE2 embedded in the trench TR2 of the semiconductor substrate SUB and the source region ($n^+$-type semiconductor region SR2) formed in the top surface portion of the semiconductor substrate SUB. The substrate main body SB and the epitaxial layer EP of the semiconductor substrate SUB function as the common drain region of the plurality of unit transistor cells 10b (unit MISFET elements) formed in the MOSFET formation region LR2.

In the MOSFET formation region LR2, each of the gate electrodes GE2 extends in the Y-direction, while the source regions ($n^+$-type semiconductor regions SR2) are formed in the areas of the active regions AR which are located between the gate electrodes GE2 adjacent to each other in the X-direction to extend in the Y-direction. The source plugs PGS2 are formed in the areas of the active regions AR which are located between the gate electrodes GE2 adjacent to each other in the X-direction.

To couple in parallel the plurality of unit transistor cells 10b (unit MISFET elements) formed in the MOSFET formation region LR2 to each other, the gate electrodes GE2 of the plurality of unit transistor cells 10b in the MOSFET formation region LR2 are electrically coupled to each other via the gate plugs PGG2 and the gate interconnect line M1G and are also electrically coupled to the gate interconnect line M2G via the gate interconnect line M1G. The source regions ($n^+$-type semiconductor regions SR2) of the plurality of unit transistor cells 10b (unit MISFET elements) formed in the MOSFET formation region LR2 are electrically coupled to each other via the source plugs PGS2 and the source interconnect lines M1S and M2S. The drain regions of the plurality of unit transistor cells 10b (unit MISFET elements) formed in the MOSFET formation region LR2 are electrically coupled to the common back surface electrode BE.

In Embodiment 5, over the gate electrodes GE2 embedded in the semiconductor substrate SUB, the gate interconnect line M1G extends in the Y-direction. More specifically, over the MOSFET formation region LR2, the gate interconnect line M1G integrally includes the portions each extending in the Y-direction and the portions each extending in the X-direction. The portions of the gate interconnect line M1G each extending in the Y-direction extend over the gate electrodes GE2 in the Y-direction. That is, over the LDMOSFET formation region LR2, the gate interconnect line M1G has a two-dimensional structure in which the plurality of interconnect line portions each extending in the Y-direction and the plurality of interconnect line portions each extending in the X-direction are integrally connected. The interconnect line portions each extending in the Y-direction extend over the gate electrodes GE2 in the Y-direction. It is preferable that, over the MOSFET formation region LR2, the gate interconnect line M1G has the two-dimensional structure in which the plurality of interconnect line portions each extending in the Y-direction and arranged at predetermined intervals (more preferably, at equal intervals) in the X-direction and the plurality of interconnect line portions each extending in the X-direction and arranged at predetermined intervals (more specifically, at equal intervals) in the Y-direction are integrally connected.

It is preferable that the portions of the gate interconnect line M1G each extending in the X-direction are located over the isolation regions ST between the active regions AR. It is also preferable that the portions of the gate interconnect line M1G each extending in the X-direction are electrically coupled to the gate electrodes GE2 via the gate plugs PGG2. That is, it is preferable to place the gate plugs PGG2 at the points of intersection of the portions of the gate interconnect line M1G each extending in the X-direction and the gate electrodes GE2 extending in the Y-direction and electrically couple the gate electrodes GE2 to the gate interconnect line M1G via the gate plugs PGG2. The respective gate electrodes GE2 of the plurality of unit transistor cells 10b formed in the MOSFET formation region LR2 are electrically coupled to each other via the gate interconnect line M1G.

The source interconnect lines M1S are in discrete patterns (discrete source interconnect lines) separate from each other with the gate interconnect line M1G being interposed therebetween (see FIGS. 66 and 69). That is, the source interconnect lines M1S are in the discrete patterns (isolated source interconnect lines) and peripherally surrounded by the gate interconnect line M1G in plan view. Specifically, the source interconnect lines M1S in the discrete patterns are peripherally surrounded by the portions of the gate interconnect line M1G each extending in the Y-direction and the portions of the gate interconnect line M1G each extending in the X-direction. The source interconnect lines M1S in the discrete patterns are located over the respective source regions ($n^+$-type semiconductor regions SR2) of the plurality of unit transistor cells 10b formed in the MOSFET formation region LR2 and electrically coupled to the source regions via the source plugs PGS2. The two-dimensional shape of each of the source interconnect lines M1S in the discrete patterns (discrete source interconnect lines) can be, e.g., a rectangular shape (rectangular shape having short sides in the X-direction and long sides in the Y-direction).

In the MOSFET formation region LR2, the plurality of source interconnect lines M1S in the discrete patterns (discrete source interconnect lines) are formed. The source interconnect line M2S is located so as to cover the plurality of source interconnect lines M1S. The plurality of source interconnect lines M1S formed in the MOSFET formation region LR2 are each electrically coupled to the common source interconnect line M2S via the via portions (portions embedded in the source through holes THS) of the source interconnect line M2S and electrically coupled to each other via the source interconnect line M2S. The source interconnect line M2S is partly exposed from the source opening OPS of the insulating film PA. The source interconnect line M2S exposed from the source opening OPS serves as the source pad PDS.

The semiconductor device CP in Embodiment 5 can also be applied to each of the foregoing semiconductor devices PKG1 and PKG1a.

Embodiment 5 also has characteristic features (characteristic features related to the interconnect lines M1 and M2) similar to those of Embodiment 1 described above except that the portions of the gate interconnect line M1G each extending in the Y-direction extend not over the plugs TL embedded in the semiconductor substrate SUB, but over the gate electrodes GE2 embedded in the semiconductor substrate SUB. Accordingly, in Embodiment 5 also, effects similar to those obtained in Embodiment 1 described above can be obtained.

Briefly, in Embodiment 5 also, it is possible to reduce gate resistance, while ensuring the effective area of the LDMOSFET formation region LR2. It is also possible to increase the effective area of the LDMOSFET formation region LR2, while ensuring low gate resistance. This can achieve each of a reduction in gate resistance and a reduction in ON resistance. Therefore, it is possible to improve the performance of the semiconductor device.

In addition, it is also possible to apply the techniques in Embodiments 2 and 3 described above.

While the invention achieved by the present inventors has been specifically described heretofore on the basis of the embodiments thereof, the present invention is not limited to the foregoing embodiments. It will be appreciated that various changes and modifications can be made in the invention within the scope not departing from the gist thereof.

Additionally, a part of the content of the description of Embodiments described above is shown below.

(Note 1)

A semiconductor device includes: a semiconductor substrate; a plurality of unit MISFET elements formed in a first MISFET formation region of a main surface of the semiconductor substrate and coupled in parallel to each other; an interconnect line structure formed over the semiconductor substrate and having a first interconnect line layer, and a second interconnect line layer located over the first interconnect line layer; and a drain back surface electrode formed over a back surface of the semiconductor substrate opposite to the main surface. Each of the unit MISFET elements is a trench-gate MISFET element and includes a gate electrode embedded in a trench of the semiconductor substrate, and a source region formed in a top surface layer portion of the semiconductor substrate. The first interconnect line layer of the interconnect line structure includes a first source interconnect line, and a first gate interconnect line. The second interconnect line layer of the interconnect line structure includes a second source interconnect line, and a second gate interconnect line. Each of the first source interconnect line and the first gate interconnect line has a thickness smaller than a thickness of each of the second source interconnect line and the second gate interconnect line. The respective source regions of the unit MISFET elements are electrically coupled to each other via the first source interconnect line and the second source interconnect line. The respective gate electrodes of the unit MISFET elements are electrically coupled to each other via the first gate interconnect line and electrically coupled to the second gate interconnect line via the first gate interconnect line. The first gate interconnect line extends over each of the gate electrodes.

(Note 2)

In the semiconductor device according to Note 1, over the first MISFET formation region, the first gate interconnect line integrally includes a portion extending in a first direction as an extending direction of each of the gate electrodes, and a portion extending in a second direction crossing the first direction. The portion of the first gate interconnect line extending in the first direction extends over the each of the gate electrodes in the first direction.

(Note 3)

In the semiconductor device according to Note 2, the first source interconnect line is divided into a plurality of discrete source interconnect lines with the first gate interconnect line being interposed therebetween. Over the respective source regions of the unit MISFET elements, the discrete source interconnect lines are placed. The second source interconnect line is placed so as to cover the discrete source interconnect lines. The discrete source interconnect lines are electrically coupled to each other via the second source interconnect line.

(Note 4)

In the semiconductor device according to Note 3, in plan view, each of the discrete source interconnect lines is surrounded by the first gate interconnect line.

(Note 5)

In the semiconductor device according to Note 1, the second source interconnect line forms a source pad, and the second gate interconnect line forms a gate pad.

What is claimed is:

1. A semiconductor device, comprising:
   a semiconductor substrate;

a plurality of unit MISFET elements formed in a first MISFET formation region of a main surface of the semiconductor substrate and coupled in parallel to each other;

an interconnect line structure formed over the semiconductor substrate and having a first interconnect line layer, and a second interconnect line layer located over the first interconnect line layer; and a back surface electrode formed over a back surface of the semiconductor substrate opposite to the main surface, wherein each of the unit MISFET elements has a source region formed in the semiconductor substrate, a drain region formed in the semiconductor substrate, and a gate electrode formed over the semiconductor substrate located between the source region and the drain region via a gate insulating film, wherein the first interconnect line layer of the interconnect line structure includes a first source interconnect line, and a first gate interconnect line, wherein the second interconnect line layer of the interconnect line structure includes a second source interconnect line, and a second gate interconnect line, wherein each of the first source interconnect line and the first gate interconnect line has a thickness smaller than a thickness of each of the second source interconnect line and the second gate interconnect line, wherein the respective drain regions of the unit MISFET elements are electrically coupled to the back surface electrode via a conductive plug embedded in a trench of the semiconductor substrate to be electrically coupled to each other, wherein the respective source regions of the unit MISFET elements are electrically coupled to each other via the first source interconnect line and the second source interconnect line, wherein the respective gate electrodes of the unit MISFET elements are electrically coupled to each other via the first gate interconnect line and electrically coupled to the second gate interconnect line via the first gate interconnect line, and wherein the first gate interconnect line extends over the plug.

2. The semiconductor device according to claim 1,
wherein the first gate interconnect line extends over the plug in a first direction as an extending direction of each of the gate electrodes.

3. The semiconductor device according to claim 2,
wherein the plug extends in the first direction between the gate electrodes adjacent to each other with the drain regions being interposed therebetween.

4. The semiconductor device according to claim 3,
wherein, over the first MISFET formation region, the first gate interconnect line integrally includes a portion extending in the first direction, and a portion extending in a second direction crossing the first direction, and
wherein the portion of the first gate interconnect line extending in the first direction extends over the plug in the first direction.

5. The semiconductor device according to claim 4,
wherein the first source interconnect line is divided into a plurality of discrete source interconnect lines with the first gate interconnect line being interposed therebetween,
wherein, over the respective source regions of the unit MISFET elements, the discrete source interconnect lines are placed, wherein the second source interconnect line is placed so as to cover the discrete source interconnect lines, and
wherein the discrete source interconnect lines are electrically coupled to each other via the second source interconnect line.

6. The semiconductor device according to claim 5,
wherein, in plan view, each of the discrete source interconnect lines is surrounded by the first gate interconnect line.

7. The semiconductor device according to claim 6,
wherein the discrete source interconnect lines extend also over the gate electrodes.

8. The semiconductor device according to claim 7,
wherein each of the unit MISFET elements further includes a field plate electrode,
wherein the discrete source interconnect lines extend also over the field plate electrodes, and
wherein the field plate electrodes are electrically coupled to the discrete source interconnect lines.

9. The semiconductor device according to claim 8,
wherein each of the field plate electrodes extends from over a part of the drain region to over a part of the gate electrode via an insulating film.

10. The semiconductor device according to claim 6,
wherein the first gate interconnect line has a portion extending along an outer periphery of the first MISFET formation region,
wherein the second gate interconnect line has a portion extending along the outer periphery of the first MISFET formation region, and
wherein, in plan view, the portion of the first gate interconnect line extending along the outer periphery of the first MISFET formation region overlaps the portion of the second gate interconnect line extending along the outer periphery of the first MISFET formation region.

11. The semiconductor device according to claim 1,
wherein the second source interconnect line forms a source pad, and
wherein the second gate interconnect line forms a gate pad.

12. The semiconductor device according to claim 1,
wherein each of the first interconnect line layer and the second interconnect line layer of the interconnect line structure has no interconnect line coupled to the drain regions of the unit MISFET elements.

13. The semiconductor device according to claim 1,
wherein the unit MISFET elements are unit LDMOSFET elements.

14. The semiconductor device according to claim 1,
wherein the plug is made of a metal film embedded in the trench of the semiconductor substrate.

15. The semiconductor device according to claim 1,
wherein the first source interconnect line is not placed over the plug.

16. A semiconductor device, comprising:
a semiconductor substrate;
a plurality of unit MISFET elements formed in a first MISFET formation region of a main surface of the semiconductor substrate and coupled in parallel to each other;
an interconnect line structure formed over the semiconductor substrate and having a first interconnect line layer, and a second interconnect line layer located over the first interconnect line layer; and
a back surface electrode formed over a back surface of the semiconductor substrate opposite to the main surface,
wherein each of the unit MISFET elements has a source region formed in the semiconductor substrate, a drain region formed in the semiconductor substrate, and a gate electrode formed over the semiconductor substrate located between the source region and the drain region via a gate insulating film, wherein the first interconnect line layer of the interconnect line structure includes a first drain interconnect line, and a first gate interconnect line, wherein the second interconnect line layer of the interconnect line structure includes a second drain interconnect line, and a second gate interconnect line, wherein each of the first drain interconnect line and the first gate interconnect line has a thickness smaller than a thickness of each of the second drain interconnect line and the second gate interconnect line, wherein the respective source regions of the unit MISFET elements are electrically coupled to the back surface electrode via a conductive plug embedded in a trench of the semiconductor substrate to be electrically coupled to each other, wherein the respective drain regions of the unit MISFET elements are electrically coupled to each other via the first drain interconnect line and the second drain interconnect line, wherein the respective gate electrodes of the unit MISFET elements are electrically coupled to each other via the first gate interconnect line and electrically coupled to the second gate interconnect line via the first gate interconnect line, and wherein the first gate interconnect line extends over the plug.

17. The semiconductor device according to claim 16, wherein, over the first MISFET formation region, the first gate interconnect line integrally includes a portion extending in a first direction as an extending direction of each of the gate electrodes, and a portion extending in a second direction crossing the first direction, and wherein the portion of the first gate interconnect line extending in the first direction extends over the plug in the first direction.

18. The semiconductor device according to claim 17, wherein the first drain interconnect line is divided into a plurality of discrete drain interconnect lines with the first gate interconnect line being interposed therebetween, wherein, over the respective drain regions of the unit MISFET elements, the discrete drain interconnect lines are placed, wherein the second drain interconnect line is placed so as to cover the discrete drain interconnect lines, and wherein the discrete drain interconnect lines are electrically coupled to each other via the second drain interconnect line.

19. The semiconductor device according to claim 18, wherein, in plan view, each of the discrete drain interconnect lines is surrounded by the first gate interconnect line.

20. The semiconductor device according to claim 16, wherein the second drain interconnect line forms a drain pad, and wherein the second gate interconnect line forms a gate pad.

* * * * *